(12) United States Patent
Takeuchi et al.

(10) Patent No.: US 7,177,196 B2
(45) Date of Patent: Feb. 13, 2007

(54) NONVOLATILE SEMICONDUCTOR MEMORY HAVING PLURAL DATA STORAGE PORTIONS FOR A BIT LINE CONNECTED TO MEMORY CELLS

(75) Inventors: Ken Takeuchi, Tokyo (JP); Tomoharu Tanaka, Yokohama (JP); Noboru Shibata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/073,999

(22) Filed: Feb. 14, 2002

(65) Prior Publication Data

US 2002/0114207 A1 Aug. 22, 2002

Related U.S. Application Data

(62) Division of application No. 09/667,610, filed on Sep. 22, 2000, now Pat. No. 6,373,746.

(30) Foreign Application Priority Data

Sep. 28, 1999 (JP) ........................................... 11-275327
Dec. 3, 1999 (JP) ........................................... 11-345299

(51) Int. Cl.
*G11C 16/06* (2006.01)

(52) U.S. Cl. .............................. 365/185.22; 365/185.11; 365/185.17; 365/185.18; 365/185.28

(58) Field of Classification Search ............ 365/185.22, 365/185.17, 185.18, 185.28, 185.11, 185.01
See application file for complete search history.

(56) References Cited

U.S. PATENT DOCUMENTS 5,748,529 A * 5/1998 Lee ......................... 365/185.17

| 5,870,334 | A | | 2/1999 | Hemink et al. |
| 5,920,507 | A | * | 7/1999 | Takeuchi et al. ........ 365/185.22 |
| 5,966,326 | A | * | 10/1999 | Park et al. ............. 365/185.03 |
| 5,969,985 | A | * | 10/1999 | Tanaka et al. ......... 365/185.03 |
| 6,055,181 | A | | 4/2000 | Tanaka et al. |
| 6,058,042 | A | * | 5/2000 | Nobukata ............... 365/185.03 |
| 6,122,193 | A | * | 9/2000 | Shibata et al. ......... 365/185.03 |
| 6,125,052 | A | * | 9/2000 | Tanaka ................... 365/185.03 |
| 6,134,140 | A | | 10/2000 | Tanaka et al. |
| 6,307,807 | B1 | * | 10/2001 | Sakui et al. ............. 365/238.5 |

FOREIGN PATENT DOCUMENTS

| JP | 04-192188 | 10/1992 |
| JP | 08-315586 | 1/1996 |
| JP | 08-147976 | 7/1996 |
| JP | 09-326197 | 12/1997 |
| JP | 11-176178 | 7/1999 |
| JP | 3153730 | 1/2001 |
| KR | 1996-0042759 | 12/1996 |
| KR | 1999-0063059 | 7/1999 |
| KR | 000056966 | 8/2001 |

OTHER PUBLICATIONS

Tae–Sung Jung et al., "A 3.3V 128Mb Multi–Level NAND Flash Memory for Mass Storage Applications", 1996 IEEE International Solid–State Circuits Conference, pp. 32–33.
Korean Office Action issued on Jun. 21, 2004, and its English translation.

* cited by examiner

*Primary Examiner*—Hoai V. Ho
(74) *Attorney, Agent, or Firm*—Banner & Witcoff, Ltd

(57) ABSTRACT

Data having three values or more is stored in a memory cell in a nonvolatile manner. A data circuit has a plurality of storage circuits. One of the plurality of storage circuits is a latch circuit. Another one of the plurality of storage circuits is a capacitor. The latch circuit and the capacitor function to temporarily store program/read data having two bits or more. Data held by the capacitor is refreshed using the latch circuit if data variation due to leakage causes a program. As a result, the data circuit does not become large in size even if multi-level data is used.

13 Claims, 70 Drawing Sheets

PROGRAM OF ODD PAGE DATA (INTERNAL DATA LOAD 3RD QUARTER)

| | STEP1-1 | STEP1-2 | STEP1-3 | STEP1-4 | STEP1-5 | STEP1-6 | STEP1-7 |
|---|---|---|---|---|---|---|---|
| TrNA1 | ON | OFF | OFF | ON | OFF | OFF | OFF |
| TrNA2 | OFF | ON | OFF | OFF | ON | ON | OFF |
| TrNA3 | OFF | OFF | ON | OFF | OFF | OFF | OFF |
| TrNB1 | OFF→ON | OFF | OFF | OFF→ON | OFF | OFF | ON |
| TrNB2 | OFF | OFF→ON | OFF | OFF | OFF→ON | ON | OFF |
| TrNB3 | OFF | OFF | OFF→ON | OFF | OFF | OFF | OFF |
| CellA1 | DATA LOAD | --- | DATA RETENTION | --- | REFRESH | --- | PROGRAMMING | --- | DATA TRANSFER FROM BLB1 TO DL |
| CellA2 | --- | DATA LOAD | --- | DATA RETENTION | --- | REFRESH | --- | PROGRAMMING | --- | DATA RETENTION |
| CellA3 | --- | --- | DATA LOAD | --- | DATA RETENTION | --- | PROGRAMMING | --- | DATA RETENTION |

DL : DATA LATCH (LATCH CIRCUIT IN DATA CIRCUIT)

FIG. 75

| | STEP1-8 | STEP1-9 | STEP1-10 | STEP1-11 | STEP1-12 |
|---|---|---|---|---|---|
| TrNA1 | ON | OFF | OFF | OFF | OFF |
| TrNA2 | OFF | OFF | ON | OFF | OFF |
| TrNA3 | OFF | OFF | OFF | OFF | ON |
| TrNB1 | OFF→ON | OFF | OFF | OFF | OFF |
| TrNB2 | OFF | ON | OFF→ON | OFF | OFF |
| TrNB3 | OFF | OFF | OFF | ON | OFF→ON |
| CellA1 | VERIFY | ---------- | DATA RETENTION | ---------- | ---------- |
| CellA2 | DATA RETENTION | DATA TRANSFER FROM BLB2 TO DL | VERIFY | ---------- | DATA RETENTION |
| CellA3 | DATA RETENTION | ---------- | ---------- | DATA TRANSFER FROM BLB3 TO DL | VERIFY |

DL : DATA LATCH (LATCH CIRCUIT IN DATA CIRCUIT)

FIG. 76

| | STEP1-13 | STEP1-14 | STEP1-15 | STEP1-16 | STEP1-17 |
|---|---|---|---|---|---|
| TrNA1 | OFF | ON | OFF | OFF | OFF |
| TrNA2 | OFF | OFF | OFF | ON | ON |
| TrNA3 | OFF | OFF | OFF | OFF | OFF |
| TrNB1 | ON | OFF | OFF | OFF | OFF |
| TrNB2 | OFF | OFF | ON | OFF | ON |
| TrNB3 | OFF | OFF | OFF | OFF | OFF |
| CellA1 | DATA TRANSFER FROM BLB1 TO DL | DATA TRANSFER FROM DL TO BLA1 | DATA RETENTION | DATA RETENTION | PROGRAMMING |
| CellA2 | DATA RETENTION | DATA RETENTION | DATA TRANSFER FROM BLB2 TO DL | DATA TRANSFER FROM DL TO BLA2 | PROGRAMMING |
| CellA3 | | | DATA RETENTION | | PROGRAMMING |

DL : DATA LATCH (LATCH CIRCUIT IN DATA CIRCUIT)

FIG. 77

NONVOLATILE SEMICONDUCTOR MEMORY HAVING PLURAL DATA STORAGE PORTIONS FOR A BIT LINE CONNECTED TO MEMORY CELLS

This application is a Divisional of U.S. application Ser. No. 09/667,610 filed on Sep. 22, 2000 now U.S. Pat. No. 6,373,746 B1, hereby incorporated by reference as to its entirety.

CROSS-REFERENCE TO RELATED APPLICATION

This application is based on and claims the benefit of priority from the prior Japanese Patent Applications No. 11-275327, filed Sep. 28, 1999; and No. 11-345299, filed Dec. 3, 1999, the entire contents of which are incorporated herein by reference.

BACKGROUND OF THE INVENTION

The present invention relates to a nonvolatile semiconductor memory and particularly relates to a nonvolatile semiconductor memory used as a Multi-level NAND cell type EEPROM, e.g., a four-level NAND cell type EEPROM.

There is known, as one of nonvolatile semiconductor memories, an NAND cell type EEPROM. This EEPROM has a memory cell array consisting of a plurality of NAND cell units. Each of the NAND cell units consists of a plurality of memory cells connected in series and two select transistors connected to both ends of the memory cells, respectively. The NAND cell unit is connected between a bit line and a source line.

Each memory cell consists of an n channel MOS transistor having a so-called stack gate structure in which a control gate electrode is stacked on a floating gate electrode. Each select transistor consists of an n channel MOS transistor having a structure in which an upper electrode is stacked on a lower electrode as in the case of the memory cell. It is the lower electrode, for example, that actually functions as the gate electrode of the select transistor.

One source region or one drain region is common to adjacent two transistors among a plurality of transistors (memory cells and select transistors) in an NAND cell unit.

Now, the concrete structure of an NAND cell type EEPROM will be described.

FIG. 1 shows part of a memory cell array of the NAND cell type EEPROM.

Each NAND cell unit consists of a plurality of (4, 8, 16 or the like) memory cells connected in series and two select transistors connected to both ends of the memory cells, respectively. The NAND cell unit is connected between bit lines BLi and source lines SL. Each of the source lines is connected to reference potential lines each formed of a conductive member such as polysilicon at preset positions.

The source lines SL extend in row direction, whereas the bit lines BLi and the reference potential lines extend in column direction. Contact portions on which the source line SL and the reference potential line contact are provided at intervals at which each source line SL intersects, for example, 64 bit lines, i.e., four bit lines BL0, ... BL63. The reference potential lines is connected to so-called peripheral circuits provided on the peripheral section of the memory cell array.

Word lines (control gate lines) WL1, ... and WLn extend in the row direction and the select gate lines SG1 and SG2 extend in the row direction, as well. The collection of the memory cells connected to one word line (control gate line) WLi is called one page. Further, the collection of the memory cells connected to the word lines WL1, ... and WLn put between the two select gate lines SG1 and SG2 is called one NAND block or simply one block.

One page consist of, for example, 256-byte (256×8) memory cells. The memory cells in one page are programmed almost simultaneously. In addition, if one page consists of 256-byte memory cells and one NAND cell unit consists of eight memory cells, one block consists of 2048-byte (2048×8) memory cells. The memory cells in one page are erased almost simultaneously.

FIG. 2 is a plan view of one NAND cell unit in the memory cell array. FIG. 3 is a cross-sectional view of the NAND cell taken along line III—III of FIG. 2. FIG. 4 is a cross-sectional view thereof taken along line IV–IV of FIG. 2. FIG. 5 shows an equivalent circuit of the devices of FIGS. 2 to 4.

In a p substrate (p-sub) 11-1, a so-called double-well region, consisting of an n well region (Cell n-well) 11-2 and p well region (Cell p-well) 11-3, is formed. The memory cells and select transistors are formed in the p well region 11-3.

The memory cells and select transistors are arranged in an element region within the p well region 11-3. The element region is surrounded by an element separation oxide film (element separation region) 12 formed on the p well region 11-3.

In this example, one NAND cell unit consists of eight memory cells M1 to M8 connected in series and two select transistors S1 and S2 connected to the both ends of the memory cells, respectively.

Each memory cell consists of a silicon oxide film (gate insulating film) 13 formed on the p well region (Cell p-well) 11-3, a floating gate electrode 14 ($14_1$, $14_2$ ... $14_8$) on the silicon oxide film 13, a silicon oxide film (inter-polysilicon insulating film) 15 on the floating gate electrode 14 ($14_1$, $14_2$ ... $14_8$), a control gate electrode 16 ($16_1$, $16_2$ ... $16_8$) on the silicon oxide film 15 and a source-drain region 19 in the p well region (Cell p-well) 11-3.

Each select transistor consists of a silicon oxide film (gate insulating film) formed on the p well region 11-3, a gate electrode 14 ($14_9$, $14_{10}$) and 16 ($16_9$, $16_{10}$) on the silicon oxide film, and a source-drain region 19 in the p well region 11-3.

The structure of the select transistor is similar to that of the memory cell for the following reason. By simultaneously forming the memory cells and the select transistors through the same process, the number of process steps is intended to be reduced to thereby reduce production cost.

One source region ($n^+$ diffused layer) 19 or one drain region ($n^+$ diffused layer) 19 is common to adjacent two transistors among the plural transistors (memory cells and select transistors) in the NAND cell unit.

The memory cells and the select transistors are covered with a silicon oxide film (CVD oxide film) 17 formed by the CVD method. A bit line 18 connected to one end of the NAND cell unit ($n^+$ diffused layer 19) is arranged on the CVD oxide film 17.

FIG. 6 shows the well structure of the NAND cell type EEPROM.

In the p substrate (p-sub) 11-1, a so-called double-well region, consisting of the n well region (Cell n-well) 11-2 and the p well region (Cell p-well) 11-3, an n well region (n-well) 11-4 and a p well region (p-well) 11-5.

The double-well region is formed on a memory cell array section, and the n well region 11-4 and the p well region 11-5 are formed on a peripheral circuit section.

The memory cells are formed in the p well region 11-3. The n well region 11-2 and the p well region 11-3 are set to have the same potential.

A high voltage n channel MOS transistor applied with a higher voltage than a power supply potential is formed on the p substrate (p-sub) 11-1. A low voltage p channel MOS transistor applied with the power supply voltage is formed on the n well region (n-well) 11-4 and a low voltage n channel MOS transistor applied with the power supply voltage is formed on the p well region (p-well) 11-5.

Next, the basic operation of the NAND cell type EEPROM will be described.

First, to facilitate the description, the following preconditions are specified. Two level data "0" and "1" are stored in a memory cell; a state in which the threshold voltage of the memory cell is low (e.g., the threshold voltage is negative) is a "0" state; and a state in which the threshold voltage of the memory cell is high (e.g., the threshold voltage is positive) is a "1" state.

In an ordinary two-level NAND cell type EEPROM, a state in which the threshold voltage of the memory cell is low is set at a "1" state and that in which the threshold voltage is high is set at a "0" state. However, as will be described later, the present invention is mainly intended for a multi-level (e.g., four-level) NAND type EEPROM. Considering this, it is assumed that a state in which the threshold voltage of the memory cell is low is a "0" state and that in which the threshold voltage of the memory cell is high is a "1" state.

As for the memory cell, it is assumed that the "0" state is an erase state and the "1" state is a program state. "Programming" involves "0"-programming and "1"-programming. The "0"-programming means maintaining the erase state ("0" state) and the "1"-programming means changing the "0" state to the "1" state.

Program Operation

In program operation, the potential of a bit line is set according to program data on a selected memory cell connected to the bit line. For example, if the program data is "1" ("1"-programming), the potential of the bit line is set at a ground potential (0V) Vss. If the program data is "0" ("0"-programming), the potential of the bit line is set at a power supply potential Vcc.

The potential of a select gate line SG1 at a bit line side (drain side) in a selected block, i.e., in an NAND cell unit including the selected memory cell is set at the power supply potential Vcc. The potential of a select gate line SG2 at a source line side in the selected block, i.e., in the NAND cell unit including the selected memory cell is set at the ground potential (0V) Vss.

The potentials of select gate lines SG1 and SG2 in the unselected block, i.e., in the NAND cell unit not including the selected memory cell are all set at the ground potential (0V) Vss.

In case of "1"-programming, the ground potential (0V) Vss is transmitted to the channel of the selected memory cell in the selected block. In case of "0"-programming, the channel potential of the selected memory cell in the selected block is Vcc−Vthsg (where Vthsg is the threshold voltage of the select transistor S1). Thereafter, the channel of the selected memory cell in the selected block turns into a floating state while maintaining the potential Vcc−Vthsg so as to cut off the select transistor S1 at the bit line side (drain side) in the selected block.

If the selected memory cell is not the closest to the bit line and the threshold voltage of a memory cell positioned at the bit line side with respect to the selected memory cell (or, at least one memory cell among a plurality of memory cells which exist at the bit line side with respect to the selected memory cell) is a positive voltage Vthcell, then the channel of the selected memory cell turns into a floating state while maintaining the potential Vcc−Vthcell.

Then, a program potential Vpp (e.g., about 20V) is applied to a selected word line in the selected block, i.e., to the control gate electrode of the selected memory cell. An intermediate potential Vpass (e.g., about 10V) is applied to unselected word lines in the selected block, i.e., the control gate electrodes of unselected memory cells.

At this moment, the channel potential of the selected memory cell to which "1"-programming is conducted, is the ground potential (0V) Vss. Due to this, a high voltage necessary for the "1"-programming is applied between the floating gate electrode and the channel (Cell p-well) of the memory cell and electrons move from the channel to the floating gate electrode by F-N tunnel effect. As a result, the threshold voltage of the selected memory cell rises (e.g., moves from a negative value to a positive value).

On the other hand, the channel potential of the selected memory cell to which "0"-programming is conducted, is Vcc−Vthsg or Vcc−Vthcell and the channel is in a floating state. Due to this, if either Vpp or Vpass is applied to the word line, the channel potential rises by the capacitive coupling between the control gate electrode and the channel. As a result, a high voltage necessary for "1"-programming is not applied between the floating gate electrode and the channel (Cell p-well) and the threshold voltage of the selected memory cell is kept in a present status (the memory cell is kept in an erase state).

Erase Operation

Data erase is carried out in block units and data on memory cells in a selected block are erased almost simultaneously.

Concrete erase operation will be described below.

First, the potentials of all word lines (control gate electrodes) in a selected block are set at 0V and the potentials of all word lines (control gate electrodes) of unselected blocks and all select gate lines in all blocks are set at an initial potential Va and then set in a floating state.

Thereafter, a high voltage Vpp (e.g., about 20V) is applied to the p well region (Cell p-well) and the n well region (Cell n-well) for erase operation.

At this moment, as for the memory cells in the selected block, since the potentials of the word lines (control gate electrodes) are 0V and those of the well regions are VppE, a sufficiently high voltage is applied between the control gate electrodes and the well regions for erase operation.

Accordingly, in the memory cells in the selected block, electrons in the floating gate electrodes move to the well regions and the threshold voltages of the memory cells decrease (e.g., the threshold voltages become negative) by the F-N tunnel effect.

On the other hand, the potentials of all word lines in the unselected blocks rise from the initial potential Va to VppE or a potential close to VppE by the capacitive coupling between the word lines and the well regions. Likewise, the potentials of all select gate lines in all blocks rise from the initial potential Va to VppE or a potential close to VppE by the capacitive coupling between the select gate lines and the well regions.

Accordingly, in the memory cells in the unselected blocks, a high voltage sufficient for data erase is not applied between the control gate electrodes and the well regions. That is, since electrons within the floating gate electrodes do not move, the threshold voltages of the memory cells have no change (the present state is maintained).

Read Operation

Data read is carried out by changing the potentials of bit lines according to memory cell data and by detecting the potential change.

First, a bit line (or part of bit lines if all bit lines or a bit line shield read method or the like is adopted) to which a memory cell which data is to be read is connected, is precharged, the potential of the bit line is set at a precharge potential, e.g., the power supply potential Vcc and the bit line is then turned into a floating state.

Thereafter, the potential of the selected word line, i.e., the potential of the control gate electrode of the selected memory cell is set at 0V, those of unselected word lines (or the control gates of unselected memory cells) and of the select gate lines are set at the power supply potential Vcc (e.g., about 3V), and those of the source lines are set at 0V.

At this time, if selected memory cell data is "1" (the threshold voltage Vth of the memory cell satisfies Vth>0), the selected memory cell is turned off and the potential of the bit line to which this memory cell is connected is, therefore, kept a precharge potential (e.g., the power supply potential Vcc).

On the other hand, if the selected memory cell data is "0" (the threshold potential Vth of the memory cell satisfies Vth<0), the selected memory cell is turned on. As a result, the charges of the bit line to which the selected memory cell is connected are discharged and the potential of the bit line decreases from the precharge potential by ΔV.

In this way, the potential of the bit line changes according to the memory cell data. Thus, if this change is detected by a sense amplifier circuit, the memory cell data can be read.

Meanwhile, so-called multi-level NAND cell type EEPROMs have been developed and put to practical use with a view of increasing one-chip memory capacity and reducing cost per bit.

In case of the above-stated NAND cell type EEPROM, binary (one-bit) data ("0", "1") can be stored in a memory cell. An n-level NAND cell type EEPROM, where n is a natural number of not lower than 3 is, by contrast, characterized in that n-level data can be stored in a memory cell.

In case of an four-level NAND cell type EEPROM, for example, four-level (2-bit) data ("00", "01", "10", "11") can be stored in a memory cell.

The prior art multi-level NAND cell type EEPROM is described in, for example, Reference 1 (Japanese Patent Application No. 8-98627).

Normally, in the n-level NAND cell type EEPROM, a plurality of latch circuits are provided per bit line connected to a selected memory cell. Namely, if n-level data are programmed into or read from a selected memory cell, the plural latch circuits function to temporarily store the n-level data.

As described in Reference 1, for example, in the four-level NAND cell type EEPROM, two latch circuits corresponding to one bit line connected to a selected memory cell are provided so as to temporarily store four-level (two-bit) data during program or read operation.

However, as shown, for example, in FIG. 7, each latch circuit consists of SRAM (static RAM) cells. Further, the latch circuit consisting of the SRAM cells is large in area. In addition, if the quantity of data stored in one memory cell increases (the value of n is higher), the number of latch circuits provided per bit line connected to the selected memory cell increases, as well.

In case of the four ($=2^2$)-level NAND cell type EEPROM, for example, two latch circuits are provided per bit line connected to a selected memory cell. In an eight ($=2^3$)-level NAND cell type EEPROM, three latch circuits are provided per bit line connected to a selected memory cell.

Accordingly, if data stored in the memory cell are multi-level (n-level) data and the number of n increases, the number of latch circuits (SRAM cells) on a memory chip increases and the area of the chip disadvantageously increases.

BRIEF SUMMARY OF THE INVENTION

The present invention has been made to solve the above-stated disadvantages. It is, therefore, an object of the present invention to provide a data circuit (a storage circuit temporarily storing multi-level data during program/read operations) which can prevent a chip area from extremely increasing even if data stored in a memory cell is multi-level data.

A nonvolatile semiconductor memory according to the present invention comprises a memory cell section including at least one memory cell; a bit line connected to the memory cell section; and a data circuit connected to the bit line, the data circuit storing program/read data having two bits or more, wherein the data circuit includes the first capacitor storing the first data and the first latch circuit storing the second data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13;

FIG. 75 shows the detail of the operation of the present invention relating to program speed;

FIG. 76 shows the detail of the operation of the present invention relating to program speed;

FIG. 77 shows-the detail of the operation of the present invention relating to program speed.

DETAILED DESCRIPTION OF THE INVENTION

A nonvolatile semiconductor memory of the present invention will be described-below in detail with reference to the accompanying drawings.

[Preconditions]

First, to facilitate understanding the description to be given below, preconditions will be specified as follows. It is noted that these preconditions are intended to facilitate understanding the description only and that the present invention is realized on conditions other than these preconditions.

The present invention is directed to a nonvolatile semiconductor memory for storing n-level data, where n is a natural number of not lower than 3. In the following embodiments, a four-level NAND cell type EEPROM will be described to represent such nonvolatile semiconductor memories.

It is assumed that four-level data, "00", "01", "10" and "11", are stored in a memory cell. It is also assumed that a state in which the threshold voltage of the memory cell is the lowest (e.g., a threshold voltage is negative) is data "11" (or a "0" state), a state in which the threshold voltage of the memory cell is the second lowest (e.g., the threshold voltage is positive) is data "10" (or a "1" state), a state in which the threshold voltage of the memory cell is the third lowest (e.g., the threshold voltage is positive) is data "00" (or a "2" state), and a state in which the threshold voltage of the memory cell is the highest (e.g., the threshold voltage is positive) is data "01" (or a "3" state).

In addition, since it is assumed that four-level data are stored in a memory cell, odd page data program/read operations and even page data program/read operations are required. Here, among data "**", it is assumed that the left "*" is odd page data and the right "*" is even page data.

Further, as for the state of a memory cell, it is assumed that a state in which data "11" is stored is an erase state, and states in which data "10", "00" and "01" are stored are program states.

[Outline]

Figure 8:
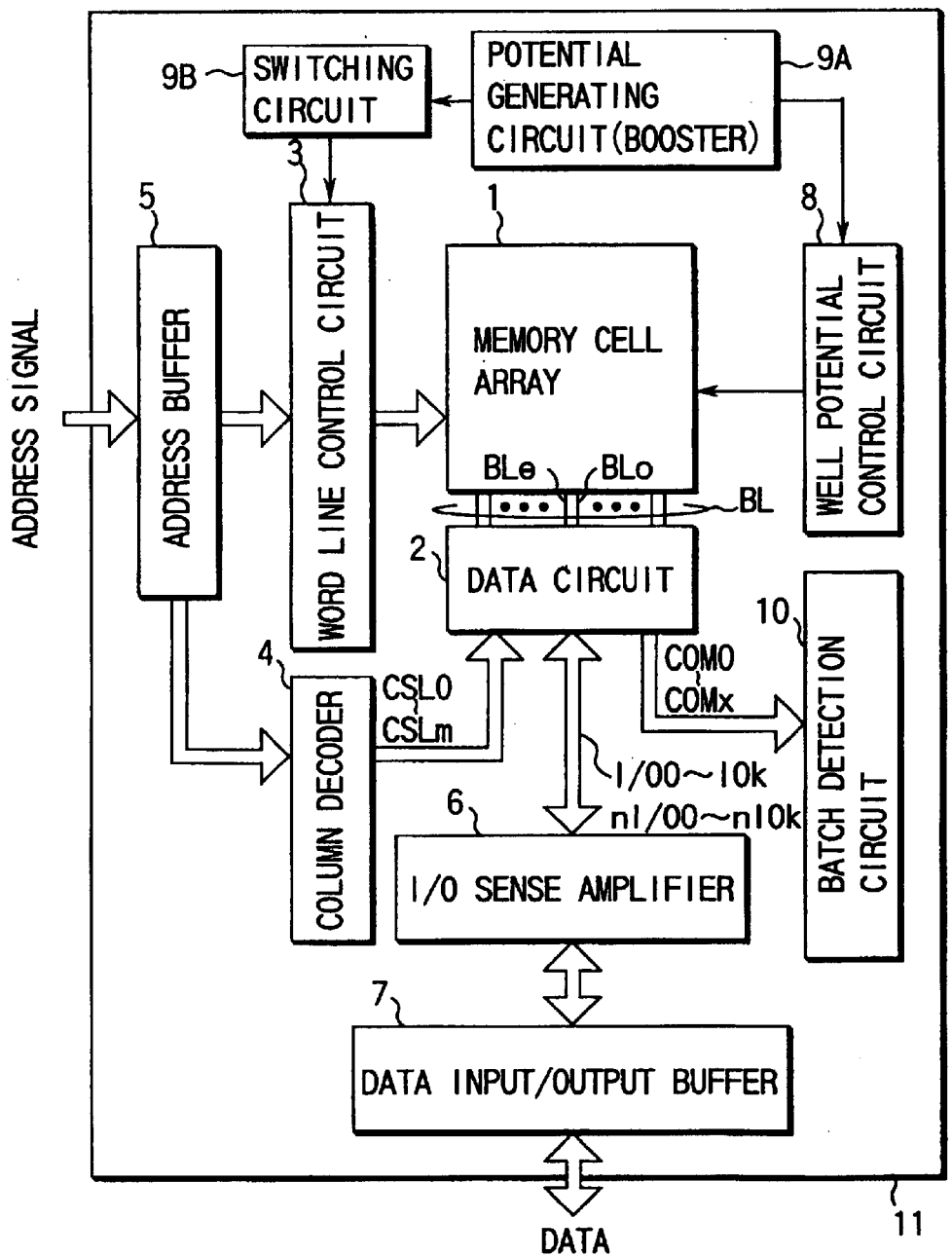
FIG. 8 shows the outline of a multi-level NAND cell type EEPROM according to the present invention.

FIG. 8 is a block diagram showing the important parts of a four-level NAND cell type EEPROM according to the present invention.

Reference symbol 1 denotes a memory cell array. The memory cell array 1 has a plurality of memory cells connected in series and two select transistors connected to both ends of the memory cells, respectively. The concrete structure of the memory cell is show in FIGS. 61 to 63.

The structure and equivalent circuit of the memory cell array 1 are almost the same as those of a two-level NAND cell type EEPROM except that each memory cell stores four-level data in the four-level NAND cell type EEPROM.

A data circuit 2 includes a plurality of storage circuits. The data circuit 2 will be described in detail later. The function of the data circuit will be described herein briefly.

The data circuit 2 includes storage circuits temporarily storing two-bit (four-level) read data during read operation. To be specific, two storage circuits per bit line connected to a selected memory cell are provided.

One of the two storage circuits temporarily stores odd page data. The other storage circuit temporarily stores even page data. The odd/even page data stored in these two storage circuits are programmed into the memory cell during program operation and outputted from a memory chip 11 during read operation.

A word line control circuit 3 includes a low address decoder and a word line driver. The word line control circuit 3 controls the potential of each word line in the memory cell array 1 based on an operation mode (a program mode, an erase mode, a read mode or the like) and a row address signal. The word line control circuit 3 will be described later in detail.

A column decoder 4 selects a column of the memory cell array 1 based on a column address signal.

During program operation, input data is inputted into storage circuits in the data circuit which storage circuits belong to the selected column, through a data input/output buffer 7 and an I/O sense amplifier 6. During read operation, output data from the storage circuits in the data circuit which storage circuits belong to the selected column is outputted externally of the memory chip 11 through the I/O sense amplifier 6 and the data input/output buffer 7.

The row address signal is inputted into the word line control circuit 3 through an address buffer 5. The column address signal is inputted into the column decoder 4 through the address buffer 5.

A well potential control circuit 8 controls the potential of a cell well region (e.g., a double-well region consisting of an n well and a p well) in which memory cells are arranged based on an operation mode (a program mode, an erase mode, a read mode or the like).

A potential generating circuit (booster) 9A generates, for example, a program potential Vpp (e.g., about 20V) and a transfer potential Vpass (e.g., about 10V) during the program operation. These potentials Vpp and Vpass are allotted to a plurality of word lines in, for example, a selected block by a switching circuit 9B.

The potential generating circuit 9A also generates, for example, an erase potential VppE (e.g., about 20V) during the erase operation and applies the potential VppE to the cell well region (both the n well and the p well) in which the memory cells are arranged.

A batch detection circuit 10 verifies whether or not predetermined data has been correctly programmed into a memory cell during the program operation, and also verifies whether or not the memory cell data has been successfully erased during the erase operation.

The first feature of the present invention lies in the data circuit 2. Namely, as will be described in detail, at least one of a plurality of storage circuits arranged in the data circuit and used to temporarily store multi-level data (n-level data), is constituted by a DRAM cell (capacitor). If two storage circuits are used to temporarily store four-level data in, for example, the four-level NAND type EEPROM, one of the storage circuits is an SRAM cell (latch circuit) and the other is a DRAM cell.

As is well known, the area of the DRAM (dynamic RAM) cell is smaller than the area of the SRAM (static RAM) cell. Due to this, in consideration of the n-level NAND cell type EEPROM, where n is a natural number of not lower than 3, if part of the plural storage circuits is constituted by a DRAM cell, it is possible to decrease the area of the data circuit 2 compared with a case of constituting all storage circuits only out of SRAM cells as shown in a conventional semiconductor memory.

The second feature of the present invention lies in the word line control circuit 3. Namely, as will be described later in detail, the word line control circuit 3 consists of a row address decoder and a word line driver. The word line control circuit 2 adopts a layout in which the row address decoder is arranged only at one side of the memory cell array 1 and the word line drivers are arranged at both sides of the memory cell array 1, respectively.

In this case, a signal line for connecting the row address decoder at one side of the memory cell array 1 to the word line driver at the other side thereof, is arranged on the memory cell array 1. The present invention improves the word line control circuit 3 so as to minimize the adverse effect of this signal line on the operations of memory cells.

The third feature of the present invention lies in the read operation. Namely, according to the present invention, the relationship between four-level data and the threshold voltages of memory cells is set as shown in, for example, FIG. 20 (which detail will be described later).

In that case, even page data is read by two read operations ("READ01" and "READ00") and odd page data is read by one read operation ("READ00"). That is, a total of three read operations allow reading the four-level data, thereby making it possible to shorten read time (or accelerate data read).

The fourth feature of the present invention lies in the program operation (particularly, verification operation). Namely, according to the present invention, the relationship between four-level data and the threshold voltages of memory cells is set as shown in, for example, FIG. 20 (which detail will be described later).

In that case, during the program operation of even page data, "11" and "10" are programmed into memory cells. Then, during the program operation of odd page data, when odd page data is "0", the "11" state is changed to the "01" state and the "10" state is changed to the "00" state. Here, the change amount of the threshold voltages in case of changing the "11" state to the "01" state is larger than the change amount of threshold voltages in case of changing the "10" state to the "00" state.

It is quite natural, therefore, that the "00"-programming is completed earlier than the "01"-programming. Thus, after completing the "00"-programming, "00" verify-read may be omitted and only "01" verify-read may be carried out. By doing so, it is possible to shorten program time (accelerate programming) for four-level data programming.

The fifth feature of the present invention lies in the fact that refresh operation is carried out to the DRAM cell (capacitor) provided instead of a latch circuit in the data circuit 2 during, for example, the program operation. Namely, according to the present invention, as shown in the first feature stated above, at least one of a plurality of storage circuits used to temporarily store multi-level data (n-level data) is changed to a DRAM cell (capacitor).

In this case, the area of the data circuit can be advantageously reduced. However, the charges of the capacitor gradually decrease due to leakage thereof. If the change of data due to leakage causes a disadvantage, refresh operation is required. In other words, during the program operation, a refresh sequence for the DRAM cell in the data circuit 2 needs to be added to an ordinary program sequence.

The sixth feature of the present invention lies in the fact that a write cache is provided in the data circuit. In this case, if a program operation is executed over a plurality of pages, for example, it is possible to execute the program operation (the supply of a program pulse) and to input program data in parallel. This can dispense with data load time for loading data on page 2 and the following pages, thereby making it possible to accelerate the program operation.

The seventh feature of the present invention lies in the fact that refresh operation is carried out to a DRAM cell if the write cache provided in the data circuit consists of the DRAM cell (capacitor) and the change of data due to leakage causes a disadvantage.

The four-level NAND cell type EEPROM according to the present invention as well as the first to second features stated above will be described hereinafter in detail.

[Data Circuit] . . . First Feature

Figure 9:
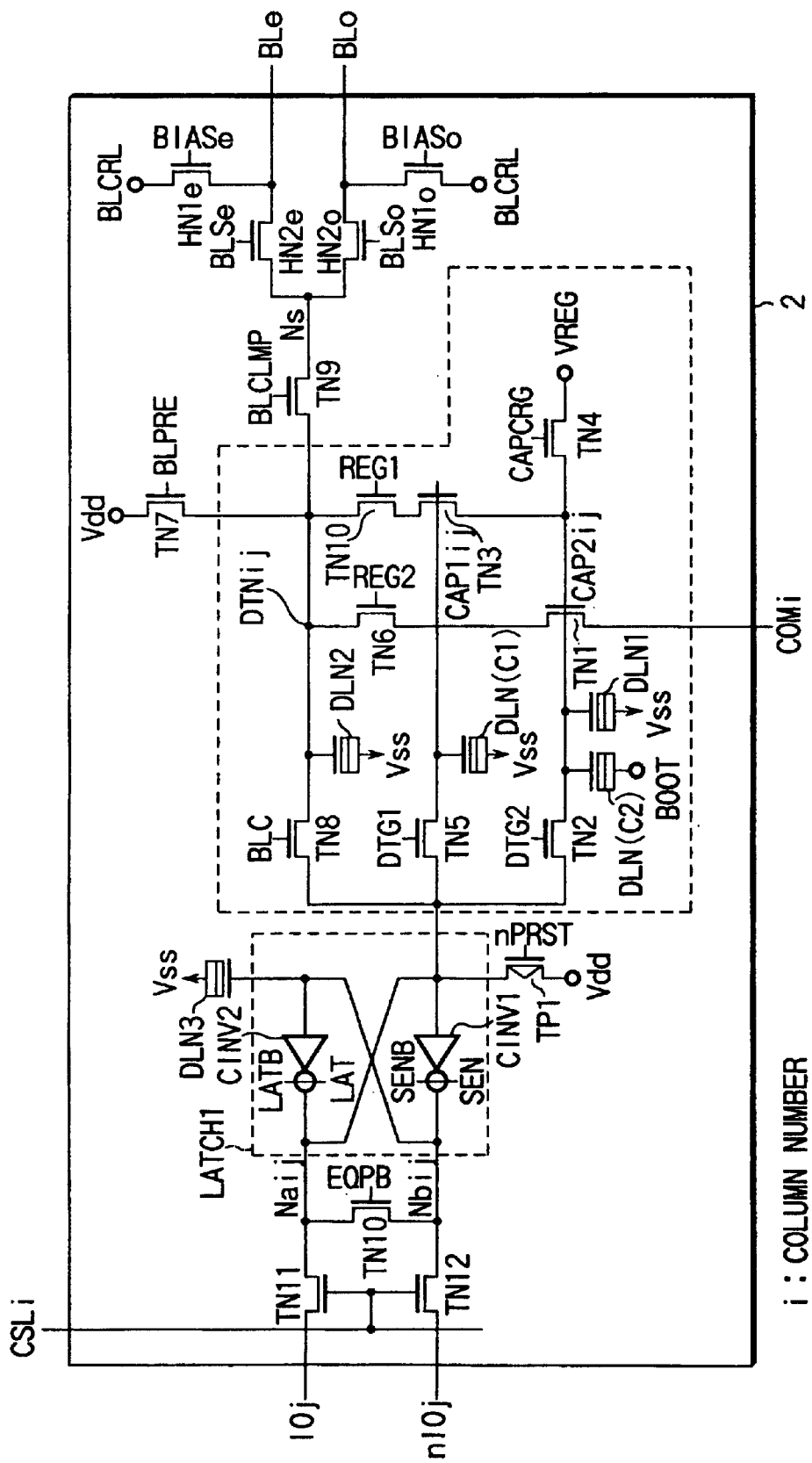
FIG. 9 shows a data circuit in the memory shown in FIG. 8.
Figure 10:
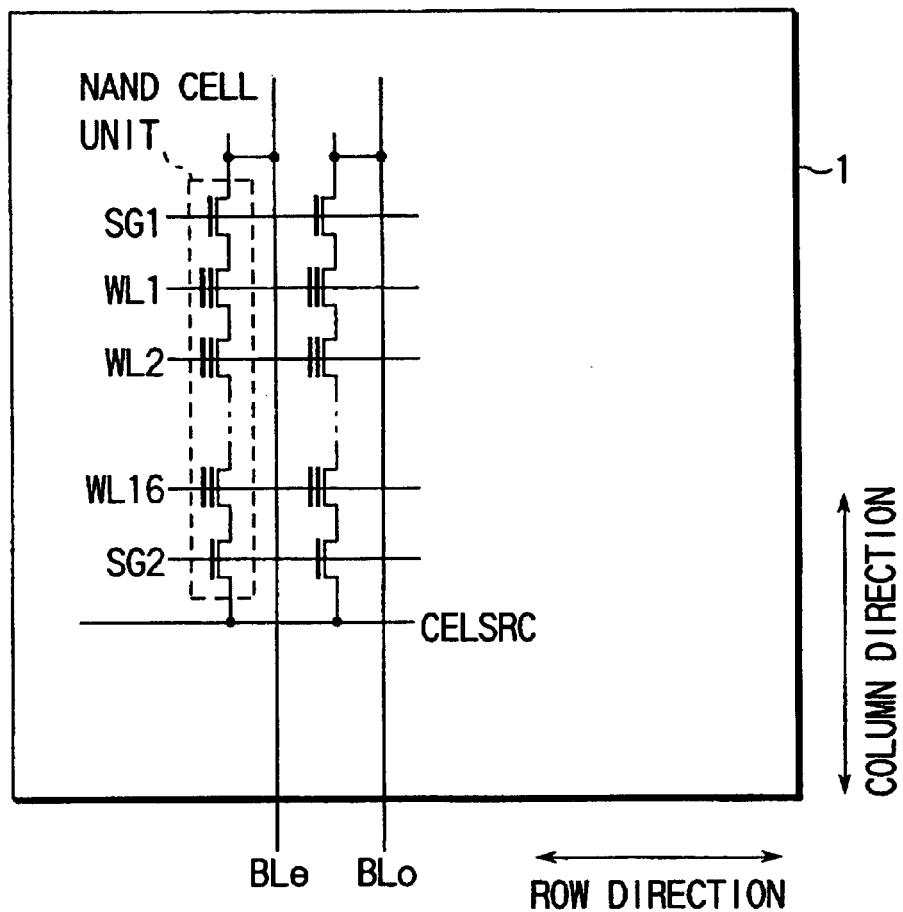
FIG. 10 shows a memory cell array in the memory shown in FIG. 8.

FIG. 9 shows one example of the data circuit 2 shown in FIG. 8. FIG. 10 shows part of the memory cell array 1 shown in FIG. 9.

This example shows the data circuit for one column. Actually, one data circuit is provided, for example, for each of a plurality of columns of the memory cell array 1. That is, the data circuit 2 shown in FIG. 8 consists of a plurality of data circuits corresponding to the plural columns of the memory cell array 1.

Further, in this embodiment, two bit lines BLe and BLo are arranged in one column and one data circuit is connected to these two bit lines BLe and BLo. The reasons the two bit lines BLe and BLo are connected to one data circuit are to attain the following objects: (1) to prevent the generation of noise due to the capacitive coupling between adjacent bit lines during the read operation (to adopt a shield bit line read method); and (2) to intend to reduce the number of data circuits and to thereby decrease the chip area.

Additionally, in this embodiment, it is assumed that four-level data (two-bit data) are stored in one memory cell. Due to this, two storage circuits are provided in one data circuit so as to temporarily store the four-level data during the program/read operations.

Reference symbol LATCH1 denotes one of the two storage circuits, i.e., a latch circuit. The latch circuit LATCH1 consists of a flip-flop circuit (SRAM cell) consisting of clocked inverters CINV1 and CINV2. The latch circuit LATCH1 is controlled by control signals SEN, SENB, LAT and LATB.

It is noted that signal "*B" indicates the inversion signal of a signal "*". That is, the level of the signal "*B" and that of the signal "*" are opposite in phase (when one level is "H", the other is "L"). This definition applies to the following description.

Reference symbol DLN(C1) denotes a capacitor which is the other storage circuit of the two storage circuits. This capacitor CLN(C1) consists of a low voltage depletion N channel MOS transistor (MOS capacitor) applied with a voltage not higher than the power supply voltage Vcc. In this embodiment, an N channel MOS transistor TN5 functions as a gate and data is latched by a node CAP1ij. That is, the latch circuit consists of a DRAM cell consisting of the capacitor DLN(C1) and the MOS transistor TN5.

In FIG. 9, an MOS transistor to which symbol "HN* *" (* is number, symbol or the like) is added is a high voltage enhancement N channel MOS transistors having a threshold voltage of, for embodiment, about 0.6V. A higher voltage than the power supply voltage Vcc is applied to the MOS transistor. This MOS transistor is turned off when gate potential is 0V.

Also, an MOS transistor to which symbol "DLN**" is added is a low voltage depletion N channel MOS transistor having a threshold voltage of, for example, about −1V and applied with a voltage not higher than the power supply voltage Vcc. In this embodiment, this transistor is used as an MOS capacitor.

Further, an MOS transistor to which symbol "TN* *" is added is a low voltage enhancement N channel MOS transistor having a threshold voltage of, for example, about 0.6V and applied with a voltage not higher than the power supply voltage Vcc. This transistor is turned off when gate potential is 0V.

In case of the MOS transistors HN1e, HN1o, HN2e and HN2o, one of the two bit lines BLe and BLo is used as a bit line to which data is read and the other is used as a shield bit line.

That is, the potential of BLCRL is set at the ground potential Vss. Further, when the level of BIASo is "H" and that of BIASe is "L", data is read to the bit line BLe and the bit line BLo becomes a shield bit line to prevent noise generated when reading the data to the bit line BLe. On the other hand, when the level of BIASe is "H" and that of BIASo is "L", data is read to the bit line BLo and the bit line BLe becomes a shield bit line to prevent noise generated when reading the data to the bit line BLo.

An MOS transistor TN7 is a bit line precharge MOS transistor to preset one bit line, to which data is read, of the two bit lines BLe and BLo at, for example, the power supply potential Vcc. The MOS transistor TN7 is controlled by a control signal BLPRE.

An MOS transistor TN9 is a clamping MOS transistor for controlling electrical connection/disconnection between the bit lines BLe and BLo and the data circuit (important parts thereof). The MOS transistor TN9 functions to precharge the bit lines BLe and BLo during, for example, the read operation and then keep the bit lines BLe and BLo in a floating state until the data read to the bit line BLe or BLo is sensed. The MOS transistor TN9 is controlled by a control signal BLCLMP.

The MOS transistors TN1, ..., TN6, TN8 and TN10 are provided to control odd/even page data during the program/read operations (or verification operation), and to detect whether or not the program/erase operations have been successfully completed for all the selected memory cells after verify-read (Program/Erase Completion detection) during the program/erase operations.

It is noted that an output signal COMi is used during the Program/Erase completion detection.

An MOS transistor TP1 is a preset transistor for presetting the potential of a sense node DTNij at Vdd. The MOS transistor TP1 is controlled by a control signal nPRST.

The MOS transistor TN10 is an equalizer circuit equalizing the potentials of the two output nodes Naij and Nbij of the latch circuit LATCH1. The MOS transistor TN10 is controlled by a control signal EQPB.

MOS transistors TN11 and TN12 function as column switches for determining electrical connection/disconnection between the nodes Naij, Nbij and input/output lines IOj and nIOj, respectively. When the level of a column select signal CSLi is "H", the MOS transistors TN11 and TN12 are turned on and the output nodes Naij and Nbij of the latch circuit are electrically connected to the input/output lines IOj and nIOj, respectively.

Figure 11:
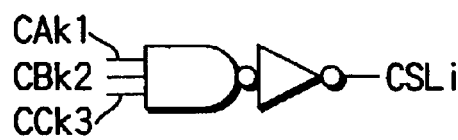
FIG. 11 shows a part of a column decoder in the memory shown in FIG. 8.

The column select signal CSLi is outputted from the column decoder 4 shown in FIG. 8. A column decoder is constituted by an NAND circuit as shown in FIG. 11. That is to say, for example, VAK1, CBK2, and CCH3 are all "H", the column select signal CSLi becomes "L".

In FIG. 9, reference symbol Vdd (e.g., about 2.3V) denotes a lower internal power supply potential than an external power supply potential Vcc. The internal power supply potential Vdd is generated from the external power supply potential Vcc. Alternatively, the external power supply potential Vcc instead of the internal power supply potential Vdd may be applied to the data circuit.

[Batch Detection Circuit]

Figure 12:
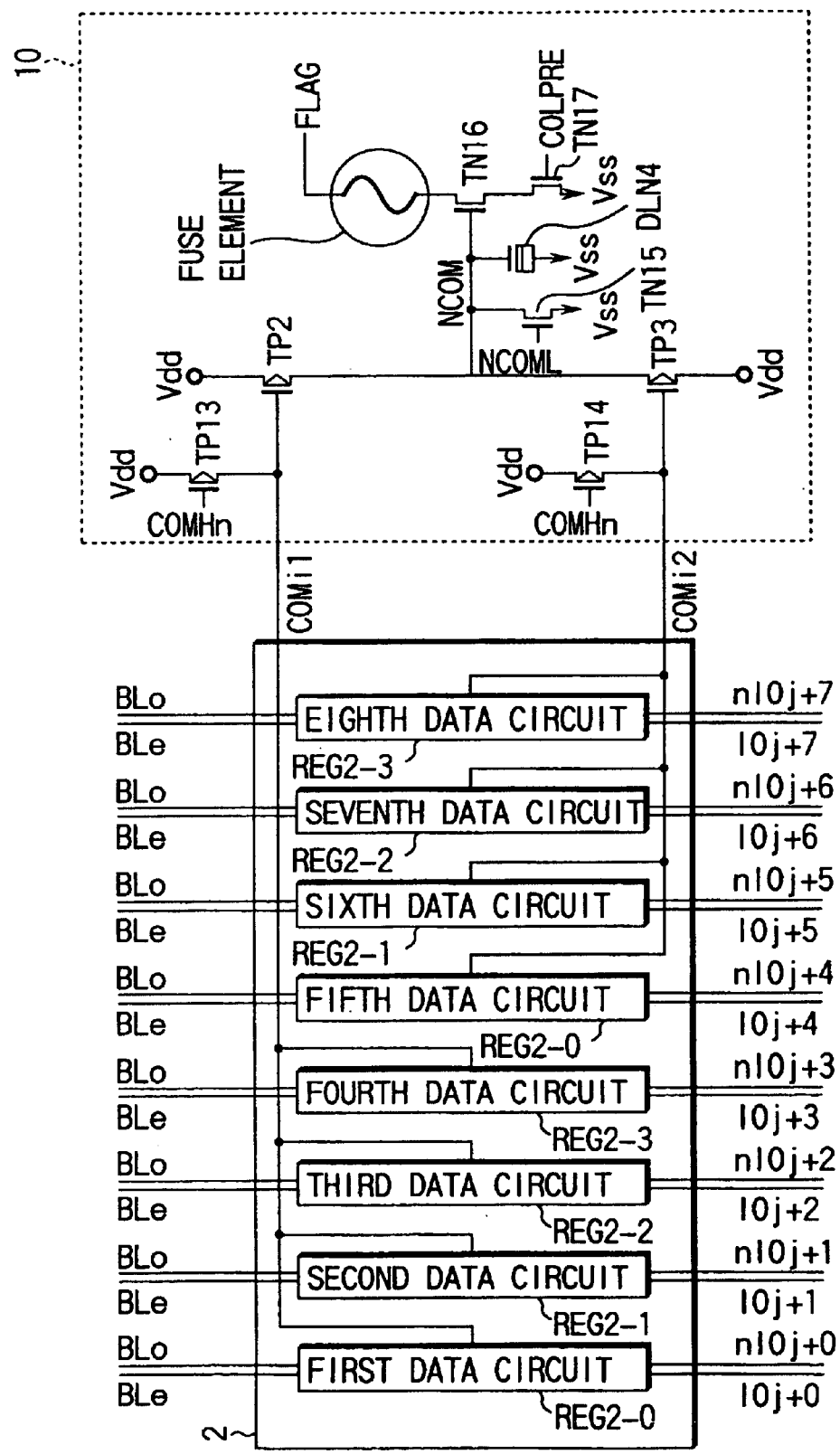
FIG. 12 shows a batch detection circuit in the memory shown in FIG. 8.

FIG. 12 shows important parts of the batch detection circuit 10 shown in FIG. 8.

The batch detection circuit 10 functions to detect whether or not program/erase operations have been successfully completed for all selected memory cells after verify-read (Program/Erase completion detection).

Each data circuit has a constitution as shown in FIG. 9. REG2-k (k=0, 1, 2, 3) is REG2 (see FIG. 9) in the (k+1)-th and (k+5)-th data circuits.

Output nodes COMi of the first to fourth data circuits are mutually connected and the connection node COMi1 thereof is also connected to the gate of a P channel MOS transistor TP2. Likewise, output nodes COMi of the fifth to eighth data circuits are mutually connected and the connection node CoMi2 thereof is also connected to the gate of a P channel MOS transistor TP3.

P channel MOS transistors TP13 and TP14 function to set the potentials of nodes COMi1 and COMi2 at the internal power supply potential Vdd and then turn the nodes COMi1 and CoMi2 into a floating state during the Program/Erase completion detection. The MOS transistors TN13 and TN14 are controlled by a control signal COMHn.

An N channel MOS transistor TN15 functions to set the potential of a node NCOM at the ground potential Vss and then turn the node NCOM into a floating state. The MOS transistor TN15 is controlled by a control signal NCOML.

During the Program/Erase completion detection, the potential level of the output signal COMi (see FIG. 9) from the data circuit corresponding to the memory cell for which the program/erase operations have not been sufficiently completed, decreases from "H" to "L". Accordingly, the level of the node NCOM is changed from "L" into "H" and the level of a node FLAG becomes "L".

On the other hand, if the program/erase operations have been sufficiently completed for all the memory cells, the potential levels of output signals COMi (see FIG. 9) from all data circuits remain "H". Accordingly, the level of the node NCOM remains "L" and the level of the node FLAG becomes "H".

As can be seen from the above, by detecting the potential level of the node FLAG, it is possible to detect whether or not the program/erase operations have been successfully completed for all the selected memory cells. The operation of the Program/Erase completion detection will be described later in detail.

In this embodiment, the eight data circuits are grouped into one unit and the voltage level of the node FLAG is detected for eight columns of memory cells corresponding to these eight data circuits, thereby detecting whether or not the program/erase operations have been sufficiently completed.

The reason for grouping the eight data circuits into one unit is to replace memory cells of a redundancy circuit in units of eight columns corresponding to these eight data circuits. That is, when a fuse element (enclosed by a broken line) is cut off, the memory cells connected to these eight data circuits always turn into an unselected state and auxiliary memory cells in a redundancy region are selected.

Accordingly, if the memory cells of the redundancy circuit are replaced in units of n columns corresponding to n data circuits (where n is a natural number), the n data circuits are grouped into one unit.

Figure 13:
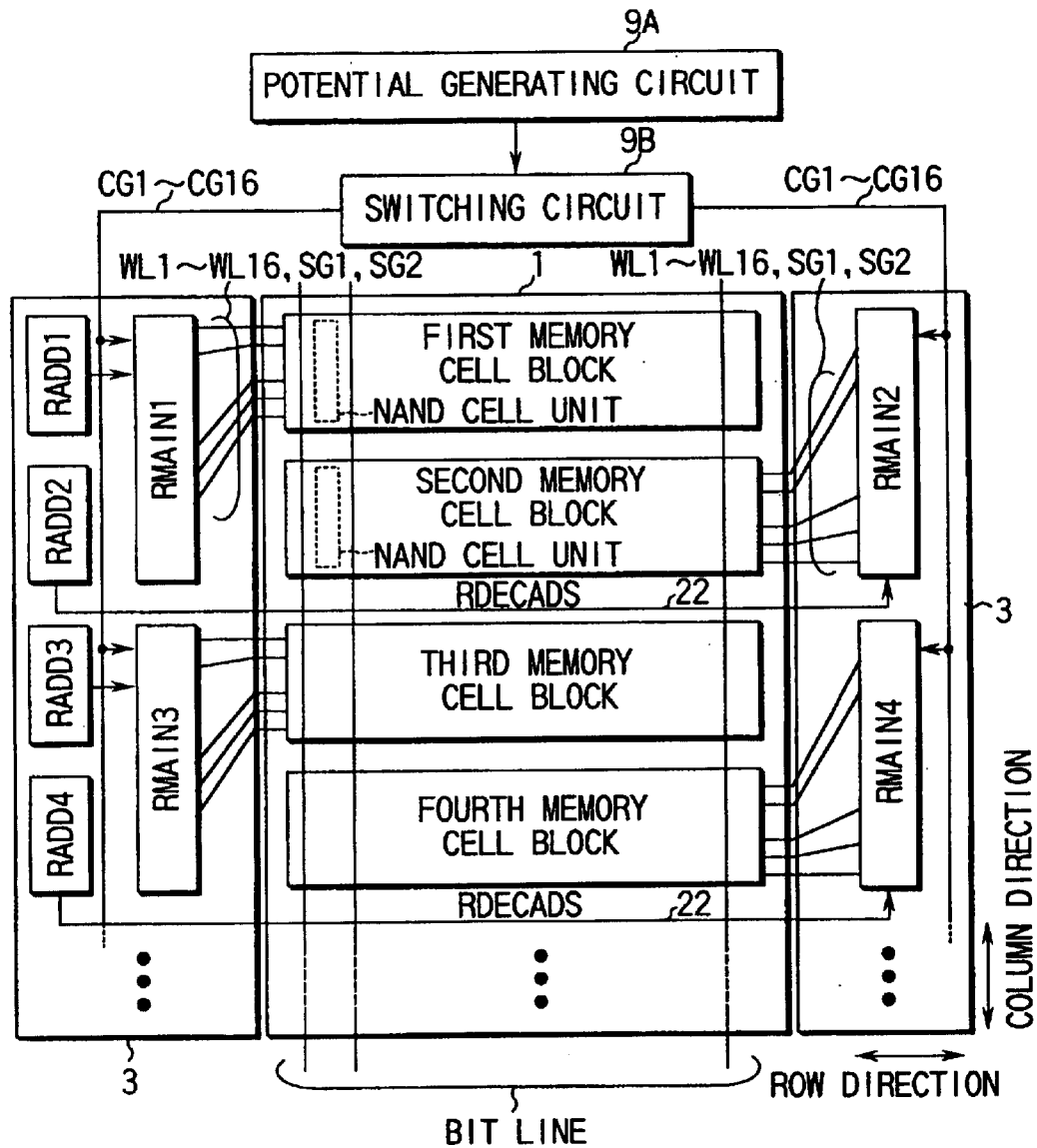
FIG. 13 shows a word line control circuit in the memory shown in FIG. 8.

It is noted that the node FLAG is a common node to all columns. If the number of columns is, for example, 2048 and eight data circuits (columns) are set as a redundancy replacement unit, then 256 circuits shown in FIG. 12 exist on a chip. These 256 circuits are connected to the common node FLAG. [Word Line Control Circuit] . . . Second Feature FIG. 13 shows a concrete example of the word line control circuit shown in FIG. 8.

Figure 61:
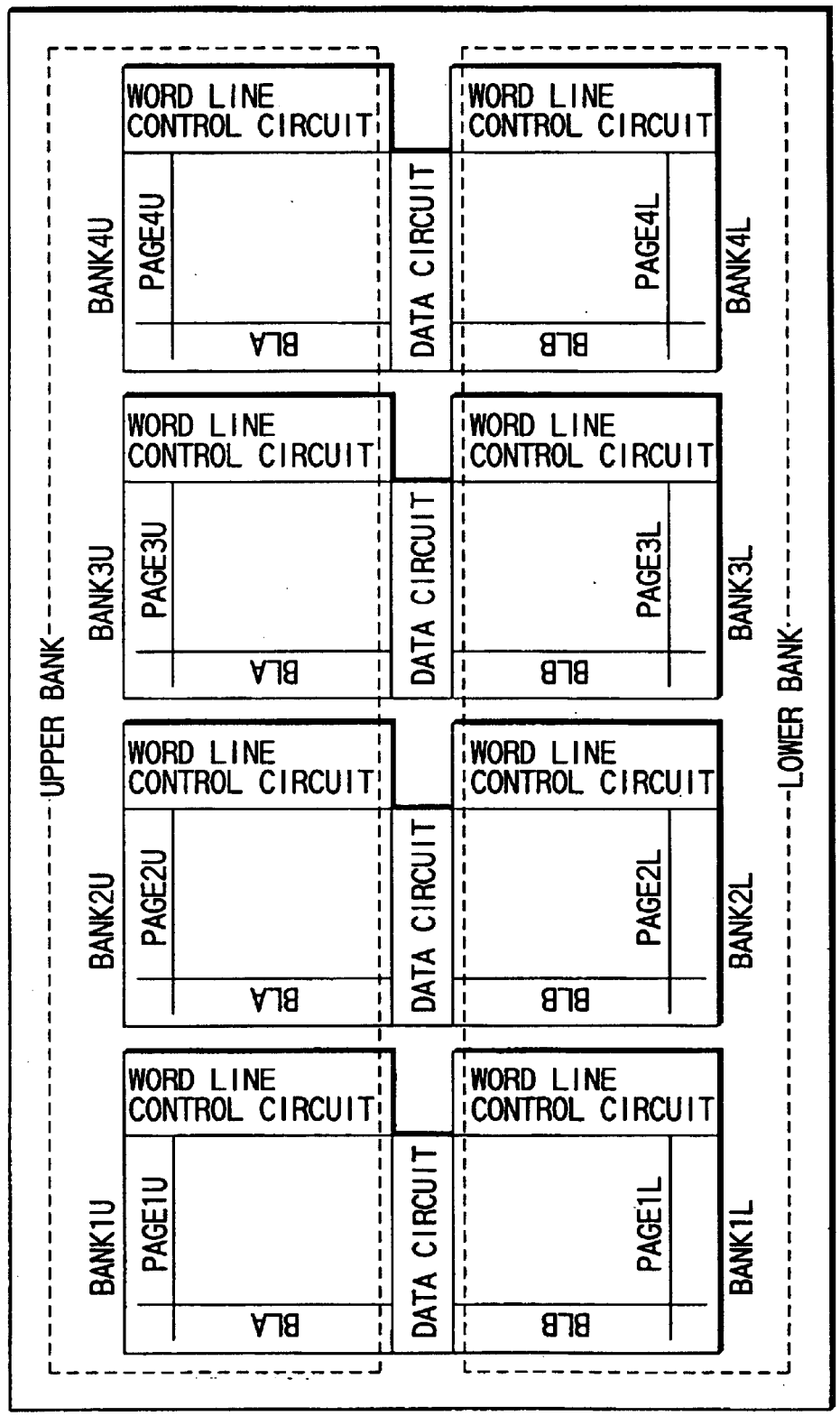
FIG. 61 shows the chip layout of a two-level NAND cell type EEPROM according to the present invention.
Figure 62:
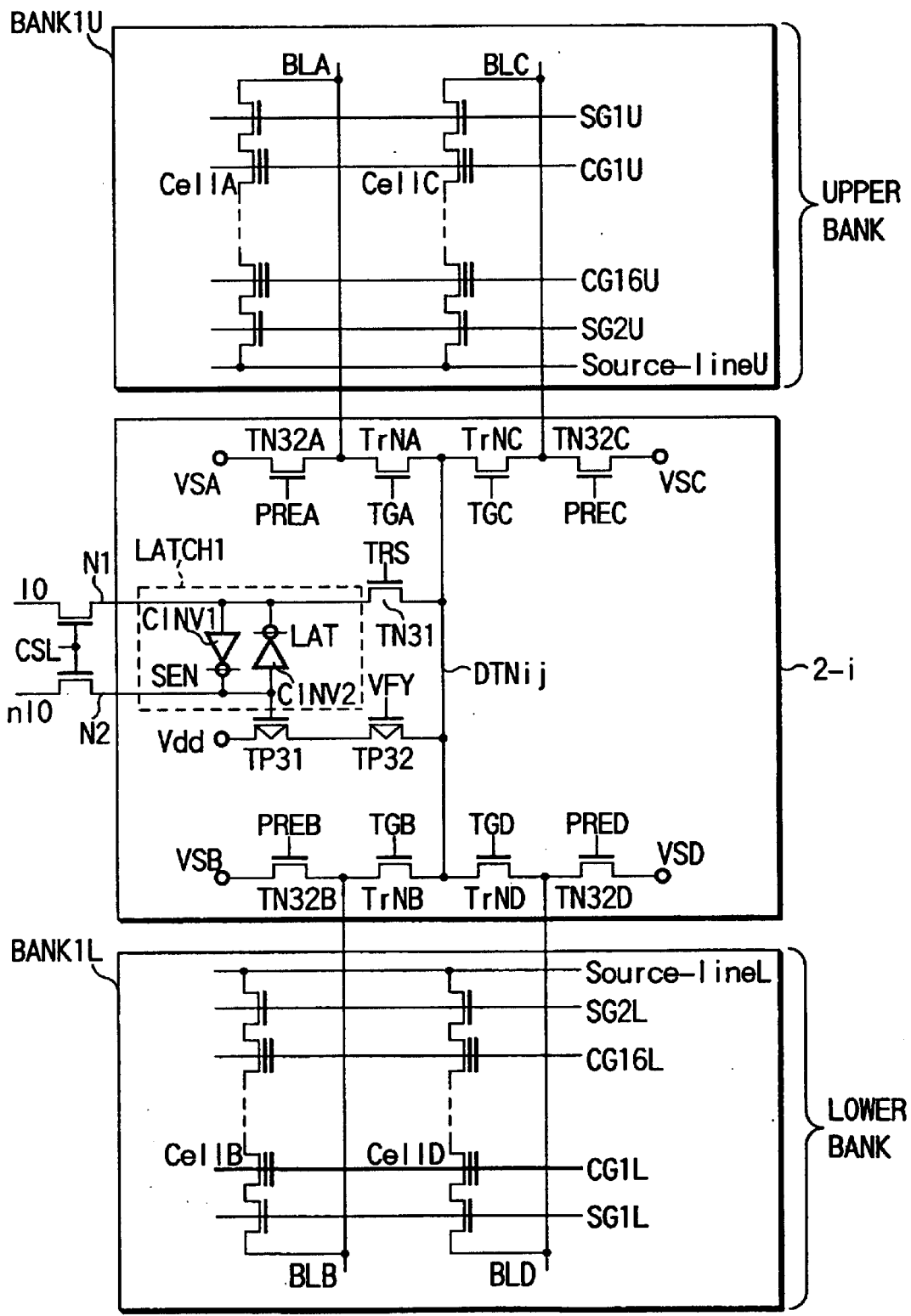
FIG. 62 shows one example of a data circuit in the memory shown in FIG. 61.
Figure 63:
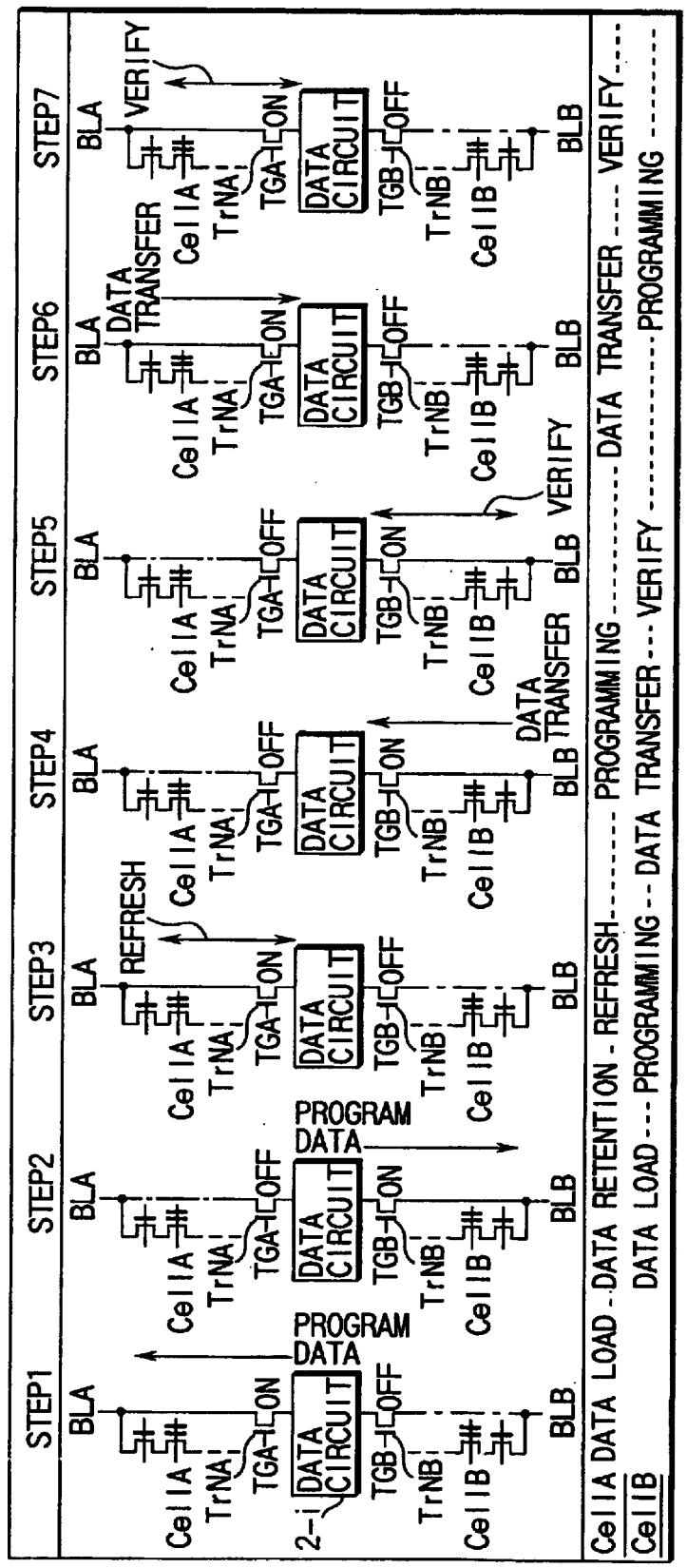
FIG. 63 shows the detail of the operation of the present invention relating to Data Load.

The memory cell array 1 consists of a plurality of memory cell blocks arranged in column direction. Each of the memory cell blocks has a plurality of NAND cell units arranged in row direction. The concrete example of the memory cell array and the NAND cell units is shown in FIGS. 61 to 63.

In this embodiment, one row address decoder and one word line driver are provided per memory cell block.

For example, word lines WL1, . . . WL16 and select gate lines SG1 and SG2 in the first memory cell block are connected to the first word line driver RMAIN1. The first word line driver RMAIN1 receives the output signal (decoding result) of the first row address decoder RADD1 for determining whether to select/unselect the first memory cell block.

In this way, the word lines WL1, . . . WL16 and the select gate lines SG1 and SG2 in the i-th memory cell block (where i=1, 2, . . . ) are connected to the i-th word line driver RMAINi. The word line driver RMAINi receives the output signal (decoding result) of the i-th row address decoder RADDi for-determining whether to-select/unselect-the i-th memory cell block.

In this embodiment, the word line drivers are arranged at both sides of the memory cell array 1 (two end portions thereof in row direction).

To be specific, the word line drivers RMAIN1, RMAIN3, corresponding to the odd-numbered memory cell array blocks are arranged at one side (left side) of the two end portions of the memory cell array 1 in row direction, whereas the word line drivers RMAIN2, RMAIN4, corresponding to the even-numbered memory cell array blocks are arranged at the other side (right side) of the two end portions of the memory cell array 1 in row direction.

Such arrangement of the word line drivers RMAINi on both ends of the memory cell array 1 facilitates designing the word line drivers RMAINi (or increases the degree of freedom in layout). That is to say, in this embodiment, one word line driver can secure a layout space for two memory cell blocks in column direction.

Furthermore, the word lines WL1, . . . WL16 and the select gate lines SG1 and SG2 in one memory cell block are always driven from one side (or the other side) of the memory cell array 1 by the word line driver corresponding to this memory cell block. This can, therefore, prevent drive signal supply timing for the memory cells and the select transistors in a predetermined NAND cell unit in the selected block from shifting.

On the other hand, the row address decoders RADDi (where i=1, 2, . . . ) are arranged only at one side of the two end portions of the memory cell array 1 in row direction. This means that it suffices to arrange signal lines (address buses) for applying row address signals to the row address decoders RADDi only at one side of the memory cell array 1. The area of the address buses can be, therefore, reduced, resulting in a contribution to the reduction of the chip area.

Namely, if providing that the row address decoders RADDi are arranged on the two end portions of the memory cell array 1 in row direction as in the case of the word line drivers RAMINi, it is necessary to arrange address buses on the two end portions of the memory cell array 1 in row direction. This is not advantageous for the reduction of the area of the memory cell array 1.

In this embodiment, as a result of arranging the row address decoders RADDi only on one of the two end portions (at one side of) the memory cell array 1 in row direction, signal lines 22 are arranged on the memory cell array 1. The signal lines 22 are used to apply the output signals (decoding results) of the row address decoders RADD2, RADD4, corresponding to the even-numbered memory cell array blocks to the word line drivers RMAIN2, RMAIN4, . . . , respectively.

During normal operation, a signal RDECADS is transmitted through this signal line 22. Accordingly, it is necessary to prevent the potential of the signal lines 22 from adversely affecting the memory cell operation. The present invention provides novel row address decoders RADDi and word line drivers RMAINi which can prevent the potential of the signal lines 22 from adversely affecting the memory cell operation, which will be described later in detail.

The potential generating circuit 9A has a booster (charge-pumping circuit) and generates a program potential Vpp and a transfer potential Vpass used in the program operation. The potential generating circuit 9A is connected to a switching circuit 9B. The switching circuit 9B functions to allot potentials including the program potential Vpp, the transfer potential Vpass, the internal power supply potential Vdd and the ground potential Vss to signal lines CG1, . . . CG16 corresponding to the word lines WL1, . . . WL16.

The signal lines CG1, . . . CG16 are connected to the word line drivers RMAINi. Namely, the signal lines CG1, . . . CG16 are connected to the word lines WL1, . . . WL16, respectively by way of potential transfer transistors HNt1, HNt2, . . . HNt16 (to be described later) in the word line drivers RMAINi.

[Device Structure] . . . Regarding Signal Lines 22 Shown in FIG. 13

Figure 14:
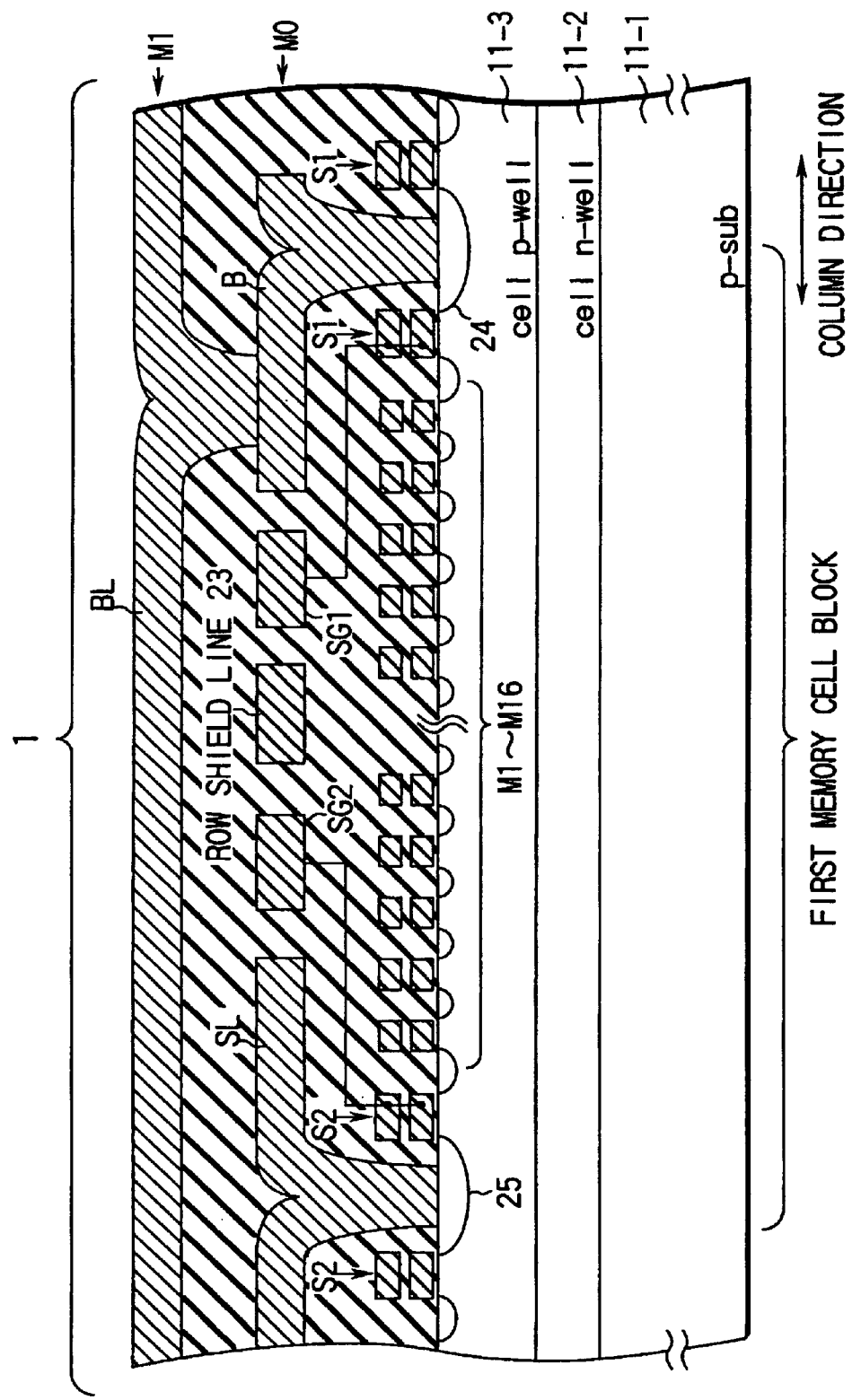
FIG. 14 shows a device structure in the first memory cell block shown in FIG. 13.

FIG. 14 is a cross-sectional view of an odd-numbered memory cell block of FIG. 13 in column direction.

In case of odd-numbered memory cell blocks, the row address decoders RADD1, RADD3, and the word line drivers RMAIN1, RMAIN3, . . . are arranged at one side of the memory cell array 1. Due to this, signal lines connecting the row address decoders RADD1, RADD3, with the word line drivers RAMIN1, RAMIN3, are not arranged on the memory cell array 1.

The concrete structure of the memory cell block will be described hereinafter.

A double-well region consisting of an n well region 11-2 and a p well region 11-3, is formed in a p silicon substrate 11-1. For example, 16 memory cells M1, . . . M16 connected in series are formed on the p well region 11-3. Each memory cell consists of an N channel MOS transistor and has a stack gate structure consisting of a floating gate electrode and a control gate electrode.

Select transistors S1 and S2 are connected to the two end portions of the serially-connected memory cells M1, . . . M16, respectively. Each of the select transistors S1 and S2 consists of an N channel MOS transistor. The diffused layer (drain) 24 of the bit line-side select transistor S1 is connected to a metal wiring B in the first wiring layer M0. The diffused layer (source) 25 of the source line-side select transistor S2 is connected to a source line SL in the first wiring layer M0.

The gate electrode (select gate line (polysilicon)) of the select transistor S1 is connected to the metal wiring SG1 in the first wiring layer M0 to decrease the wiring resistance of the select gate line. Contact portions between the select gate line (polysilicon) and the metal wiring SG1 are provided at positions, for example, at which the select gate line intersect 528 bit lines, respectively.

Likewise, the gate electrode (select gate line (polysilicon)) of the select transistor S2 is connected to the a metal wiring SG2 in the first wiring layer M0. Contact portions between the select gate line (polysilicon) and the metal wiring SG2 are provided at positions, for example, at which the select gate line intersect 528 bit lines, respectively.

The bit lines BL is arranged in the second wiring layer Ml provided on the first wiring layer M0. The bit line BL extends in column direction and is connected to the diffused layer (drain) 24 of the select transistor S1 through the metal wiring B in the first wiring layer M0.

The respective signal lines in the first and second wiring layers M0 and M1 are made of, for example, aluminum, copper or an alloy thereof.

A row shield line 23 is arranged above the memory cells M1, . . . M16 and between the metal wirings SG1 and SG2.

The row shield line 23 is arranged so as to prevent the generation of so-called coupling noise during the program/read operations and to sufficiently increase the potentials of unselected word lines during the erase operation. The potential of the row shield line 23 is normally set at the same as that of the double-well region (cell well) 11-2 and 11-3.

During the program/read operations, the cell well potential is normally set at the ground potential Vss. At this moment, therefore, the potential of the row shield line 23 is fixed to the ground potential Vss, as well. In that case, since the coupling capacity between the bit line BL and the word line WL is almost eliminated, it is possible to prevent coupling noise from occurring to the data transmitted through the bit line.

Further, during the program/read operations, the potentials of the select gate lines (metal wirings) SG1 and SG2 in unselected blocks are set at the ground potential Vss. Due to this, the select gate lines (metal wirings) SG1 and SG2 also function as shield lines during the program/read operations.

In this way, by setting the potentials of the row shield line 23 and the select gate lines (metal wirings) SG1 and SG2 in the unselected blocks at the ground potential Vss, respectively, it is possible to reduce the capacitive coupling between the bit line BL and the word line WL and to prevent coupling noise from being applied to the data transmitted through the bit line.

Meanwhile, during the erase operation, the potential of the row shield line 23 is set at an erase potential Vera (e.g., about 20V). This is because the potentials of the word lines WL in unselected blocks are to be sufficiently increased during the erase operation.

Namely, during the erase operation, the word lines (control gate lines) WL of unselected blocks are in a floating state. When the erase potential (e.g., about 20V) is applied to the double-well region (cell well) 11-2, 11-3, the potentials of the word lines WL in the unselected blocks are increased by capacitive coupling.

Therefore, if the potential of the row shield line 23 is set at the erase potential Vera during the erase operation, the potential of the word line WL is not influenced by the potential of the row shield line 23 when the potential of the cell wells 11-2 and 11-3 rises from the ground potential Vss to the erase potential Vera. Thus, it is possible to sufficiently increase the potentials of the word lines WL in the unselected blocks to the same level as that of the erase potential Vera.

Further, the potentials of the word lines WL in the unselected blocks rise sufficiently to the same level as that of the erase potential Vera. Due to this, a high electric field is not applied to the tunnel oxide film between the floating gate electrode and the cell wells and erroneous data erase can be, therefore, prevented.

At this moment, providing that the potential of the row shield line 23 is the ground potential Vss or the power supply potential Vcc, the potential of the word line WL is influenced by the potential of the row shield line 23 (Vss or Vcc) and does not rise to the same level as that of the erase potential Vera. Accordingly, a high electric field may possibly be applied to the tunnel oxide films of the unselected memory cells to thereby cause erroneous data erase.

Figure 15:
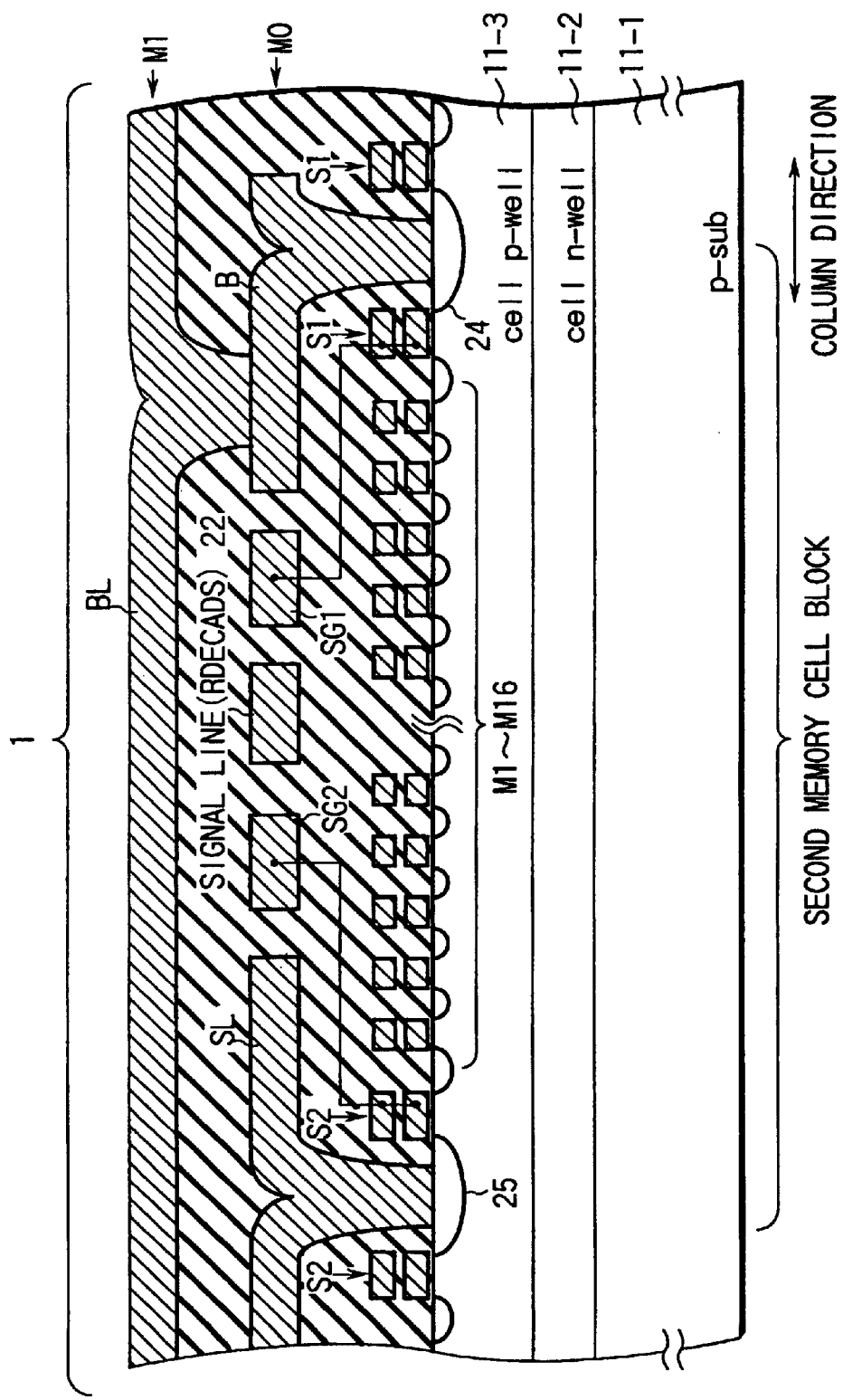
FIG. 15 shows a device structure in the second memory cell block shown in FIG. 13.

FIG. 15 is a cross-sectional view of an even-numbered memory cell block of FIG. 13 in column direction.

In case of even-numbered memory cell blocks, the row address decoders RADD2, RADD4, . . . are arranged on one end of the memory cell array 1 in row direction. The word line drivers RMAIN2, RMAIN4, are arranged on the other end of the memory cell array 1 in row direction. Accordingly, signal lines 22 connecting the row address decoders RADD2, RADD4, . . . with the word line drivers RMAIN2, RMAIN4, . . . respectively, are arranged on the memory cell array 1.

The concrete structure of the memory cell block in FIG. 15 will be described hereinafter.

A double-well region consisting of an n well region 11-2 and a p well region 11-3, is formed in a p silicon substrate 11-1. For example, 16 memory cells M1, . . . M16 connected in series are formed on the p well region 11-3. Each memory cell consists of an N channel MOS transistor and has a stack gate structure consisting of a floating gate electrode and a control gate electrode.

Select transistors S1 and S2 are connected to the two end portions of the serially connected memory cells M1, . . . M16, respectively. Each of the select transistors S1 and S2 consists of an N channel MOS transistor. For example, the diffused layer (drain) 24 of the bit line-side select transistor S1 is connected to a metal wiring B in the first wiring layer M0. The diffused layer (source) 25 of the source line-side select transistor S2 is connected to a source line SL in the first wiring layer M0.

The gate electrode (select gate line (polysilicon)) of the select transistor S1 is connected to the metal wiring SG1 in the first wiring layer M0 to decrease the wiring resistance of the select gate line. Contact portions between the select gate line (polysilicon) and the metal wiring SG1 are provided at positions, for example, at which the select gate line intersect 528 bit lines, respectively.

Likewise, the gate electrode (select gate line (polysilicon)) of the select transistor S2 is connected to the metal wiring SG2 in the first wiring layer M0 to decrease the wiring resistance of the select gate line. Contact portions between the select gate line (polysilicon) and the metal wiring SG2 are provided at positions, for example, at which the select gate line intersect the 528 bit lines, respectively.

The bit lines BL is arranged in the second wiring layer M1 provided on the first wiring layer M0. The bit line BL extends in column direction and is connected to the diffused layer (drain) 24 of the select transistor S1 through the metal wiring B in the first wiring layer M0.

The respective signal lines in the first and second wiring layers M0 and M1 are made of, for example, aluminum, copper or an alloy thereof.

A signal line 22 is arranged above the memory cells M1, . . . M16 and between the metal wirings SG1 and SG2.

The device of the even-numbered memory cell block is characterized in that the signal line 22 is provided instead of the row shield line 23 (see FIG. 14) of the odd-numbered memory cell block.

As described with reference to FIG. 13, the signal line 22 functions to transmit the output signal RDECAD of the row address decoder to the word line driver. Accordingly, the potential of the signal line 22 cannot be set at the same as that of the row shield line 23.

The present invention proposes a word line control circuit capable of setting the potential of the signal line 22 at an appropriate value according to an operation mode, preventing so-called coupling noise during the program/read operations and sufficiently increasing the potentials of unselected word lines during the erase operation without hampering the functions of the above-stated signal line 22.

Now, an embodiment of the word line control circuit of the present invention will be described. Then, description will be given to how the potential level of the signal line 22 varies in each operation mode if this circuit is used.

[Example of Word Line Control Circuit]

First, symbols added in the drawings are defined as follows.

An MOS transistor to which symbol "HN* *" (where * is a number, symbol or the like)" is added is a high voltage enhancement N channel transistor having a threshold voltage of, for example, about 0.6V and is applied with a higher voltage than the power supply voltage Vcc. This transistor is turned off when gate potential is 0V.

An MOS transistor to which symbol "1HN**" (where * is a number, symbol or the like)" is added is a high voltage enhancement N channel MOS transistor having a threshold voltage of, for example, about 0.1V and is applied with a higher voltage than the power supply voltage Vcc.

An MOS transistor to which symbol "DHN* *" is added is a high voltage depletion N channel MOS transistor having a threshold voltage of, for example, about −1V. If the potentials of the gate and drain of the transistor are set at the power supply potential Vcc, the potential of the drain Vcc is transferred to the source thereof. In addition, if the potential of the gate is set at 0V while the potentials of the source and drain are Vcc, this transistor is turned off.

An MOS transistor to which symbol "TN* *" is added is a low voltage enhancement N channel MOS transistor having a threshold voltage of, for example, about 0.6V and is applied with a voltage of not higher than the power supply voltage Vcc. An MOS transistor to which symbol "TP* *" is added is a low voltage enhancement P channel MOS transistor having a threshold voltage of, for example, about 0.6V.

Figure 16:
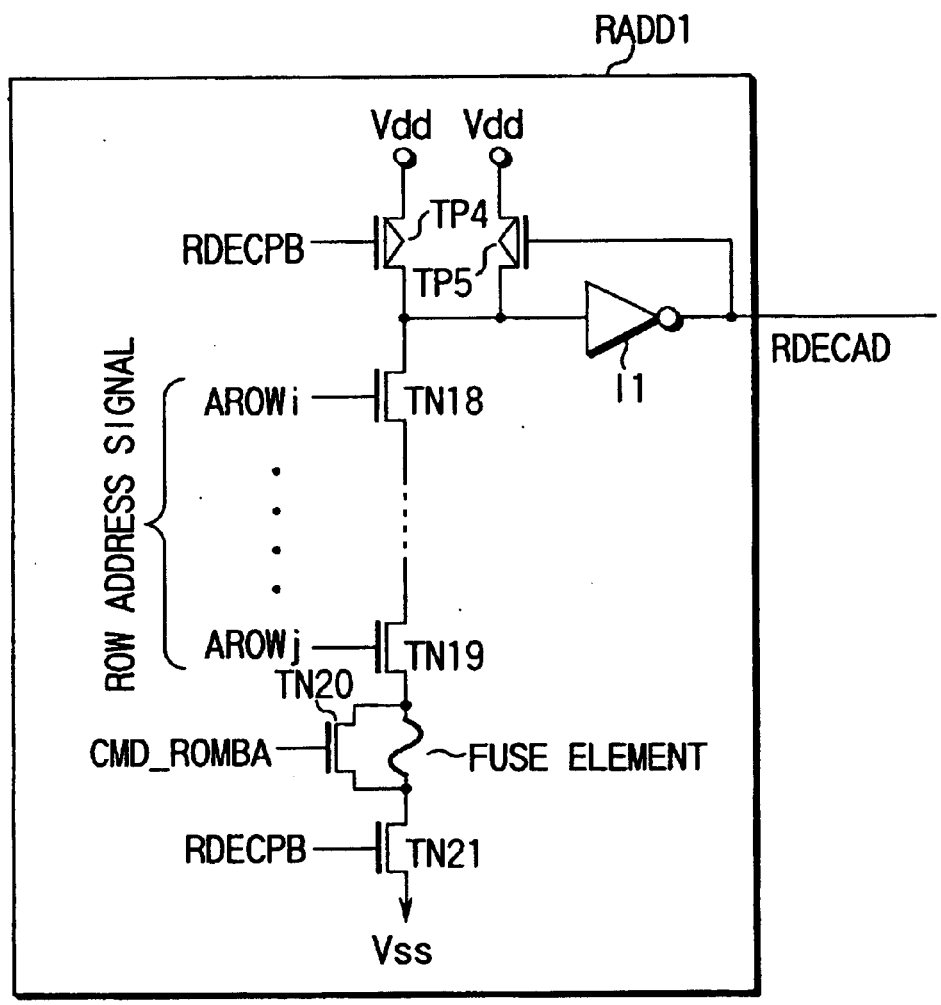
FIG. 16 shows a row address decoder RADD1 shown in FIG.

FIG. 16 shows the important parts of the row address decoder provided to correspond to the odd-numbered memory cell block.

To be exact, this row address decoder RADD1 functions as a block decoder. Namely, when the first memory block is selected, for example, the levels of all row address signals AROWi, . . . AROWj become "H" and the level of an output signal RDECAD becomes "H". The operation of the row address decoder RADD1 will be described later in detail.

Figure 17:
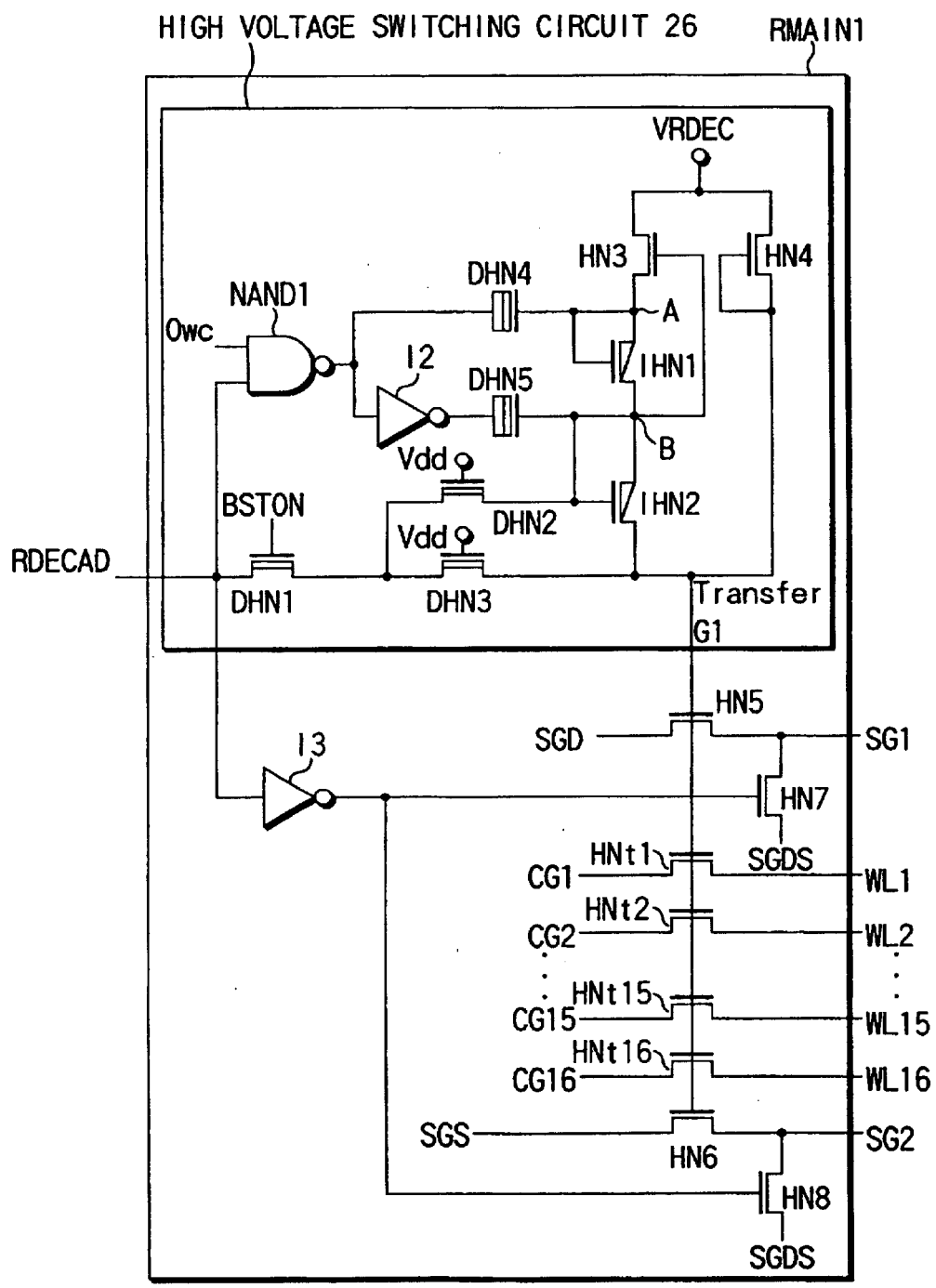
FIG. 17 shows a word line driver RMAIN1 shown in FIG. 13.

FIG. 17 shows the important parts of the word line driver provided to correspond to the odd-numbered memory cell block.

The main constituent elements of the word line driver RMAIN1 are a high voltage switching circuit 26 and transfer MOS transistors HN5, HN6, HNt1, . . . HNt16.

The high voltage switching circuit 26 comprises the first booster unit consisting of an MOS capacitor DHN4 and an MOS transistor 1HN1, and the second booster unit consisting of an MOS capacitor DHN5 and an MOS transistor IHN2.

The gate of the MOS transistor HN3 is connected to a connection node B connecting the MOS transistors IHN1 and IHN2. In this case, the potentials of nodes A, B and transferal gradually increase synchronously with a clock signal Owc while the potential levels of the gate and the source of the MOS are maintained to be opposite in phase. Thus, boosting efficiency improves.

The high voltage switching circuit 26 turns into an operation state when the level of the output signal RDECAD of the row address decoder RADD1 is "H". Namely, when the level of the output signal RDECAD is "H", the output signal of an NAND circuit NAND1 becomes a clock signal opposite in phase to the clock signal Owc. The output signal of the NAND circuit NAND1 is applied to one end of each of the MOS capacitors DHN4 and DHN5.

As a result, a boosting potential is applied to the gates of the transfer MOS transistors HN5, HN6, HNt1, . . . HNt16, respectively and the transfer MOS transistors HN5, HN6, HNt1, . . . HNt16 are turned on.

If the level of the output signal RDECAD of the row address decoder RADD1 is "H", MOS transistors HN7 and HN8 are turned off. At this moment, the potentials of the signal lines SGD and SGS become the internal power supply potential Vdd and applied to the select gate lines SG1 and SG2 through the transfer MOS transistors HN5 and HN6, respectively.

Further, the potentials of the signal lines CG1, CG2, . . . CG16 are set predetermined potentials according to an operation mode by the switching circuit 9B (see FIG. 8). The potentials of the signal lines CG1, CG2, CG16 are applied to the word lines WL1, WL2, . . . WL16 through the transfer MOS transistors HNt1, . . . HNt16, respectively.

Figure 18:
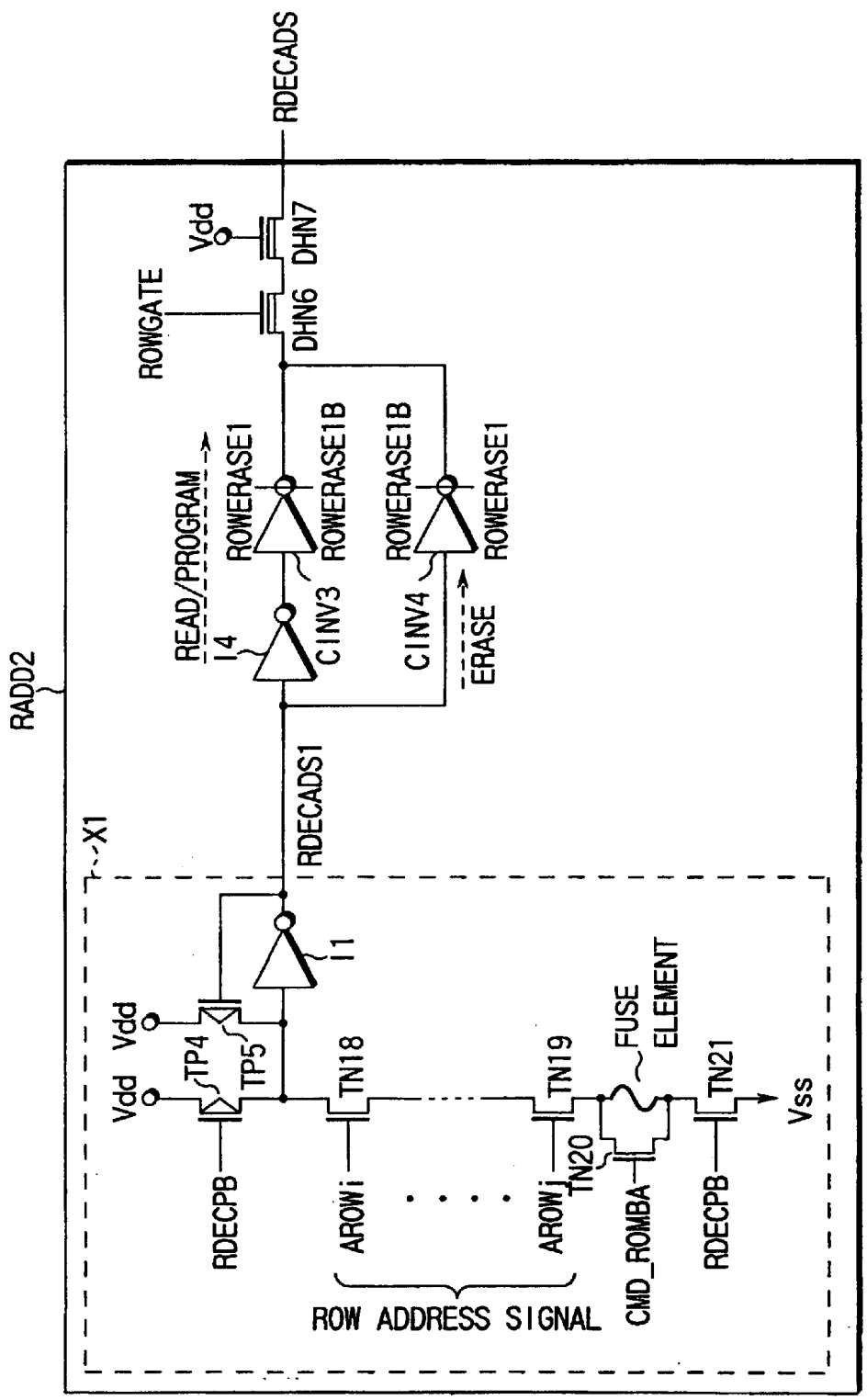
FIG. 18 shows a row address decoder RADD2 shown in FIG. 13.

FIG. 18 shows the important parts of the row address decoder provided to correspond to the even-numbered memory cell block.

The row address decoder RADD2 includes the same circuit as that of the row address decoder RADD1 shown in FIG. 16. Namely, a circuit enclosed by a broken line X1 is the same as the row address decoder RADD1. It is noted that the same constituent elements shown in FIG. 18 as those in FIG. 16 are denoted by the same reference symbols.

The row address decoder RADD2 of the present invention is characterized by newly providing an inverter I4, clocked inverters CINV3 and CINV4 and depletion high voltage N channel MOS transistors DHN6 and DHN7.

The clocked inverter CINV4 functions to turn the potential of the output signal RDECADS of the row address decoder corresponding to the selected memory cell block (the potential of the signal line 22 shown in FIG. 8) into the ground potential Vss during the erase operation (ERASE) and to turn the output signals RDECADS of the row address decoders corresponding to the unselected memory cell block into the internal power supply potential Vdd.

The MOS transistor DHN6 functions to turn the signal line 22 (see FIG. 15) into a floating state together with a transistor DHN9 shown in FIG. 19 to be described later.

During the erase operation (ERASE), the level of signal RDECADS1 becomes "H (Vdd)" in the selected memory block, and becomes "L (Vss)" in the unselected memory cell block.

Providing that, as in the case of the conventional decoder, this signal RDECADS1 is applied to the signal line 22 (see FIG. 15) on the memory cell array, the level of the signal line 22 (see FIG. 15) on the memory cell array becomes "L (Vss)" in the unselected memory cell block.

In that case, if the erase potential Vera is applied to the cell wells by the capacitive coupling between the cell wells and the word line and the potential of the word lines in the unselected memory cell block is to be increased, the potential of the word line does not sufficiently rise due to the influence of the signal line 22 (FIG. 15) having the ground potential Vss.

Since the present invention newly provides a clocked inverter CINV4, the level of the output signal RDECADS becomes "L (Vss)" in the selected memory cell block and becomes "H (Vdd)" in the unselected memory cell block during the erase operation (ERASE).

Figure 19:
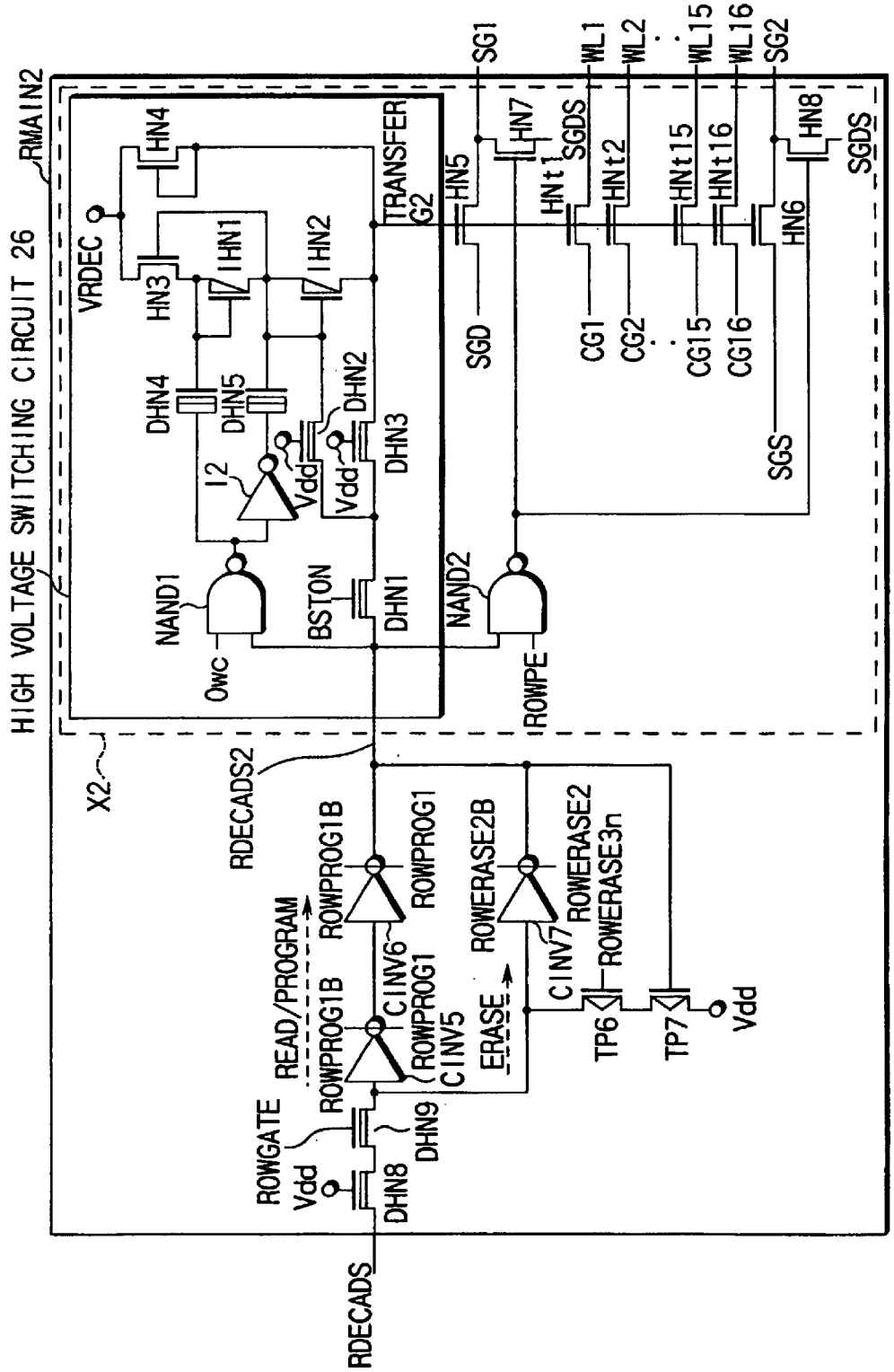
FIG. 19 shows a word line driver RMAIN2 shown in FIG. 13.

That is to say, the level of the signal line 22 (see FIG. 15) on the memory cell array in the unselected memory cell block become "H (Vdd)" and into a floating state by the cutoff of the MOS transistors DHN6 and DHN9 (FIG. 19).

Accordingly, in case of increasing the potential of the word lines in the unselected memory cell blocks by the capacitive coupling between the cell wells and the word line, the potential of the word line sufficiently rises with less influence of the signal line 22 (FIG. 15) having the internal power supply potential Vdd.

FIG. 19 shows the important parts of the word driver provided to correspond to the even-numbered memory cell block.

Among the main constituent elements of the word line driver RMAIN2, the high voltage switching circuit 26 and the transfer MOS transistors HN5, HN6, HNt1, . . . HNt16 are the same as those in the word line driver RMAIN2 shown in FIG. 17. Namely, a circuit enclosed by a broken line X2 is almost the same as the row address decoder RADD1 of FIG. 17. It is noted that the same constituent elements in FIG. 19 as those in FIG. 17 are denoted by the same reference symbols.

The word line driver RMAIN2 of the present invention is characterized by newly providing clocked inverters CINV5, CINV6 and CINV7, depletion high voltage N channel MOS transistors DHN8 and DNH9 and enhancement P channel MOS transistors TP6 and TP7.

Figure 1:
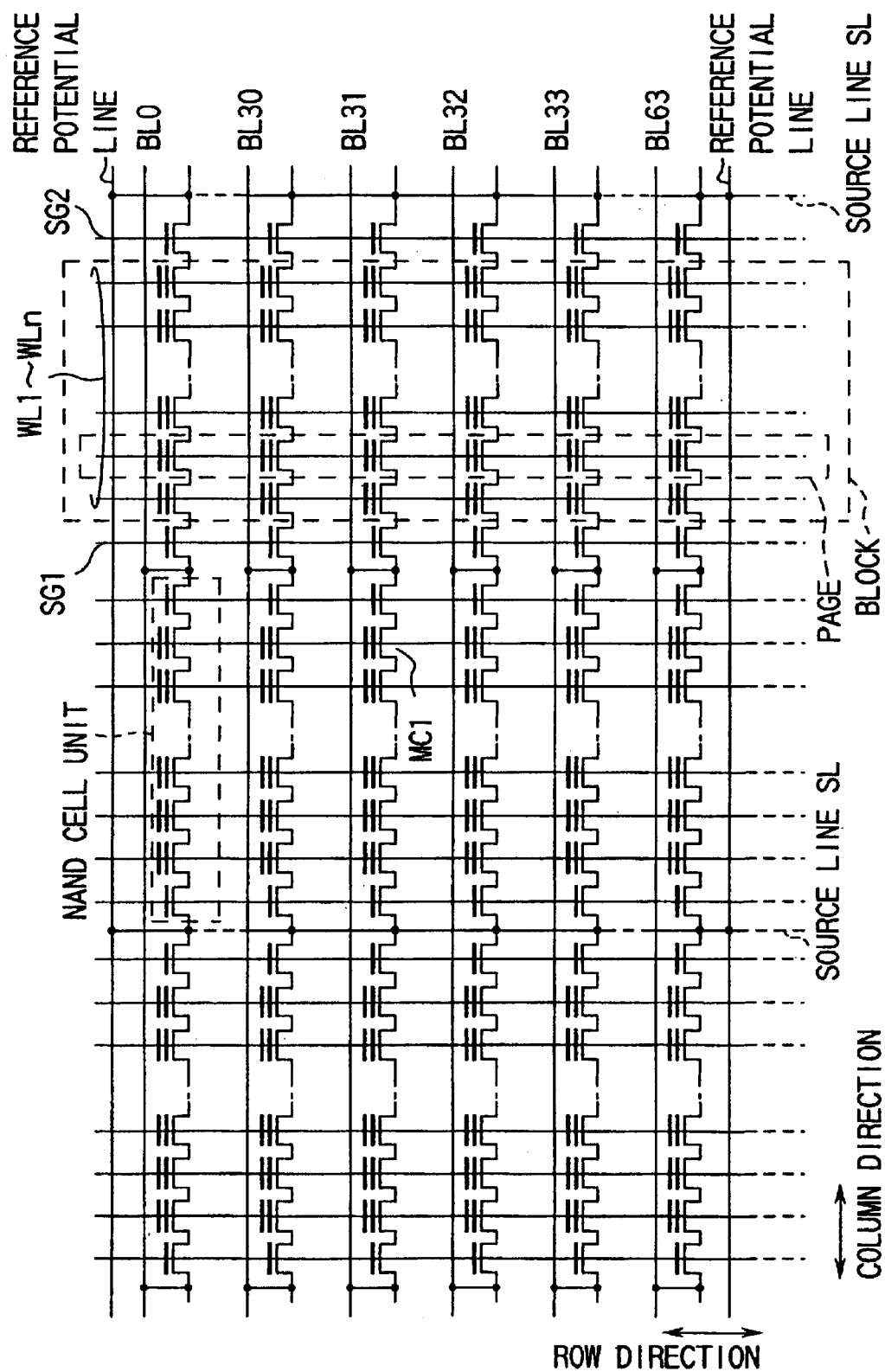
FIG. 1 is a circuit diagram showing the memory cell array of an NAND cell type EEPROM.
Figure 2:
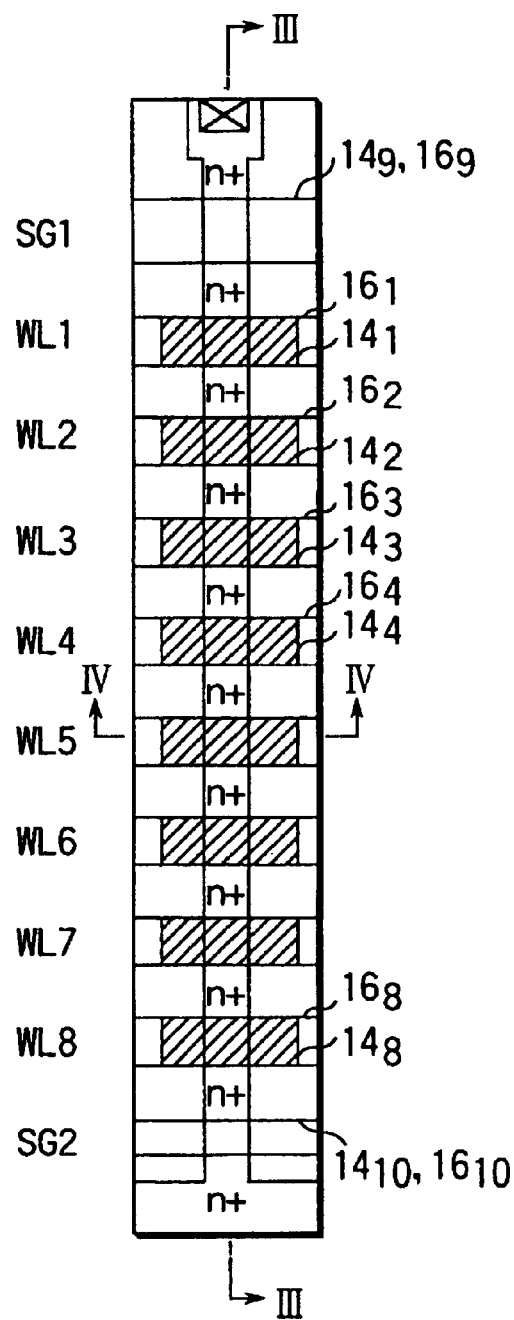
FIG. 2 is a plan view showing the device structure of an NAND cell unit.
Figure 3:
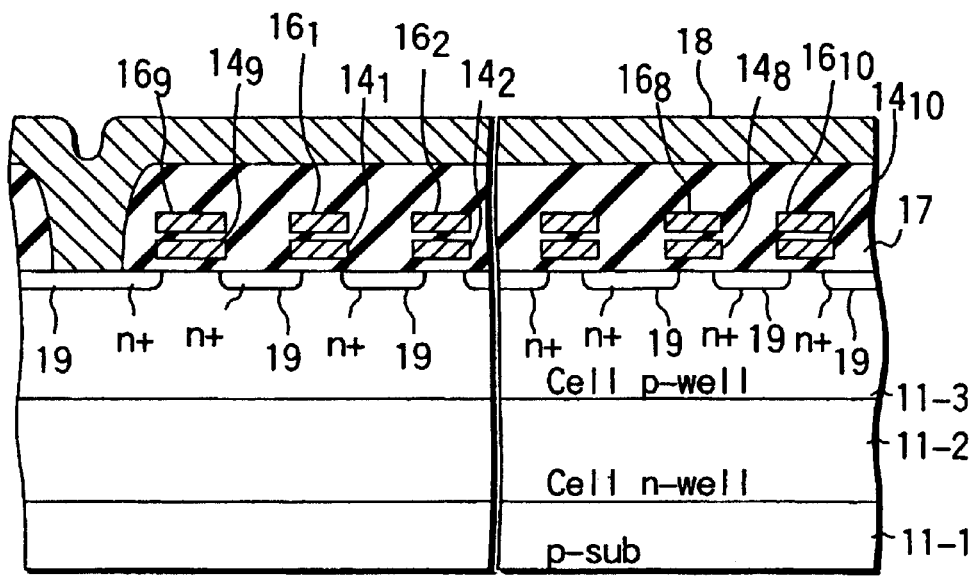
FIG. 3 is a cross-sectional view taken along line III—III of FIG. 2.
Figure 4:
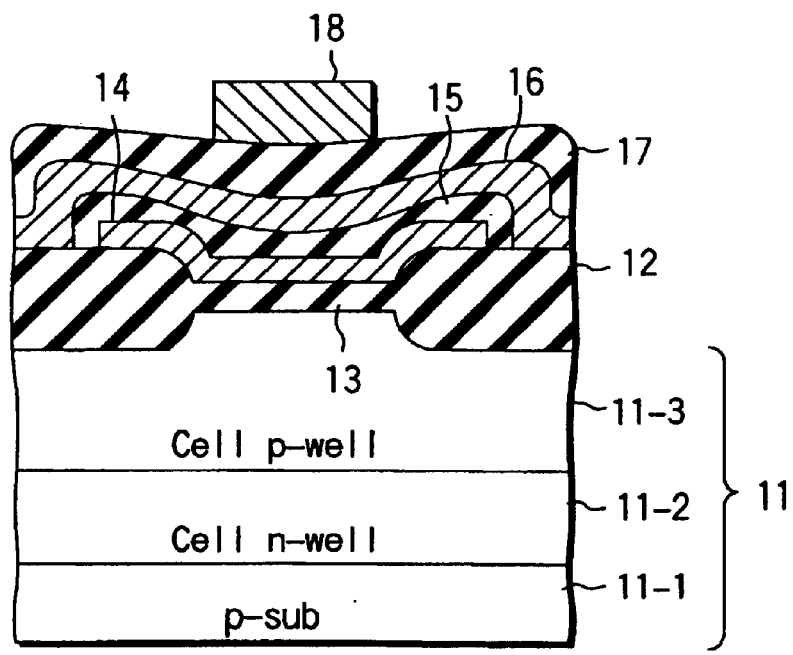
FIG. 4 is a cross-sectional view taken along line IV—IV of FIG. 2.
Figure 5:
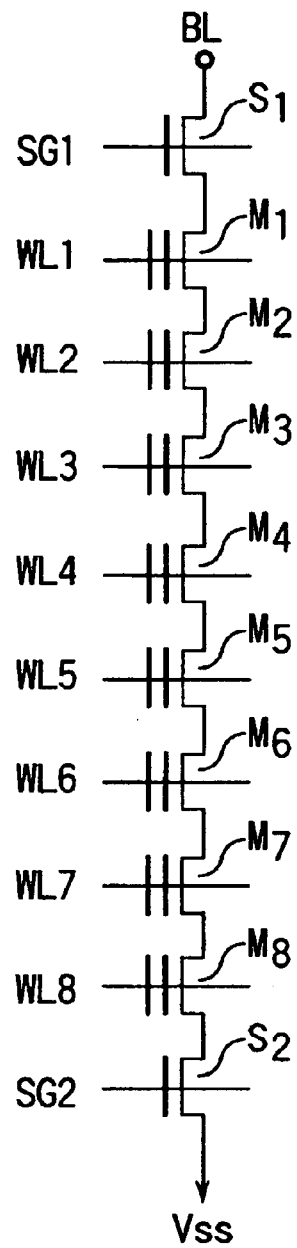
FIG. 5 shows an equivalent circuit of the NAND cell unit shown in FIG. 2.
Figure 6:
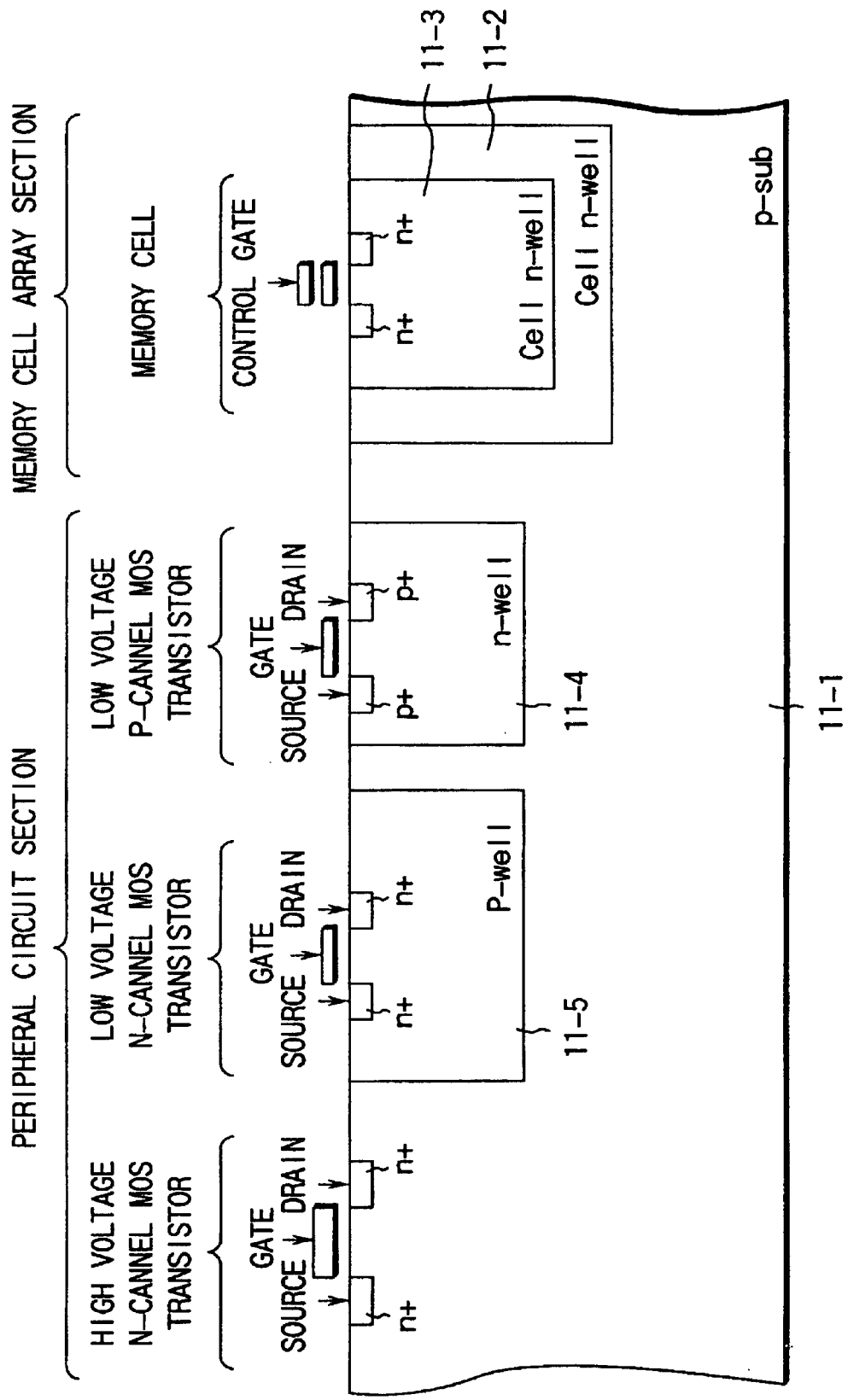
FIG. 6 shows the well structure of the NAND cell type EEPROM.
Figure 7:
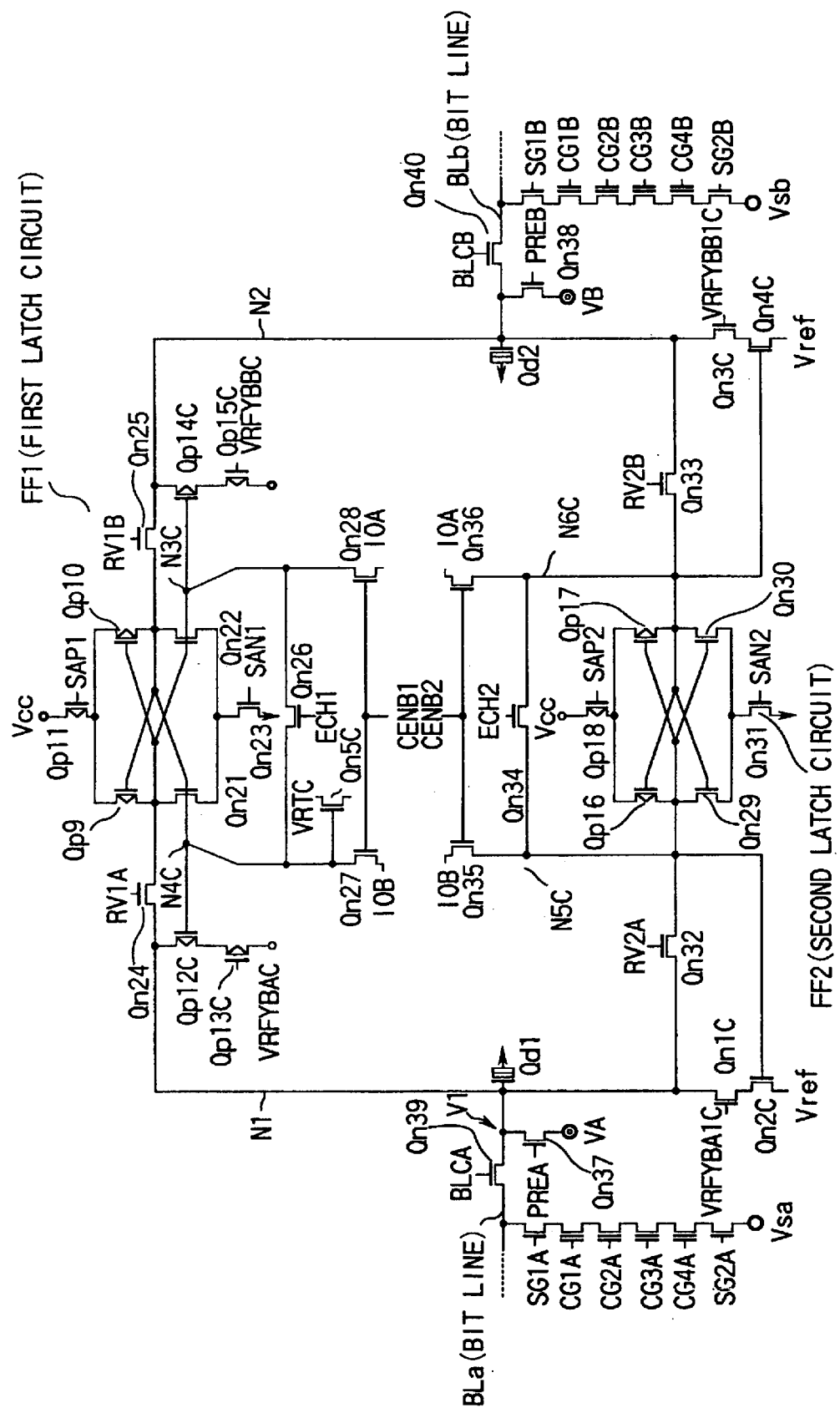
FIG. 7 shows a conventional data circuit.

The clocked inverter CINV7 functions to return the potential of the output signal RDECADS (the potential of the signal line 22 of FIG. 5) of the row address decoder corresponding to the selected memory cell block from the ground potential Vss to the internal power supply potential Vdd, return the potential of the output signal RDECADS of the row address decoder corresponding to the unselected memory cell block from the internal power supply potential Vdd to the ground potential Vss during the erase operation (ERASE), and then to apply the signals as a signal RDECADS2 to the circuit enclosed by the broken line X2.

The MOS transistor DHN9 functions to turn, together with the transistor DHN6 shown in FIG. 18, the signal line 22 (see FIG. 15) into a floating state.

In this way, the inverter I4, the clocked inverters CINV3 and CINV4, the depletion high voltage N channel MOS transistors DHN6 and DHN7 in the row address decoder RADD2 shown in FIG. 18 attain the same object as that of the clocked inverters CINV5, CINV6 and CINV7, the depletion high voltage N channel MOS transistors DHN8 and DHN9 and the enhancement P channel MOS transistors TP6 and TP7 in the word line driver RMAIN2 shown in FIG. 19. Thus, they are used in pairs.

It is noted that FIGS. 16 to 19 show that the potential Vdd (the internal power supply potential lower than the external power supply potential) is applied to those circuits as a power supply potential. Alternatively, the external power supply potential Vcc instead of the internal power supply potential Vdd may be applied to these circuits.

[Potential Level of Signal Line 22]

Next, description will be given to how the potential level of the signal line 22 (see FIG. 15) changes in each operation mode. It is noted that only the potential level of the signal line 22 will be described herein and that the operation of the word line control circuit including the potential level of the signal line 22 will be described later in detail.

In this embodiment, the signal line 22 (FIG. 15) connects the row address decoder (FIG. 18) with the word line driver (FIG. 19) corresponding to the even-numbered memory cell block. Accordingly, while referring to FIGS. 18 and 19, the potential level of the word line driver select signal RDECADS transmitted through the signal line 22 (FIG. 15) will be described.

The potential level of the output signal RDECADS of the row address decoder RADD2 differs among the operation modes.

In operations other than the erase operation (ERASE) (Program/Read, Verify-Read operations), the potentials of ROWERASELB, ROWPROG1, ROWERASE2B, ROWERASE3n and ROWGATE are set at the power supply potential Vdd (the internal potential lower than the external power supply potential Vcc, or the external power supply potential Vcc), and the potentials of ROWERASE1, ROWPROG1B and ROWERASE2 are set at the ground potential Vss, respectively.

At this time, the clocked inverters CINV3, CINV5 and CINV6 turn into an operation state and the clocked inverters CINV4 and CINV7 turn into an non-operation state. Also, the MOS transistor TP6 is turned off.

In the selected memory cell block, the level of the output signal RDECADS1 from the portion enclosed by the broken line X1 becomes "H", i.e., the internal power supply potential Vdd and the level of the output signal RDECADS from the row address decoder RADD2 also becomes "H", i.e., the internal power supply potential Vdd.

In the unselected memory cell block, on the other hand, the level of the output signal R from the portion enclosed by the broken line X1 becomes "L", i.e., the ground potential Vss and the level of the output signal RDECADS from the row address decoder RADD2 also becomes "L", i.e., the internal power supply potential Vss.

Accordingly, in operations other than the erase operation, the potential of the signal line 22 (see FIG. 15) arranged on the memory cell array in the unselected memory cell blocks becomes the ground potential Vss, and the potentials of the select gate lines SG1 and SG2 in the unselected memory cell block become the ground potential Vss, as well. These signal lines 22, SG1 and SG2 function as shield lines between the bit line and the word line (as in the case of the row shield line 23 shown in FIG. 14). As a result, it is possible to reduce coupling noise occurring to the data transmitted through the bit lines.

In the erase operation, the potentials of ROWERASELB, ROWPROG1, ROWERASE2B, ROWERASE3n and ROWGATE are set at the ground potential Vss, and the potentials of ROWERASE1, ROWPROG1B and ROWERASE2 are set at the internal power supply potential Vdd (or the power supply potential Vcc), respectively.

At this time, the clocked inverters CINV4 and CINV7 turn into an operation state and the clocked inverters CINV3, CINV5 and CINV 6 turn into a non-operation state. Also, the MOS transistor TP6 is turned on.

In the selected memory cell block, the level of the output signal RDECADS1 from the portion enclosed by the broken line X1 becomes "H", i.e., the internal power supply potential Vdd, and the level of the output signal RDECADS from the row address decoder RADD2 becomes "L", i.e., the ground potential Vss.

In the unselected memory cell block, the level of the output signal RDECADS1 from the portion enclosed by the broken line X1 becomes "L", i.e., the ground potential Vss, and the level of the output signal RDECADS from the row address decoder RADD2 becomes "H", i.e., the internal power supply potential Vdd.

Further, ROWGATE has the ground potential Vss. Due to this, if the potential of the signal line 22 (see FIG. 15) arranged on the memory cell array in the unselected memory cell block (potential of RDECADS) becomes about 1 to 1.5V, the MOS transistors DHN6 and DHN9 are cut off and thereby become a floating state.

In this way, in the erase operation, the potential of the signal line 22 (see FIG. 15) arranged on the memory cell array in the unselected memory cell block is 1 to 1.5V and in a floating state. Namely, if the cell wells are applied with the erase potential Vera, the potential of the signal line 22 (FIG. 15) rises by the capacitive coupling as in the case of the word line. Thus, the signal line 22 (FIG. 15) does not suppress the increase of the potential of the word line.

Accordingly, if the cell wells are applied with the erase potential Vera, the potentials of the word line in the unselected memory cell blocks advantageously, easily rises by the capacitive coupling between the cell wells and the word line.

Following this, a high electric field is not applied to the tunnel oxide film of the memory cells in the unselected memory cell block, so that it is possible to prevent erroneous erase from occurring to the unselected memory cell block.

In the meantime, the fuse element in the broken line X in FIG. 18 (as well as the fuse element in FIG. 16) is not cut off if a memory cell block corresponding to this fuse element (row address decoder) is used as an ordinary memory region for a user.

However, if the memory cell block corresponding to the fuse element (row address decoder) is used as an ROM BLOCK region for storing device code, the fuse element is cut off and a user is inhibited from freely conducting program/erase operations to the ROM BLOCK region.

The ROM BLOCK region has the following significance.

In the recent years, NAND type flash memories have been used as memories for various types of electronic equipment. However, there are cases where NAND type flash memories are used as memories for data related to copyrights such as those for storing music information by telephone communications.

To prevent illegal duplication, a chip number, i.e., a device code is stored in an NAND type flash memory.

The device code is characteristic of an individual NAND type flash memory. If a user can freely reprogram this device code, the original purpose of the device code cannot be fulfilled.

Considering this, the device code is programmed into the ROM BLOCK region of the NAND type flash memory before shipment and A user is inhibited from programming/erasing the ROM BLOCK region. Namely, a fuse element is cut off in a memory cell block which becomes the ROM BLOCK region.

By doing so, if music information is to be duplicated in, for example, an information reception-side NAND type flash memory from an information providing-side NAND type flash memory or the device code is to be read from the information providing-side NAND type flash memory and the device code of the information reception-side NAND type flash memory differs from that of the information providing-side NAND type flash memory, then duplication is inhibited.

The fuse element is cut off right after the device code is programmed into the memory cell block which becomes the ROM BLOCK region.

This is because if a pre-shipment test is conducted in a state in which the fuse element is not cut off, the device code is erased in this test.

Specifically, in the pre-shipment test, all blocks are simultaneously selected and programmed/erased to shorten test time. In other words, since the levels of all row address signals AROWi, AROWj become "H", the level of REDECADS1 becomes "H" (in FIG. 16, the level of RDECAD becomes "H") if the fuse element is not cut off even with the level of CMD ROMBA being "L". As a result, the memory cell block which becomes the ROM BLOCK region is selected.

On the other hand, even if the levels of all row address signals AROWi, AROWj are "H", the level of CMD ROMBA is "L" as long as the fuse element is cut off. Thus, the level of RDECADS1 becomes "L" (in FIG. 16, the level of RDECAD becomes "L") and the memory cell block which becomes the ROM BLOCK region is not selected.

Even if the fuse element is cut off, it is necessary to read the device code stored in the ROM BLOCK region.

The data can be read from the ROM BLOCK region by setting the level of CMD ROMBA at "H". That is to say, if the level of CMD ROMBA becomes "H" and those of the signals AROWi, . . . AROWj in the ROM BLOCK region become "H", then the memory cell block which becomes the ROM BLOCK region is selected.

Furthermore, even after the fuse element is cut off, the data in the ROM BLOCK region can be reprogrammed by inputting a special command to thereby set the levels of the CMD ROMBA and the signals ARoWi, . . . AROWj in the ROM BLOCK region at "H". In that case, a command to set the level of CMD ROMBA at "H" is made closed to ordinary users so as to prevent the data in the ROM BLOCK region from being illegally reprogrammed.

In this embodiment, description has been given to a case of cutting the fuse element in the ROM BLOCK region. The fuse in FIG. 16 and that in the broken line X of FIG. 18 are also cut off if a memory cell block is a defective block. In that case, the defective block is replaced by a backup block by a redundancy circuit.

[Description of Basic Operation] . . . Third to Fifth Features

Now, detailed description will be given to the operations of the important parts of the four-level NAND cell type EEPROM (FIG. 8) of the present invention in the respective operation modes such as a read mode, a program mode, an erase mode and a test (burn-in) mode. To be specific, the operations of the data circuit (FIG. 9), the batch detection circuit (FIG. 12) and the word line control circuit (FIGS. 13, and 16 to 19) will be described.

Before the description of the operations, one example of the threshold voltages of memory cells and a data programming method will be described briefly.

Figure 20:
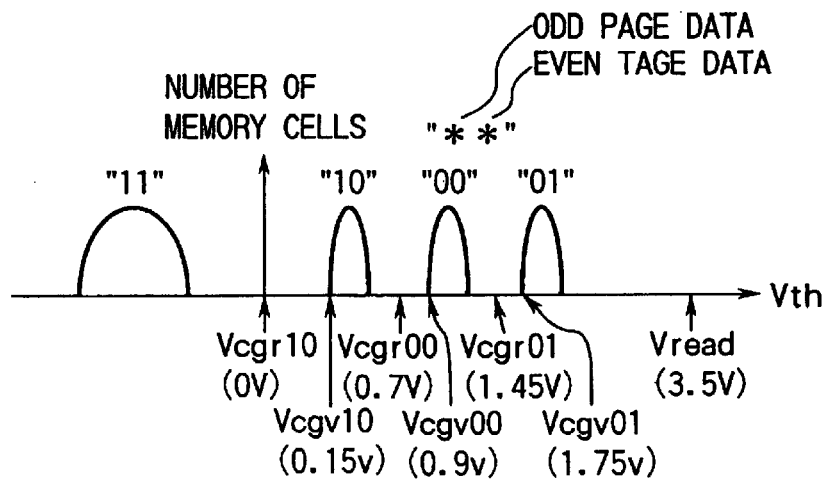
FIG. 20 shows the relationship between four-level data and the threshold voltages of memory cells.

FIG. 20 is a distribution view of the threshold voltages (Vth) of memory cells in the four-level NAND cell type EEPROM.

Four-level data (two-bit data) are stored in one memory cell. In this embodiment, as already described above, it is assumed that the four-level data includes "11", "10", "00" and "01". It is also assumed that the four-level data ("11", "10", "00" and "01") and the threshold voltages of memory cells has a relationship shown in FIG. 20.

That is, it is assumed that "11" is an erase state. A memory cell in the erase state has a negative threshold voltage Vth. It is also assumed that "10", "00" and "01" are program states. A memory cell in the program state has a positive threshold voltage Vth. Further, among the program states, the "10" state has the lowest threshold voltage, the "01" state has the highest threshold voltage and the "00" state has a threshold voltage between the threshold of the state "10" and that of the state "01".

The four-level data (two-bit data) consists of even page data and odd page data, and is programmed into a memory cell by two program operations.

First, the even page data is programmed.

Figure 21:
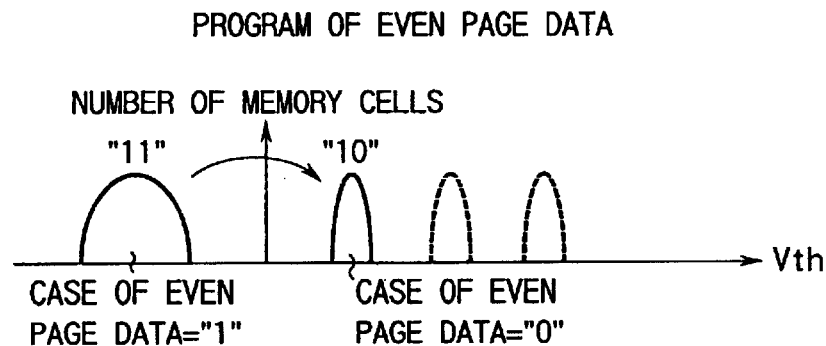
FIG. 21 shows the threshold voltage distribution of memory cells after programming even page data.

It is now assumed that all memory cells are in the erase state, i.e., in the data "11" state. Thereafter, as shown in FIG. 21, when the even page data is programmed, the distribution of the threshold voltages Vth of the memory cells is divided into two sections according to the values ("1" and "0") of the even page data.

That is to say, if the even page data is "1", the tunnel oxide film of each memory cell is prevented from being applied with a high electric field and the threshold voltage Vth of the memory cell is prevented from rising. As a result, the memory cell is maintained in the erase state ("11" state) (program of even page data "1").

On the other hand, if the even page data is "0", then a high electric field is applied to the tunnel oxide film of each memory cell, electrons are injected into the floating gate electrode of the memory cell and the threshold voltage Vth of the memory cell rises by a predetermined amount. As a result, the memory cell turns into a program state ("10" state) (program of even page data "0").

The program of odd page data follows.

The odd page data is programmed based on program data (i.e., odd page data) inputted externally of a memory chip and on the even page data already programmed into the memory cell.

Figure 22:
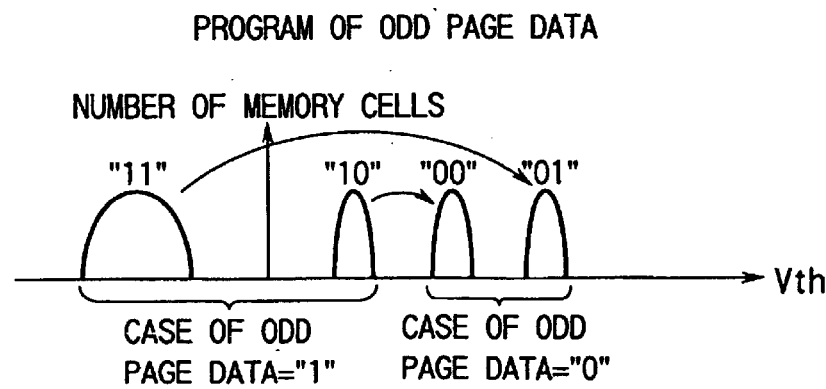
FIG. 22 shows the threshold voltage distribution of memory cells after programming odd page data.

Namely, as shown in FIG. 22, if odd page data is "1", the tunnel oxide film of each memory cell is prevented from being applied with a high electric field and the threshold voltage Vth of the memory cell is prevented from rising. As a result, the memory cell in the "11" state (erase state) remains the "11" state and the memory cell in the "10" state turns into the "00" state (program of odd page data "0").

On the other hand, if odd page data is "0", the tunnel oxide film of each memory cell is applied with a high electric field and the threshold voltage Vth of the memory cell is increased by injecting electrons into the floating gate electrode. As a result, the memory cell in the "11" state (erase state) turned into the "01" state and the memory cell in the "10" state turns into the "00" state (program of odd page data "0").

That is to say, in this embodiment, if the even page data is "1" and the odd page data is "1", data "11" is programmed into each memory cell. If the odd page data is "0" and the even page data is "1", data "10" is programmed into the memory cell. If the even page data is "1" and the odd page data is "0", data "01" is programmed into the memory cell. If the even page data is "0" and the odd page data is "0", data "00" is programmed into the memory cell.

In this way, by conducting two program operations, the distribution of the threshold voltages Vth of memory cells is divided into four section ("11", "10", "00" and "01").

The present invention is characterized by a program method when odd page data is "0" (the fourth feature). To be specific, in this embodiment, four-level data and the threshold voltages of the memory cells is set to have the relationship shown in FIG. 20. Due to this, if the odd page data is "0", the "11" state is changed to the "01" state and the "10" state is changed to the "00" state (see FIG. 22).

Now, as is obvious from FIG. 22, the change amount of the threshold voltages if the state "11" is changed to the state "01" is larger than that if the state "10" is changed to the state "00". In other words, since a program pulse is applied to a memory cell to which "00"-programming is conducted and to a memory cell to which "01"-programming is conducted on the same conditions, "00"-programming is completed earlier than "01"-programming.

Utilizing this, the present invention (fourth feature) omits "00" verify-read after the completion of "00"-programming and then conducts only the "01" verify-read to thereby shorten program time (accelerate program) (which will be described later).

Further, since the above-stated program method is adopted, the present invention is also characterized by verification-related circuits (e.g., MOS transistor TN1, . . . TN6, TN8, TN10 and the like) in the data circuit (FIG. 9).

Additionally, in this embodiment, since the four-level data and the threshold voltages of the memory cells is set to have the relationship shown in FIG. 20, the present invention is characterized by a data read method (the third feature).

According to prior art (Japanese Patent Application No. 8-98627), for example, the "00" state and the "01" state are opposite to each other with regard to the relationship shown in FIG. 20. That is, the change amount of the threshold voltages in a case where the state "11" is changed to the state "01" and that in a case where the state "10" is changed to the state "00" are almost the same.

Now, operations will be described concretely while referring to an operation timing view.

1. Read Operation

Read operation consists of an even page data read operation and an odd page data read operation.

1.-1 Even page data read operation

As is evident from FIG. 20, the "11" state and the "01" state are even page data "1" and the "10" state and the "00" state are odd page data "0". That is, it is possible to judge whether the even page data is "1" or "0" from two read operations of "READ01" and "READ10".

Accordingly, the even page data read operation consists of two read operations of "READ01" and "READ10". First, the "READ01" operation is carried out and then the "READ10" operation follows.

1.-1.-1 "READ01"

Figure 23:
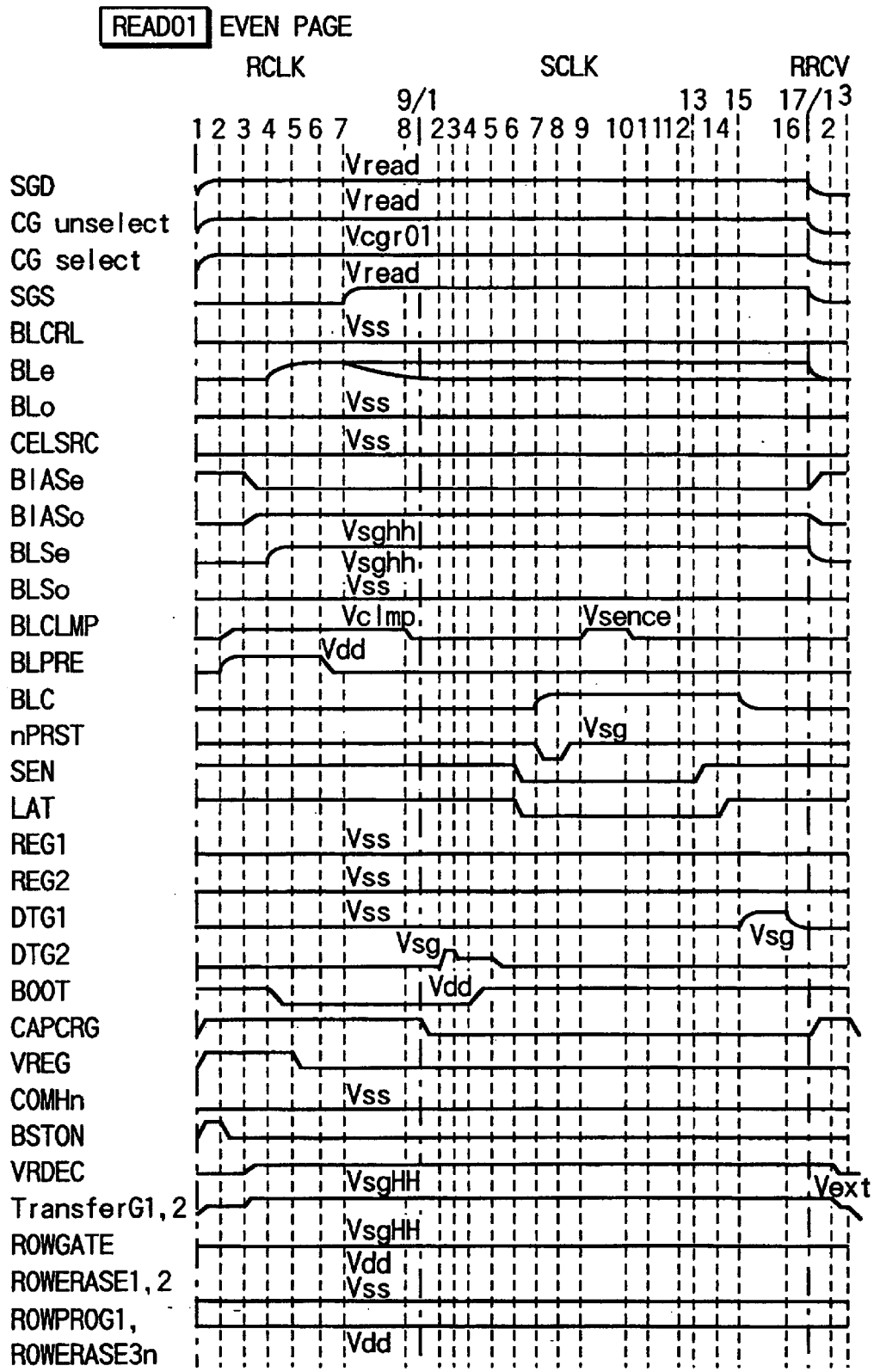
FIG. 23 is a waveform view showing operation timing relating to the read of even page data.

FIG. 23 shows the "READ01" operation.

In the "READ01" operation, a read potential (the potential of a selected word line) is set at Vcgr01 (e.g., about 1.45V) and it is recognized whether memory cell data is "01" or other data "11", "10" or "00".

First, in the row address decoder (FIGS. 16 and 18), the level of RDECPB is set at "L". At this moment, the levels of both RDECAD (FIG. 16) and RDECADS1 (FIG. 18) are "L (Vss)" and all memory cell blocks are in an unselected state.

Thereafter, the level of RDECPB is changed from "L" to "H". At this time, the MOS transistor TP4 is turned off and the MOS transistor TN21 is turned on (FIGS. 16 and 18).

Further, in a selected memory cell block, the levels of all row address signals AROWi, . . . AROWj become "H" and the levels of both RDECAD (FIG. 16) and RDECAD1 (FIG. 18) become "H". In unselected memory cell blocks, since the level of at least one of the row address signals AROWi, . . . AROWj is "L", the levels of RDECAD (FIG. 16) and RDECADS1 (FIG. 18) are maintained "L".

In the word line driver (FIGS. 17 and 19) in the selected memory cell block, the levels of the input signals RDECAD and RDECADS1 become "H". Due to this, the high voltage switching circuit (NMOS charge-pumping circuit) 26 is actuated by an oscillation signal (clock signal) Owc.

Accordingly, in the word line driver (FIGS. 17 and 19) in the selected memory cell block, potential VRDEC is transferred to the output node of the high voltage switching circuit 26.

If the word line driver RMAIN1 (FIG. 17) in the first memory cell block is selected, for example, the potential VRDEC (e.g., about 6V) is applied to the output node TransferG1. If the word line driver RMAIN2 (FIG. 19) in the second memory cell block is selected, for example, the potential VRDEC (e.g., about 6V) is applied to the output node TransferG2.

As a result, the potentials of the gates of the transfer transistors HNt1, HNt2, . . . HNt16 become VRDEC, and the potentials of the signal lines CG1, CG2, . . . CG16 are transferred to the word lines (control gate lines) WL1, WL2, . . . WL16 through the transfer transistors HNt1, HNt2, . . . HNt16, respectively.

The potentials of the signal lines SGD and SGS are also transferred to the select gate lines SG1 and SG2 through the transfer transistors HN5 and HN6, respectively.

Here, among the signal lines CG1, CG2, . . . CG16, the potential of a selected signal line is set at Vcgr01 (e.g., about 1.45V) by the switching circuit (FIG. 8), whereas the potentials of the remaining unselected signal lines are set at Vread (e.g., about 3.5V) by the switching circuit (FIG. 8).

Further, the potentials of the signal lines SGD and SDS are set at Vread (e.g., about 3.5V).

On the other hand, in each word line driver (FIGS. 17 and 19) in the unselected memory cell blocks, the potentials of RDECAD and RDECADS2 are transferred to the output nodes TrasferG1 and TransferG2 of the high voltage switching circuit 26, respectively.

That is, in each word line driver (FIGS. 17 and 19) in the unselected memory cell blocks, the potentials of both of the output nodes TransferG1 and TransferG2 become the ground potential Vss.

As a result, the transfer transistors HNt1, HNt2, HNt16 are turned off and the word lines (control gate lines) WL1, WL2, WL16 turn into a floating state. Further, the select gate lines SG1 and SG2 are grounded by the signal lines SGS and SGD, respectively.

Operation timing shown in FIG. 23 will be described in detail.

It is assumed that a memory cell connected to the bit line BLe is selected and that the bit line BLO is a shield bit line.

At the row side (word line control circuit side), first, at period RCLK1, the level of BSTON becomes "H". At this time, in the selected memory cell block, Vdd (RDECAD or RDECADS2) is transferred to the output node (TransferG1 or TransferG2) of the high voltage switching circuit in the word line driver.

At period RCLK2, the level of BSTON becomes "L" and at period RCLK3, the potential of HRDEC becomes VsgHH. Due to this, in the selected memory block, the potential of the output node (TransferG1 or TransferG2) of the high voltage switching circuit in the word line driver rises to VsgHH.

The potential of the selected word line CGselect is set at Vcgr01 (e.g., about 1.45V) and those of unselected word lines CGunselect and the potential SGD of the select gate line SG1 are set at Vread (e.g., about 3.5V).

At the column side (data circuit side), at period RCLK2, the potential of BLPRE becomes Vdd (e.g., about 2.3V). At period RCLK3, the potential of BIASe becomes the ground potential Vss, and the potential of BIASo becomes Vsghh. At period RCLK4, when the potential of BLSe becomes Vsghh, the bit line BLe is precharged and the potential of the bit line BLo becomes the ground potential Vss.

The potential of BLCLMP while precharging the bit line BLe is Vclmp (e.g., about 2V). Due to this, after rising to about 0.8V, the bit line BLe turns into a floating state. Then, at period RCLK7, the precharge of the bit line BLe is completed.

At period RCLK7, when the potential SGS of the select gate line SG2 is set at Vread, the potential of the bit line BLe decreases or is maintained according to the data of the selected memory cell.

That is to say, if the selected memory cell data is "11", "10" or "00", this selected memory cell is turned on by the potential Vcgr01. Thus, the charges of the bit line BLe are discharged and the potential of the bit line BLe decreases to 0.3V or lower (while unselected memory cells in the selected block are turned on by the potential Vread).

If the selected memory cell data is "01", this selected memory cell is not turned on by the potential Vcgr01. Due to this, the charges of the bit line BLe are not discharged and the bit line BLe maintains the precharge potential (about 0.8V).

At period SCLK6, the levels of both SEN ad LAT become "L", those of both SENB and LATB become "H", and the latch circuit LATCH1, i.e., the clocked inverters CINV1 and CINV2, turns into a non-operation state (FIG. 9).

At period SCLK7, if the potential of BLC becomes Vsg (about 4.5V) and the level of nPRST becomes "L", the potential of the sense node DTNij becomes Vdd. At period SCLK8, if the level of nPRST becomes "H", the sense node turns into a floating state. Further, at period RSCLK9, the potential of BLCMP becomes Vsense (e.g., about 1.6V) and the potential of the bit line BLe is transmitted to the sense node.

At this time, if the memory cell data is "11", "10" or "00", the potential of the bit line BLe is not higher than 0.3V. Due to this, the potential of the sense node DTNij decreases from Vd to a potential of not higher than 0.3V. If the memory cell data is "01", the potential of the bit line BLe maintains the precharge potential (about 0.8V). Accordingly, the clamping MOS transistor TN9 (see FIG. 9) is cut off and the sense node DTNij maintains the potential Vdd.

Thereafter, at period SCLK13, the level of SEN becomes "H", that of SENB becomes "L" and the clocked inverter CINV1 turns into an operation state (FIG. 9).

As a result, if the memory cell data is "11", "10" or "00", the potential of the output node Nbij of the clocked inverter CINV1 becomes Vdd. If the memory cell data is "01", the potential of the output node Nbij of the clocked inverter CINV1 becomes Vss.

At period SCLK14, the level of LAT becomes "H", that of LATB becomes "L" and the clocked inverter CINV2 turns into an operation state (FIG. 9). Namely, read data (sense node data) is latched by the latch circuit LATCH1.

At this time, if the memory cell data is "11", "10" or "00", the potential of the output node Naij becomes Vss and that of the output node Nbij becomes Vdd. If the memory cell data is "01", the potential of the output node Naij becomes Vdd and that of the output node Nbij becomes Vss.

At period SCLK15, when the potential of DTG1 become Vsg (about 4.5V), the data latched by the latch circuit LATCH1 is transferred to the DRAM cell which is the first feature of the present invention, i.e., the node CAP1ij. Since the capacitor DLN (C1) for latching data is connected to the node CAP1ij, read data is latched by the node CAP1ij.

As a result of the above-stated "READ01" operation, the data latched by the DRAM cell, i.e., the node CAPA1ij becomes the data as shown in Table 1.

TABLE 1

| CAP1ij after "READ 01" | | | |
|---|---|---|---|
| "11" | "10" | "00" | "01" |
| CAP1ij Vss | Vss | Vss | Vdd |

Namely, at this stage, when the potential of the node CAPA1ij is Vdd ("H"), the even page data is obviously "11". When the potential of the node CAPA1ij is Vss ("L"), it is not clear whether the even page data is "1" or "0".

Therefore, following the "READ01" operation, "READ10" operation is carried out.

1.-1.-2. "READ10"

Figure 24:
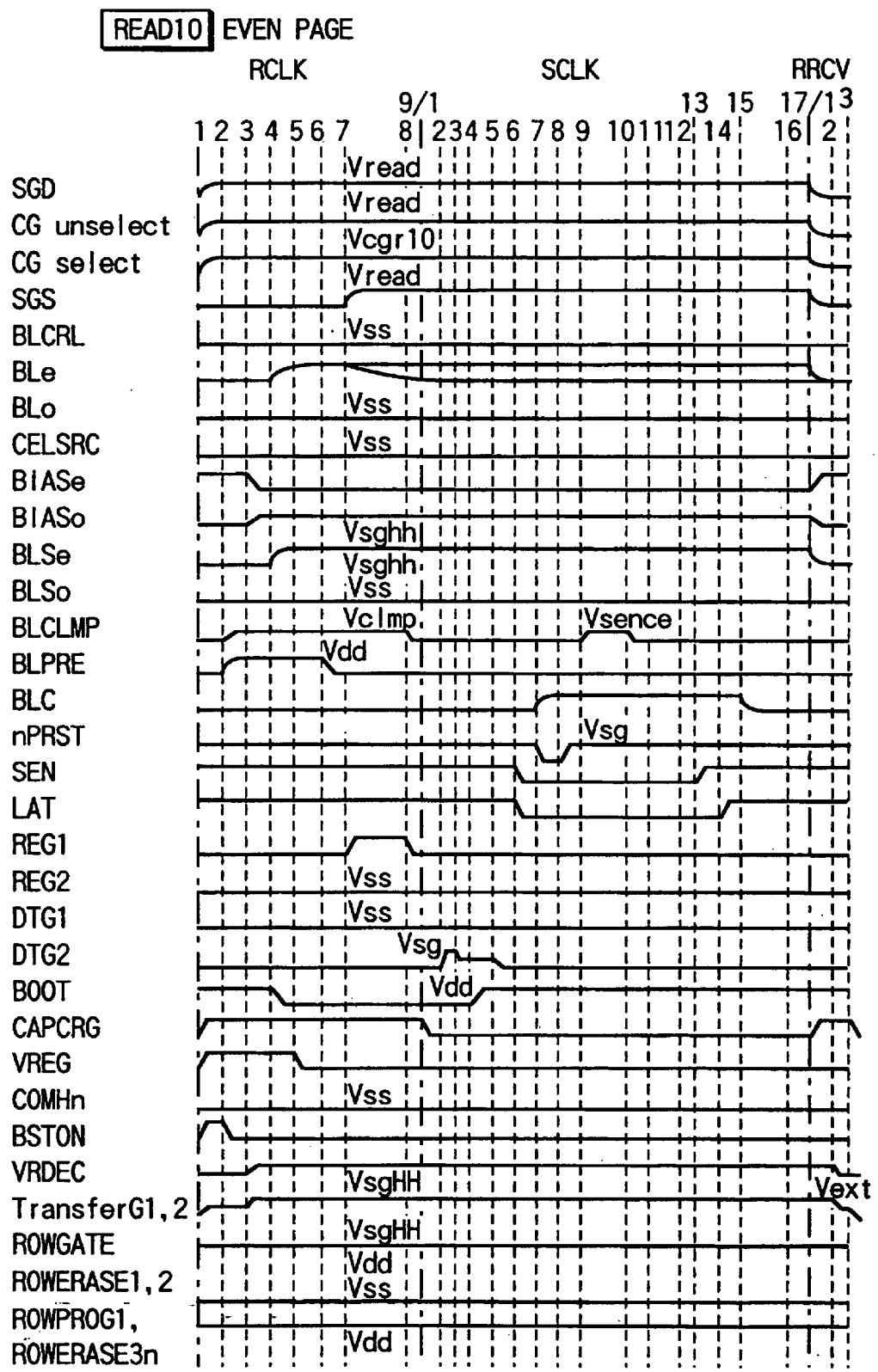
FIG. 24 is a waveform view showing operation timing relating to the read of even page data.

FIG. 24 shows the "READ10" operation.

In the "READ10" operation, the read potential (the potential of the selected word line) is set at Vcgr10 (e.g., 0V) and it is recognized whether memory cell data is "11" or other data "10", "00" or "01".

The "READ10" operation is almost the same as the "READ01" operation except for the level of the read potential (the potential of the selected word line).

First, from periods RCLK1 to RCLK6, the same operation as the "READ01" operation is carried out except for the level of the potential of the selected word line. That is, the potential of the selected word line is set at Vcgr10, the potentials of unselected word lines in the selected block are set at Vread and the bit line BLe is precharged and then turned into a floating state, and the potential of the bit line BLo is set at the ground potential Vss.

Thereafter, at period RCLK7, when the potential SGS of the select gate line SG2 is set at Vread, the potential of the bit line BLe decreases or is maintained according to the selected memory cell data.

Namely, if the selected memory cell data is "11", the selected memory cell is turned on by the potential Vcgr10. Due to this, the charges of the bit line BLe are discharged and the potential of the bit line BLe decreases to 0.3V or lower (while the unselected memory cells in the selected block are turned on by the potential Vread).

On the other hand, if the selected memory cell data is "10", "00" or "01", this selected memory cell is not turned on by the potential Vcgr10. Due to this, the charges of the bit line BLe are not discharged and the bit line BLe maintains the precharge potential (about 0.8V).

Here, the difference between the "READ10" operation and the "READ01" operation is that at period RCLK7, the potential of REG1 becomes Vdd.

If the potential of REG1 becomes Vdd, the MOS transistor TN10 (FIG. 9) is turned on. Further, since the potential of CAPCRG is Vdd and those of VREG and DTG2 are Vss, the potential of the node CAP2ij is Vss. Namely, it is determined whether the sense node DTNij is to be short-circuited to VREG (Vss) or disconnected from VREG according to the data read in the "READ01" operation (to be specific, the data latched by the node CAP1ij).

For example, if the data latched by the node CAP1ij is Vdd (the memory cell data is "01", see Table 1 above), the MOS transistor TN3 (FIG. 9) is turned on and the sense node DTNij is, therefore, short-circuited to VREG (Vss). As a result, the charges of the bit line BLe are discharged to VREG and the potential of the bit line BLe changes from the precharge potential (about 0.8V) to Vss.

If the data latched by the node CAP1ij is Vss (the memory cell data is "11", "10" or "00", see Table 1 above), the MOS transistor TN3 (FIG. 9) is turned off and the sense node DTNij is not, therefore, short-circuited to VREG (Vss). As a result, the potential of the bit line BLe becomes a value according to the selected memory cell data. Namely, if the selected memory cell data is "11", the potential of the bit line BLe becomes not higher than 0.3V and if "10" or "00", the potential of the bit line BLe becomes the precharge potential (about 0.8V).

In other words, after the "READ01" operation, at period RCLK8 in the "READ10" operation, if the selected memory cell data is "11" or "01", the potential of the bit line BLe becomes "L (Vss or a potential not higher than 0.3V)". If the selected memory cell data is "10" or "00", the potential of the bit line BLe becomes "H (precharge potential)".

Thereafter, as in the case of the "READ01" operation, the potential of the bit line BLe is sensed and latched by the latch circuit LATCH1.

That is to say, at period SCLK6, the levels of both SEN and LAT are set at "L", those of SENB and LATB are set at "H", and the latch circuit LATCH1, i.e., the clocked inverters CINV1 and CINV2, is turned into a non-operation state.

At period SCLK7, when the potential of BLC is set at Vsg (about 4.5V) and the level of the nPRST is set at "L", the potential of the sense node DTNij becomes Vdd. Also, at period SCLK8, when the level of nPRST becomes "H", the sense node becomes a floating state. Further, at period SCLK9, the potential of BLCLMP becomes Vsense (e.g., about 1.6V) and the potential of the bit line BLe is transmitted to the sense node.

At this time, if the memory cell data is "11" or "01", the potential of the bit line BLe is either Vs or a potential not higher than 0.3V. Due to this, the potential of the sense node DTNij decreases from Vdd to either Vss or a potential not higher than 0.3V. If the memory cell data is "10" or "00", the bit line BLe maintains the precharge potential (about 0.8V). Thus, the clamping MOS transistor TN9 (see FIG. 9) is cut off and the sense node DTNij maintains the potential Vdd.

Thereafter, at period SCLK13, the level of SEN becomes "H", that of SENB becomes "L" and the clocked inverter CINV1 turns into an operation state (FIG. 9).

As a result, if the memory cell data is "11" or "01", the potential of the output node Nbij of the clocked inverter CINV1 becomes Vdd. If the memory cell data is "10" or "00", the potential of the output node Nbij of the clocked inverter CINV1 becomes Vss.

Further, at period SCLK14, the level of LAT becomes "H", that of LATB becomes "L" and the clocked inverter CINV2 turns into an operation state (FIG. 9). Namely, the read data (sense node data) is latched by the latch circuit LATCH1.

As a result of the above-stated "READ10" operation, the data latched by the latch circuit LATCH1 becomes the data as shown in Table 2.

TABLE 2

| Read data of even page | | | | |
|---|---|---|---|---|
| | "11" | "10" | "00" | "01" |
| Naij | Vss | Vdd | Vdd | Vss |

That is, in case of the memory cell having even page data "1", the potential of the output node Naij of the latch circuit LATCH1 becomes Vss. In case of the memory cell having even page data "0", the potential of the output node Naij of the latch circuit LATCH1 becomes Vdd.

Thereafter, the level of CSLi is set at "H", thereby outputting the data (even page data) in the latch circuit LATCH1 to the I/O lines (IOj and IO) and externally of the memory chip.

Figure 25:
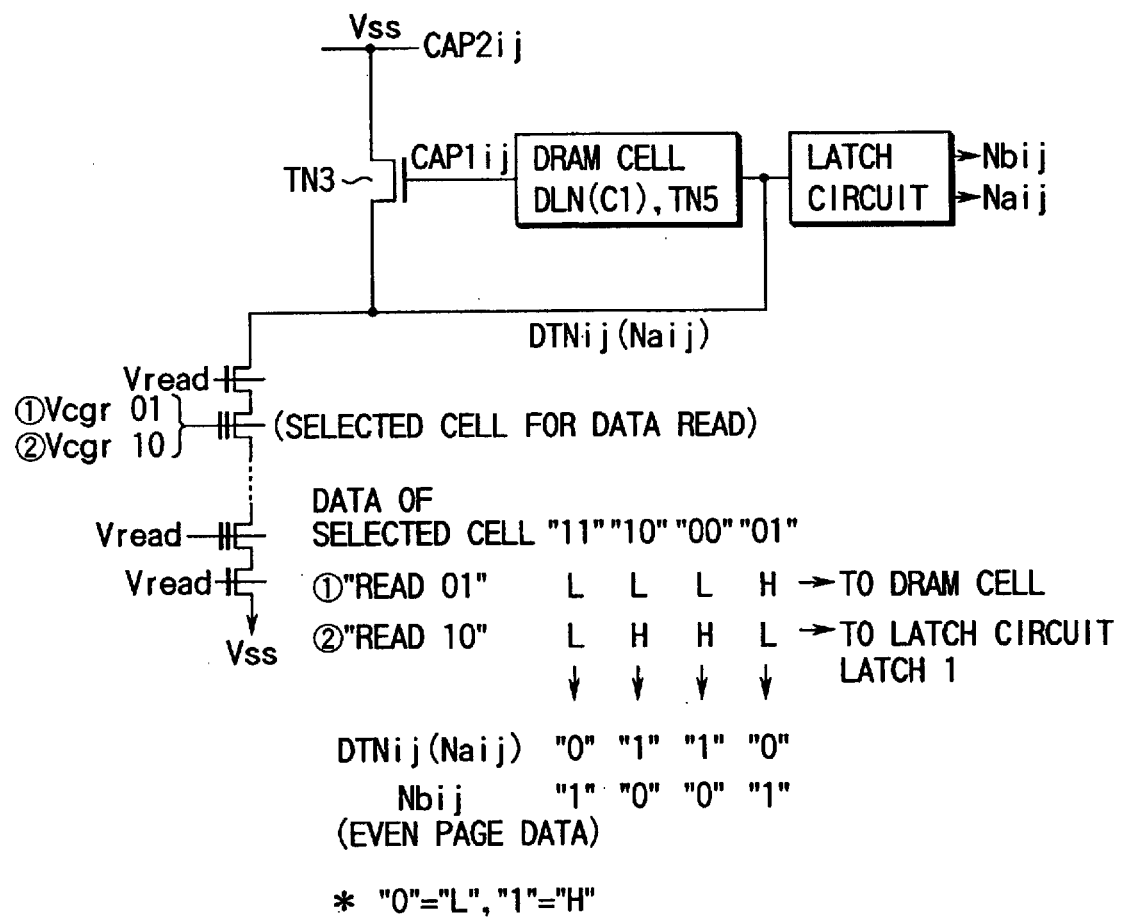
FIG. 25 shows the outline of read operation to even page data.

It is noted that FIG. 25 shows the outline of the feature of the read operation of even page data stated above. Namely, in this embodiment, the read data is latched by the storage circuit (DRAM cell) in the "READ01" operation. Only when the data level is "H" (the memory cell is in the "01" state), the level of the sense node DTNij is forcedly set at "L" in the next "READ10" operation.

Further, in the "READ10" operation, the level of the sense node becomes "L" only when the memory cell is in the "11" state. As a consequence, if the memory cell is in the "11" or "01" state (even page data is "1"), the level of the sense node DTNij becomes "L" and if the memory cell is in the "10" or "00" state (even page data is "0"), the level of the sense node DTNij becomes "H".

1.-2. Read Operation of Odd Page Data

As is obvious from FIG. 20, the "11" state and the "10" state indicate odd page data "1" and the "00" state and the "01" state indicate the odd page data "0". That is to say, one read operation "READ00" can judge whether the odd page data is "1" or "0". Accordingly, the read operation of the odd page data includes only "READ00".

Figure 26:
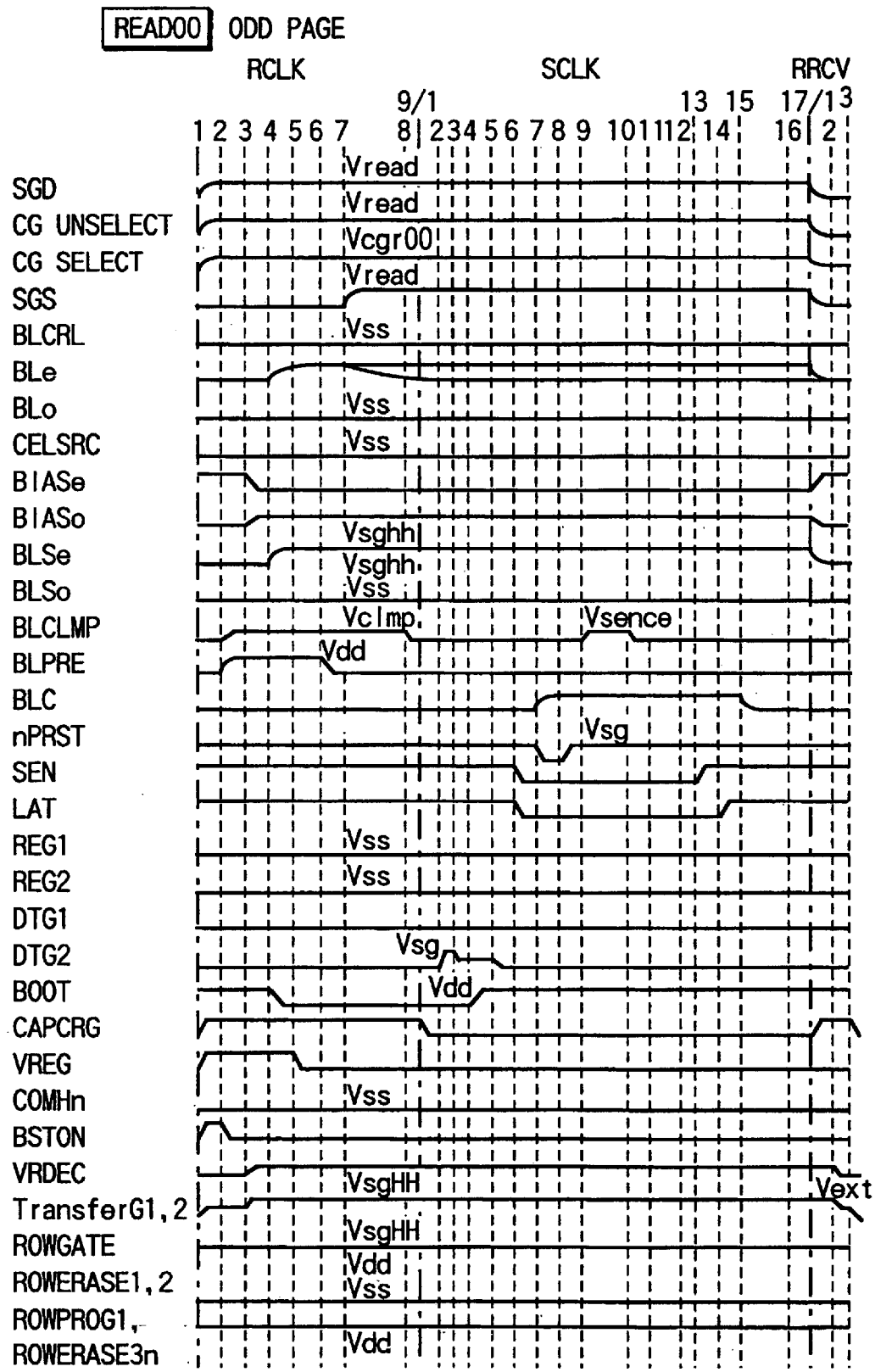
FIG. 26 is a waveform view showing operation timing relating to the read of odd page data.

1.-2.-1. "READ00" FIG. 26 shows the "READ00" operation.

In the "READ00" operation, a read potential (the potential of a selected word line) is set at Vcgr00 (e.g., about 0.7V) and it is recognized whether memory cell data is "11", "10" or "00" or "01".

The "READ00" operation is almost the same as the "READ01" operation except for the level of the read potential (the potential of the selected word line).

First, the potential of the selected word line is set at Vcgr00, the potentials of unselected word lines in a selected block are set at Vread, the bit line BLe is precharged and then turned into a floating state, and the potential of the bit line BLe is set at the ground potential Vss (where BLe is a selected bit line and BLo is a shield bit line).

Thereafter, at period RCLK7, when the potential SGS of the select gate line SG2 is set at Vread, the potential of the bit line BLe decreases or is maintained according to the selected memory cell data.

That is to say, if the selected memory cell data is "11" or "10", this selected memory cell is turned on by the potential Vcgr00. Due to this, the charges of the bit line BLe are discharged and the potential of the bit line BLe decreases to 0.3V or lower (while unselected memory cells in the selected memory cell block are turned on by the potential Vread).

On the other hand, if the selected memory cell data is "00" or "01", this selected memory cell is not turned on by the potential Vcgr00. Due to this, the charges of the bit line BLe are not discharged and the bit line BLe maintains the precharge potential (about 0.8V).

Thereafter, as in the same manner as the "READ01" operation, the potential of the bit line BLe is sensed and latched by the latch circuit LATCH1.

That is, at period SCLK6, the levels of both SEN and LAT are set at "L", those of SENB and LATB are set at "H" and the latch circuit LATCH1, i.e., the clocked inverters CINV1 and CINV2, is turned into a non-operation state.

At period SCLK7, when the potential of BLC is set at Vsg (about 4.5V) and the level of nPRST is set at "L", then the potential of the sense node DTNij becomes Vdd. At period SCLK8, when the level of the nPRST becomes "H", the sense node is turned into a floating state. At period SCLK9, the potential of BLCLMP becomes Vsense e.g., about 1.6V) and the potential of the bit line BLe is transmitted to the sense node.

At this time, if the memory cell data is "11" or "10", the potential of the bit line BLe is not higher than 0.3V. Due to this, the potential of the sense node DTNij decreases from Vdd to a potential of not higher than 0.3V. Further, if the memory cell data is "00" or "01", the bit line BLe maintains the precharge potential (about 0.8V). Thus, the clamping MOS transistor TN9 (see FIG. 9) is cut off and the sense node DTNij maintains the potential Vdd.

Thereafter, at period SCLK13, the level of SEN becomes "H", that of SENB becomes "L", and the clocked inverter CINV1 turns into an operation state (FIG. 9).

As a result, if the memory cell data is "11" or "10", the potential of the output node Nbij of the clocked inverter CINV1 becomes Vdd. If the memory cell data is "00" or "01", the potential of the output node Nbij of the clocked inverter CINV1 becomes Vss.

Further, at period SCLK14, the level of LAT becomes "H" and that of LATB becomes "L", and the clocked inverter CINV2 turns into an operation state (FIG. 9). That is, the read data (sense node data) is latched by the latch circuit LATCH1.

As a result of the "READ00" operation stated above, the data latched by the latch circuit LATCH1 becomes the data as shown in Table 3.

TABLE 3

| | Read data of odd page | | | |
|---|---|---|---|---|
| | "11" | "10" | "00" | "01" |
| Naij | Vss | Vss | Vdd | Vdd |

That is to say, in case of the memory cell having odd page data "1", the potential of the output node Naij of the latch circuit LATCH1 is Vss. In case of the memory cell having odd page data "0", the potential of the output node Naij of the latch circuit LATCH1 is Vdd.

Thereafter, the level of CSLi is set at "H", thereby outputting the data (odd page data) of the latch circuit LATCH1 to the I/O lines (IOj, nIOj) and externally of the memory chip.

Figure 27:
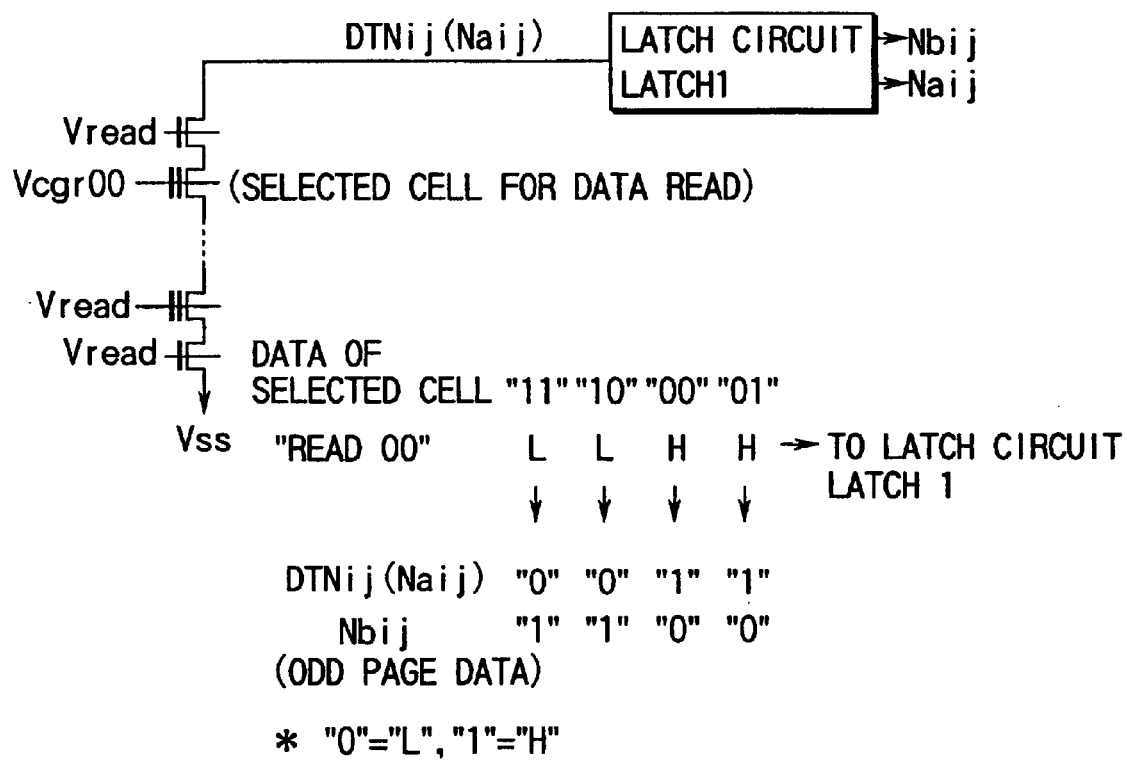
FIG. 27 shows the outline of read operation to odd page data.

It is noted that FIG. 27 shows the outline of the feature of the read operation of odd page data. Namely, in this embodiment, the data read in the "READ00" operation becomes odd page data as it is. Accordingly, in the odd page data read operation, only the latch circuit (SRAM cell) LATCH1, for example, is used and the DRAM cell is not used.

2. Program Operation

As outlined by FIGS. 21 and 22, the program operation consists of two program operations, i.e., an even page data program operation and an odd page data program operation.

2.-1. Program Operation of Even Page Data

First, the outline (operation flow) of the program operation of even page data will be described and then the concrete circuit operation thereof (operation timing) will be described.

Figure 28:
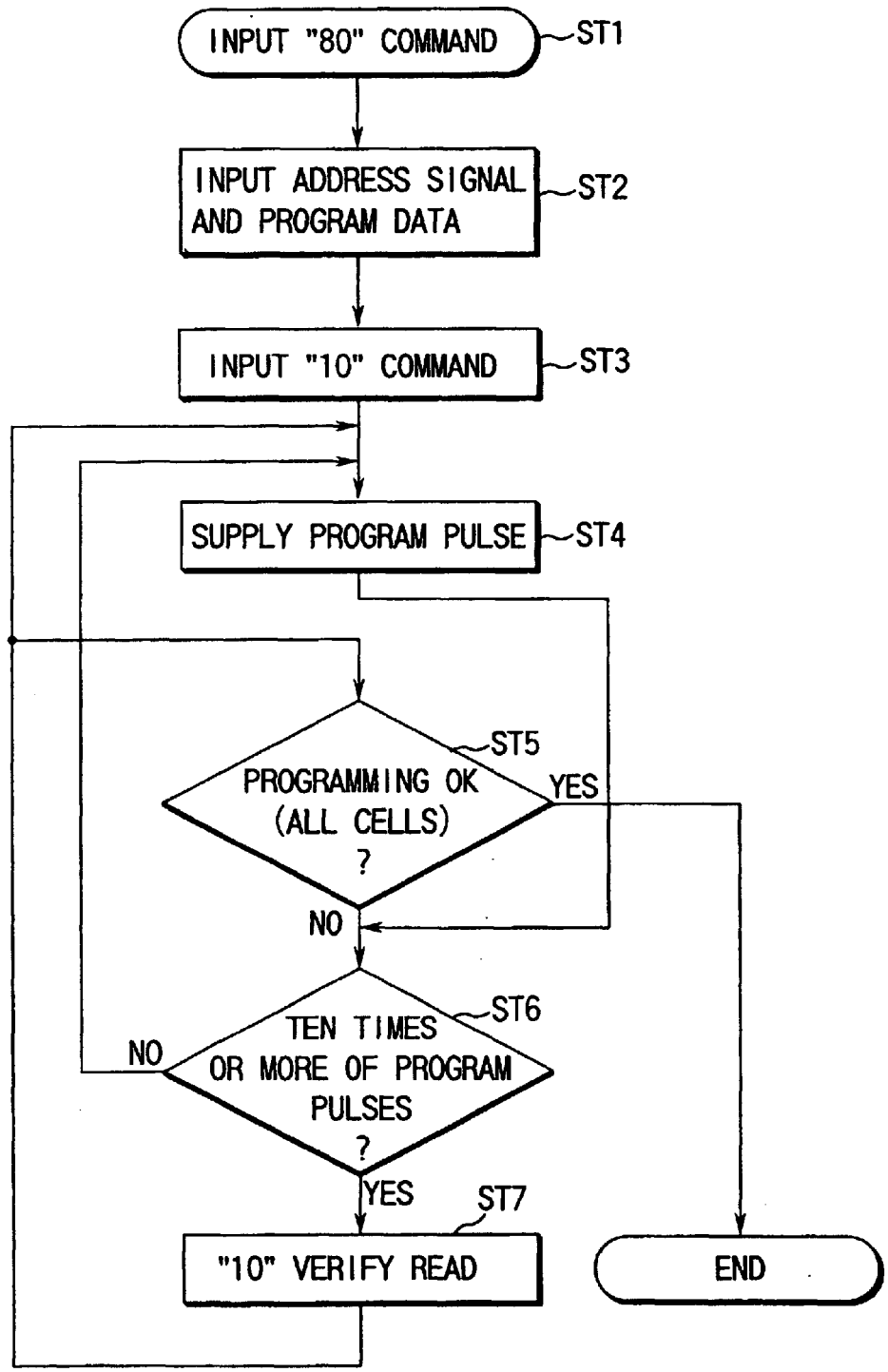
FIG. 28 is a flow chart showing even page data program operation.

FIG. 28 shows the outline of the program operation of even page data.

First, an "80 (hexadecimal)" command is inputted into the chip. Later, an address signal is inputted into the chip and even page program data is inputted into the chip. This program data is inputted into the latch circuit LATCH1 (FIG. 9) in the data circuit through the I/O lines IOj and nIOj in the chip (in steps ST1 to ST2).

Next, a "10 (hexadecimal)" command is inputted into the chip. Then, a program pulse is supplied to the word line of a memory cell (in steps ST3 to ST4).

Here, for the purpose of shortening program time (accelerating the program), this embodiment adopts a sequence (parallel processing) for detecting whether "10"-programming has been carried out sufficiently by supplying a program pulse the (n−1)-th time (a step ST5) as well as supplying a program pulse the n-th time (the step ST4).

As shown below, as another means for realizing shortened program time (acceleration of the program), this embodiment adopts a sequence for gradually increasing a program potential (magnitude of the program pulse) and not to conduct "10" verify-read at the beginning of the program operation.

In this embodiment, therefore, if the "10" verify-read is not conducted, a detection as to whether or not programming has been sufficiently conducted (the step ST5), is not made, either.

If the number of times at which a program pulse is supplied to the word line is not more than a predetermined number of times (e.g., nine times), the "10" verify-read is omitted and program pulses are continuously supplied (in a step ST6). This is because the program can be accelerated by omitting the verify-read at the beginning of the program operation.

The "10" verify-read (VERIFY10) means that in the verification for verifying whether data "10" has been successfully programmed into a memory cell to which "10"-programming is conducted, the memory cell data is read at a verify-read potential Vcgv10 (FIG. 20) so as to make the verification.

In this embodiment, the program potential (program pulse level) is set at an initial value and the supply of a program pulse starts. Thereafter, every time a program pulse is applied, the program potential applied to the word line is gradually increased by a predetermined value (e.g., about 0.2V).

For example, by increasing the program potential by about 0.2V, the width of the threshold voltage distribution of the memory cell in the "10"-programming state can be ideally set at about 0.2V. In the actual operation, the width of the threshold voltage distribution of the memory cell in the "10"-programming state is about 0.4V due to so-called array noise generated during the verify-read operation.

In FIG. 20, it is assumed that the width of the threshold voltage distribution of the memory cell in the program state ("10", "00" or "01") is about 0.4V.

During a period from the start of the program operation until the supply of program pulses, for example, nine times, the program potential is set sufficiently low and the memory cell to the "10"-programming is conducted is not excessively programmed (programmed so that the threshold voltage exceeds Vcgr00).

The reason that pulses having a low program potential is applied to the word line at the beginning, and every time a pulse is supplied, the program potential is gradually increased, is to gradually inject electrons into the floating gate electrode and finally accumulate a predetermined amount of electrodes in the floating gate electrode.

In that case, compared with a case of, for example, injecting a predetermined amount of electrons into the floating gate electrode by one program pulse, an electric filed applied to the tunnel oxide film of the memory cell by one program pulse is low and the reliability of the tunnel oxide film is, therefore, improved.

Further, the program potential (program pulse level) is gradually increased from a lower value to a higher value. Namely, in case of gradually increasing the program potential, the width of the threshold voltage distribution of the memory cell can be empirically narrowed compared with a case of setting an initial program potential at a high value and gradually decreasing this program potential.

If the number of times at which program pulses are supplied to the word line is, for example, 10 times or more, after program pulses are supplied to the word line, "10", verify-read is carried out (in steps ST6 to ST7) so as to verify whether or not the data "10" has been successfully programmed into the memory cell to which the "10"-programming is conducted.

Further, the data read from the memory cell by the "10" verify-read is data indicating whether "10"-programming has been sufficiently carried out, and the data is stored in the latch circuit LATCH1 in the data circuit.

Then, when the next program pulse is supplied to the word line (in the step ST4), an operation for verifying whether "10"-programming has been sufficiently carried out by the previous program pulse (Program Completion Detection) is executed based on the data in the latch circuit LATCH1 (in a step ST5).

To be specific, as shown in FIG. 21, in the even page data program operation, "11"-programming and "10"-programming are included. "11"-programming means maintaining the erase state ("11"). "10"-programming means increasing the threshold voltage by program pulses and changing the "11" state into the "10" state.

If predetermined data "11" or "10" has been sufficiently programmed into all selected memory cells (columns) (or, actually, if data "10" has been successfully programmed into the memory cell to which the "10"-programming is conducted), the even page data program operation is completed.

If the predetermined data "11" or "10" has not been sufficiently programmed into at least one selected memory cell (column) (or, actually, the data "10", has not been sufficiently programmed into all memory cells to which "10"-programming is conducted), the "10" verify-read operation and the supply of program pulses are continued.

Normally, thereafter, a high electric field is not applied to the tunnel oxide film of the memory cell which has been programmed sufficiently and a high electric field is applied to the tunnel oxide films of only the memory cells which have not been programmed sufficiently, thereby preventing excessively programming the memory cells having good program characteristics.

In the meantime, in this embodiment, the operation for detecting whether the program is carried out sufficiently/insufficiently (Program Completion Detection) is executed simultaneously with the operation for the supply of a program pulse to the word line. Alternatively, the program completion detection may be carried out right after the "10" verify-read and, if the result of the program completion detection is not satisfactory, a program pulse may be applied again.

The outline of the program operation of the even page data has been described so far.

As stated above, the even page data program operation consists of the supply of program pulses, the "10" verify-read (VERIFY10) and the program completion detection (detection as to whether or not program has been carried out sufficiently).

Now, these three operations will be described one by one in detail.

2.-1.-1 Supply of Program Pulse

Figure 29:
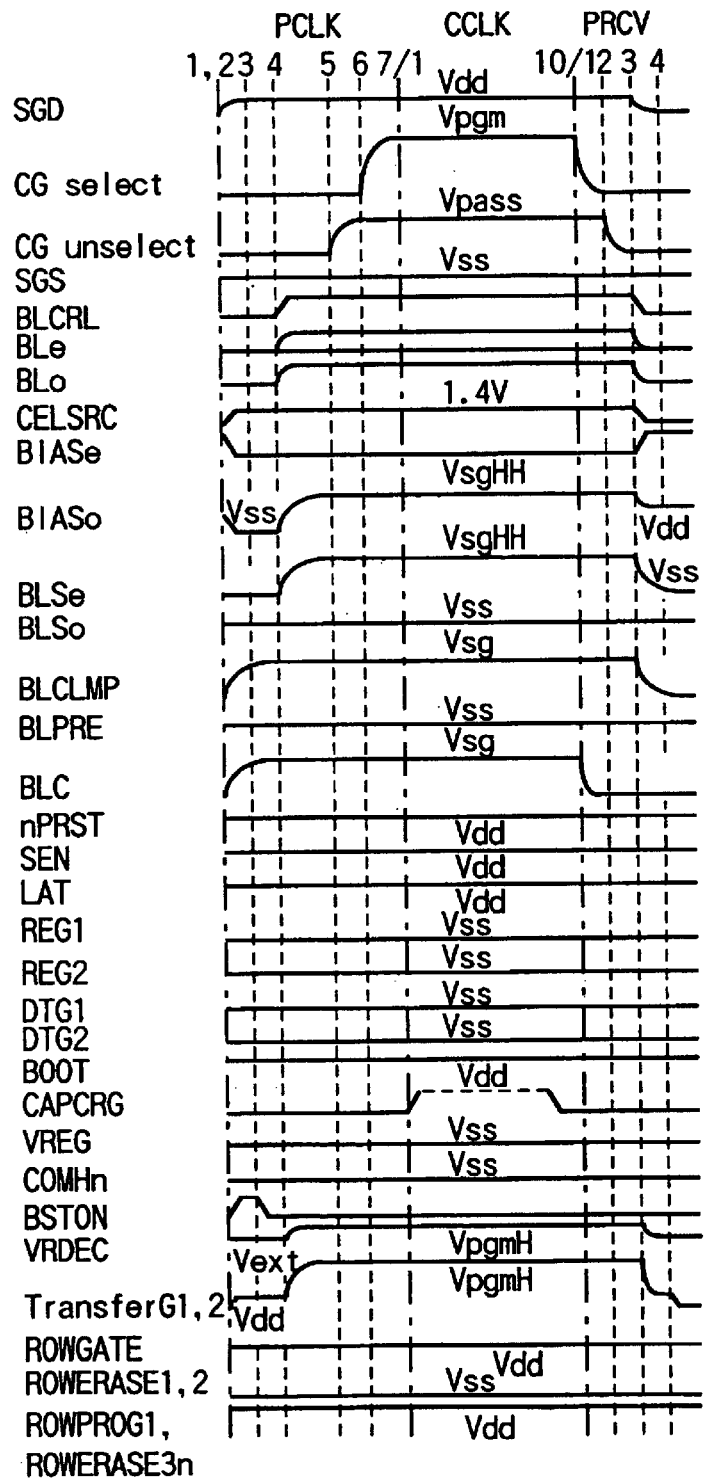
FIG. 29 is a waveform view showing operation timing relating to the supply of a program pulse during program operation.

FIG. 29 shows operation timing relating to the supply of program pulses.

At the data circuit (column) side, if "10"-programming is conducted (even page data "0" is programmed into a memory cell), program data is inputted into the latch circuit LATCH1 (FIG. 9) externally of the memory chip and the node Naij of the latch circuit LATCH1 is latched to "L".

If "11"-programming is conducted (even page data "1" is programmed into a memory cell), program data is inputted into the latch circuit LATCH1 (FIG. 9) externally of the memory chip and the node Naij of the latch circuit LATCH1 is latched to "H".

At the word line control circuit (row) side, first, the level of RDECPB is set at "L" in the row decoder (FIGS. 16 and 18). At this time, the levels of both RDECAD (FIG. 16) and RDECADS1 (FIG. 18) are "L (Vss)" and all memory cell blocks are in an unselected state.

Thereafter, the level of RDECPB is changed from "L" to "H". At this moment, the MOS transistor TP4 is turned off and the MOS transistor TN21 is turned on (FIGS. 16 and 18).

Further, in a selected memory cell block, the levels of all row address signals AROWi, AROWj become "H" and the levels of both RDECAD (FIG. 16) and RDECADS1 (FIG. 19) become "H". In unselected memory cell blocks, since the level of at least one of the row address signals AROWi, . . . AROWj is "L", RDECAD (FIG. 16) and RDECADS1 (FIG. 18) maintain "L".

In the word line driver (FIGS. 17 and 19) in the selected memory cell blocks since the levels of the input signals RDECAD and RDECADS1 become "H", the high voltage switching circuit (NMOS charge-pumping circuit) 26 is actuated by an oscillation signal (clock signal) Owc.

Accordingly, in the word line driver (FIGS. 17 and 19) in the selected memory cell block, a boosting potential VpgmH (a potential higher than the program potential Vpgm by about 2V) generated based on the potential VRDEC is transferred to the output node of the high voltage switching circuit 26.

For example, if the word line driver RMAIN1 (FIG. 17) in the first memory cell block is selected, the potential VpgmH (e.g., about 18 to 22V) is transferred to the output node TransferG1. If the word line driver RMAIN2 (FIG. 19) in the second memory cell block is selected, the potential VpgmH is transferred to the output node TransferG2.

As a result, the gates of the transfer transistors HNt1, HNt2, . . . HNt16 have sufficiently high potentials and the potentials of the signal lines CG1, CG2, . . . CG16 are transferred to the word lines (control gate lines) WL1, WL2, . . . WL16 through the transfer transistors HNt1, HNt2, . . . HNt16, respectively, without so-called threshold drop.

Also, the potentials of the signal lines SGD and SGS are transferred to the select gate lines SG1 and SG2 through the transfer transistors HN5 and HN6, respectively.

Here, among the signal lines CG1, CG2, . . . CG16, the potential of one selected signal line is set at Vpgm (e.g., about 16 to 20V) by the switching circuit (FIG. 8) and the potentials of the remaining unselected signal lines are set at Vpass (e.g., about 10V) by the switching circuit (FIG. 8).

Further, the potential of the signal line SGD is set at Vdd and that of the signal line SGS is set at Vss.

In the word line drivers (FIGS. 17 and 19) in unselected memory cell blocks, the potentials of RDECAD and RDECADS2 are transferred to the output nodes TransferG1 and TransferG2 of the high voltage switching circuit 26, respectively.

Namely, in the word line drivers (FIGS. 17 and 19) in the unselected memory cell blocks, the potentials of both the output nodes TransferG1 and TransferG2 become the ground potential Vss.

As a result, the transfer transistors HNt1, HNt2, . . . HNt16 are turned off and the word lines (control gate lines)

WL1, WL2, ... WL16 are turned into a floating state. The select gate lines SG1 and SG2 are grounded by the signal lines SGS and SGD, respectively.

The operation timing shown in FIG. 29 will be described in detail.

It is noted that description will be given while assuming that a memory cell connected to the bit line BLe is selected.

At the row side (word line control circuit side), at period PLCK1, the level of BSTON becomes "H". At this time, in the selected memory cell block, the potential Vdd (RDECAD or RDECADS2) is transferred to the output node (TransferG1 or TransferG2) of the high voltage switching circuit in the word line driver.

At period PCLK3, the level of BSTON becomes "L". At period PCLK4, the potential of VRDEC becomes VpgmH. Due to this, in the selected memory cell block, the potential of the output node (TransferG1 or TransferG2) of the high voltage switching circuit in the word line driver rises to VpgmH.

At the column side (data circuit side), on the other hand, at period PCLK1, the potentials of BLC and BLCLMP become Vsg (e.g., about 6V) and at period PCLK4, the potential of BLSe becomes VsgHH. As a result, the latch circuit LATCH1 and the bit line BLe are electrically connected to each other and the data in the latch circuit LATCH1 is transferred to the bit line BLe.

For example, the potential Vss is transferred from the latch circuit LATCH1 to a bit line (selected bit line) BLe to which a memory cell, to which the "10"-programming is conducted, is connected (while the potential of the node Naij of-the latch circuit is Vss). Also, the potential Vdd is transferred from the latch circuit LATCH1 to the bit line (selected bit line) BLe to which a memory cell, to which "11"-programming is conducted, (a memory cell maintained in an erase state) is connected (while the potential of the node Naji of the latch circuit is Vdd).

The potential of the unselected bit line BLo is set at Vdd. Namely, the potential of BLSO is always set at Vss. At period PLCK4, the potential of BIASo becomes VsgHH and that of BLCRL becomes Vdd, so that the potential Vdd is transferred from BLCRL to the bit lines BLo.

Then, after completing charging the bit lines BLe and BLo, at period PCLK5, the potentials of unselected word lines CG unselect are set at Vpass (e.g., about 10V). At period PCLK6, the potential of the selected word line CG select is set at Vpgm (e.g., about 16 to 20V).

The potential of the selected bit line BLe to which a memory cell, to which "10"-programming is conducted, is connected is Vss. Due to this, the channel potential of the memory cell is Vss, as well. Accordingly, in the memory cell to which "10"-programming is conducted, a high electric field is applied between the channel and the control gate electrode (selected word line) and electrons are injected from the channel into the floating gate electrode.

The potential of the bit line BLe to which a memory cell, to which "11"-programming is conducted, is Vdd and that of the select gate line SG1 is Vdd, as well. That is, the select transistor connected between the memory cell, to the "11"-programming is conducted, and the bit line is cut off.

Consequently, if the potentials of the unselected word lines become Vpass and the potential of the selected word line becomes Vpgm, the channel potential of the memory cell, to the "11"-programming is conducted, rises up to about 8V by the capacitive coupling between the channel of the memory cell, to which "11"-programming is conducted, and the word line.

As a result, in the memory cell to which "11"-programming is conducted, a high electric field is not applied between the channel and the control gate electrode (selected word line) and no electrons are injected from the channel into the floating gate electrode (which means that "10"-programming is inhibited, that is, the erase state is maintained).

Meanwhile, the potential of the bit line BLo is Vdd. Therefore, if the potential of the select gate SG1 becomes Vdd, the select transistor connected to the bit line BLo is cut off. That is, in unselected memory cells connected to the bit lines BLo, channel potential rises and "10"-programming is inhibited.

It is noted that the program pulse is supplied to the selected word line during time from period PCLK6 until period CCLK10/PRCV1.

At period PRCV1, the charges of the selected word line are discharged to change the potential of the selected word line from Vpgm to Vss. At period PRCV2, the charges of the unselected word lines are discharged to change the potentials of the unselected word lines from the transfer potential Vpass to Vss. Further, at period PRCV3, the charges of the bit lines BLE and BLo are discharged.

Figure 30:
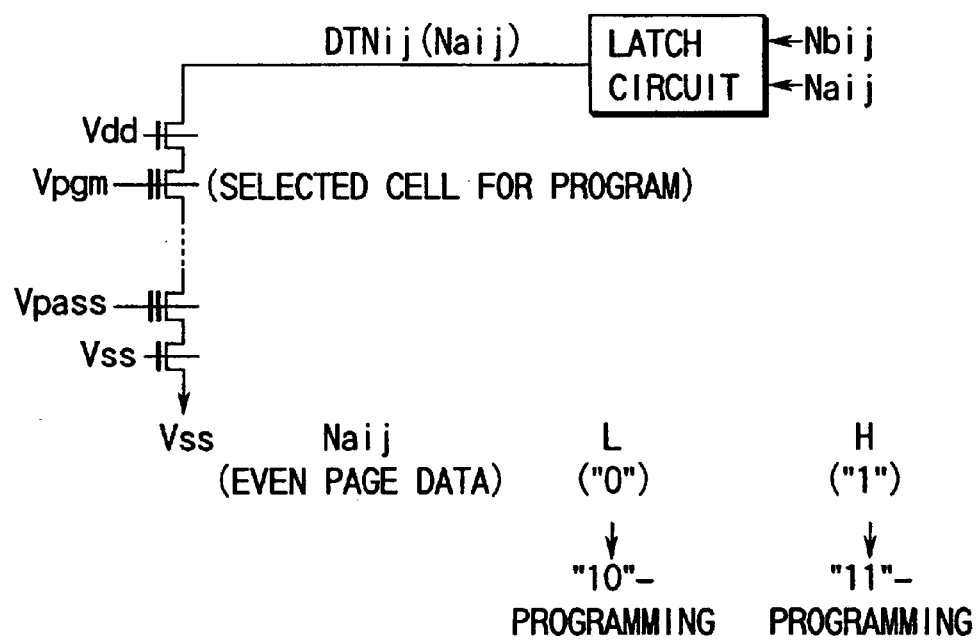
FIG. 30 shows the outline of the supply of a program pulse during the program operation.

FIG. 30 shows a state in which a program pulse is supplied. Namely, if even page data is "0", the ground potential Vss ("L") is transferred to the channel of the program cell. If even page data is "1", the potential of the program cell is Vdd-Vth and in a floating state.

2.-1.-2. "VERIFY10"

Figure 31:
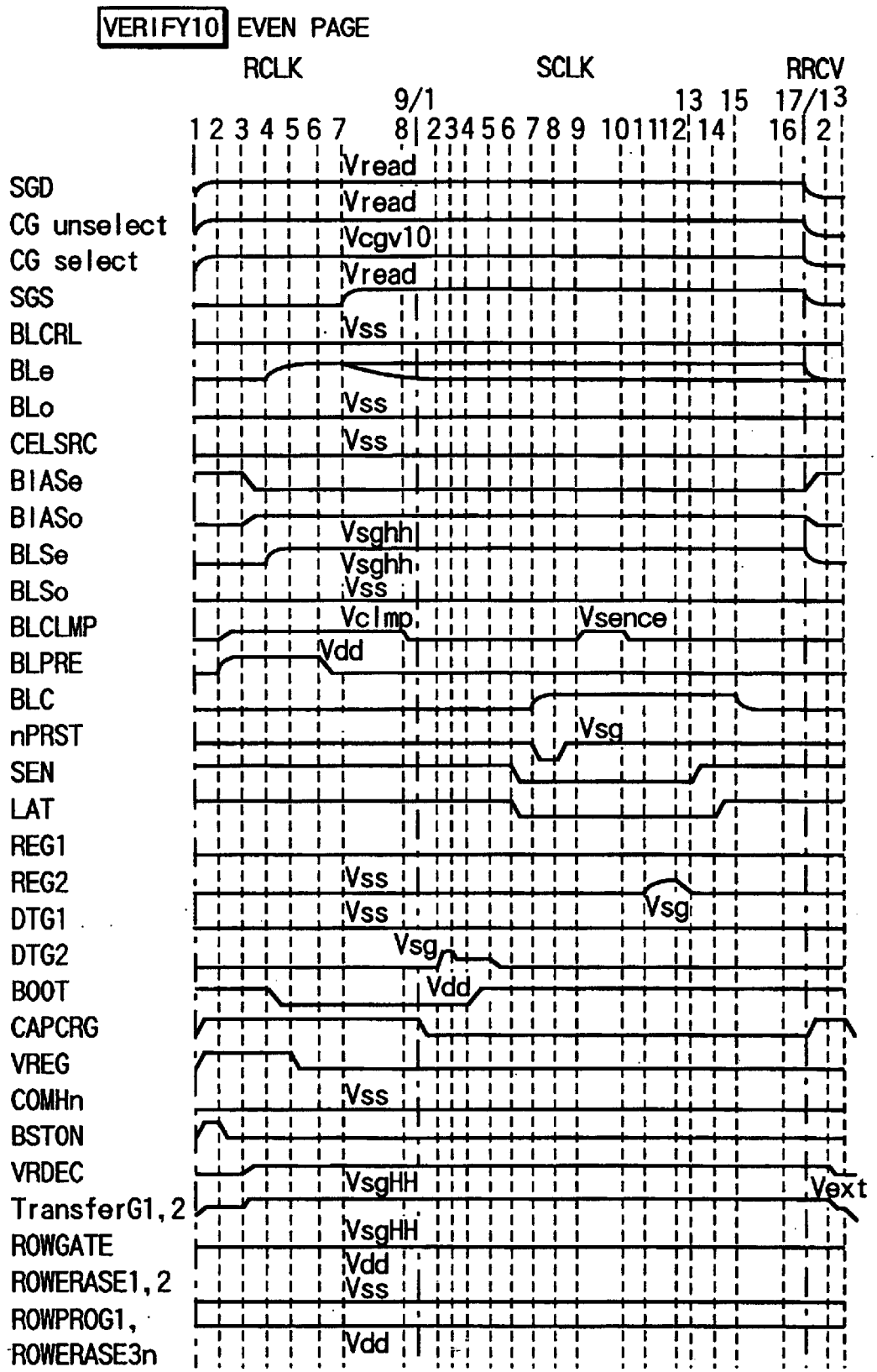
FIG. 31 is a waveform view showing operation timing relating to "10" verify read during the program operation.

FIG. 31 shows operation timing for "10" verify read.

In the "10" verify-read (VERIFY10) operation, after the bit line is precharged, the potential of a selected word line is set at Vcgv10 (e.g., about 0.15V), a change in the potential of the bit line is detected and memory cell data is read.

Here, since program data is already latched by the latch circuit LATCH1 (FIG; 9), it is necessary not to collide the read data against the program data in the verify-read operation.

To prevent such collision, while precharging and discharging the bit line (reading cell data), the program data stored in the latch circuit LATCH1 is transferred to the node CAP2ij and temporarily stored therein.

More concrete description will be given hereinafter.

First, at period PCLK1, the potentials of CAPCRG and VREG are set at Vdd. At period RCLK, the potential of BOOT is set at Vss. At period RCLK5, when the potential of VREG becomes Vss, the potential of the node CAP3ij is reset at Vss. During these periods, the potential of DTG2 is Vss.

At period RCLK9/SCLK1, the potential of CAPCRG becomes Vss and the node CAP2ij turns into a floating state. Then, at period SCLK2, the potential of DTG2 becomes Vsg (e.g., about 4.5V) and the program data latched by the latch circuit LATCH1 is transferred to the node CAP2ij by way of the MOS transistor TN2 and is temporarily stored therein.

In other words, if even page program data is "0" ("10"-programming is conducted), the level of the node Naij of the latch circuit LATCH1 is "L" and the potential of the node CAP2ij, therefore, becomes Vss.

If even page program data is "1" ("11"-programming is conducted, the level of the node Naij of the latch circuit LATCH1 is "H" and the potential of the node CAP2ij, therefore, becomes Vdd.

Then, at period SCLK3, the potential of DTG2 becomes Vdd and at period SCLK4, the potential of BOOT becomes Vdd.

Here, if even page program data is "0" ("10"-programming is conducted), the potential of the node CAP2ij remains Vss. If even page program data is "1" ("11"-programming is conducted), the potential of the node CAP2ij is booted by the capacitor DLN (C2) and rises from Vdd (e.g., about 2.3V) to about 3.5V.

Thereafter, at period SCLK5, the potential of DTG2 becomes Vss and the node CAP2ij is electrically disconnected from the latch circuit LATCH1.

On the other hand, the memory cell data is read to the bit line BLe in the same manner as the ordinary read operation (READ10).

Namely, after precharging the bit line BLe or the like, at period RCLK7, the potential of the SGS becomes Vread and that of the bit line BLe changes according to the memory cell data.

For example, in the selected memory cell to which "11"-programming is conducted (the selected memory cell having even page program data "1"), the selected memory cell is turned on by the potential Vcgv10. Due to this, the charges of the bit line BLe are discharged and the potential of the bit line BLe becomes not higher than 0.3V.

Further, in the selected memory cell to which "10"-programming is conducted (in the selected memory cell having even page program data "0"), if "10"-programming is insufficient, the selected memory cell is turned on by the potential Vcgv10. Due to this, the charges of the bit line BLe are discharged and the potential of the bit line BLe becomes not lower higher than 0.3V.

In the selected memory cell to which "10"-programming is conducted (the selected memory cell having even page program data "0"), if "10"-programming is sufficient, the selected memory cell is turned off by the potential Vcgv10. Due to this, the charges of the bit line BLe are not discharged and the potential of the bit line BLe is maintained 0.8V.

Thereafter, at period SCLK6, the levels of both SEN and LAT become "L", those of both SENB and LATB become "H" and the latch circuit LATCH1 in the data circuit, i.e., clocked inverters CINV1 and CINV2, turns into a non-operation state.

At this moment, the program data has been already transferred to the node CAP2ij and at period SCLK5, the node CAP2ij has been already electrically disconnected from the latch circuit LATCH1.

At period SCLK7, since the potential of BLC becomes Vsg (e.g., about 4.5V) and the level of nPRST becomes "L", the sense node DTNij is charged and the potential of the sense node becomes Vdd (while the potential of Naij becomes Vdd, as well). At period SCLK8, when the potential of nPRST becomes Vdd, the sense node DTNij turns into a floating state.

At period SCLK9, when the potential of BLCLMP becomes Vsense (e.g., about 1.6V), the memory cell data read to the bit line BLe is transferred to the sense node DTNij.

Namely, as for a memory cell which has been programmed insufficiently out of the selected memory cell to which "11"-programming is conducted (the selected memory cell having even page program data "1") and the selected memory cell to which "10"-programming is conducted (the selected memory cell having even page program data "0"), the potential of the bit line BLe is not higher than 0.3V and that of the sense node DTNij decreases to a potential not higher than 0.3V, as well.

As for a memory cell which has been programmed sufficiently out of the selected memory cells to which "10"-programming is conducted (the selected memory cell having even page program data "0"), the potential of the bit line BLe is maintained 0.8V. Due to this, the clamping MOS transistor TN9 is cut off and the sense node DTNij maintains the potential Vdd.

At period SCLK10, the potential of the sense node DTNij becomes the potential as shown in Table 4.

TABLE 4

| | Sense node (DTNij · Naij) in "VERIFY 10" | | |
|---|---|---|---|
| | "11"-programming (Write inhibit) | "10"-programming Deficient | "10"-programming Sufficient |
| Point of SCLK 10 | "LOW" | "LOW" | "HIGH" |
| Point of SCLK 12 | "HIGH" | "LOW" | "HIGH" |

Thereafter, differently from the ordinary read operation (READ10), at period SCLK11, the potential of REG2 becomes Vsg and the MOS transistor TN6 is turned on in the "10" verify read operation.

If "11"-programming is conducted (even page program data is "1"), the node CAP2ij is latched to "H" and the MOS transistor TN1 is, therefore, turned on. That is, the COMi (set at Vdd) and the sense node DTNij are short-circuited, with the result that the potential of the sense node DTNij becomes Vdd.

If "10"-programming is conducted (even page program data is "0"), the node CAP2ij is latched to "L" and the MOS transistor TN1 is, therefore, turned off. That is, the COMi (set at Vdd) and the sense node DTNij are electrically disconnected from each other and the potential of the sense node DTNij has no change.

Accordingly, at period SCLK12, the potential of the sense node DTNij becomes the potential as shown in the above table 4.

Then, at period SCLK13, the potential of SEN becomes Vdd, that of SENB becomes Vss, and the clocked inverter CINV1 turns into an operation state to thereby sense the potential of the sense node DTNij.

As shown in Table 4 above, if "11"-programming is conducted and "10"-programming is sufficient, the level of the sense node DTNij is "H". Due to this, the potential of the output node Nbij of the clocked inverter CINV1 becomes Vss. If "10"-programming is deficient, the level of the sense node DTNij is "L" and the potential of the output node Nbij of the clocked inverter CINV1, therefore, becomes Vdd.

Thereafter, at period SCLK14, the potential of LAT becomes Vdd, that of LATB becomes Vss and read data is latched by the latch circuit LATCH1.

That is to say, if "11"-programming is conducted and "10"-programming is deficient, the potential of the node Naij becomes Vdd and that of the node Nbij becomes Vss. If "10"-programming is deficient, the potential of the node Naij becomes Vss and that of the node Nbij becomes Vdd.

The data in the latch circuit LATCH1 at a point at which the "10" verify read operation is completed becomes the data as shown in Table 5.

TABLE 5

Data of latch circuit LATCH1 after "VERIFY 10"

|  | "11"-programming (Write inhibit) | "10"-programming Deficient | "10"-programming Sufficient |
|---|---|---|---|
| Naij | "Vdd" | "Vss" | "Vdd" |
| Nbij | "Vss" | "Vdd" | "Vss" |

The data in the latch circuit LATCH1 is later used as new program data (even page data). Namely, in the "VERIFY10" operation, the data latched by the node CAP2ij is erased in Program completion detection which will be described later.

By doing so, if program data (even page data) is "0" (i.e., "L"), the program ("10"-programming) is executed. If program is deficient, the program data is changed from "0" ("L") to "1" ("H") and the program ("10"-programming) is not executed thereafter.

In the meantime, in the above-stated "10" verify-read operation, at period SCLK4, the potential of BOOT is changed from Vss to Vdd and that of the node CAP2ij in case of "11"-programming is booted to about 4V. This is because the sense node DTNij is to be set at Vdd without the threshold drop corresponding to the threshold voltage of the N channel MOS transistor TN1 when the potential of REG2 is set at Vsg at period SCLK11.

Providing that the potential of the node CAP2ij is Vdd (e.g., about 2.3V) in case of "11"-programming, the sense node DTNij rises only to about 1.5V at period SCLK11.

While it is considered that the potential of the sense node, i.e., 1.5V can be recognized as "H" in logical operation, a through current disadvantageously flows into the clocked inverter CINV1 during the sense operation (at period SCLK13). Since the number of data circuits in a chip is 4,000, 8,000 or 16,000, if a through current flows into the clocked inverters CINV1 of all of the data circuits, the total current becomes as high as about 100 mA.

As a result, the internal power supply potential Vdd disadvantageously drops or consumption current increases considerably.

As described in this embodiment, if the potential of the node CAP2ij in case of "11"-programming is booted to about 4V, the sense node DTNij can be charged without the threshold drop at the MOS transistor TN1 and it is possible to prevent the power supply potential Vdd from dropping or consumption current from increasing as stated above.

Figure 32:
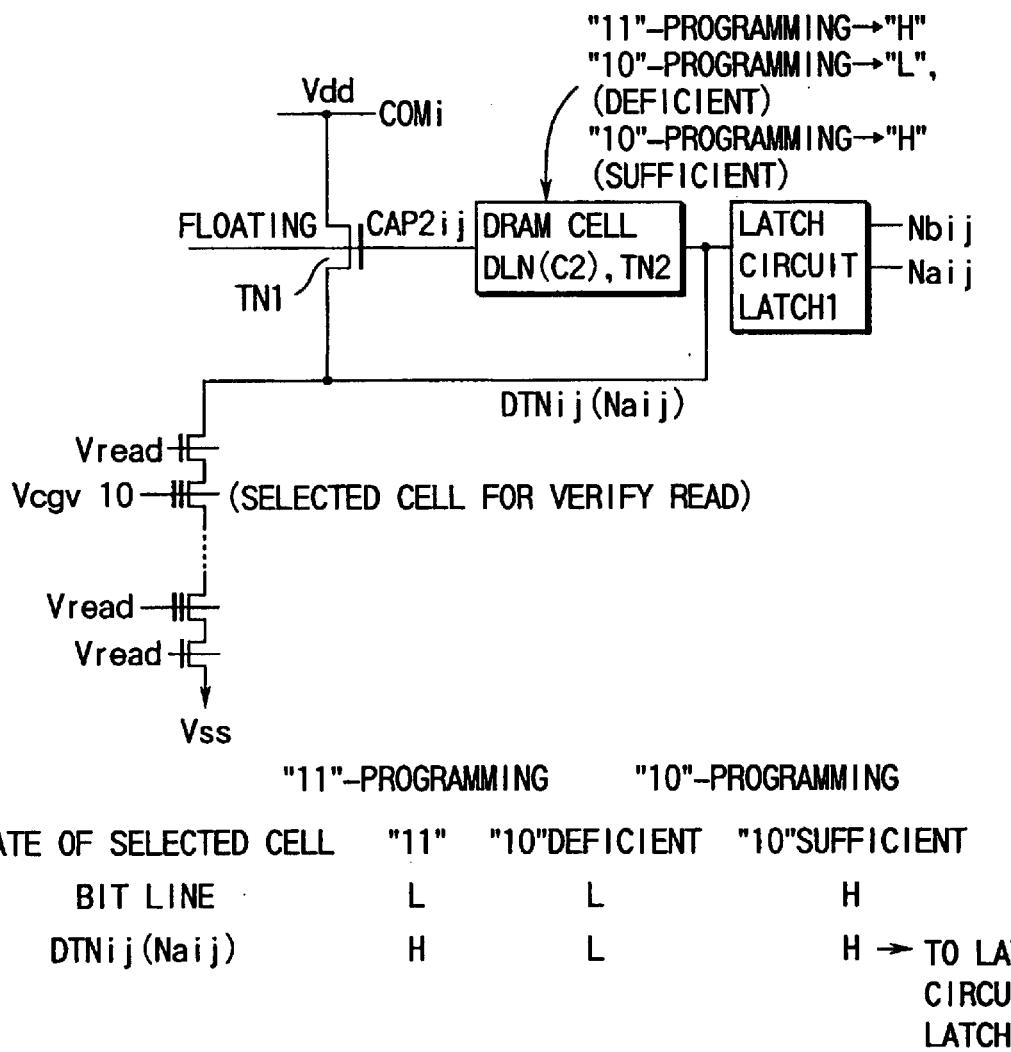
FIG. 32 shows the outline of "10" verify read during the program operation.

FIG. 32 shows the outline of the "10" verify-read operation. Namely, after the program data latched by the latch circuit LATCH1 is transferred to the DRAM cell, the read data is transferred to the sense node DTNij.

At this time, if the data latched by the DRAM cell is "H", i.e., the data indicates that "11"-programming is conducted "10"-programming is sufficient, the level of the sense node DTNij becomes "H" irrespectively of the read data.

That is to say, only when the data latched by the DRAM cell is "L", i.e., the data indicates that "10"-programming is deficient, the data according to the memory cell state is transferred to the sense node DTNij.

For example, if the memory cell state does not reach the "10" state ("10"-programming is deficient), the level of the sense node DTNij becomes "L". If the memory cell state reaches the "10" state ("10"-programming is sufficient), the level of the sense node DTNij becomes "H".

The data of the sense node DTNij is latched by the latch circuit LATCH1.

Following the above, the next program pulse is supplied and the next "10" verify-read operation is conducted based on the data latched by the latch circuit LATCH1.

2.-1.-3. "Program Completion Detection"

After "VERIFY10", "Program completion detection" operation for detecting whether or not "10"-programming has been successfully conducted to all memory cells to "10"-programming is conducted, is carried out. This detection is made based on the data (see Table 5) latched by the latch circuit LATCH1 in the "VERIFY10" operation. If "10"-programming is detected to be deficient, reprogram (supply of program pulses) is executed. If "10"-programming is sufficient, the program (supply of program pulses) is completed.

Figure 33:
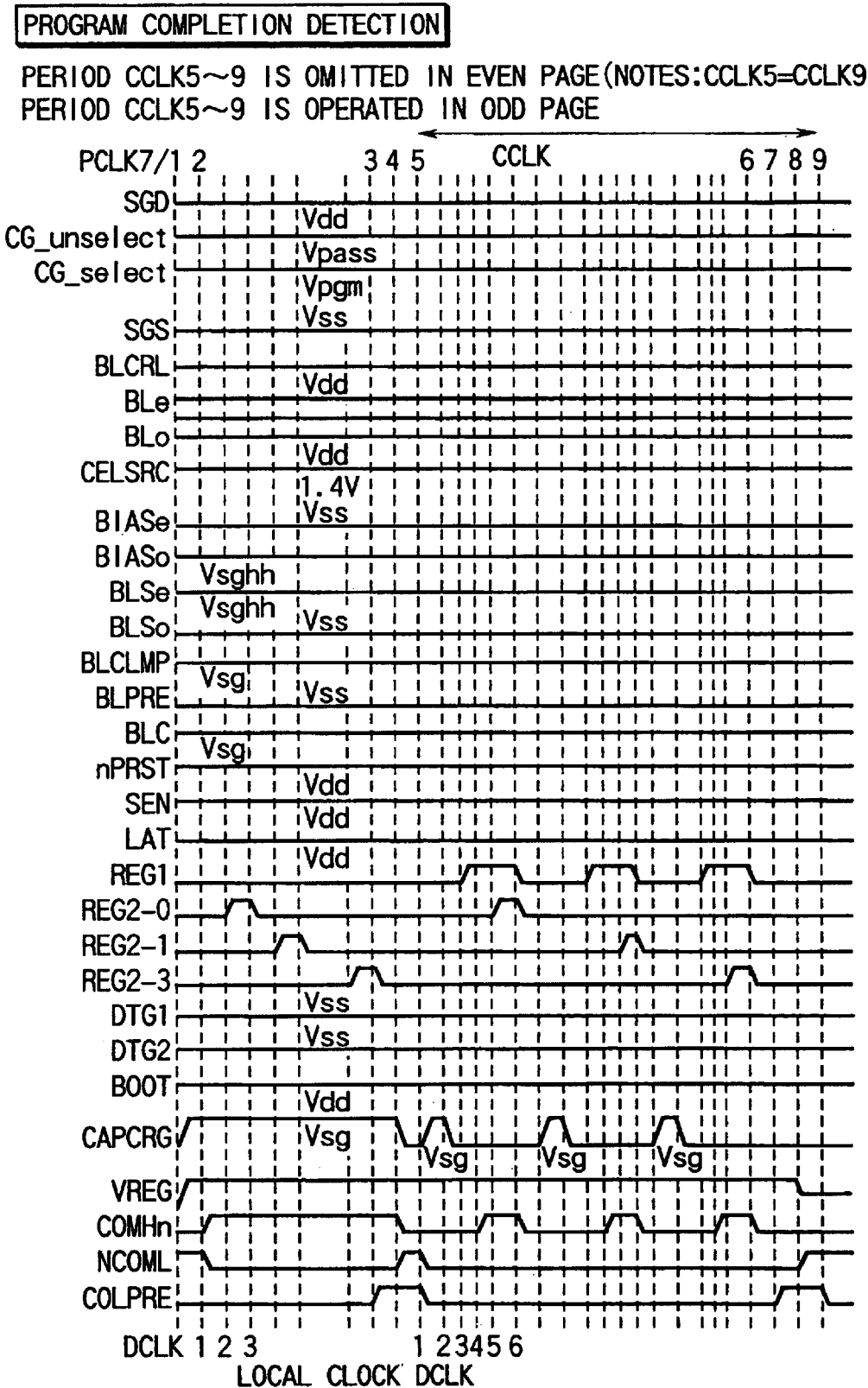
FIG. 33 is a waveform view showing operation timing relating to "Program completion detection" during the program operation.

FIG. 33 shows the operation timing of "Program completion detection" operation.

In this "Program completion detection" operation, the batch detection circuit shown in FIG. 12 is used.

As described in the outline of operation with reference to FIG. 26, after the completion of "VERIFY10", the next "supply of programming pulses" is instantly started and "Program completion detection" is executed in parallel to the "supply of "programming pulses".

Accordingly, period PCLK7/CCLK1 is the same as the period PCLK7/CCLK1 shown in FIG. 29.

Further, in "Program completion detection" during the program operation of even page data, the period CCLK5 in FIG. 33 becomes the period CCLK9. Namely, operations until the period CCLK5 are executed and those from periods CCLK5 to CCLK9 are omitted.

It is noted that the operations from periods CCLK5 until CCLK9 are executed in "Program completion detection" in the program operation of odd page data to be described later.

First, at period CCLK1, the potential of CAPCRG becomes Vsg and that of Vreg becomes Vdd, the node CAP2ij is charged and the potential of the node CAP2ij becomes Vdd (while the potential of DTG2 is Vss).

At this time, the data (even page data) latched by the node CAP2ij in "VERIFY10" is erased. However, since new-program data has been already latched by the latch circuit LATCH1 in "VERIFY10", program data is not completely erased.

That is, when program data (even page data) is "0" (i.e., "L"), the program ("10"-programming) is executed. If the program is sufficient, the program data is changed from "0" to "1" and the program ("10"-programming) is not executed thereafter.

Then, at period CCLK2 (DCLK1), when the potential of COMHn (FIG. 12) is changed from Vss to Vdd and that of NCOML (FIG. 12) is changed from Vdd to Vss, the potentials of COMi1 and COMi2 become Vdd and turn into a floating state and the potential of NCOM becomes Vss and turns into a floating state.

At period DCLK2, the potential of REG2-0 becomes, for example, Vdd. At this time, in FIG. 12, the first to fifth data circuits are selected, and the potential of REG2 in the first data circuit and that of REG2 in the fifth data circuit become Vdd.

In both the first and fifth data circuits, if the potential of the node Naij of the latch circuit LATCH1 is Vdd (see Table 5), i.e., "11"-programming (write inhibit) is conducted or "10"-programming is sufficient, then the sense node DTNij maintains the potential Vdd. Thus, the MOS transistor TN6 (FIG. 9) is turned off and COMi1 and COMi2 maintain the potential Vdd. Accordingly, NCOM maintains the potential Vss.

On the other hand, if the potential of the data of the node Naij of the latch circuit LATCH1 is Vss (see Table 5) in at least one of the first and fifth data circuits, i.e., if "10"-programming is deficient, then the sense node DTNij maintains the potential Vss. Due to this, the MOS transistor TN6 (FIG. 9) is turned on and the potentials of COMi1 or COMi2 changes from Vdd to Vss. Accordingly, the potential of NCOM changes from Vss to Vdd.

Likewise, the potentials of REG2-1, REG2-2 and REG2-3 sequentially become Vdd. Namely, when the potential of REG2-1 is Vdd, the second and sixth data circuits are selected. When the potential of REG2-2 is Vdd, the third and seventh data circuits are selected. When the potential of REG2-3 is Vdd, the fourth and eighth data circuits are selected. In each data circuit, a state of the latch circuit LATCH1, i.e., whether "10"-programming is sufficient/deficient, is detected.

As a result, if data indicating that "11"-programming (write inhibit) is conducted or that "10"-programming is sufficient is outputted from all of the first to eighth data circuits, the potential of NCOM becomes Vss at period CCLK3. Further, if data indicating that "10"-programming is deficient is outputted from at least one of the first to eighth data circuits, the potential of NCOM becomes Vdd at period CCLK3.

Furthermore, all columns are connected in parallel to the FLAG node (FIG. 12). Accordingly, the FLAG node is preset to have the potential Vdd and in a floating state. Then, at period CCLK3, the potential of COLPRE is set at Vdd and the MOS transistor TN17 (FIG. 12) is turned on.

At this time, if data indicating that "11"-programming (write inhibit) is conducted or that "10"-programming is sufficient is outputted from all data circuits corresponding to all columns, the potential of NCOM is Vss and the MOS transistor TN16 (FIG. 12) is, therefore, turned off. Accordingly, the FLAG node maintains the potential Vdd.

Further, if data indicating that "10"-programming is deficient is outputted from at least one of all data circuits corresponding to all columns, the potential of NCOM becomes Vdd and the MOS transistor TN16 (FIG. 12) is, therefore, turned on. Accordingly, the potential of the FLAG node changes from Vdd to Vss.

As can be understood from the above description, only when a memory cell to which "10"-programming has been conducted deficiently, does not exist in all columns, the FLAG node maintains the potential Vdd. If a memory cell to which "10"-programming has been conducted deficiently, exists in at least one column, the potential of the FLAG node changes to Vss.

Therefore, if the level of this FLAG node is detected and the potential of the FLAG node is Vdd, i.e., there does not exist a column (memory cell) for which "10"-programming is deficient, an even page data program routine is finished. If the potential of the FLAG node is Vss, i.e., there exists at least one column (memory cell) for which "10"-programming is deficient, "10" verify-read is conducted again and then Program completion detection is conducted in parallel with the supply of a program pulse.

In a fail column replaced by a spare cell by the redundancy circuit due to the presence of a fail cell (it is assumed that a replacement unit is eight columns), the fuse element of the batch detection circuit 10 shown in FIG. 12 is cut off. Accordingly, the potential of the FLAG node does not become Vss because of such a fail column.

Figure 34:
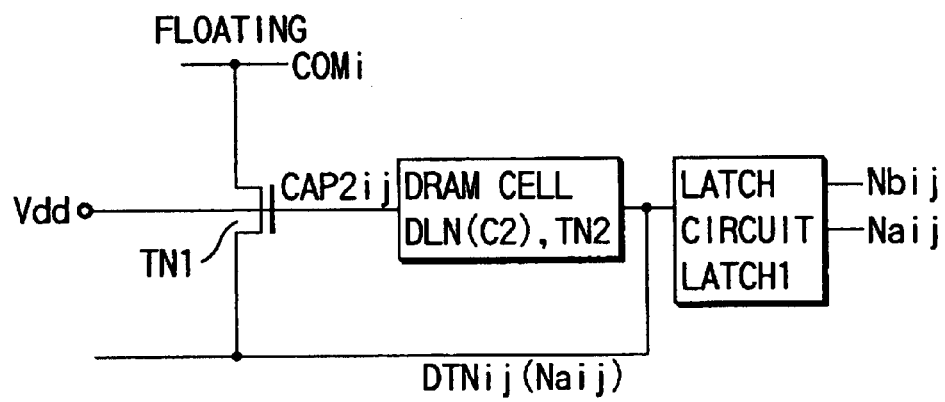
FIG. 34 shows the outline of "Program completion detection" during the program operation.

FIG. 34 shows the outline of Program completion detection. Namely, the data read from the memory cell in the "10" verify-read operation is latched by the latch circuit LATCH1. Therefore, if the data in the latch circuit LATCH1 is transferred to the sense node DTNij and the potential change of COMi is detected, then it is possible to detect whether or not "10"-programming is completed for all memory cells.

2.-2. Program Operation of Odd Page Data

First, the outline (operation flow) of the program operation of odd page data will be described and then the concrete circuit operation thereof (operation timing) will be described.

Figure 35:
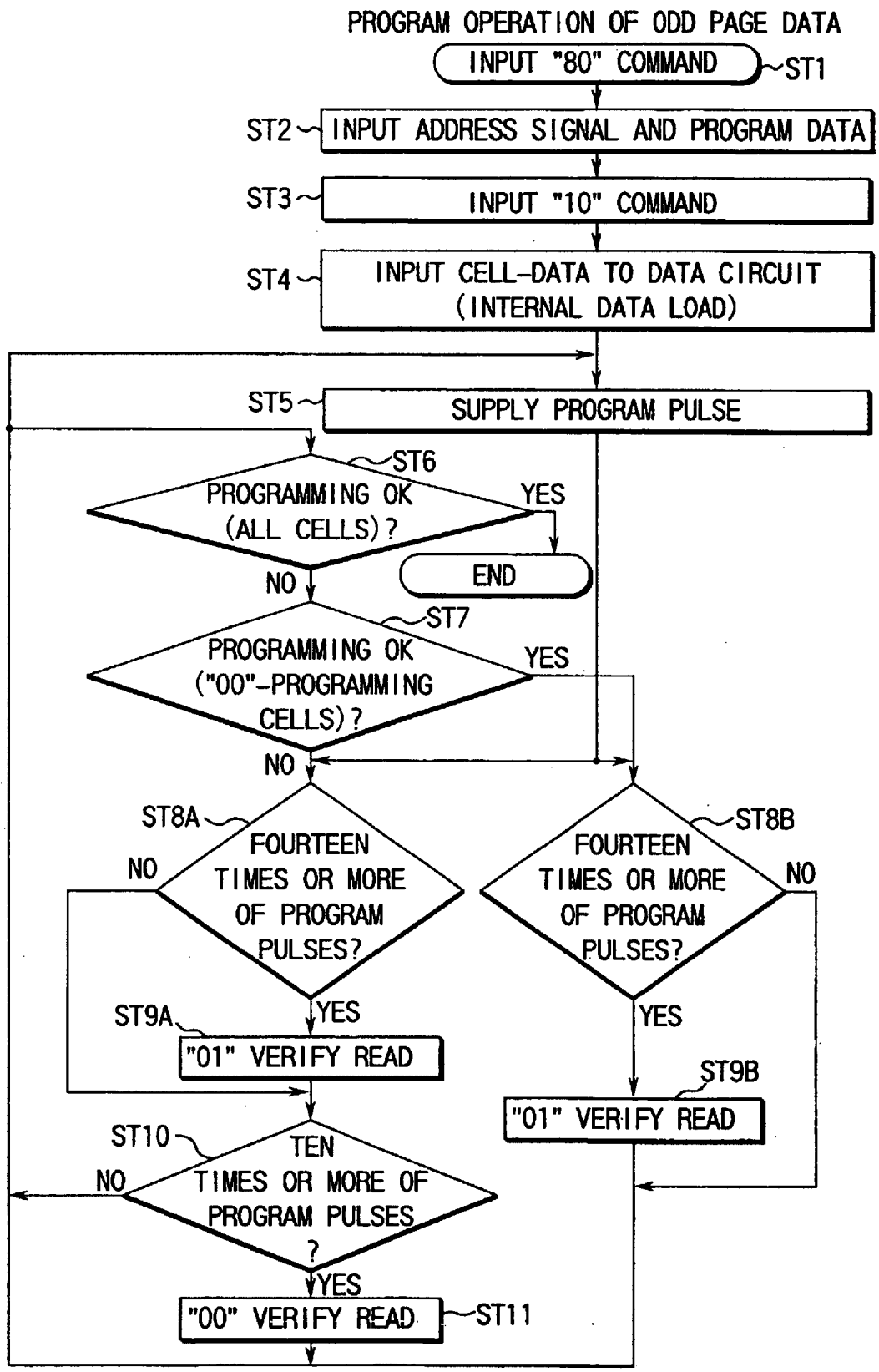
FIG. 35 is a flow chart showing odd page data program operation.

FIG. 35 shows the outline of the program operation of odd page data.

Before conducting odd page data programming, the even page data program as described above has been already completed. Therefore, the memory cell state is "11" or "10" state.

First, an "80 (hexadecimal)" command, for example, is inputted into the chip. Then, an address signal is inputted into the chip and odd page program data is inputted into the latch circuit LATCH1 (FIG. 9) in the latch circuit through the I/O lines IOj and nIOJ (in steps ST1 to ST2).

Next, a "10 (hexadecimal)" command, for example, is inputted into the chip. Then, the even page data stored in the memory cell is read (Internal Data Load). Thereafter, based on the odd page data (program data) inputted externally of the chip and the even page data read from the memory cell, the supply of a program pulse is executed (in steps ST3 to ST5).

Here, in this embodiment, for the purpose of shortening program time (accelerating the program), this embodiment adopts a sequence (parallel processing) for detecting whether "00"-programming and "01"-programming have been carried out sufficiently by supplying a program pulse the (n−1)-th time as well as supplying a program pulse the n-th time (in steps ST5 to ST7).

However, as shown below, as another means for realizing shortened program time (accelerated program), this embodiment adopts a sequence for gradually increasing a program potential (the magnitude of a program pulse) and not to conduct "00" verify-read and "01" verify-read at the beginning of the program operation.

In this embodiment, therefore, if the "00" verify-read is not conducted, a detection as to whether or not "00"-programming has been sufficiently conducted, is not made. Further, if "01" verify-read is not conducted, a detection as to whether or not "01"-programming has been sufficiently conducted, is not made, either.

If the number of times at which a program pulse is supplied to the word line is not higher than the first predetermined number of times (e.g., nine times), the "00" verify-read is omitted and program pulses are continuously supplied (in a step ST10). If the number of times at which a program pulse is supplied to the word line is not higher than the second predetermined number of times (e.g., 13 times), the "01" verify-read is omitted (in steps ST8A and 8B).

As can be seen, the reason for omitting the verify read operation at the beginning of the program is that with a method of gradually increasing the program potential as stated above, there is little possibility that predetermined data is programmed into the memory cell at the beginning of the program and it is, therefore, advantageous to omit the verify-read operation and accelerate program speed rather than conducting the verify-read operation at the beginning of the program.

The "00" verify-read (VERIFY00) means that memory cell data is read with a verify read potential Vcgv00 (FIG. 20) in verification to verify whether or not data "00" has been programmed into a memory cell to which "00"-programming is conducted.

The "01" verify-read (VERIFY01) means that memory cell data is read with a verify read potential Vcgv01 (FIG. 20) in verification to verify whether or not data "01" has been programmed into a memory cell to which "01"-programming is conducted.

In this embodiment, the program potential (program pulse level) is set at an initial value and the supply of a program pulse starts. Then, every time a program pulse is supplied, the program potential applied to the word line is gradually increased by a predetermined value (e.g., about 0.2V).

For example, by increasing the program potential by about 0.2V, the width of the threshold voltage distribution of the memory cell in the "00"-programming state and that of the memory cell in the "01"-programming state can be ideally made about 0.2V. In actual operation, due to array noise generated during the verify-read operation, the width of the threshold voltage distribution of the memory cell in the "00"-programming state and that of the memory cell in the "01"-programming state become about 0.4V.

During the period from the start of the program operation until a program pulse is supplied to the word line the ninth time, the program potential is set at a low value sufficient to completely conduct "00"-programming. Further, during the period from the start of the program operation until a program pulse is supplied the 13th time, the program potential is set at a low value sufficient to completely conduct "01"-programming.

Accordingly, the memory cell to which "00"-programming is conducted and the memory cell to which "01"-programming is conducted, is not excessively programmed (programmed so that the threshold voltage exceeds Vcgr01).

In this way, at the beginning of the operation, a pulse having a low program potential is supplied to the word line. Every time a pulse is supplied, the program potential is gradually increased. This is because electrons are gradually injected into the floating gate electrode and finally a predetermined amount of electrons are injected into the floating gate electrode.

In that case, compared with a case where a predetermined amount of electrons are injected into the floating gate electrode with one program pulse, an electric field applied to the tunnel oxide film of the memory cell with one program pulse is low, thereby enhancing the reliability of the tunnel oxide film.

Further, the program potential (program pulse level) is gradually increased from a lower value to a higher value. Namely, if the program potential is gradually increased, the width of the threshold voltage distribution of the memory cell can be empirically narrowed, compared with a case where the initial program potential is set at a high value and this program potential is gradually decreased.

If the number of times at which a program pulse is supplied to the word line is, for example, 10 or more, "00" verify read is conducted to the memory cell to which "00"-programming is conducted after a program pulse is supplied to the word line so as to verify whether or not data "00" has been successfully programmed into the memory cell (in steps ST10 to ST11).

Further, if the number of times at which a program pulse is supplied to the word line is, for example, 14 or more, "01" verify read is conducted to the memory cell to which "01"-program fitting is-conducted after a program pulse is supplied to the word line so as to verify whether or not data "01" has been successfully programmed into the memory cell (in steps ST8A to ST9A, ST8B to ST9B).

The data read from the memory cell by the "00" verify read is data indicating whether or not "00"-programming has been sufficiently conducted and this data is stored in the latch circuit LATCH1 in a data circuit existing in a column to which "00"-programming is conducted.

The data read from the memory cell by the "01" verify read is data indicating whether or not "01"-programming has been sufficiently conducted and this data is stored in the latch circuit LATCH1 in a data circuit existing in a column to which "01"-programming is conducted.

Thereafter, simultaneously with an operation of supplying the next program pulse to the word line (in step ST5), an operation (Program completion detection) for detecting whether or not "00"-programming or "01"-programming has been sufficiently conducted is executed by a previous program pulse based on the data in the latch circuit LATCH1 (in steps ST6 to ST7).

To be specific, in the odd page data program operation, as shown in FIG. 22, four types of programs, i.e., "11", "10", "00" and "01" exist. "11"-programming and "10"-programming are intended to maintain the state of a memory cell after even page data has been programmed into the memory cell. In addition, "00"-programming means increasing the threshold voltage by a program pulse and changing the "10" state to "00" state. "01"-programming means increasing the threshold voltage by a program pulse and changing the "11" state to the "01" state.

If predetermined data "11", "10", "00" or "01" has been sufficiently programmed into all of the selected memory cells (columns) (or, actually, if data "00" or "01" has been sufficiently programmed into the memory cells to which "00"-programming or "01"-programming are conducted), then, the odd page data program operation is completed (in a step ST6).

If predetermined data "11", "10", "00" or "01" has not been sufficiently programmed into at least on selected memory cell (column) (or actually, data "00" or "01" has not been sufficiently programmed into a memory cell to which "00"-programming or "01"-programming is conducted), "00" verify read, "01" verify read and the supply of a program pulse are continued (in steps ST5 to ST11).

Here, in this embodiment, after "00"-programming has been sufficiently conducted to all the memory cells to which "00"-programming is conducted, "00" verify read is not conducted and only "01" verify read and Program completion detection are conducted (a route of steps ST7, ST8 and ST9B).

The reason for using such a sequence is that "00"-programming is usually completed earlier than "01"-programming (the threshold voltage in the "00" state is lower than that in the "01" state), "00" verify read after the completion of "00"-programming is omitted to thereby shorten program time (accelerate program).

Meanwhile, in this embodiment, the operation (Program completion detection) for detecting whether or not the program is sufficient/deficient is conducted simultaneously with the operation for supplying a program pulse to the word line. Alternatively, the Program completion detection may be conducted right after "00" verify read or "01" verify read and then a program pulse may be supplied again if the result of the Program completion detection shows that the program is deficient.

Alternatively, program pulses may not be supplied to the memory cell which has been programmed sufficiently and a program pulse is continuously supplied (reprogrammed) only to the memory cell which has been programmed deficiently, thereby preventing memory cell having good program characteristics from excessively programmed.

The above description has been given to the outline of the odd page data program operation.

As stated above, the odd page data program operation consists of loading of even page data stored in a memory cell (Internal data load), the supply of program pulses, "00" verify read (VERIFY00), "01" verify read (VERIFY01), Program completion detection and "00" program completion detection.

Now, these operations will be described in this order in detail.

2.-2.-1. "Internal Data Load"

Internal data load is an operation for reading even page data stored in a memory cell and latching the data to the storage circuit (DRAM cell, i.e., node CAP1ij) in the data circuit. It is noted that program data (odd page data) is temporarily latched by the node CAP2ij and then latched again by the latch circuit LATCH1.

Figure 36:
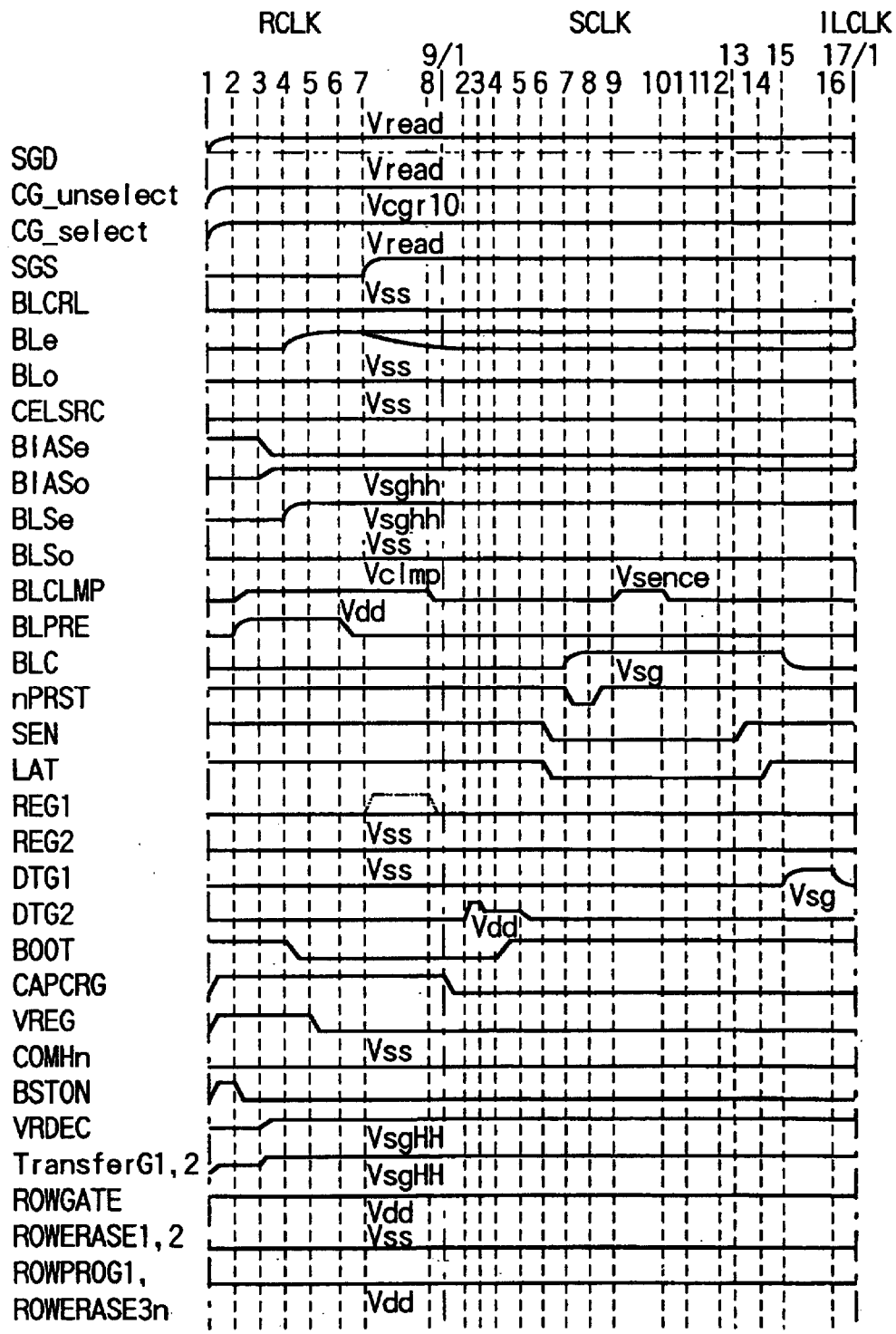
FIG. 36 is a waveform view showing operation timing relating to "Internal Data Load 1st/3rd Quarters" during the program operation.
Figure 37:
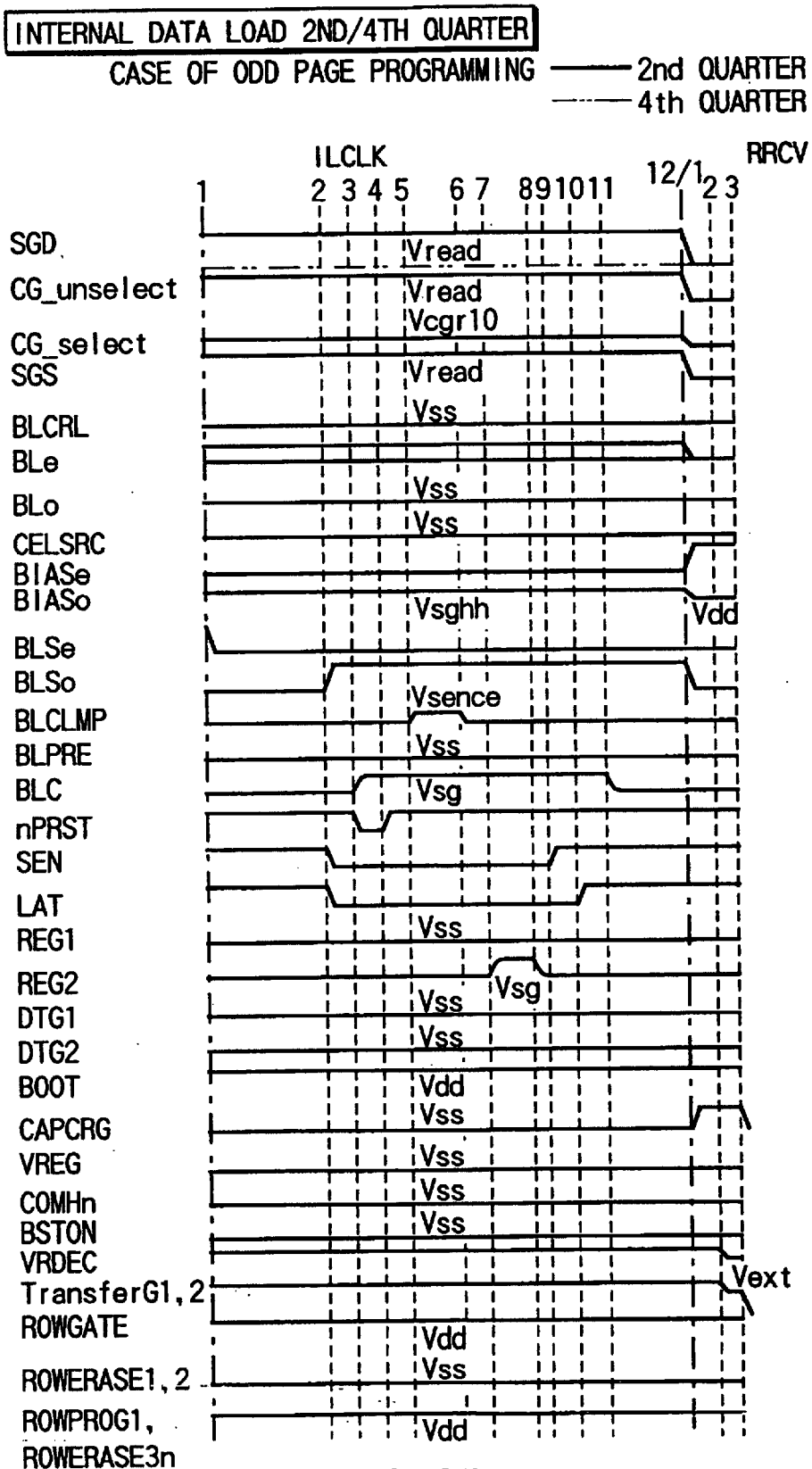
FIG. 37 is a waveform view showing operation timing relating to "Internal Data Load 2nd/4th Quarters" during the program operation.

FIGS. 36 and 37 show operation timing relating to Internal data load, respectively.

Internal data load consists of four operations (1st Quarter, 2nd Quarter, 3rd Quarter and 4th Quarter).

The 1st Quarter and the 2nd Quarter are indicated by solid lines in FIGS. 36 and 37, respectively. The 3rd Quarter is almost the same as the 1st Quarter except for a portion indicated by two-dot chain lines shown in FIG. 36. The 4th Quarter is almost the same as the 2nd Quarter except for a portion indicated by two-dot chain lines shown in FIG. 37.

2.-2.-1.-1. "Internal Data Load 1st Quarter"

The solid lines of FIG. 36 indicate operation timing relating to the Internal data load 1st Quarter.

If odd page program data inputted externally of the chip is "1", the level of the node Naij of the latch circuit LATCH1 is "H". If odd page program data inputted externally of the chip is "0", the level of the node Naij of the latch circuit LATCH1 is "L".

While setting the potential (read potential) of a selected word line at Vcgr10, a read operation is carried out. In this case, if the memory cell is in the "11" state, the charges of the bit line are discharged and the level of the bit line becomes "L". If the memory cell is in the "10" state, the bit line maintains a precharge potential and the level of the bit line is, therefore, "H".

In the meantime, while reading the memory cell data to the bit line, the odd page data latched by the latch circuit LATCH1 is transferred to the node CAP2ij.

To be specific, if the odd page data is "1", i.e., the level of the node Naij of the latch circuit LATCH1 is "H", the potential of the node CAP2ij becomes about 4V at period SCLK5. If the odd page data is "00", i.e., the level of the node Naij of the latch circuit LATCH1 is "L", the potential of the node CAP2ij becomes Vss at period SCLK5.

Then, the potential of the bit line is sensed and latched by the latch circuit LATCH1. If the memory cell is in the "11" state, the level of the bit line is "L". Thus, the level of the sense node DTNij becomes "L" and that of the node Naij of the latch circuit LATCH1 becomes "L", as well. If the memory cell is in the "10" state, the level of the bit line is "H". Thus, the level of the sense node DTNij becomes "H"

and that of the node Naij of the latch circuit LATCH1 becomes "H", as well.

Further, at period RCLK5, when the potential of DTG1 becomes Vsg, the data in the latch circuit LATCH1 is transferred to the DRAM cell, i.e., the node CAP1ij and latched thereby.

As can be seen from the above, at a time when the 1st Quarter is completed, the odd page data is latched by the node CAP2ij and the even data is latched by the node CAP1ij.

The data of the nodes CAP1ij and CAP2ij at the time of completion of the 1st Quarter become the data as shown in Table 6.

TABLE 6

| | Data of capacitor C1, C2 after "Internal Data Load 1st Quarter" | | | |
|---|---|---|---|---|
| | "11" | "10" | "00" | "01" |
| CAP1ij | "Low" | "High" | "High" | "Low" |
| CAP2ij | "High" | "High" | "Low" | "Low" |

Namely, in "Internal data load 1st Quarter", if the even page data stored in the memory cell is "1" (in the "11" state), the level of the node CAP1ij becomes "L" and if the even page data stored in the memory cell is "0" (in the "10" state), the level of the node CAP1ij becomes "H".

Further, if the odd page data is "1" (the memory cell state "11" or "10" is not changed), the level of the node CAP2ij becomes "H" and if the odd page data is "0" (the memory cell state is changed to "00" or "01"), the level of the node CAP2ij becomes "L".

Figure 38:
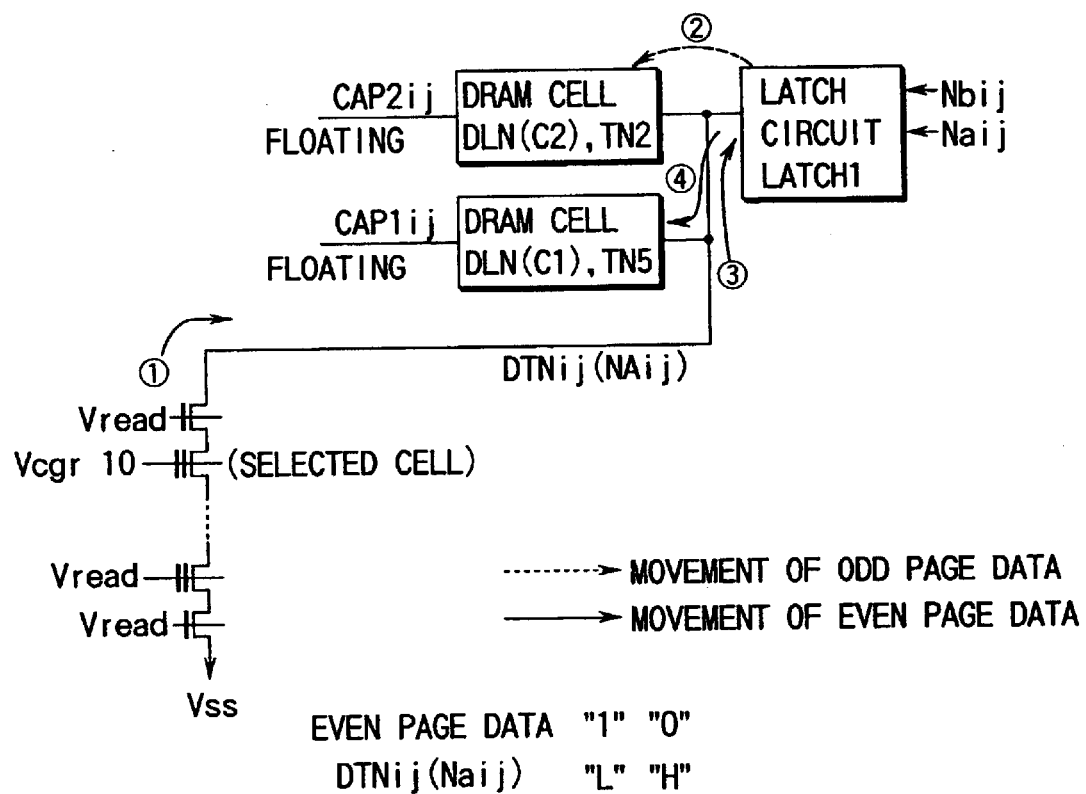
FIG. 38 shows the outline of "Internal Data Load 1st Quarter" during the program operation.

FIG. 38 shows the simplified movement of even/odd page data in the "Internal data load 1st Quarter".

2.-2.-1.-2. "Internal Data Load 2nd Quarter"

The solid lines of FIG. 37 indicate operation timing relating to the Internal data load 2nd Quarter.

Following the Internal data load 1st Quarter, the Internal data load 2nd Quarter is started. In the Internal data load 2nd Quarter, an operation for returning the odd page data latched by the node CAP2ij to the latch circuit LATCH1 is conducted.

First, at period ILCLK1, the potential of BLSe becomes Vss and at period ILCLK2, the potential of BLSO becomes Vdd. The potential of BLCRL is Vss. As a result, a node Ns shown in FIG. 9 is short-circuited to the node BLCRL and the potential of the node Ns becomes Vss.

Further, at period ILCLK2, the potentials of SEN and LAT become Vss and those of SENB, LATB become Vdd, and the latch circuit LATCH1, i.e., the clocked inverters CINV1 and CINV2, is deactivated.

Then, at period ILCKL3, when the potential of nPRST becomes Vss, the sense node DTNij is precharged with Vdd. Further, at period ILCLK4, when the potential of nPRST becomes Vdd, the sense node DTNij turns into a floating state.

At period ILCLK3, the potential of BLC becomes Vsg and at period ILCLK5, the potential of BLCLMP becomes Vsense (e.g., about 1.6V). At this moment, since the potential of the node Ns is Vss, the potential of the sense node DTNij becomes Vss, as well.

Thereafter, at period ILCLK6, the potential of BLCLMP becomes Vss and at period ILCLK7, the potential of REG2 becomes Vsg. At this moment, the potential of the sense node DTNij changes according to the data at the node CAP2ij.

For example, as is obvious from Table 6 above, if odd page data is "1", i.e., "11"-programming and "10"-programming are conducted (to be specific, memory cell data is maintained, i.e., during write inhibit), the level of the node CAP2ij is "H". Due to this, the MOS transistor shown in FIG. 9 is turned on. As a result, the sense node DTNij is connected to the node COMi and the potential of the sense node becomes Vdd.

Meanwhile, if the odd page data is "0", i.e., "00"-programming and "01"-programming are conducted, the level of CAP2ij is "L". Due to this, the MOS transistor TN1 shown in FIG. 9 is turned off. As a result, the potential of the sense node DTNij remains Vss.

Thereafter, at period ILCLK9, the potential of SEN becomes Vdd and the clocked inverter CINV1 turns into an operation state. Namely, the potential of the sense node DTNij is sensed by the clocked inverter CINV1. Also, at period ILCLK10, the potential of LAT becomes Vdd and the latch circuit LATCH1 turns into an operation state.

In other words, the level of the node Naij of the latch circuit LATCH1 is "H" if the odd page data is "1" and the potential level thereof is "L" if the latch circuit LATCH1 is "0".

As a result, the state of the DRAM cell (node CAP1ij) and that of the node Naij of the latch circuit LATCH1 at the time of completion of the 2nd Quarter become those as shown in Table 7.

TABLE 7

Data of capacitor C1 and latch circuit LATCH1 after "Internal Data Load 2nd Quarter"

|  | "11" | "10" | "00" | "01" |
| --- | --- | --- | --- | --- |
| CAP1ij | "Low" | "High" | "High" | "Low" |
| Naij | "High" | "High" | "Low" | "Low" |

Figure 39:
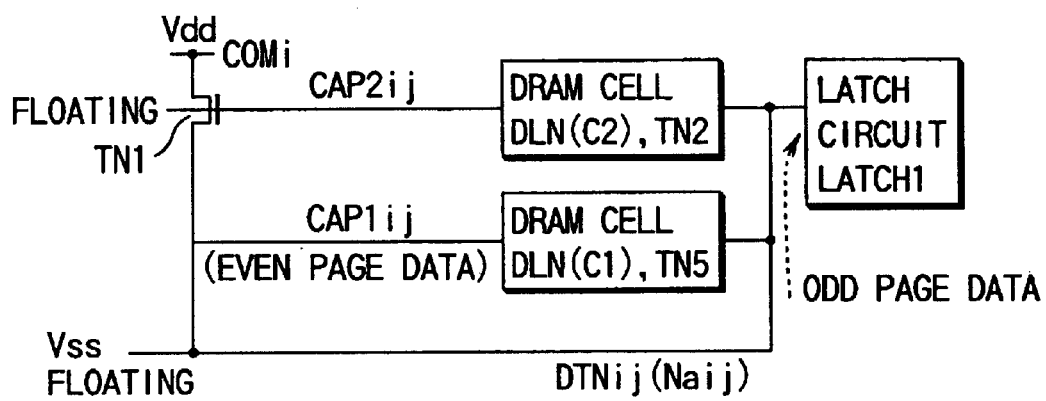
FIG. 39 shows the outline of "Internal Data Load 2nd Quarter" during the program operation.

It is noted that FIG. 39 shows the simplified movement of the odd page data in the "Internal data load 2nd Quarter".

2.-2.-1.-3. "Internal Data Load 3rd Quarter"

The solid lines of FIG. 36 (two-dot chain lines for SGD and REG1) indicate operation timing relating to the Internal data load 3rd Quarter.

In the Internal data load 3rd Quarter and the Internal data load 4th Quarter, an operation for inverting the data latched by the DRAM cell (node CAP1ij) in the Internal data load 1st Quarter and the Internal data load 2nd Quarter ("H" "BL" and "L" "H") is carried out.

As shown in Table 7 above, the data latched by the node CAP1ij is "L" if the even page data is "1" and "H" if the even page data is "0". Namely, if "1" and "0" are regarded as "H" and "L", respectively, the value of the even page data is opposite to the value of the data latched by the node CAP1ij.

Then, in the Internal data load 3rd Quarter and the Internal data load 4th Quarter, the data latched by the DRAM cell (node CAP1ij) is inverted so that the value of the even page data becomes the same as the value of the data latched by the node CAP1ij.

The differences of the Internal data load 3rd Quarter from the Internal data load 1st Quarter are ① the potential of SGD is Vss; and ② during periods RCLK7 to RCLK8, the potential of REG1 becomes Vdd.

In the Internal data load 3rd Quarter, after the data at the node CAP1ij is inverted and transferred to the sense node DTNij, the odd page data latched by the latch circuit LATCH1 is transferred to the node CAP2ij and then the data at the sense node DTNij is transferred to the latch circuit LATCH1.

First, as in the case of the Internal data load 1st Quarter, at period RCLK4, the bit line is precharged and the potential of the bit line becomes about 0.8V. Then, at period RCLK7, the potential of SGS becomes Vread. In this embodiment, however, since the potential of SGD is always Vss, the charges of the bit line are not discharged through the memory cell.

In this embodiment, at period RCLK7, when the potential of REG1 becomes Vdd, it is determined whether to discharge the charges of the bit line (or sense node) or to maintain the present state based on the data latched by the CAP1ij.

For example, as is obvious from Table 7 above, if the even page data is "0", i.e., "10"-programming or "00"-programming is conducted, the potential of the node CAP1ij is Vdd. Due to this, the MOS transistor TN3 (FIG. 9) is turned on and the bit line (sense node) is short-circuited to VREG (Vss).

On the other hand, if the even page data is "1", i.e., "11"-programming or "01"-programming is conducted, the potential of the node CAP1ij is Vss. Due to this, the MOS transistor TN3 (FIG. 9) is turned off and the bit line (sense node) maintains the precharge potential (about 0.8V).

Thereafter, the odd page data latched by the latch circuit LATCH1 is transferred to the node CAP2ij at period SCLK2 as in the case of the Internal data load 1st Quarter. Following this, at period SCLK6, the levels of both SEN and LAT become "L" and the latch circuit LATCH1 turns into a non-operation state.

Further, at period SCLK7, the potential of BLC becomes Vsg and that of nPRST becomes Vss. At period SCLK8, the potential of nPRST becomes Vdd. At period SCLK9, the potential of BLCLMP becomes Vsense and at period SCLK13, the level of SEN becomes "H" and the potential of the sense node DTNij is sensed by the clocked inverter CINV1. Also, at period SCLK14, the level of LAT becomes "H" and the latch circuit LATCH1 turns into an operation state.

As a result, if the even page data is "0" (the potential of the node CAPij is Vdd), the level of the node Naij of the latch circuit LATCH1 becomes "L". if the even page data is "1" (the potential of the node CAPij is Vss), the level of the node Naij of the latch circuit LATCH1 becomes "H".

Thereafter, at period SCLK15, if the potential of DTG1 is set at Vsg, the data in the latch circuit LATCH1 is transferred to the DRAM cell (node CAP1ij).

Here, if the even page data is "0" (the potential of the node CAP1ij is Vdd), the level of the node Naij of the latch circuit LATCH1 is "L". Due to this, the node CAP1ij is inverted from Vdd ("H") to Vss ("L"). Further, if the even page data is "1" (the potential of the node CAP1ij is Vss), the level of the node Naij of the latch circuit LATCH1 is "H". Due to this, the node CAP1ij is inverted from Vss ("L") to Vdd ("H").

At the time of the completion of the Internal data load 3rd Quarter, the odd page data has been stored in the node CAP2ij and the even page data has been stored in node CAP1ij.

The data of CAP1ij and CAP2ij at the time of the completion of the 3rd Quarter are those as shown in Table 8.

TABLE 8

| | Data of capacitor C1, C2 after "Internal Data Load 3rd Quarter" | | | |
|---|---|---|---|---|
| | "11" | "10" | "00" | "01" |
| CAP1ij | "High" | "Low" | "Low" | "High" |
| CAP2ij | "High" | "High" | "Low" | "Low" |

Figure 40:
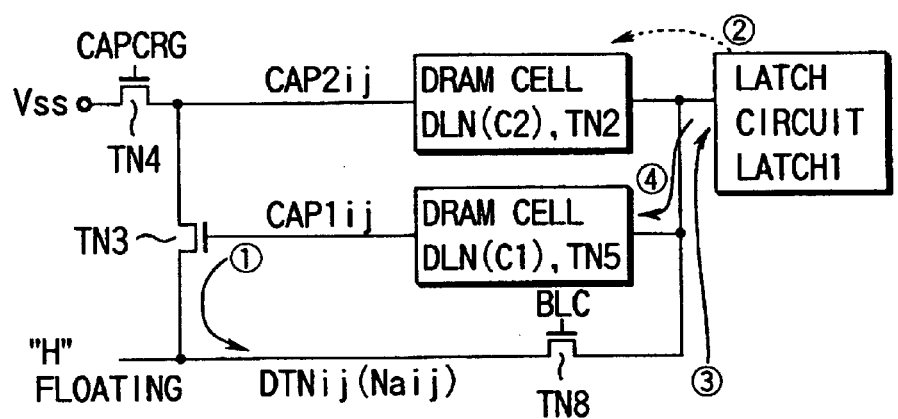
FIG. 40 shows the outline of "Internal Data Load 3rd Quarter" during the program operation.

FIG. 40 shows the simplified movement of even/odd page data in the "Internal data load 3rd Quarter".

2.-2.-1.-4. "Internal Data Load 4th Quarter"

The solid lines of FIG. 37 (two-dot chain lines for SGD) show operation timing relating to the Internal data load 4th Quarter.

In the Internal data load 4th Quarter, an operation for returning the odd page data latched by the node CAP2ij to the latch circuit LATCH1 is carried out.

The Internal data load 4th Quarter differs from the Internal data load 2nd Quarter only in that the potential of SGD is always Vss.

The operation for returning the odd page data latched by the node CAP2ij to the latch circuit LATCH1 is the same as that in the Internal data load 2nd Quarter. Therefore, the detailed description of the Internal data load 4th Quarter will not be given herein.

The data latched by the DRAM cell (node CAP1ij) and the latch circuit LATCH1 (node Naij) are those as shown in Table 9.

TABLE 9

| | Data of capacitor C1 and latch circuit LATCH1 after "Internal Data Load 4th Quarter" | | | |
|---|---|---|---|---|
| | "11" | "10" | "00" | "01" |
| CAP1ij | "High" | "Low" | "Low" | "High" |
| Naij | "High" | "High" | "Low" | "Low" |

Figure 41:
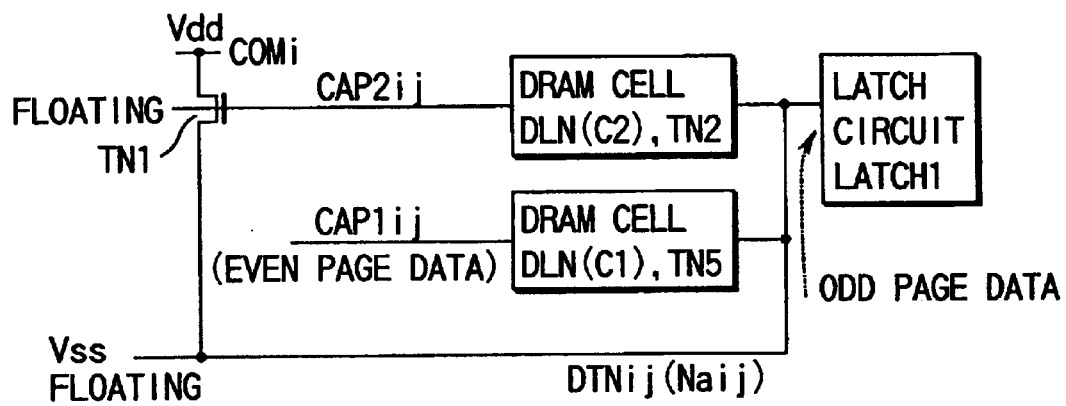
FIG. 41 shows the outline of "Internal Data Load 4th Quarter" during the program operation.

FIG. 41 shows the simplified movement of odd page data in the "Internal data load 4th Quarter".

The Internal data load (1st Quarter, 2nd Quarter, 3rd Quarter and 4th Quarter) has been described above.

As a result of the Internal data load, the odd page data is latched by the latch circuit LATCH1 and the even page data is latched by the DRAM cell (node CAP1ij). Besides, the values of the odd/even page data are the same as those of the latched data ("1" corresponds to "H" and "0 corresponds to "L").

Thereafter, as shown in Table 9, based on the two-bit data latched by the CAP1ij and Naij, the actual program operation of the odd page data is carried out.

2.-2.-2. Supply of Program Pulse

A program pulse is supplied exactly at the same timing as that for supplying a program pulse for the even page data.

In "00"-programming and "01"-programming, the level of the node Naij of the latch circuit LATCH1 is "L" as shown in Table 9 and the potential of the bit line becomes, therefore, Vss. Accordingly, a high electric field is applied to the tunnel oxide film of a selected memory cell and electrons are injected into the floating gate electrode of the memory cell by the FN tunnel effect, thereby effecting the program.

In "11"-programming and "10"-programming, the potential level of the node Naij of the latch circuit LATCH1 is "H" as shown in Table 9 above, the potential of the bit line becomes Vd. Accordingly, a high electric field is not applied to the tunnel oxide film of the selected memory cell and the state of the memory cell does not change (i.e., the memory cell is maintained in either the "11" state or the "10" state).

Operation timing relating to the supply of a program pulse is the same as that relating to the supply of a program pulse (section 2.-1.-1) in the even page data program operation (section 2.-1), which detailed description will not be, therefore, given herein.

2.-2.-3. "VERIFY01"

Figure 42:
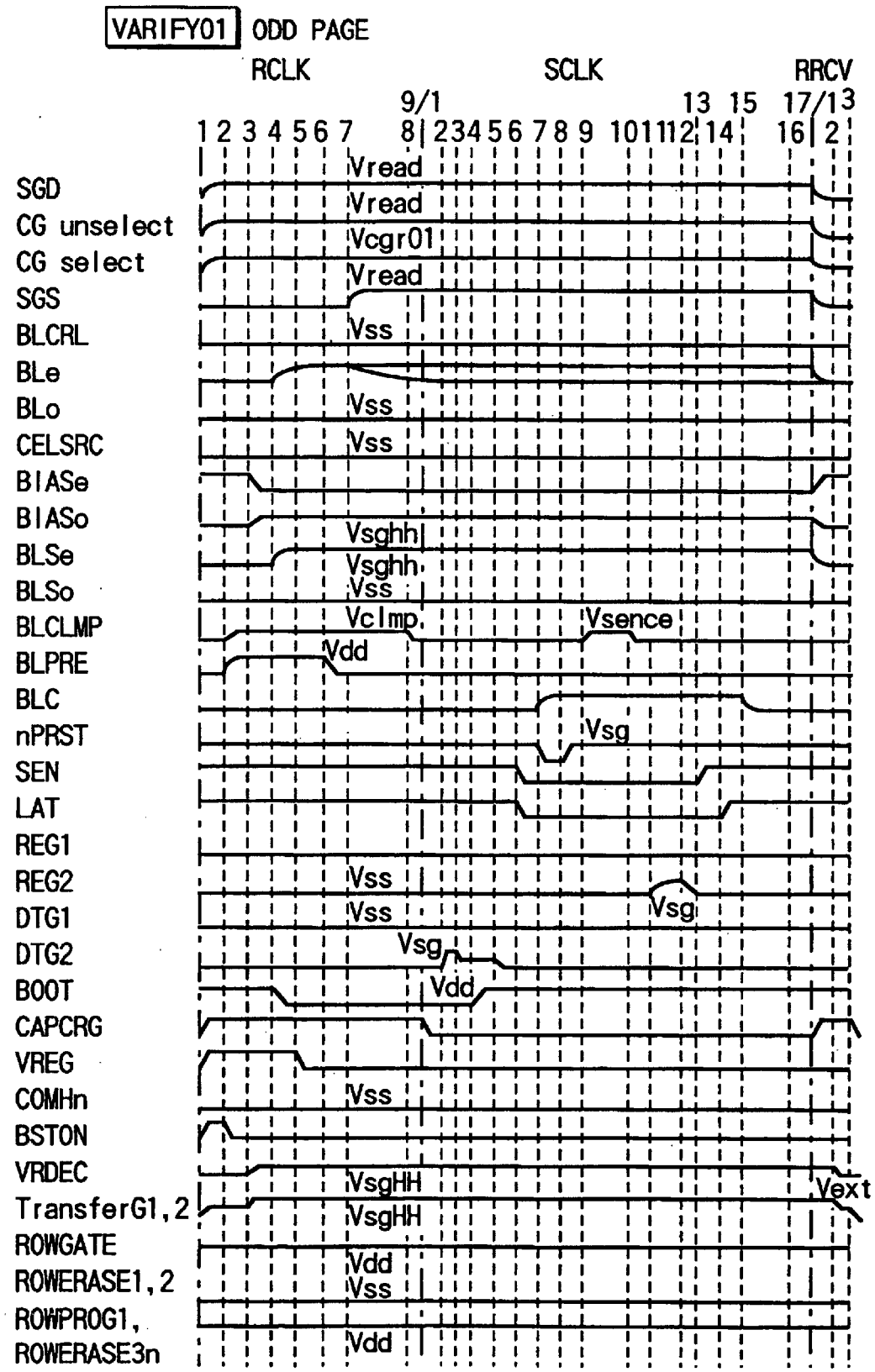
FIG. 42 is a waveform view showing operation timing relating to "01" verify read during the program operation.

FIG. 42 shows operation timing for "01" verify read.

In "01" verify read (VERIFY01), after the bit line is precharged, the potential of the selected word line is set at Vcgv01 (e.g., about 1.75V) shown in FIG. 20, the potential change of the bit line is detected and memory cell data is read.

In "VERIFY01", if two storage circuits (LATCH1, C1) in the data circuit latch program data of "11", "10" and "00", the program data has no change.

As for data "00", if "VERIFY00", which will be described later, is OK (program is sufficient), the data changes from "00" to "11". As for this, reference is made to "VERIFY00" described later. However, the value of the data, whether "00" or "10", does not change in "VERIFY01".

On the other hand, in "VERIFY01", if the two storage circuits (LATCH1, C1) in the data circuit latch program data of "01" and read data indicates sufficient program, i.e., the level of the bit line is "H", then the program is not conducted thereafter and the program data changes from "01" to "11" (odd page data changes from "0" to "1").

Further, in "VERIFY01", if the two storage circuits (LATCH1, C1) in the data circuit latch the program data of "01" and the read data indicates that program is deficient, i.e., the level of the bit line is "L", then the program is continuously conducted and the program data has no change.

The concrete operation will be described as follows.

First, while the bit line is being precharged or discharged (cell data is being read), the program data stored in the latch circuit LATCH1 is transferred to the node CAP2ij and temporarily stored in the node CAP2ij. By doing so, the read data is prevented from colliding against the odd page data.

At period RCLK1, the potentials of CAPCRG and VREG are set at Vdd and at period RCLK4, the potential of BOOT is set at Vss. At period RCLK5, when the potential of VREG becomes Vss, the node CAP2ij is reset at Vss. During this time, the potential of DTG2 is Vss.

At period RCLK9/SCLK1, the potential of CAPCR becomes Vss and the node CAP2ij turns into a floating state. Then, at period SCLK2, the potential of DTG2 becomes Vsg (e.g., about 4.5V) and the program data (odd page data) latched by the latch circuit LATCH1 is transferred to the node CAP2ij by way of the MOS transistor TN2 and temporarily stored in the node CAP2ij.

Namely, if the odd page program data is "0" ("00"-programming or "01"-programming is conducted), the level of the node Naij of the latch circuit LATCH1 is "L" and the potential of the node CAP2ij, therefore, becomes Vss.

Further, if the odd page program data is "1" (the memory cell is maintained in the "11" or "10" state and "00"-programming and "01"-programming are sufficient), then the level of the node Naij of the latch circuit LATCH1 is "H" and the potential of the node CAP2ij, therefore, becomes Vdd.

Then, at period SCLK3, the potential of DTG2 becomes Vdd and at period SCLK4, the potential of BOOT becomes Vdd.

At this moment, if the odd page program data is "0" ("00"-programming or "01"-programming is conducted), the potential of the node CAP2ij remains Vss. Also, if the odd page data is "1" (the memory cell is maintained in the "11" or "10" state) and the potential of the node CAP2ij is booted by the capacitor DLN (C2) and, therefore, rises from Vdd (e.g., about 2.3V) to about 3.5V.

Thereafter, at period SCLK5, the potential of DTG2 becomes Vss and the node CAP2ij is electrically disconnected from the latch circuit LATCH1.

Simultaneously with the above-stated operation, a bit line precharge operation and an operation for reading the memory cell data to the bit line are carried out.

That is, after the bit line is precharged, the potential of SGS becomes Vread at period RCLK7 and the potential of the bit line changes according to the memory cell data.

For example, the memory cells (cell to which "11" or "10"-programming is conducted (i.e., cell which is not programmed) and cell to which "01"-programming is conducted) other than the memory cells to which "01"-programming is conducted, are turned on by the potential Vcgv01 (e.g., about 1.75V). Thus, the charges of the bit line are discharged and the bit line has a potential not higher than 0.3V.

Further, in case of the memory cell to which "01"-programming is conducted, if "01"-programming is deficient, the memory cell is turned on by the potential Vcgv01 (e.g., about 1.75V). Thus, the charges of the bit line are discharged and the bit line has a potential not higher than 0.3V.

Further, in case of the memory cell to which "01"-programming is conducted, if "01"-programming is sufficient, the memory cell is turned off by the potential Vcg01 (e.g., about 1.75V). Thus, the charges of the bit line are not discharged and the bit line maintains-the potential 0.8V.

Thereafter, at period SCLK6, the levels of both SEN and LAT become "L", those of both SEN and LATB become "H", and the latch circuit LATCH1 in the data circuit, i.e., the clocked inverters CINV1 and CINV2, turns into a non-operation state.

Further, at period SCLK7, the potential of BLC becomes Vsg (e.g., about 4.5V) and the level of the nPRST becomes "L". The sense node DTNij is thereby charged and the potential of the sense node becomes Vdd. At the same time, the potential of the node Naij becomes Vdd. At period SCLK8, when the potential of nPRST becomes Vdd, the sense node DTNij turns into a floating state.

At period SCLK9, when the potential of BLCLMP becomes Vsense (e.g., about 1.6V), the memory cell data read to the bit line is transferred to the sense node DTNij.

Namely, in case of each of the memory cells which have been programmed sufficiently among the memory cells to which "11" or "10"-programming is conducted, those to which "00"-programming is conducted and those to which "01"-programming is conducted, the potential of the bit line becomes not higher than 0.3V. Due to this, the potential of the sense node DTNij decreases to not higher than 0.3V, as well.

Meanwhile, as for each of the memory cells which have been programmed sufficiently among the memory cells to which "01"-programming is conducted, the potential of the bit line is maintained 0.8V. Due to this, the clamping MOS transistor TN9 is cut off and the sense node DTNij maintains the potential Vdd.

At period SCLK10, the potentials of the sense node DTNij become those as show in Table 10.

TABLE 10

| | Sense node (DTNij.Naij) in "VERIFY 01" | | | | |
|---|---|---|---|---|---|
| | "11", "10"-programming (Write inhibit) | "00"-programming Deficient | "00"-programming Sufficient | "01"-programming Deficient | "01"-programming Sufficient |
| Point of SCLK 10 | "Low" | "Low" | "Low" | "Low" | "High" |
| Point of SCLK 12 | "High" | "Low" | "Low" | Low" | "High" |

Thereafter, at period SCLK11, the potential of REG2 becomes Vsg and the MOS transistor TN6 (FIG. 9) is turned on.

Here, in case of conducting "11"-programming and "10"-programming (odd page data is "1"), "H" is stored in the node CAP2ij and the MOS transistor TN1 (FIG. 9) is, therefore, turned on. That is, the COMi (set at Vdd) and the sense node DTNij are short-circuited to each other, with the result that the potential of the sense node DTNij becomes Vdd.

Further, in case of conducting "00"-programming and "01"-programming (odd page data is "0"), "L" is stored in the node CAP2ij and the MOS transistor TN1 (FIG. 9) is, therefore, turned off. That is, the COMi (set at Vdd) and the sense node DTNij are electrically disconnected from each other, with the result that the potential of the sense node DTNij has no change.

Accordingly, the potentials of the sense node DTNj at period SCLK12 become those as shown in Table 10 above.

Thereafter, at period SCLK13, the potential of SEN becomes Vdd, that of SENB becomes Vss and the clocked inverter CINV1 turns into an operation state, whereby the potential of the sense node DTNij is sensed.

As shown in Table 10 above, in case of "11"-programming and "10" programming, the level of the sense node DTNij is "H" and that of the node Naij is "H". The level of the node Naij is originally "H" (see Table 9) in case of conducting "11"-programming and "10"-programming (odd page data is "1"). In case of conducting "11"-programming and "10"-programming, therefore, the program data has no change.

Further, in case of conducting "00"-programming, the level of the sense node DTNij is "L" and that of the node Naij is "L", as well. Since the level of the node Naij is originally "L" (see Table) in case of conducting "00"-programming (odd page data is "0"), the program data has no change in case of conducting "00"-programming.

As for "00"-programming, in "VERIFY00" to be described later, if data indicating that program has been conducted sufficiently is read, data changes from "00" to "10" (odd page data changes from "0" to "1"). However, in "VERIFY01", the program data ("00" or "10") has no change.

Further, if "01"-programming is conducted and the "01"-programming is deficient, the level of the sense node DTNij is "L" and that of the node Naij is "L", as well. Since the level of the node Naij is originally "L" (see Table 9) in case of conducting "01"-programming (odd page data is "0"), the program data has no change even if "01"-programming is conducted and the program is deficient.

Further, if "01"-programming is conducted and the "01"-programming is deficient, the level of the sense node DTNij is "H" and that of the node Naij is "H", as well. Since the level of the node Naij is "L" (see Table 9) in case of conducting "01"-programming (odd page data is "0"), the program data changes from "01" to "11" (the value of the node Naij of the latch circuit LATCH1, i.e., the odd page data changes from "01" to "1") if "01"-programming is conducted and the program is sufficient.

Figure 43:
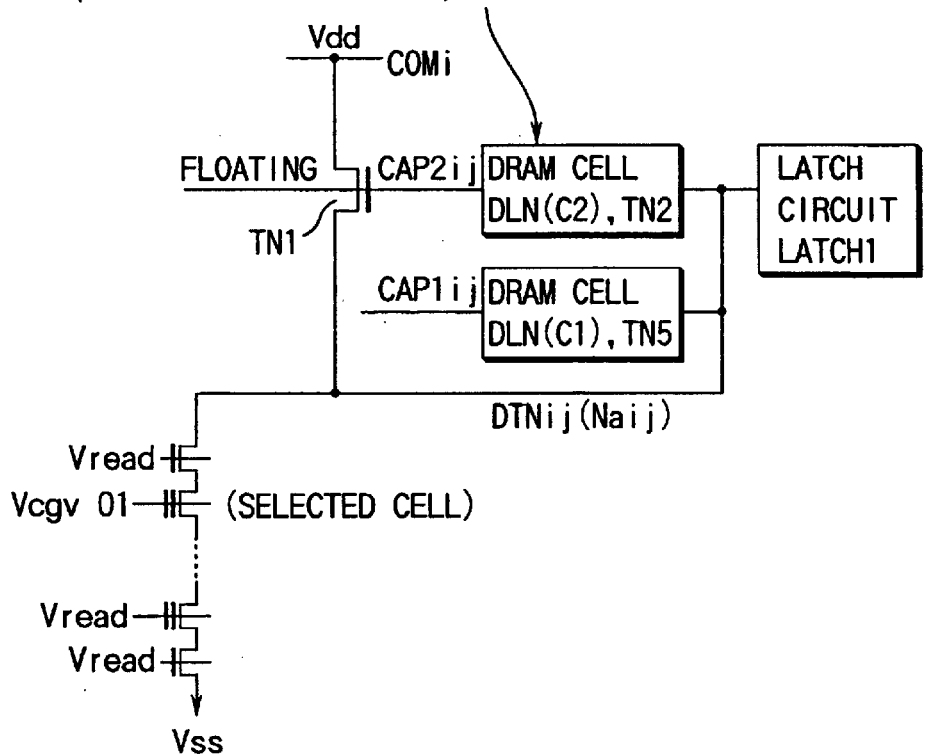
FIG. 43 shows the outline of "01" verify read during the program operation.

FIG. 43 shows the simplified state of "01" verify read operation.

2.-2.-4. "VERIFY00"

Figure 44:
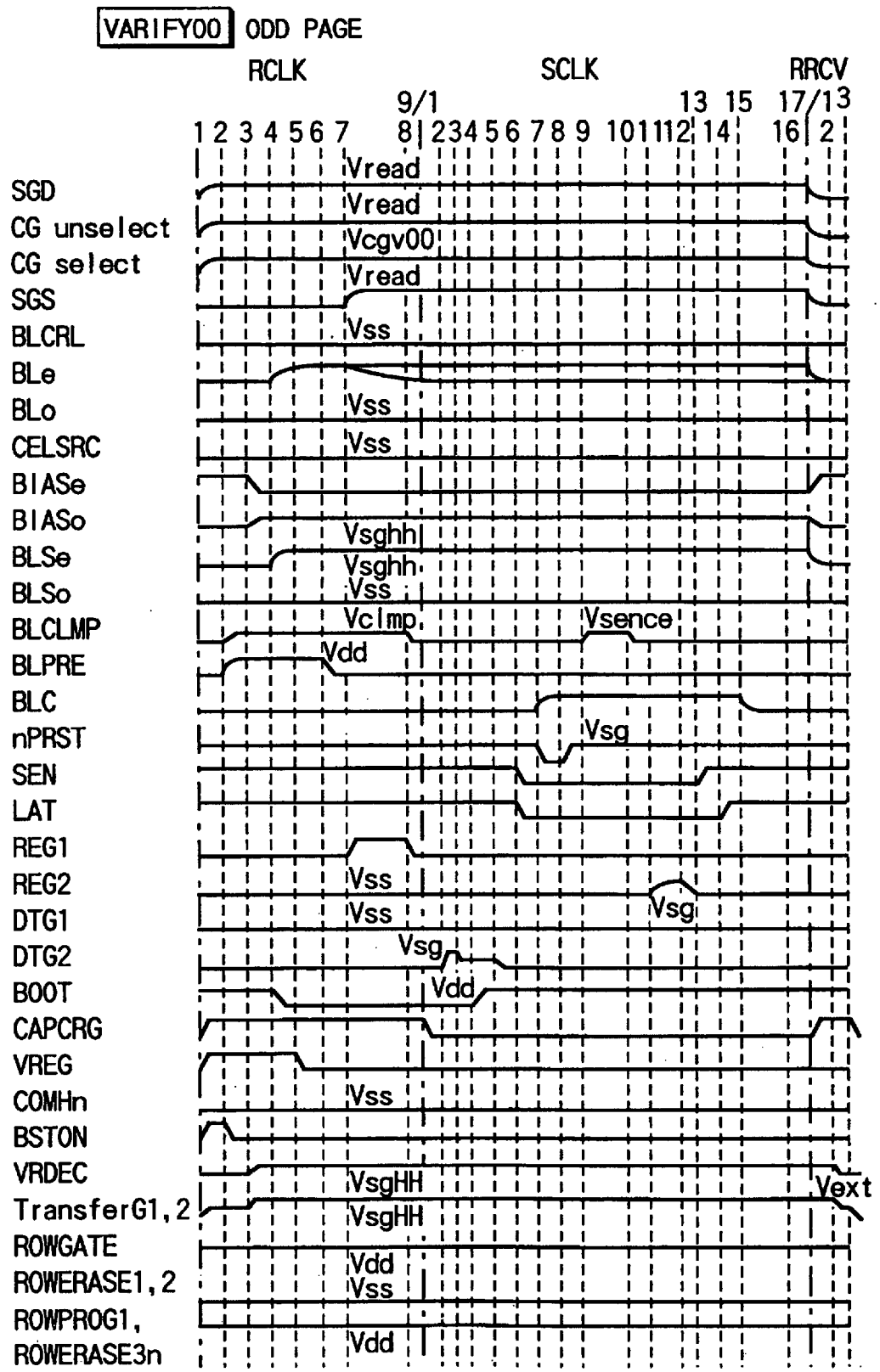
FIG. 44 is a waveform view showing operation timing relating to "00" verify read during the program operation.

FIG. 44 shows operation timing for "00" verify read.

In "00" verify read (VERIFY00), after the bit line is precharged, the potential of a selected word line is set at Vcgv00 (e.g., about 0.9V), the potential change of the bit line is detected and memory cell data is read.

In "VERIFY00", if the two storage circuits (LATCH1, C1) in the data circuit latch program data of "11", "10" and "01", the program data have no change.

On the other hand, in "VERIFY00", if the two storage circuits (LATCH1, C1) in the data circuit latch program data of "00" and the read data indicates that the program is sufficient, i.e., the level of the bit line-is "H", then the program data changes from "00" to "10" (odd page data changes from "0" to "1") so that the program is not conducted thereafter.

In "VERIFY00", if the two storage circuits (LATCH1, C1) in the data circuit latch program data of "00" and the read data indicates that the program is insufficient, i.e., the level of the bit line is "L", then the program data has no change so as to continue the program operation.

As shown in the flow chart of FIG. 30, "VERIFY01". described above is executed prior to the "VERIFY00".

Accordingly, in "VERIFY01", the data indicating that "01"-programming is sufficient has been read, the data latched by the two storage circuits (LATCH1, C1) in the data circuit have already changed from "01" to "11". If data indicating that "01"-programming is insufficient is read, the data latched by the two storage circuits (LATCH1, C1) in the data circuit remains "01".

The concrete operation will be described hereinafter.

First, an operation for precharging the bit line and an operation for reading memory cell data to the bit line are executed.

Namely, after precharging the bit line, at period RCLK7, the potential of SGS becomes Vread and the potential of the bit line changes according to the memory cell data.

For example, the memory cells to which "11"-programming and "10"-programming are conducted (i.e., memory cells which are not programmed), are turned on by the potential Vcgv00 (e.g., about 0.9V). Due to this, the charges of the bit line are discharged and the potential of the bit line becomes not higher than 0.3V.

Further, in case of the memory cells to which "00"-programming is conducted, if the "00"-programming is deficient, the memory cell is turned on by the potential Vcgv00 (e.g., about 0.9V). Due to this, the charges of the bit line are discharged and the potential of the bit line becomes not higher than 0.3V.

Moreover, in case of the memory cells to which "00"-programming is conducted, if the "00"-programming is sufficient, the memory cell is turned off by the potential Vcgv00 (e.g., about 0.9V). Due to this, the charges of the bit line are not discharged and the bit line maintains the potential 0.8V.

Moreover, in case of the memory cells to which "01"-programming is conducted, if the "01"-programming is sufficient, the memory cell is turned off by the potential Vcgv00 (e.g., about 0.9V). Due to this, the charges of the bit line are not discharged and the bit line maintains the potential 0.8V.

However, if "01"-programming is deficient, there are cases where the memory cell is turned on (the threshold voltage is lower than Vcgv0) and cases where the memory cell is turned off (the threshold voltage is higher than Vcgv00). Due to this, if "01"-programming is deficient, it is determined whether the bit line maintains the potential 0.8V or has a potential not higher than 0.3V according to the threshold voltage of the memory cell.

Here, in this embodiment, while the memory cell data is being read to the bit line, i.e., at periods RCLK7 to RCLK8, the level of REG1 becomes "H". It is noted that the potential of BLCLMP is Vclmp (e.g., about 1.6V).

As is obvious from Table 9, when the even page data is "1" ("11"-programming and "01"-programming), the DRAM cell (node CAP1ij) latches "H". Namely, in case of "11"-programming and "01"-programming, the sense node DTNij is short-circuited to VREG (Vss) and the potential of the sense node is forcedly set at Vss.

As a result, if "11"-programming and "10"-programming are conduced, "00"-programming is deficient and "01"-programming is conducted, the level of the bit line becomes "L", i.e., becomes a potential not higher than 0.3V. Only if "00"-programming is sufficient, the bit line maintains the level "H", i.e., the potential 0.8V.

Thereafter, at period RCLK9, the potential of BLCLMP becomes Vss and the bit line is electrically disconnected from the sense node.

In the meantime, while the above-stated operations, i.e., the bit line is being precharged or discharged (cell data is being read), the program data stored in the latch circuit LATCH1 is transferred to and temporarily stored by the node CAP2ij. By doing so, read data is prevented from colliding against the odd page data.

At period RCLK1, the potentials of CAPCRG and VREG are set at Vdd. At period RCLK4, the potential of BOOT is set at Vss. At period RCLK5, when the potential of VREG becomes Vss, the node CAP2ij is reset at Vss. During these periods, the potential of DTG2 is Vss.

At period RCLK9/SCLK1, the potential of CAPCRG becomes Vss and the node CAP2ij turns into a floating state. Then, at period SCLK2, the potential of DTG2 becomes Vsg (e.g., about 4.5V) and the program data (odd page data) latched by the latch circuit LATCH1 is transferred to and temporarily stored in the node CAP2ij by way of the MOS transistor TN2.

That is to say, if the odd page program data is "0" ("00"-programming and "01"-programming is conducted), the level of the node Naij of the latch circuit LATCH1 is "L" and the potential of the node CAP2ij, therefore, becomes Vss.

Further, if the odd page program data is "1" (the "11" or "10" state is maintained or "00"-programming and "01"-programming are sufficient), the level of the node Naij of the latch circuit LATCH1 is "H" and the potential of the node CAP2ij, therefore, becomes Vdd.

Thereafter, at period SCLK3, the potential of DTG2 becomes Vdd. At period SCLK4, the potential of BOOT becomes Vdd.

At this time, if the odd page program data is "0" ("00"-programming or "01"-programming is conducted), the potential of the node CAP2ij remains Vss. If the odd page program data is "1" (the "11" state or "10" state is maintained), the potential of the node CAP2ij is booted by the capacitor DLN (C2) and, therefore, rises from Vdd (e.g., about 2.3V) to about 3.5V.

Then, at period SCLK5, the potential of DTG2 becomes Vss and the node CAP2ij is electrically disconnected from the latch circuit LATCH1.

Further, at period SCLK6, the levels of both SEN and LAT become "L", those of both SENB and LATB become "H" and the latch circuit LATCH1 in the data circuit, i.e., the clocked inverters CINV1 and CINV2, turns into a non-operation state.

At period SCLK7, the potential of BLC becomes Vsg (e.g., about 4.5V) and that of nPRST becomes "L", whereby the sense node DTNij is charged and the potential of the sense node becomes Vdd. At the same time, the potential of Naij becomes Vdd. At period SCLK8, when the potential of nPRST becomes Vdd, the sense node DTNij turns into a floating state.

At period SCLK9, when the potential of BLCLMP becomes Vsense (e.g., about 1.6V), the memory cell data read to the bit line is transferred to the sense node DTNij.

Namely, in case of the memory cells which have been programmed deficiently among those to which "11"-programming and "10"-programming are conducted and those to which "00"-programming is conducted, the potential of the bit line is not higher than 0.3V. Due to this, the potential of the sense node DTNij decreases to a potential not higher than 0.3V, as well.

On the other hand, in case of the memory cells which have been programmed sufficiently among those to which "00"-programming is conducted, the bit line maintains the potential 0.8V. Due to this, the clamping MOS transistor TN9 (FIG. 9) is cut off and the sense node DTNij maintains the potential Vdd.

At period SCLK10, the potentials of the sense node DTNij become those as shown in Table 11.

TABLE 11

| | Sense node (DTNij.Naij) in "VERIFY 00" | | | | |
|---|---|---|---|---|---|
| | "11", "10"-programming (Write inhibit) | "00"-programming Deficient | "00"-programming Sufficient | "01"-programming Deficient | "01"-programming Sufficient |
| Point of SCLK 10 | "Low" | "Low" | "Low" | "Low" | "High" |
| Point of SCLK 12 | "High" | "Low" | "Low" | Low" | "High" |

Thereafter, at period SCLK11, the potential of REG2 becomes Vsg and the MOS transistor TN6 (FIG. 9) is turned on.

Here, if "11"-programming and "10"-programming are conducted and "01"-programming is sufficient (odd page data is "1", note that if "01"-programming is sufficient, "01" is changed to "11"), the node CAP2ij latches "H" and the MOS transistor TN1 (FIG. 9) is, therefore, turned on. Namely, the COMi (set at Vdd) and the sense node DTNij are short-circuited to each other, with the result that the potential of the sense node DTNij becomes Vdd.

Further, if "00"-programming is conducted and "01"-programming is deficient (odd page data is "10"), the node CAP2ij latches "L" and the MOS transistor TN1 (FIG. 9) is, therefore, turned off. Namely, since the CMOi (having a potential set at Vdd) and the sense node DTNij are electrically disconnected from each other, the potential of sense node DTNij has no change.

Accordingly, the potentials of the sense node DTNij at period SCLK12 become those as shown in Table 11.

Then, at period SCLK13, the potential of SEN becomes Vdd, that of SENB becomes Vss and the clocked inverter CINV1 turns into an operation state. Due to this, the potential of the sense node DTNij is sensed.

As shown in Table 11 above, if "11"-programming and "10"-programming are conducted, the level of the sense node DTNij is "H" and that of the node Naij is "H", as well. In case of conducting "11"-programming and "10"-programming, the level of the node Naij is originally "H" (see Table 9). Therefore, if "11"-programming and "10"-programming is conducted, the program data has no change.

Furthermore, if "00"-programming is conducted and the "00"-programming is deficient, the level of the sense node DTNij is "L" and that of the node Naij is "L", as well. In case of conducting "00"-programming (odd page data "0"), the level of the node Naij is originally "L" (see Table 9). Therefore, if "00"-programming is conducted and the "00"-programming is deficient, the program data has no change, either.

Moreover, if "00"-programming is conducted and the "00"-programming is sufficient, the level of the sense node DTNij is "H" and that of the node Naij is "H", as well. In case of conducting "00"-programming (odd page data "0"), the level of the node Naij is originally "L" (see Table 9). Therefore, if "00"-programming is conducted and the "00"- programming is sufficient, the program data changes from "00" to "10" (the value of the node Naij of the latch circuit LATCH1, i.e., the odd page data changes from "0" to "1").

In addition, if "01"-programming is conducted and the program is deficient in VERIFY01, the level of the sense node DTNij is "L" and that of the node Naij is "L", as well. In case of conducting "01"-programming (odd page data "0"), the level of the node Naij is originally "L" (see Table 9). Therefore, if "01"-programming is conducted and the program is deficient, the program data has no change.

If "01"-programming is conducted and the program is sufficient in VERIFY01, the level of the sense node DTNij is "H" and that of the node Naij is "H", as well. If the program is sufficient in VERIFY01, the program data changes from "01" to "11" as described above, and the level of the node Naij is, therefore, "H" (see Table 10). Thus, if "01"-programming is conducted and the program is sufficient, the program data has no change, either (note: the program data remains "11").

Figure 45:
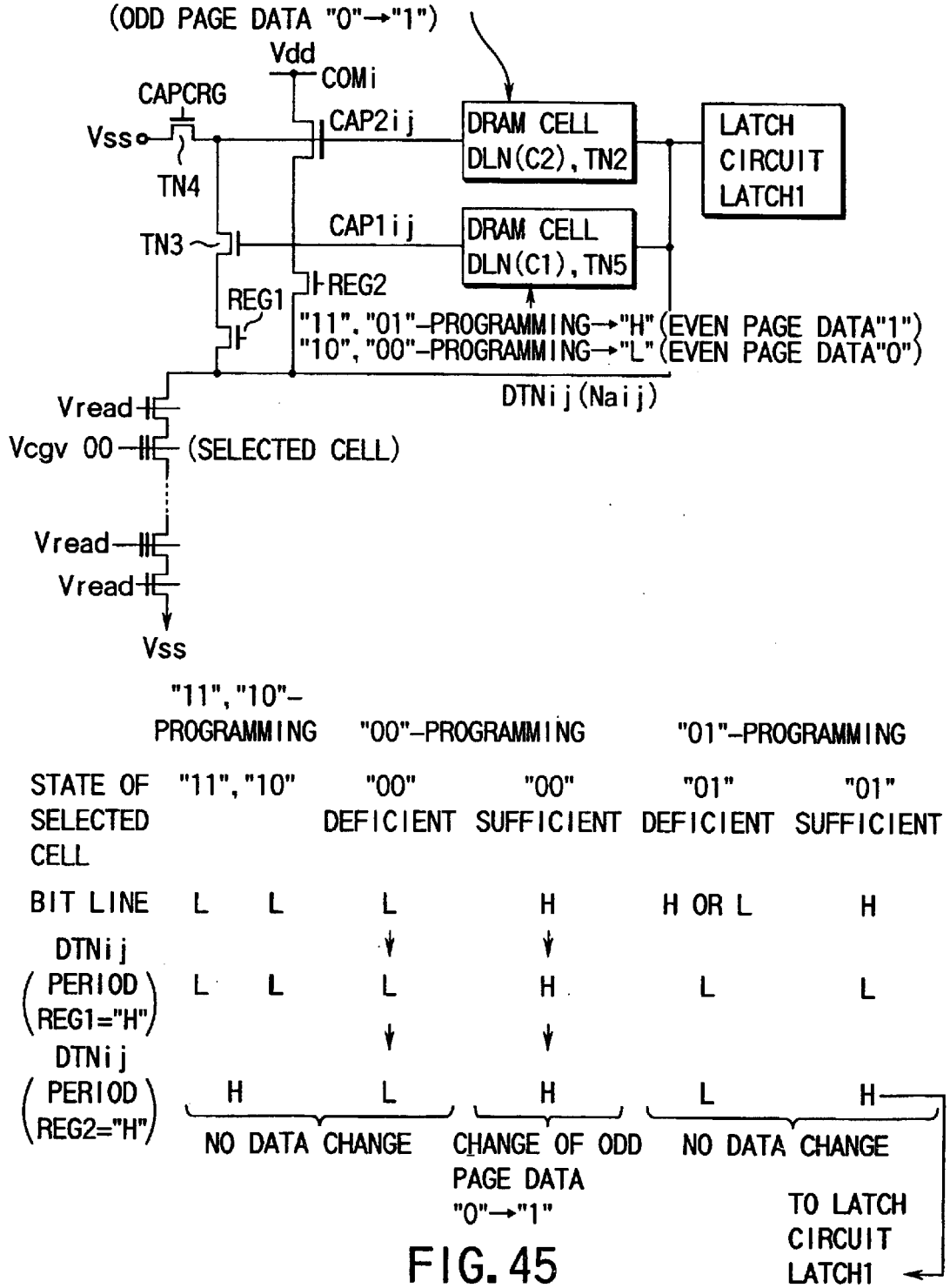
FIG. 45 shows the outline of "00" verify read during the program operation.

FIG. 45 shows the simplified state of the "00" verify read operation.

2.-2.-5. "Program Completion Detection"

Following "VERIFY01" and "VERIFY00", "Program completion detection" operation is carried out to detect whether or not "01"-programming or "00"-programming has been successfully completed to all the memory cells to which "01"-programming or "00"-programming is conducted.

This detection is made based on the data (see Tables 10 and 11) latched by the latch circuit LATCH1 in "VERIFY01" and "VERIFY00". If "01"-programming or "00"-programming is deficient, reprogram (supply of a program pulse) is executed. If "01"-programming or "00"-programming is sufficient, the program (supply of a program pulse) is completed.

FIG. 33 shows operation timing for "Program completion detection".

As already described in the outline of the operation with reference to FIG. 35, after the completion of "VERIFY00", the next "supply of a programming pulse" is instantly carried out and "Program completion detection" is executed in parallel with the "supply of a programming pulse".

Accordingly, period PCLK7/CCLK1 is the same as period PCLK7/CCLK1 shown in FIG. 29.

Further, in "Program completion detection" in the odd page data program operation", operations from periods PCLK7/CCLK1 to CCLK9 shown in FIG. 33 are executed.

First, at period CCLK1, the potential of CAPCRG becomes Vsg, that of VREG becomes Vdd, the node CAP2ij is charged and the potential of the node CAP2ij becomes Vdd (while the potential of DTG2 is Vss).

Then, at period CCLK2 (DCLK1), when the potential of COMHn (FIG. 12) changes from Vss to Vdd and that of NCOML (FIG. 12) changes from Vdd to Vss, the potentials of both COMi1 and COMi2 become Vdd and COMi1 and COMi2 turn into a-floating state, and the potential of NCOM becomes Vss and NCOM turns into a floating state.

At period DCLK2, the potential of, for example, REG2-0 becomes Vdd. At this time, in FIG. 12, the first and fifth data circuits are selected and the potentials of REG2 in the first data circuit and that of REG2 in the fifth data circuit become Vdd.

If the level of the data of the node Naij of the latch circuit LATCH1 is "H (Vdd)" (see Table 11) in each of the first and fifth data circuits, i.e., "11"-programming and "10"- programming (write inhibit) are conducted or "00"-programming and "10"-programming are sufficient, then the sense node DTNij maintains "H (Vdd)". Due to this, the MOS transistor TN6 (FIG. 9) is turned off and COMi1 and COMi2 maintain the potential Vdd. NCOM, therefore, maintains the potential Vss.

On the other hand, if the level of the data of the node Naij of the latch circuit LATCH1 is "L (Vss)" (see Table 11) in at least one of the first and fifth data circuits, i.e., "00"-programming and "01"-programming is deficient, then the sense node DTNij maintains "L (Vss)". Due to this, the MOS transistor TN6 (FIG. 9) is turned on and the potential of COMi1 or CoMi2 changes from Vdd to Vss. The potential of NCOM, therefore, changes from Vss to Vdd.

Likewise, the potentials of REG2-1, REG2-2 and REG2-3 sequentially become Vdd. Namely, when the potential of REG2-1 is Vdd, the second and sixth data circuits are selected. When the potential of REG2-2 is Vdd, the third and seventh data circuits are selected. When the potential of REG2-3 is Vdd, the fourth and eighth data circuits are selected. In each data circuit, the state of the latch circuit LATCH1, i.e., whether "00"-programming and "01"-programming are sufficient/deficient is detected.

As a result, if data indicating that "11"-programming and "10"-programming (write inhibit) are conducted or "00"-programming and "01"-programming are sufficient, is outputted from all of the first to eighth data circuits, the potential of NCOM becomes Vss at period CCLK3. If data indicating that "00"-programming and "01"-programming are deficient, is outputted from at least one of the first to eighth data circuits, the potential of NCOM becomes Vdd at period CCLK3.

Further, all columns are connected in series to the FLAG node (FIG. 12). Accordingly, the FLAG node is preset to have the potential Vdd and in a floating state and then at period CCLK3, the potential of COLPRE is set at Vdd and the MOS transistor TN17 (FIG. 12) is turned on.

At this time, data indicating that "11"-programming and "10"-programming (write inhibit) are conducted or "00"-programming and "01"-programming are deficient, is outputted from all data circuits corresponding to all columns, the potential of NCOM is Vss and the MOS transistor TN16 (FIG. 12) is, therefore, turned off. Accordingly, the FLAG node maintains the potential Vdd.

Further, if data indicating that "00"-programming and "01"-programming are deficient is outputted from at least one of all data circuits corresponding to all columns, the potential of NCOM becomes Vdd and the MOS transistor TN16 (FIG. 12) is, therefore, turned on. Accordingly, the potential of the FLAG node changes from Vdd to Vss.

As can be seen from the above, only if there does not exist a memory cell for which "00"-programming and "01"-programming are deficient in each column, the FLAG node maintains the potential Vdd. If there exists a memory cell for which "00"-programming and "01"-programming are deficient, in at least one column, the potential of the FLAG node becomes Vss.

Accordingly, if this FLAG node level is detected and the potential of the FLAG node is Vdd, i.e., there does not exist a column (memory cell) for which "00"-programming and "01"-programming are deficient, the odd page data program routine is completed. If the potential of the FLAG node is Vss, i.e., there exists at least one column (memory cell) for which "00"-programming and "01"-programming are deficient, the "01" verify read operation and the "00", verify read operation are re-executed and then Program completion detection is conducted in parallel with the supply of a program pulse.

In a fail column replaced by a spare cell by the redundancy circuit due to the presence of a fail cell (it is assumed that a replacement unit is eight columns), the fuse element of the batch detection circuit 10 shown in FIG. 12 is cut off. Accordingly, the potential of the FLAG node does not become Vss because of such a fail column.

2.-2.-6. "00"-Program Completion Detection

After Program completion detection, "00"-Program completion detection is conducted to detect whether or not "00"-programming has been successfully completed to all the memory cells to which "00"-programming is conducted.

The purpose of "00"-Program completion detection is, as already described in the outline of the odd page data program operation, to omit "VERIFY00" after all the memory cells to which "00"-programming is conducted have been sufficiently programmed and finally to make all the memory cells to which "00"-programming and "01"-programming are conducted, sufficiently programmed.

In that case, after all the memory cells to which "00"-programming is conducted have been programmed sufficiently, "VERIFY00" is omitted. Thus, it is possible to shorten program time (accelerate program).

Periods CCLK4 to CCLK9 shown in FIG. 33 indicate operation timing for "00"-Program completion detection.

"00"-Program completion detection is conducted in parallel with the supply of a program pulse (FIG. 29) as in the case of Program completion detection.

At period CCLK5, the potential of C-APCRG becomes Vsg and the MOS transistor TN4 (FIG. 9) is turned on. As a result, the node CAP2ij is short-circuited to VREG (Vdd) and the potential of the node CAP2ij becomes Vdd. Then, at period DCLK2, the potential of CAPCRG becomes Vss and the MOS transistor TN4 (FIG. 9) is turned off. As a result, the node CAP2ij turns into a floating state. It is noted that the potential of DTG2 is Vss.

Thereafter, at period DCLk3, the potential of REG1 becomes Vdd. In addition, in case of "11"-programming and "01"-programming, the level of the node CAP1ij is "H" (see Table 9).

In case of "11"-programming, the potential of the sense node DTNij is Vdd. Therefore, the MOS transistors TN3 and TN10 (FIG. 9) are turned off and the node CAP2ij maintains the potential Vdd.

If "01"-programming is sufficient, the potential of the sense node DTNij is Vdd. Therefore, the MOS transistors TN3 and TN10 (FIG. 9) are turned off and the node CAP2ij maintains the—potential Vdd. If "01"-programming is deficient, the potential of the sense node DTNij is Vss. Therefore, the MOS transistors TN3 and TN10 (FIG. 9) are turned on and the potential of the node CAP2ij changes from Vdd to Vss.

Further, in case of "00"-programming and "10"-programming, the level of the node CAP1ij is "L" (see Table 9). Therefore, the MOS transistor TN3 (FIG. 9) is turned off and the node CAP2ij maintains the potential Vdd.

Namely, at period DCLK4, only if "01"-programming is deficient, the potential of the node CAP2ij becomes Vss; otherwise, the node CAP2ij maintains the potential Vdd.

At period DCLK4, the level of COMHn becomes "L" and the potentials of COMi1 and COMi2 shown in FIG. 12 have the potential Vdd and turn into a floating state. It is noted that the node NCOM has the potential Vss and in a floating state.

At period DCLK4, the potential of, for example, REG2-0 becomes Vdd. At this time, in FIG. 12, the first and fifth data circuits are selected and the potential of REG2 in the first data circuit and that of REG2 in the fifth data circuit become Vdd.

Here, COMi1 and COMi2 are discharged (the potentials of COMi1 and COMi2 become Vss) only when the potential of the node CAP2ij is Vdd and that of the sense node DTNij is Vss. This corresponds to a case where "00"-programming is deficient.

Accordingly, if "00"-programming is deficient in at least one of the first and fifth data circuits, the potential of at least one of COMi1 and CoMi2 becomes Vss and at least one of the MOS transistors TP2 and TP3 is turned on. As a result, the node NCOM is charged and the potential of the node NCOM, therefore, becomes Vdd.

If "00"-programming is not deficient in each of the first and fifth data circuits, both COMi1 and COMi2 maintain the potential Vdd and both the MOS transistors TP2 and TP3 are turned off. As a result, the node NCOM maintains the potential Vss.

Likewise, the potentials of REG2-1, REG2-2 and REG2-3 sequentially become Vdd. Namely, when the potential of REG2-1 is Vdd, the second and sixth data circuits are selected. When the potential of REG2-2 is Vdd, the third and seventh data circuits are selected. When the potential of REG2-3 is Vdd, the fourth and eighth data circuits are selected. In each data circuit, whether "00"-programming is sufficient/deficient is detected.

As a result, if data indicating that "00"-programming is deficient, is outputted from at least one of the first to eighth data circuits, the potential of NCOM becomes Vdd at period CCLK7.

Further, only if data indicating that "00"-programming is deficient, is not outputted from any one of the first to the eighth data circuits, the potential of the node NCOM becomes Vss at period CCLK7.

In the meantime, all columns are connected in series to the FLAG node (FIG. 12). Accordingly, the FLAG node is set to have the potential Vdd and in a floating state and then at period CCLK7, the potential of COLPRE is set at Vdd and the MOS transistor TN17 (FIG. 12) is turned on.

At this time, if data indicating that "00"-programming is deficient, is outputted from at least one of all data circuits corresponding to all columns, the potential of NCOM is Vdd and the MOS transistor TN16 (FIG. 12) is, therefore, turned on. Accordingly, the potential of the FLAG node becomes Vss.

On the other hand, if data indicating that "00"-programming is deficient, is not outputted from any one of all data circuits corresponding to all columns, the potential of NCOM is Vss and the MOS transistor TN16 (FIG. 12) is, therefore, turned off. Accordingly, the potential of the FLAG node becomes Vdd.

As can be seen from the above, only if there does not exist a memory cell for which "00"-programming is deficient in any column, the FLAG node maintains the potential Vdd. If there exists a memory cell for which "00"-programming is deficient in at least one column, the potential of the FLAG node becomes Vss.

Accordingly, if the level of this FLAG node is detected and the potential of the FLAG node is Vdd, i.e., there does not exist a column (memory cell) for which "00"-programming is deficient, "VERIFY00" is not conducted thereafter. If the potential of the FLAG node is Vss, i.e., there exists a column (memory cell) for which "00"-programming is deficient, "VERIFY00" continues.

In a fail column replaced by a spare cell by the redundancy circuit due to the presence of a fail cell (it is assumed that a replacement unit is eight columns), the fuse element of the batch detection circuit 10 shown in FIG. 12 is cut off. Accordingly, the potential of the FLAG node does not become Vss because of such a fail column.

3. Erase Operation

During the erase operation, an erase Vera (e.g., about 20V) is applied to the cell well.

The potential of all word lines in a selected memory block are set at the ground potential Vss. As a result, a high electric field is applied to the tunnel oxide film of each memory cell in the selected memory cell block and electrons in the floating gate electrode of the memory cell are emitted to the channel (cell well) and the threshold voltage of the memory cell decreases.

The potentials of all word lines in unselected memory cell blocks are set in a floating state. As a result, if the erase potential Vera is applied to the cell well, the potential of each word line rises to the erase potential Vera or a potential close to Vera by the capacitive coupling between the cell well and the word line (control gate electrode). Therefore, a high electric field is not applied to the tunnel oxide film of each memory cell in the unselected memory cell blocks and the transfer of electrons into the floating gate electrode of the memory cell is little and the threshold voltage of the memory cell does not change.

Meanwhile, in the first memory cell block shown in FIG. 14, a Row shield line exists on the memory cell array. During the erase operation, the potential of this Row shield line rises from Vss to Vera as in the case of the potential of the cell well. If the potential of the Row shield line becomes Vera, each word line in the unselected memory cell blocks sufficiently rises to the erase potential Vera or a potential close to Vera by the capacitive coupling between the cell well and the word line, and erroneous data erase does not, therefore, occur.

Further, in the second memory cell block shown in FIG. 15, a word line driver select signal line instead of the Row shield line is arranged on the memory cell array. During the erase operation, the word line driver select signal line turns into a floating state. Also, the potential of the bit line becomes Vera. Each word line in the unselected memory cell blocks sufficiently rises to the erase potential Vera or a potential close to Vera by the capacitive coupling between the cell well and the word line, and erroneous data erase does not, therefore, occur.

If the potential of either the row shield line or the block select line is, for example, Vss or Vdd, a large capacity is generated between the word line and the row shield line or block select line in the memory cells under the row shield line or the block select line. As a result, it becomes difficult to boost the word line to thereby cause erroneous data erase.

After the erase potential (erase pulse) Vera is applied to the cell well, an erase verify operation is conducted to verify whether or not data has been erased sufficiently. The erase verify operation consists of an erase verify read operation for reading memory cell data after applying the erase pulse to the cell well and "Erase completion detection" for detecting whether or not a column which data has not been erased sufficiently exists.

In the memory cell circuit in this embodiment (e.g., see FIG. 9), one data circuit is common to the two bit lines BLe and BLo. Due to this, after conducting the erase verify read operation to the memory cells connected to the even-numbered bit line BLe, "Erase completion detection" is conducted to detect whether or not all the data of all the memory cells connected to the even-numbered bit line BLe have been erased.

Then, after conducting the erase verify read operation to memory cells connected to, for example, the odd-numbered bit line BLo, "Erase completion detection" is conducted to detect whether or not the data of all memory cells connected to the odd-numbered bit line BLo have been erased.

If it is confirmed that the data of all the selected memory cells have been erased sufficiently, the erase operation is completed. If there is a memory cell which data has been erased deficiently, an erase operation (supply of an erase pulse) is executed again.

The erase operation will be described in detail with reference to the operation timing view hereinafter.

3.-1. Supply of Erase Pulse

Figure 46:
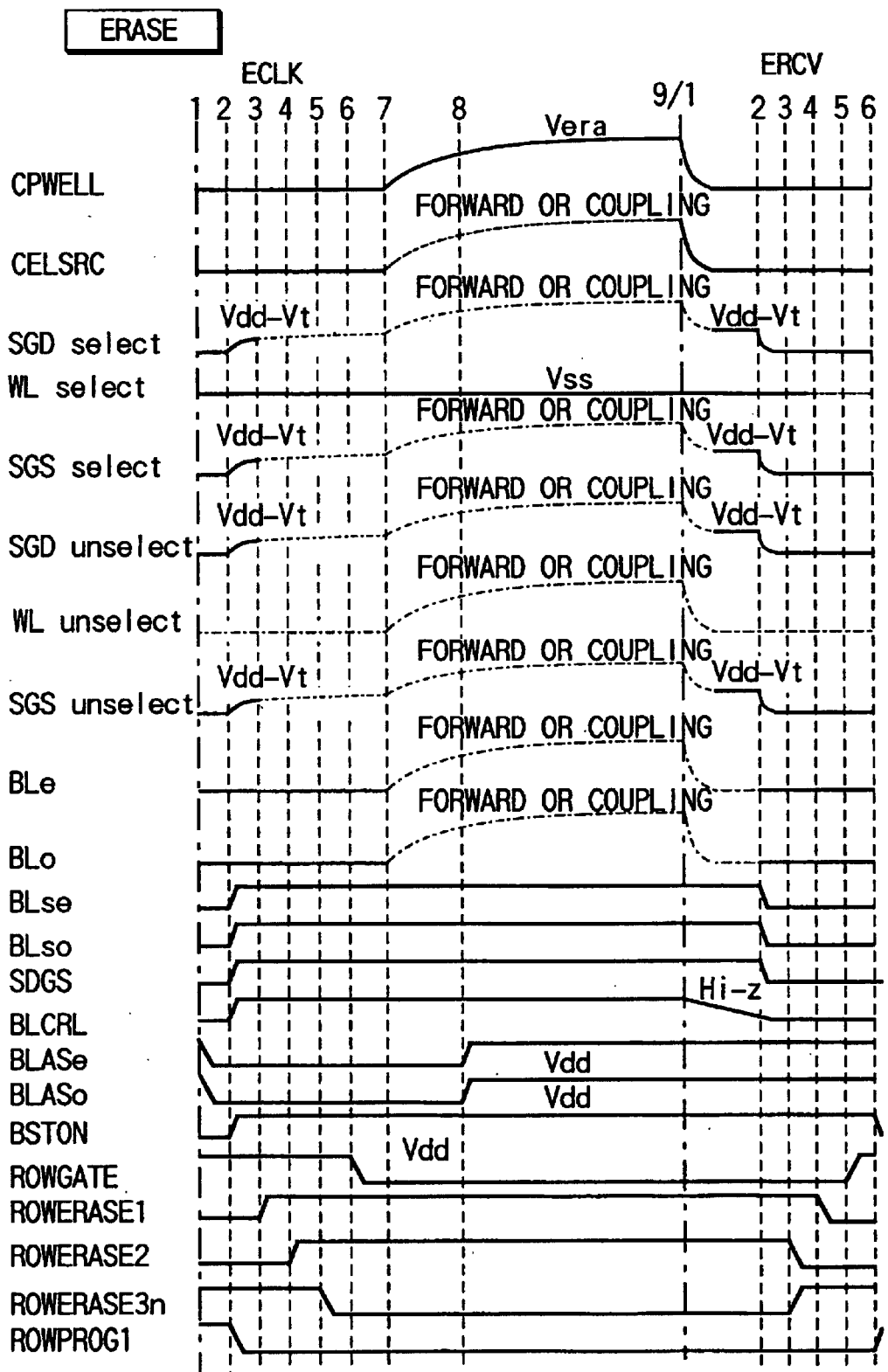
FIG. 46 is a waveform view showing operation timing relating to the supply of an erase pulse during erase operation.

FIG. 46 shows operation timing relating to the supply of an erase pulse.

<Odd-numbered memory cell block>

In an odd-numbered memory cell block, the word lines in this block and the word line control circuit (row address decoder and word line driver) for controlling the potentials of select gate lines are arranged at one side of the memory array as already described above. Description will be given hereinafter while taking the first memory cell block as an example.

If the first memory cell block is selected, the potential of the output signal RDECAD of the row address decoder RADD1 shown in FIG. 16 becomes Vdd and the potential of the node TransferG1 in the word line driver RMAIN1 shown in FIG. 17 is set at Vdd. The potentials of the signal lines CG1, CG2, . . . CG16 are set at the ground potential Vss by the switching circuit (FIG. 8). Further, the potentials of the signal lines SGD and SGS are set at Vdd.

At this time, the potentials of the word lines WL1, WL2, . . . WL16 are set at the ground potential Vss and the potentials of the select gate lines SG1 and SG2 are set at Vdd-vth (where Vth is the threshold voltage of the MOS transistor HNt1) and the select gate lines SG1 and SG2 turn into a floating state.

If the first memory cell block is not selected, the potential of the output signal RDECAD of the row address decoder RADD1 shown in FIG. 16 becomes Vss and the potential of the node TransferG1 in the word line driver RMAIN1 shown in FIG. 17 is set at Vss. As a result, each of the word lines WL1, WL2, . . . WL16 has the ground potential Vss and turns into a floating state.

Further, the MOS transistors HN7 and HN8 are turned on and the potential of SGDS is Vdd. Due to this, each of the select gate lines SG1 and SG2 has a potential of Vdd-Vth (where Vth is the threshold voltage of the MOS transistors HN7 and HN8) and turn into a floating state.

<Even-Numbered Memory Cell Block>

In an even-numbered memory cell block, the row address decoder in the word line control circuit for controlling the potentials of the word lines and the select gate lines in this block, is arranged at one side of the memory cell array and the word line driver is arranged at the other side of the memory cell array. Description will be given hereinafter, while taking the second memory cell block as an example.

First, at period ECLK2, the potential of ROWPROG1 becomes Vss, that of ROWPROGLB becomes Vdd, and the clocked inverters CINV5 and CINV6 in the word line driver RMAIN2 shown in FIG. 19 turn into a non-operation state. Then, at period ECLK3, the potential of ROWERASE1 becomes Vdd, that of ROWERASE1B becomes Vss and the clocked inverters CINV3 and CINV4 in the row address decoder RADD2 shown in FIG. 18 turn into a non-operation state and an operation state, respectively.

If the second memory cell block is selected, the potential of RDECADS1 becomes Vdd. Due to this, the potential of the output signal RDECADS of the row address decoder RADD2 shown in FIG. 18 becomes Vss. Further, if the second memory cell block is not selected, the potential of the output signal RDECADS1 becomes Vss. Due to this, the potential of the output signal RDECADS of the row address decoder RADD2 shown in FIG. 18 becomes Vdd.

Thereafter, at period ECLK4, when the potential of ROW-ERASE2 becomes Vdd and that of ROWERASE2B becomes Vss, the clocked inverter CINV7 turns into an operation state.

As a result, if the second memory cell block is selected, the potential of RDECADS2 becomes Vdd. Due to this, the potential of the node TransferG2 in the word line driver shown in FIG. 19 becomes Vdd. On the other hand, if the second memory cell block is not selected, the potential of RDECADS2 becomes Vss. Due to this, the potential of the node TransferG2 in the word line driver shown in FIG. 19 becomes Vss.

Then, at period ECLK5, when the potential of ROWERASE3n becomes Vss while the second memory cell block is not selected (the potential of RDECADS2 is Vss), the data is latched.

At period ECLK6, when the potential of ROWGATE becomes Vss while the second memory block is not selected (the potential of RDECADS is Vdd), the MOS transistors DHN6 and DHN9 (FIGS. 18 and 19) are cut off and the word line driver select signal line 22 (FIG. 15) turns into a floating state.

As can be seen from the above, whether the odd-numbered memory cell block or the even-numbered memory cell block is selected, the potentials of the word lines in the selected memory cell block are set at Vss and the word lines and select gate lines in the unselected blocks turn into a floating state at period ECLK6.

Further, in the even-numbered memory cell block, if the block is not selected, the word line driver select signal 22 (FIG. 15) has a potential Vdd and turns into a floating state.

Thereafter, at period ECLK7, the potential of the cell well CPWELL is set at Vera (e.g., about 20V). At this moment, in the selected block, a high electric field is applied between the word line (which potential is set at ground potential Vss) and the cell well, electrons in the floating gate electrode of each memory cell are emitted to the cell well and data erase is executed.

Moreover, in the unselected block, at period ECLK7, when the potential of cell well CPWELL is set at Vera (e.g., about 20V), the potential of each word line rises to Vera or a potential close to Vera by the capacitive coupling between the word line and the cell well. At this moment, the potential of the word line driver select signal 22 (FIG. 15) also rises by the capacitive coupling between the word line driver select signal and the cell well.

Accordingly, in the unselected block, a high electric field is not applied between the word line and the cell well, electrons in the floating gate electrode of each cell are not, therefore, emitted to the cell well and data erase is not executed.

The reason for setting the potentials of BIASe and BIASo at Vdd at period ECLK8 is to decrease the surface leak current of the drains of the MOS transistors HN1e and HN1o (FIG. 9).

After period ERCV1, a recovery operation after data erase is conducted.

If the potential of the cell well CPWELL decreases from Vera to about 10V, BLCRL is grounded to Vss and the charges of the bit lines BLe and BLo are discharged. If the potential Vera is about 10V, the potentials of the bit lines BLe and BL0 decrease to about 12V by the capacitive coupling between the bit lines BLe and BLo and the cell well CPWELL.

Accordingly, the MOS transistors HN1e and HN1o (FIG. 9) do not snap back.

If BLCRL is grounded to Vss and the charges of the bit lines BLe and BLo are discharged while the potential of the cell well CPWEL1 is about 20V, the MOS transistors HN1e and HN1o (FIG. 9) snap back and these transistors are disadvantageously broken.

3.-2. "Erase Verify Read"

Figure 47:
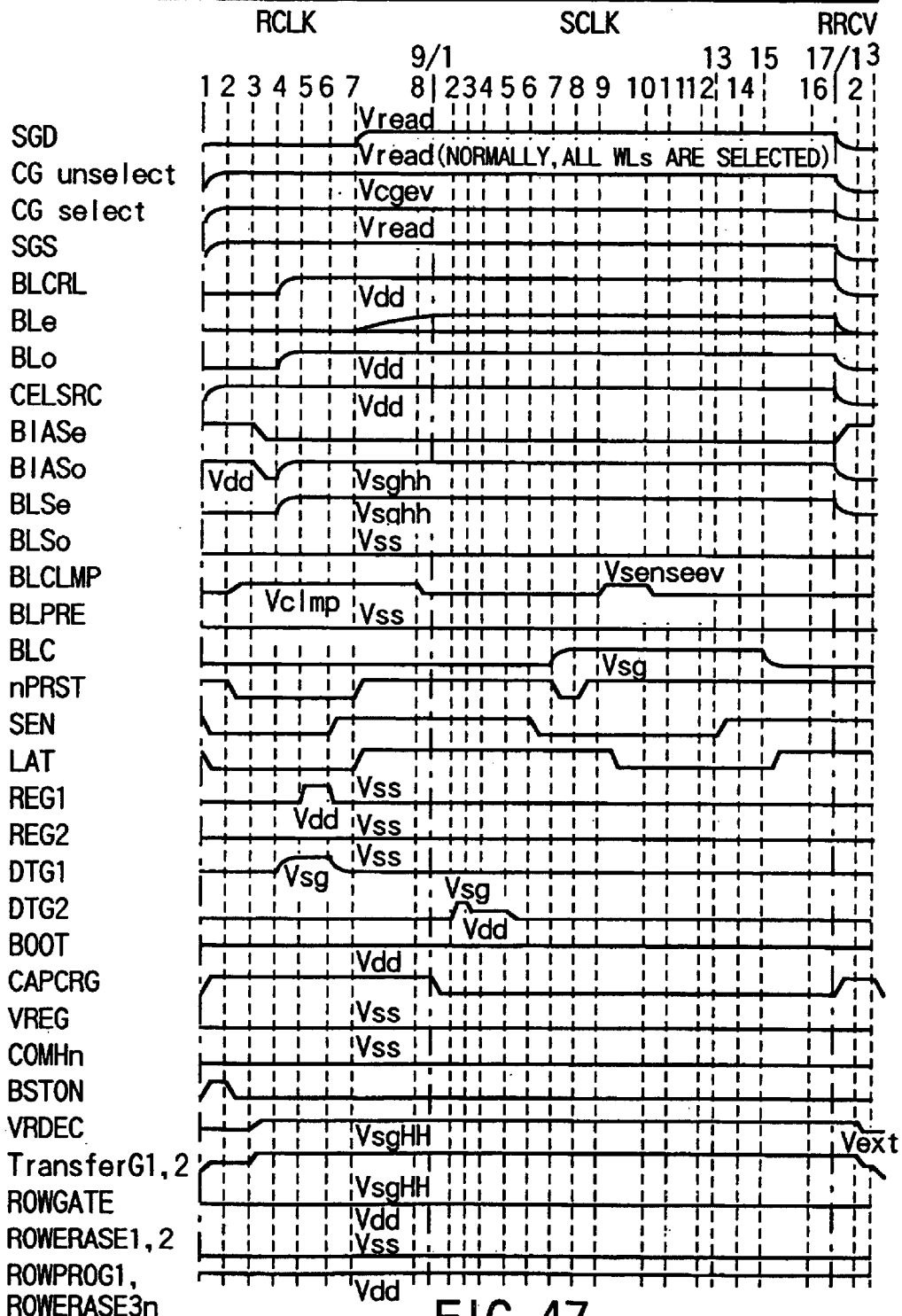
FIG. 47 is a waveform view showing operation timing relating to erase verify read during the erase operation.

FIG. 47 shows operation timing for Erase verify read.

In this embodiment, it is assumed that an erase verify read operation is conducted to memory cells connected to the even-numbered bit line BLe and that the odd-numbered bit line BLo is used as shield bit lines. In the Erase verify read operation, the potential of the shield bit line BLo is set at Vdd.

First, at period RCLK1, the potential of CAPCRG is set at Vdd. At period RCLK2, the potential of BLCLMP is set at Vclmp (e.g., about 2V). At period RCLK5, when the potential of REG1 becomes Vdd, the potential of the selected bit line BLe is set at Vss (0V) (while the potential of VREG is Vss and that of CAP1ij is Vdd).

At period RCLK7, the potential of the selected word line (control gate electrode) CGselect is set at Vcgev (e.g., 0V) and that of the select gate line SGD is set at Vread (e.g., about 3.5V) (while the potential of SGS is Vread).

The Erase verify read operation is usually conducted almost simultaneously to the memory cells connected to the bit line BLe and connected to all the word lines in the selected block. Due to this, the potentials of all word lines WL1, WL2, . . . WL16 in the selected block are set at Vcgev.

As a result, when the data of all the memory cells (memory cell in one NAND cell unit) connected to one bit line BLe in the selected one block have been erased sufficiently, the level of the one bit line BLe becomes "H". Also, the data of at least one memory cell has been erased deficiently among the memory cells connected to one bit line in the selected one block, the level of the one bit line BLe becomes "L".

In the Erase verify read operation, the potentials of unselected bit lines BLo are set at Vdd so as to reduce coupling noise generated between the bit lines.

After the potentials of the respective bit lines BLe have been determined, the potentials of the bit lines BLe are sensed as in the case of an ordinary read operation.

If the data of all memory cells connected to one bit line BLe in the selected one block have been erased sufficiently, the level of the sense node DTNij (the output node Naij of the latch circuit LATCH1) in the data circuit to which the one bit line BLe is connected, becomes "H".

Further, if the data of at least one memory cell has been erased deficiently among the memory cells connected to one bit line BLe in the selected one block, the level of the sense node DTNij (the output node Naij of the latch circuit LATCH1) in the data circuit to which the one bit line BLe is connected, becomes "L".

3.-3. "Erase Completion Detection"

Figure 48:
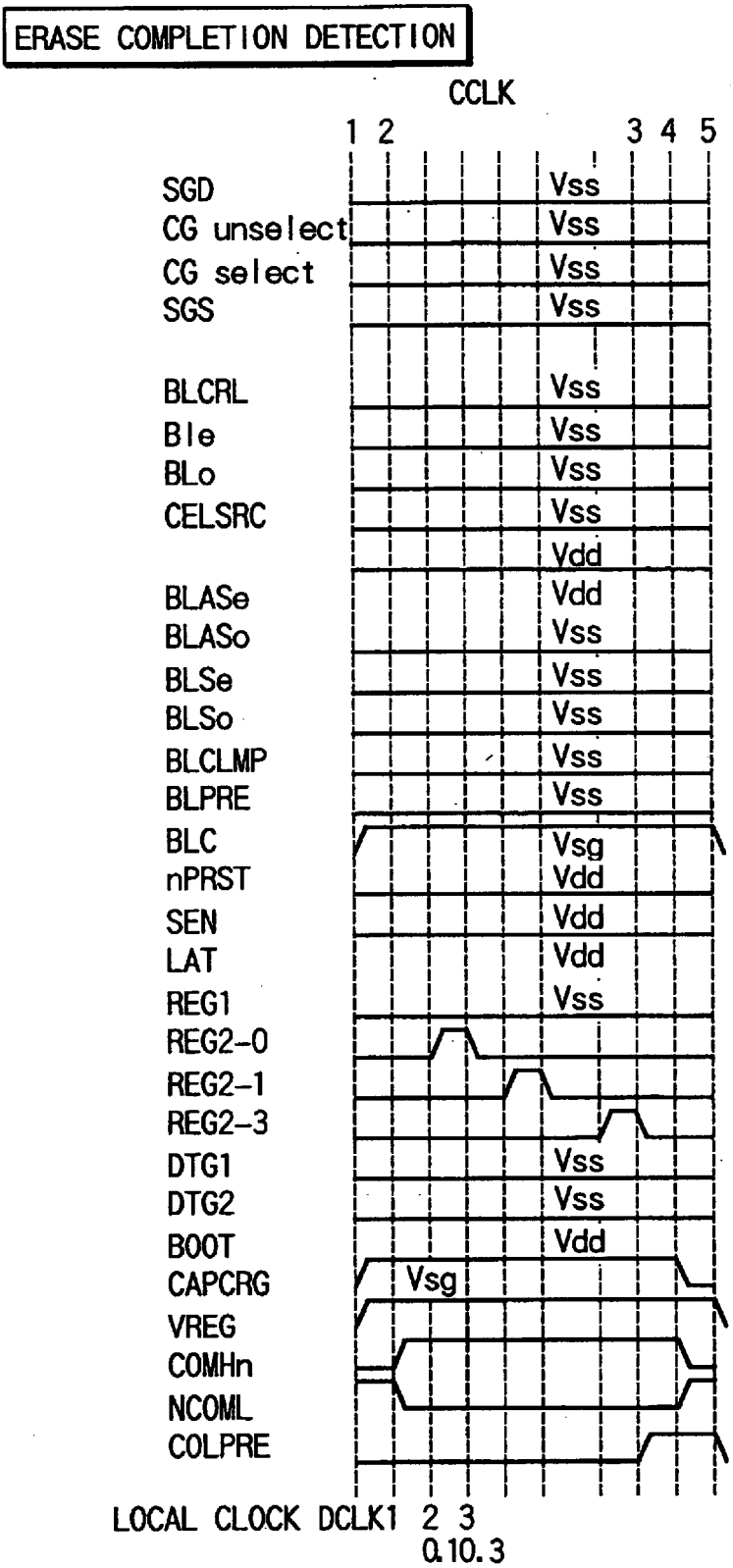
FIG. 48 is a waveform view showing operation timing relating to "Erase completion detection" during the erase operation.

FIG. 48 shows operation timing relating to Erase completion detection.

After the Erase verify read operation, "Erase completion detection" for detecting whether or not erase has been completed in all columns. In FIG. 12, when the levels of the output nodes Naij of the latch circuits LATCH1 in all data circuits are "H", the FLAG node maintains "H". In FIG. 12, when the level of the output node Naij of the latch circuit LATCH1 in at least one data circuit is "L", the level of the FLAG node becomes "L".

Since the FLAG node is connected to all columns, the data of at last one memory cell among the memory cells in the selected one block has been erased deficiently, the level of the FLAG node becomes "L" and an erase pulse is supplied again. If the data of all memory cells in the selected one block have been erased sufficiently, the level of the FLAG node becomes "H" and the erase operation is completed.

Since "Erase completion detection" is almost the same as "Program completion detection" in the above-described "even page data program operation", the detailed description of the operation is not given herein.

4. Burn-In Mode

In a burn-in mode for testing the reliability of MOS transistors (MOS transistors other than the memory cells) constituting the peripheral circuits, the value of the power supply potential Vdd is set at a higher value (e.g., about 3.5V) than a value (e.g., about 2.3V) used during an ordinary operation.

In this case, the power supply potential Vdd (e.g., about 3.5V) is applied to the node CAP2ij in the data circuit shown in FIG. 9. Accordingly, in the burn-in mode, if the value of the power supply potential Vdd is set too high, the potential of node CAP2ij becomes excessively high by capacitive coupling when the potential of BOOT changes from Vss to Vdd and the gate (MOS capacitor) of the MOS transistor DLN1 in the data circuit shown in FIG. 9 is disadvantageously broken.

To overcome such disadvantage, the potential of BOOT in the data circuit shown in FIG. 9 can be fixed to Vdd in the burn-in mode. In that case, since the potential of the node CAP2ij is always not higher than Vdd, a high voltage is not applied excessively to the gate oxide film (capacitor insulating film) of the MOS transistor DLN1.

Therefore, the gate of the MOS transistor DLN1 can be prevented from being broken.

5. DRAM Burn-In Mode

As described above, in principle, the potential Vdd cannot be applied to the node CAP2ij (DRAM cell) in the data circuit shown in FIG. 9. Then, a burn-in mode is executed to the DRAM cell at operation timing shown in FIG. 49 as follows.

Figure 49:
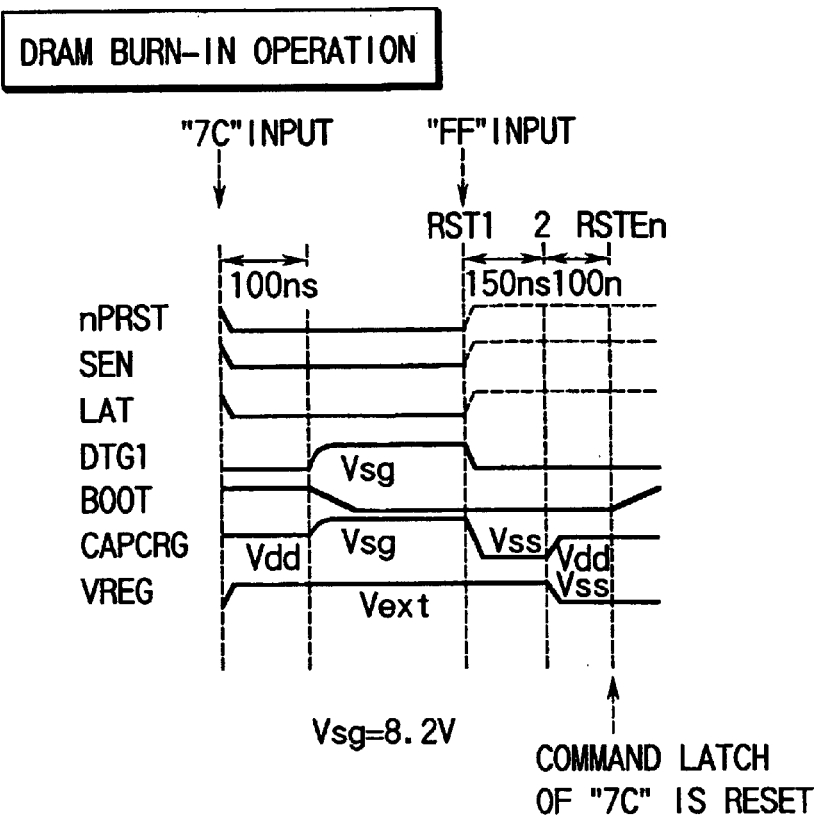
FIG. 49 is a waveform view showing operation timing relating to "DRAM Burn-in"

FIG. 49 shows a mode for conducting a-Burn-in test to the DRAM cell by applying a high potential different from Vdd to the node CAP2ij (DRAM cell).

First, Vext (power supply potential supplied externally of the chip) is applied to VREG. Also, the MOS transistor TN4 (FIG. 9) is turned on since the potential of CAPCRG is VSG.

The potential of the node CAP2ij is, therefore, fixed to Vext. It is noted that Vext is set at such a predetermined value as not to destroy the MOS capacitor DLN1.

In this embodiment, the potential of DTG1 becomes Vsg thereafter and the potential Vdd is supplied from the node Naij to the node CAP1ij (DRAM cell).

As can be seen, in this embodiment, a reliability test to the DRAM cell in the data circuit shown in FIG. 9 is conducted by "DRAM Burn-in mode", shown in FIG. 49 and a reliability test to the peripheral circuit other than the DRAM cell is conducted by an ordinary "Burn-in mode".

Further, "DRAM Burn-in mode", i.e., the reliability test to the DRAM cell can be conducted simultaneously with the reliability test to the peripheral circuits other than the DRAM cell.

6. "Refresh" . . . Fifth Feature

In this embodiment, at least one storage circuit among a plurality of storage circuits used to temporarily store multi-level data (e.g., four-level data) is constituted-by a DRAM cell (capacitor). If there is a leakage problem, it is necessary to regularly conduct a refresh operation to the DRAM cell.

For example, in the odd page data program operation, the even page data program data (data read from the memory cell) is latched by the node CAP1ij (DRAM cell). Here, there is a problem with data holding capability of the node CAP1ij due to the leakage of charges of the node CAP1ij, the data of the node CAP1ij may be refreshed regularly.

Figure 50:
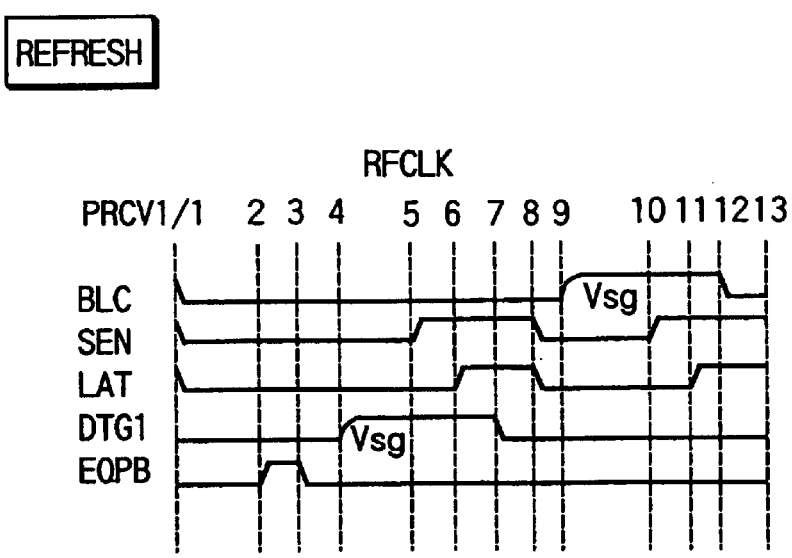
FIG. 50 is a waveform view showing operation timing relating to the refresh of a DRAM cell.

FIG. 50 shows operation timing in case of refreshing the node CAP1ij data during the program operation.

It is noted that PRCV1 corresponds to PRCV1 shown in FIG. 29 (the supply of program pulse).

At period PRCV1, as can be understood from FIG. 29, the charges of the word line are discharged. At period RFCLK1 (PRCV1), the level of BLC becomes "L" and the data circuit is disconnected from the bit line At this moment, the odd page program data is held by the bit line.

At period RFCLK1, the potentials of SEN and LAT becomes Vss and those of SENB and LATB become Vdd. As a result, the clocked inverters CINV1 and CINV2 turn into a non-operation state and the nodes Naij and Nbij turn into a floating state.

Then, at period RFCLK2, the level of EQPB becomes "H" and the potential of-the node Naij and that of the node Nbij are equalized. The MOS capacitor DLN3 shown in FIG. 9 is provided to make the capacity of the node Naij and that of the node Nbij almost equal to each other.

At period RFCLK4, the potential of DTG1 becomes Vsg and the data (even page data) of the node CAP1ij is transferred to the node Naij.

At period RFCLK5, when the level of SEN becomes "H" and that of SENB becomes "L", the data of the node CAP1ij is sensed by the clocked inverter CINV1. At period RFCLK6, when the level of LAT becomes "H" and that of LATB becomes "L", the data (even page data) of the node CAP1ij is latched by the latch circuit LATCH1.

At this point, the data of the node CAP1ij is refreshed. At period RFCLK7, when the potential of DTG1 becomes Vss, the refreshed even page data is stored again in the node CAP1ij.

Thereafter, the odd page data held by the bit line is returned to the latch circuit LATCH1.

First, at period RFCLK8, the potentials of SEN and LAT become Vss and those of SENB and LATB become Vdd. As a result, the clocked inverters CINV1 and CINV2 shown in FIG. 9 turn into a non-operation state and the nodes Naij and Nbij turn into a floating state.

At period RFCLK9, when the potential of BLC becomes Vsg, the odd page data held by the bit line is transferred to the node-Naij.

At period RFCLK10, when the level of SEN becomes "H" and that of SENB becomes "L", the odd page data is sensed by the clocked inverter CINV1. At period RFCLK11, when the level of LAT becomes "H" and that of LATB becomes "L", the odd page data is latched by the latch circuit LATCH1.

In the refresh operation in this embodiment, while the even page data held by the node CAP1ij is being refreshed, the odd page data is held by the bit line.

Accordingly, after the odd page data held by the bit line is returned to the latch circuit LATCH1, the discharge of the bit line (the discharge of the bit line after programming) is carried out. Namely, period RFCLK shown in FIG. 50 should be always before period PRCV3 shown in FIG. 29 (the supply of a program pulse).

[Modification of Data Circuit: 1] . . . Sixth and Seventh Features

Figure 51:
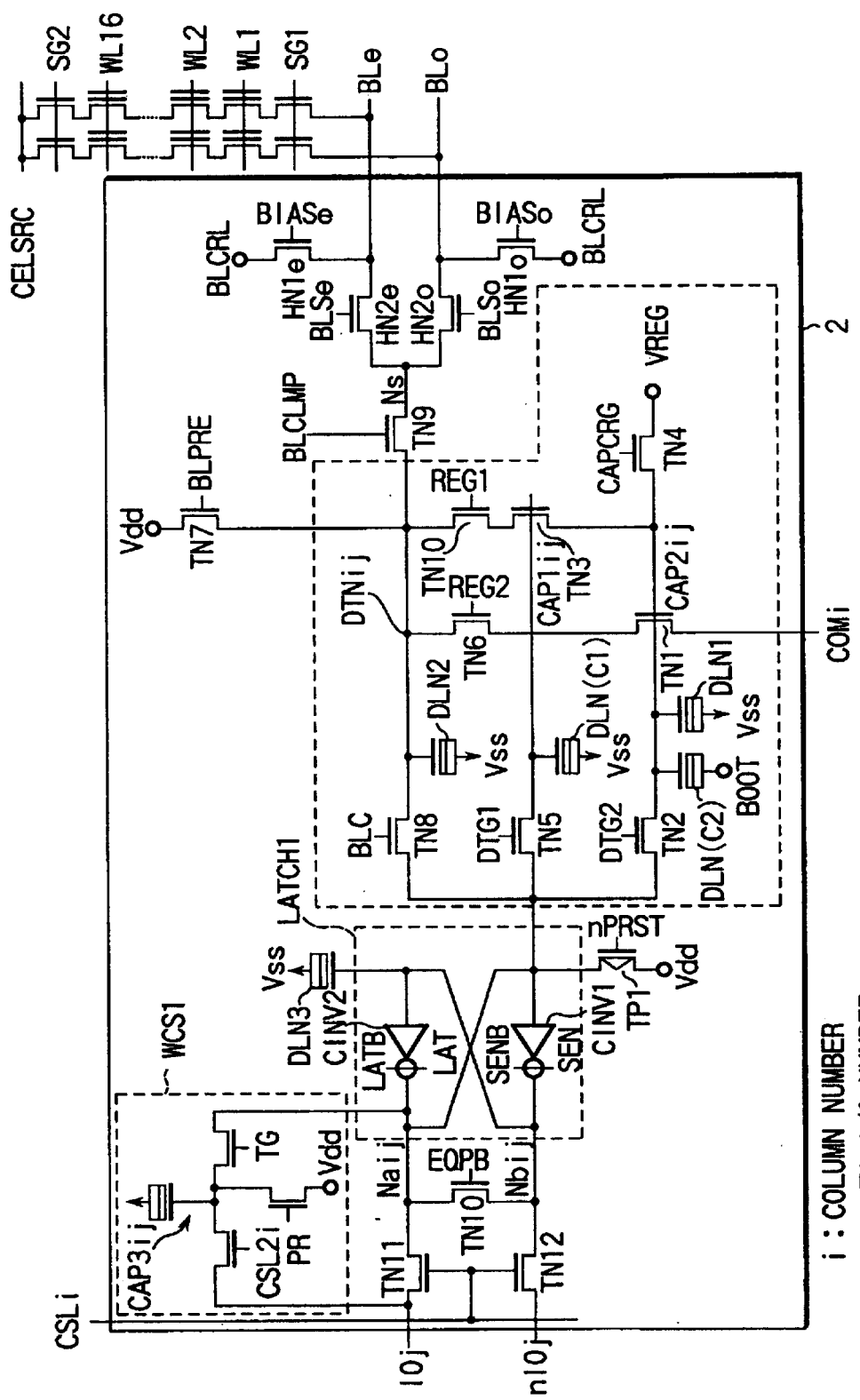
FIG. 51 shows a modification of the data circuit shown in FIG. 9.

FIG. 51 shows a modification of the data circuit.

Compared with the data circuit shown in FIG. 9, the data circuit in this modification is characterized by providing a write cache WCS21.

The write cache WCS1 is constituted by a DRAM cell.

Now, advantages obtained by using the write cache will be described.

Figure 52:
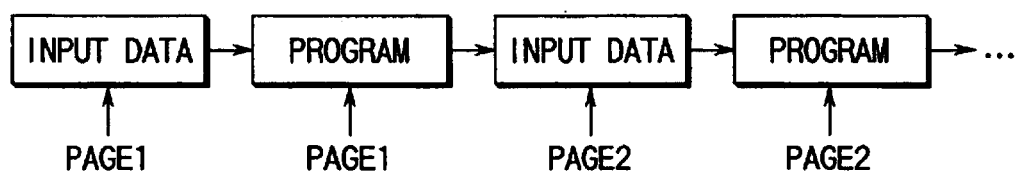
FIG. 52 shows an ordinary program sequence for a plurality of pages.

In the program operation conducted over a plurality of pages (e.g., after-programming the memory cells connected to the-word line WL1, memory cells connected to the word line WL2 are programmed and then memory cells connected to the word line WL3 are programmed), the input of program data and program (the supply of a program pulse) are conventionally conducted alternately and serially as shown in FIG. 52.

Figure 53:
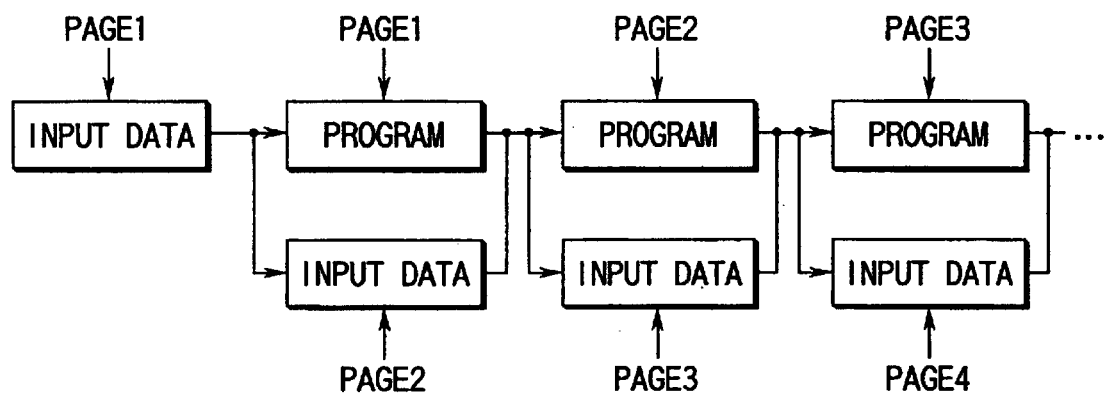
FIG. 53 is a program sequence for a plurality of pages if the data circuit shown in FIG. 51 is used.

In case of providing a write cache in the data circuit, by contrast, the input of program data and the program (the supply of a program pulse) can be conducted in parallel as shown in FIG. 53.

For example, in FIG. 51, the program data on the memory cells ("Page 1") connected to the word line WL1 is inputted by the latch circuit LATCH1 and "Page 1" is programmed. Further, program data on the memory cells ("Page2") connected to the word line WL2 is inputted into the write cache WCS1 during the program to "Page1".

After the completion of programming "Page1", the "Page2" program data held by the write cache WCS1 is transferred to the latch circuit LATCH1 and "Page2" is programmed. Also, program data on the memory cells ("Page3") connected to the word line WL3 is inputted into the write cache WCS1 while programming "Page2".

In this way, according to the data circuit provided with the write cache WCS1, program data on a page to be programmed next is loaded to the write cache WCS1 while programming a present page (supplying a program pulse). This can dispense with time for loading program data after page2. As a result, the program operation is accelerated.

Now, with regard to the write cache WCS1, operation timing during the program operation will be described in detail.

① Data Input into Write Cache

Figure 54:
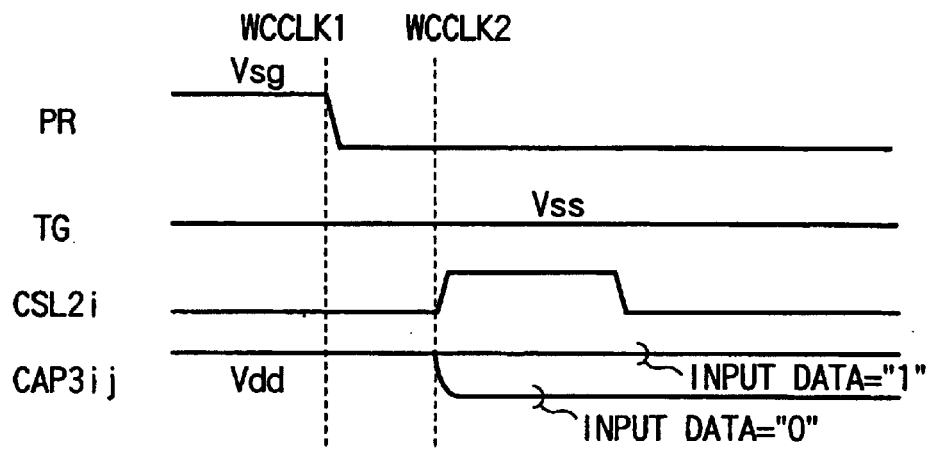
FIG. 54 is a waveform view showing operation timing for data input into a write cache in the data circuit shown in FIG. 51.

FIG. 54 shows operation timing for inputting data into the write cache.

Before inputting the program data, the potential of PR is kept Vsg. As a result, the potential of the node CAP3ij (DRAM cell) is Vdd. When a command of "iinput data into write cache WCS1" is inputted into the chip, the potential of PR changes from Vsg to Vss, the potential of the node CAP3ij becomes Vdd and the node CAP3ij turns into a floating state at period WCCLK1.

Then, at period WCCLK2, when the potential of CSL2i becomes Vdd, data is inputted into the write cache WCS1 from the input/output line IOj. In case of data "0", the potential of IOj is Vss and that of the node CAP3ij, therefore, becomes Vss (0V). In case of data "1", the potential of IOj is Vdd and that of the node CAP3ij is, therefore, kept Vdd.

While data is being inputted into the write cache WCS1, the potential of TG is Vs. Due to this, the write cache WCS1 and the latch circuit LATCH1 are electrically disconnected from each other. Therefore, even while data is being inputted into the write cache WCS1, program and verify read operations and the like can be executed based on the program data latched by the latch circuit LATCH1.

If program data is not inputted into the write cache WCS1, the potential of the node CAP3ij is Vdd, i.e., "1"-programming data is held by the node CAP3ij. As a result, columns which data are not inputted into the write cache WCS1 are not programmed.

② Data Transfer from Write Cache to Latch Circuit

When the operation for writing the data latched by the latch circuit LATCH1 into the memory cells, the data held by the write cache WCS1 is transferred to the latch circuit LATCH1 and a program operation is executed based on the data.

Figure 55:
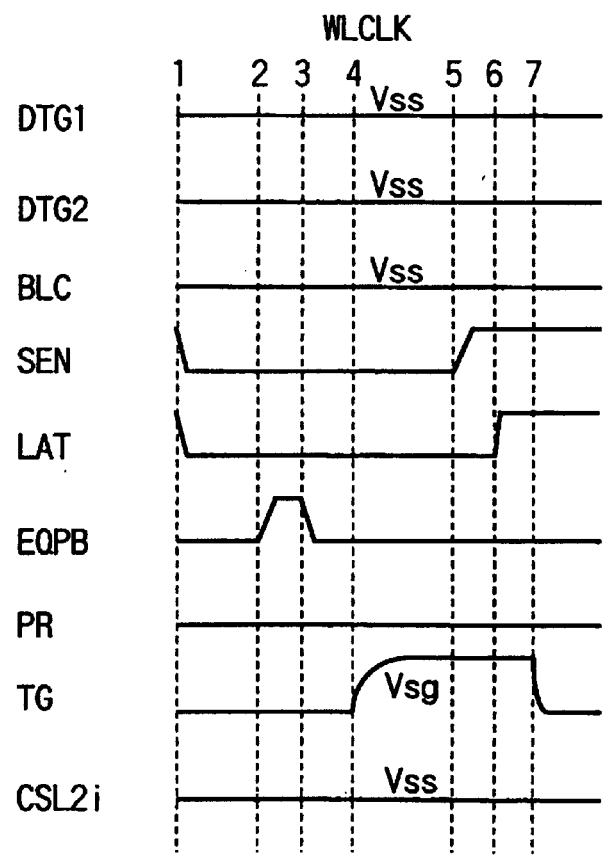
FIG. 55 is a waveform view showing operation timing for data transfer from the write cache to the latch circuit shown in FIG. 51.

FIG. 55 shows operation timing for transferring data from the write cache WCS1 to the latch circuit LATCH1.

First, at period WLCK1, the potentials of SEN and LAT become Vss and those of SENB and LATB become Vdd. As a result, the latch circuit LATCH1 turns into a non-operation state. Then, at period WLCLK2, the potential of EQPB becomes Vdd and the potential of the node Naij and that of the node Nbij are equalized.

Thereafter, at period WLCLK4, when the potential of TG becomes Vsg, the data in the write cache WCS1 is transferred to the node Naij. At period WLCLK5, when the potential of SEN becomes Vdd and that of SENB becomes Vss, the data of the node Naij is sensed by the clocked inverter CINV1. At period WLCLK6, when the potential of LAT becomes Vdd and that of LATB becomes Vss, the data of the node Naij is latched by the latch circuit LATCH1.

In this way, the data held by the node CAP3ij of the write cache WCS1 is transferred to the latch circuit LATCH1. After the data in the write cache WCS1 is transferred to the latch circuit LATCH1, the potential of TG becomes Vss at period WLCLK7.

Thereafter, the potential of PR is set at Vsg, that of CAP3ij is set at Vdd and the next program data is inputted into the write cache WCS1 (FIG. 54).

③ Refresh of Data in Write Cache

If the data holding capability of the node CAP3ij by the leakage of the charges of the node (DRAM cell) CAP3ij in the write cache WCS1 causes a problem, the data of the node CAP3ij is regularly refreshed.

Figure 56:
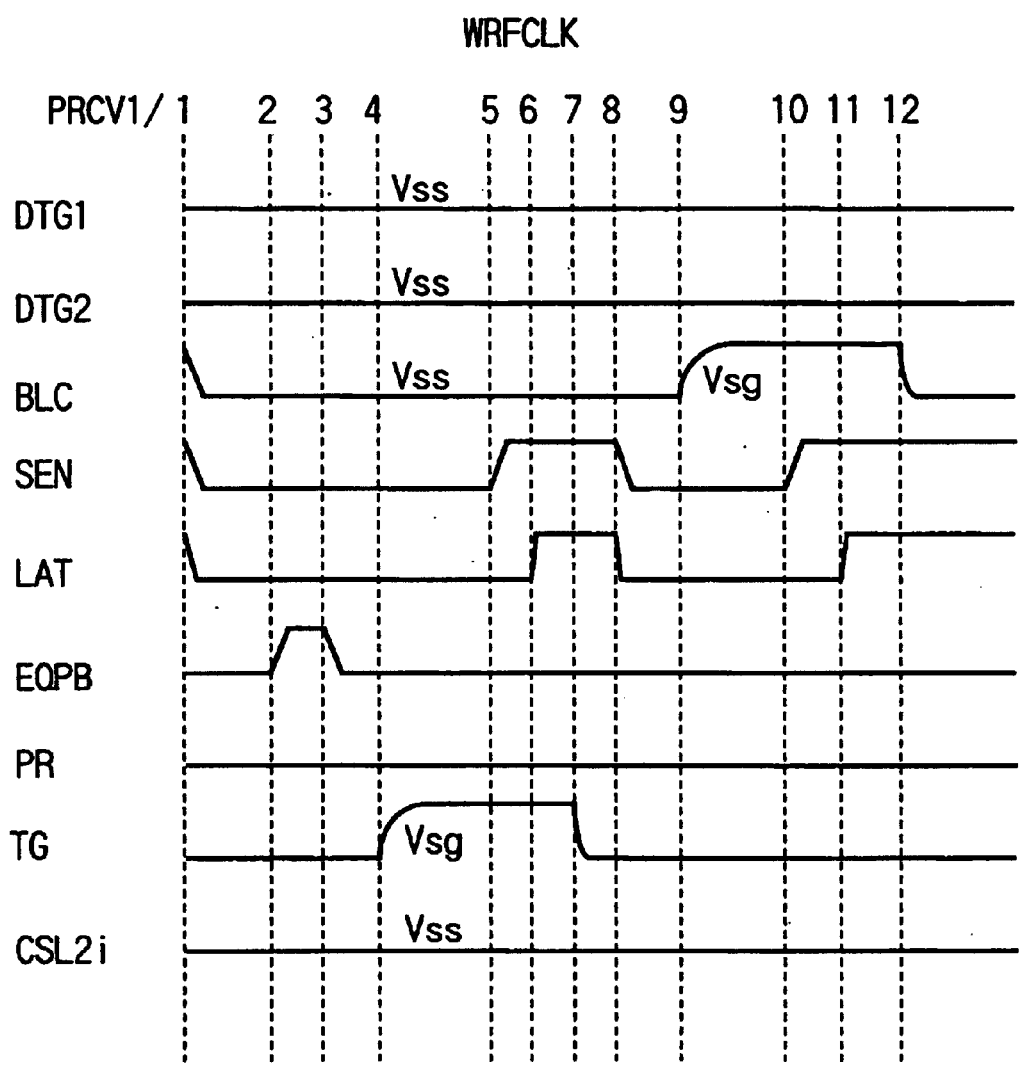
FIG. 56 is a waveform view showing operation timing relating to the refresh of data in the write cache in the data circuit shown in FIG. 51.

FIG. 56 shows operation timing for refreshing the data of the node CAP3ij during the program operation.

It is noted that PRCV1 corresponds to PRCV1 shown in FIG. 29 (the supply of a program pulse).

First, at period PRCV1, as can be understood from FIG. 29, the word lines are discharged. At period WRFCLK1 (PRCV1), the level of BLC becomes "L" and the data circuit is electrically disconnected from the bit lines. While refreshing the write cache WCS1, the program data in the latch circuit LATCH1 are made to wait in the bit lines.

Namely, at period WRFCLK1, the potentials of SEN and LAT become Vss and those of SENB and LATB become Vdd. As a result, the clocked inverters CINV1 and CINV2 shown in FIG. 51 turn into a non-operation state and the nodes Naij and Nbij turn into a floating state.

Thereafter, at period WRFCLK2, the level of EQPB becomes "H" and the potential of the node Naij and that of the node Nbij are equalized. It is noted that the MOS capacitor DLN3 shown in FIG. 51 is provided to make the capacity of the node Naij and that of the node Nbij almost equal to each other.

At period WRFCLK4, the potential of TG becomes Vsg and the data of the node CAP3ij of the write cache WCS1 is outputted to the node Naij. At period WRFCLK5, when the level of SEN becomes "H" and that of SENB becomes "L", the data in the write cache WCS1 is sensed by the clocked inverter CINV1. At period WRFCLK6, when the level of LAT becomes "H" and that of LATB becomes "L", the data in the write cache WCS1 is latched by the latch circuit LATCH1.

By this point, the data (potential of the node CAP3ij) in the write cache WCS1 has been refreshed. Then, at period WRFCLK7, when the potential of TG becomes Vss, the data in the write cache WCS1 thus refreshed is held again by the node CAP3ij.

Thereafter, an operation for returning the program data which are made to wait in the bit lines, to the latch circuit LATCH1 is executed.

First, at period WRFCLK8, the potentials of SEN and LAT become Vss and those of SENB and LATB become Vdd. As a result, the clocked inverters CINV1 and CINV2 shown in FIG. 51 turn into a non-operation state and the nodes Naij and Nbij turn into a floating state.

At period WRFCLK9, when the potential of BLC becomes Vsg, the bit lines are electrically disconnected from the data circuit and the program data held by the bit lines is transferred to the node Naij. At period WRFCLK10, when the level of SEN becomes "H" and that of SENB becomes "L", the program data is sensed by the clocked inverter CINV1. Further, at period WRFCLK11, when the level of LAT becomes "H" and that of LATB becomes "L", the program data is latched by the latch circuit LATCH1.

In this way, in the refresh operation conducted to the data in the write cache WCS1, while the data held by the node CAP3ij is being refreshed, the program data latched by the latch circuit LATCH1 is held by the bit lines.

Accordingly, after refreshing the data in the write cache WCS1 and returning the program data held by the-bit lines to the latch circuit LATCH1, the discharge of the bit lines (the discharge of the bit lines after the program operation) is executed. Namely, period WRFCLK12 should be always before PRCV3 in FIG. 29 (the supply of a program pulse).

[Modification of Data Circuit: 2] . . . Sixth Feature

Figure 57:
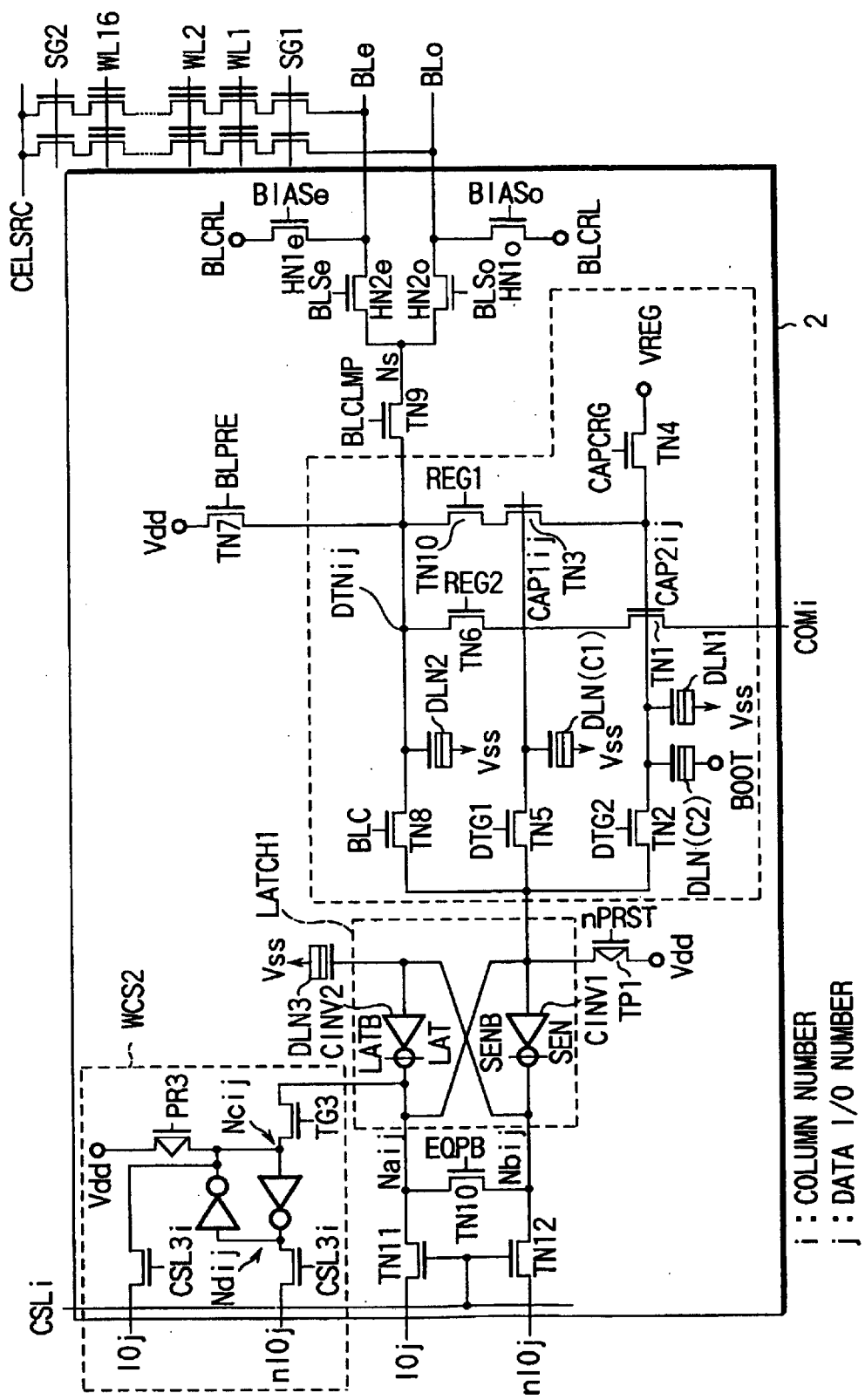
FIG. 57 shows a modification of the data circuit shown in FIG. 9.

FIG. 57 shows a modification of the data circuit.

Compared with the data circuit shown in FIG. 51, the data circuit in this modification is characterized in that the write cache WCS2 is constituted by an SRAM cell.

In the modification of FIG. 51, the write cache is constituted by a DRAM cell. In this modification, the write cache is constituted by an SRAM cell. In either case, the input of program data can be made in parallel with the program operation (the supply of a program pulse). Thus, the advantage of accelerating program speed can be obtained.

Now, with regard to the write cache WCS2, operation timing during the program operation will be described in detail.

① Data Input into Write Cache

Figure 58:
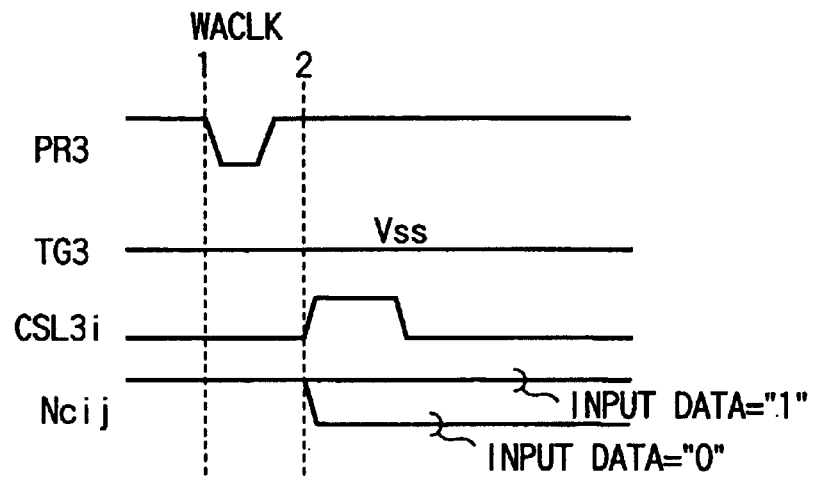
FIG. 58 is a waveform view showing operation timing for data input into a write cache in the data circuit shown in FIG. 57.

FIG. 58 shows operation timing for inputting data into the write cache.

Before inputting program data, the potential of PR3 is kept Vdd. When a command of "input data into write cache WCS2" is inputted into the chip, the potential of PR3 changes-from Vdd to Vss, that of the node Ncij becomes Vdd and that of the node Ndij is set at Vss.

Then, at period WACLK2, when the potential of CSL3i becomes Vdd, data is inputted into the write cache WCS2 from the input/output line IOj. In case of data "0", since the potential of IOj is Vss, that of nIOj is Vdd, the potential of the node Ncij of the SRAM cell becomes Vss and that of the node Ndij becomes Vdd. In case of data "1", since the potential of IOj is Vdd and that of the nIOj is Vss, the potential of the node Ncij of the SRAM cell becomes Vdd and that o the node Ndij becomes Vss.

While data is being inputted into the write cache WCS2, the potential of TG3 is Vss. Due to this, the write cache wCS2 and the latch circuit LATCH1 are electrically disconnected from each other. Therefore, even while data is being inputted into the write cache WCS2, the program and verify read operations for the data can be executed based on the program data held by the latch circuit LATCH1.

In FIG. 57, if data is not inputted into the write cache WCS2, the potential of the node Ncij becomes Vdd and that of the node Ndij becomes Vss. Namely, the write cache WCS2 holds "1"-programming data. As a result, columns which data are not inputted into the write cache WCS2 are not programmed.

② Data Transfer from Write Cache to Latch Circuit

When the program operation for the data latched by the latch circuit LATCH1 has been completed, the data held by the write cache WCS2 is transferred to the latch circuit LATCH1 and a program operation is carried out.

Figure 59:
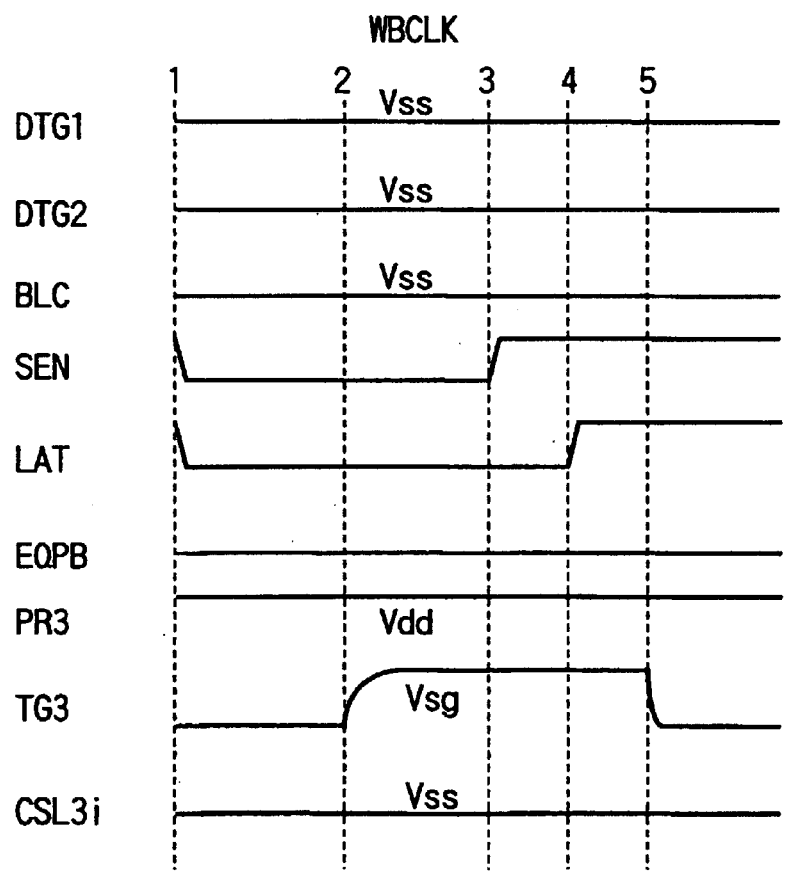
FIG. 59 is a waveform view showing operation timing for data transfer from the write cache to the latch circuit shown in FIG. 57.

FIG. 59 shows operation timing for transferring data from the write cache WCS2 to the latch circuit LATCH1.

First, at period WBCK1, the potentials of SEN and LAT become Vss and those of SENB and LATB become Vdd. As a result, the latch circuit LATCH1 turns into a non-operation state. Then, at period WBCLK2, when the potential of TG3 becomes Vsg, the data in the write cache WSC2 (data of the node Ncij) is transferred to the node Naij. At period WBCLK3, when the potential of SEN becomes Vdd and that of SENB becomes Vss, the data of the node Naij is sensed by the clocked inverter CINV1. At period WLCLK4, when the potential of LAT becomes Vdd and that of LATB becomes Vss, the data of the node Naij is latched by the latch circuit LATCH1.

In this way, the data held by the node Ncij of the write cache WCS2 is transferred to the latch circuit LATCH1. After the data in the write cache WCS2 is transferred to the latch circuit LATCH1, the potential of TG3 becomes Vss and the latch circuit LATCH1 is electrically disconnected from the write cache WCS2 at period WLCLK5.

Thereafter, the potential of PR3 is set at Vss and that of Ncij is set at Vdd. Then, the next program data is inputted into the write cache WCS2 (FIG. 58).

In this example, the write cache WCS2 is constituted by a SRAM. Therefore, "data refresh in the write cache" is not necessary.

[Program Speed]

1. Overview

In the conventional Flash memory, one data circuit is connected per bit line to which memory cells to be programmed are connected. The data circuit is provided with a storage circuit (e.g., a latch circuit) for temporarily storing program data on a selected memory cell.

In case of an ordinary two-level Flash memory, one storage circuit for holding one-bit program data is provided in one data circuit. In case of a multi-level memory, a plurality of storage circuits for storing program data of not lower than three levels are provided.

In an actual program operation, it is determined whether or not a program operation to a selected memory cell is executed (e.g., whether or not electrons are to be injected into the floating gate electrode) based on the program data stored by the data circuit.

In this way, in the conventional Flash memory, one data circuit for temporarily storing program data is provided per bit line to which memory cells to be programmed are connected. Namely, if 4,000 data circuits exist in a chip, 4,000 memories can be programmed almost simultaneously.

Accordingly, if the number of data circuits increases, program speed can be accelerated. Providing that 8,000 data circuits are provided in a chip, 8,000 memory cells can be programmed almost simultaneously. In that case, program speed can be doubled compared with a case of providing 4,000 data circuits in a chip.

However, the increase of the number of data circuits in a chip means the increase of a chip area. Further, if the chip area increases, cost per bit is disadvantageously pushed up.

The invention to be described hereinafter is intended to solve the above-stated disadvantage. The invention is characterized in that two memory cells can be programmed almost simultaneously using one data circuit.

Quite naturally, as in the case of the conventional memory, a storage circuit (e.g., a latch circuit) capable of temporarily storing only program data (two-level or multi-level data) on one memory cell is provided. In case of a two-level memory, for example, only one storage-circuit capable of temporarily storing one-bit data is provided in one data circuit.

The present invention, therefore, can accelerate program speed almost twice as fast as the conventional program speed by programming two memory cells almost simultaneously using one data circuit without increasing a chip area.

2. Gist of the Present Invention

First, the gist of the present invention will be described (FIGS. 60A to 60D).

As already stated above, the present invention is characterized in that two memory cells are programmed almost simultaneously using one data circuit.

It is noted that only a storage circuit for temporarily storing program data on one memory cell is provided in the data circuit as in the case of the conventional memory (which prevents a chip area from increasing). That is, the present invention proposes a technique for doubling program speed without increasing a chip area by contriving a program operation (program control by a control circuit).

The present invention will be described hereinafter, while taking a two-level NAND type Flash memory as an example.

In the present invention, it is assumed that at least two bit lines BLA and BLB are connected to one data circuit.

Further, these two bit lines BLA and BLB are arranged in different banks. That is to say, it is assumed that the control gate line (word line) of memory cells connected to the bit line BLA always differs from the control gate line (word line) of memory cells connected to the bit line BLB. In this case, the two bit lines BLA and BLB are arranged in an open state relative to each other about, for example, the data circuit, without arranging them to adjacently face each other.

Therefore, the present invention precludes a case where two bit lines are connected to one data circuit and arranged, for example, to adjacently face each other. It is noted, however, that the present invention can be combined with such a shield bit read method (which will be described in detail).

Description will now be given to the program operation (only the gist thereof).

A concrete program operation will be described below.

It is assumed that selected memory cells are a memory cell CellA connected to the bit line BLA and a memory cell CellB connected to the bit line BLB. A program operation is executed almost simultaneously to the two memory cells CellA and CellB using one data circuit (which can hold only program data on one memory cell).

First, program data on the memory cell CellA is held by the bit line BLA from externally of the chip by way of the data circuit. Likewise, program data on the memory cell CellB is held by the bit line BLB from externally of the chip by way of the data circuit.

Figure 60A:
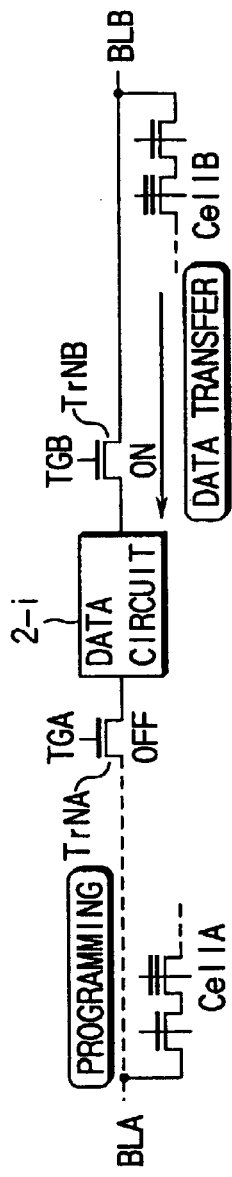
FIGS. 60A to 60D show the gist of the present invention (Concrete Example 1) relating to program speed.
Figure 60B:
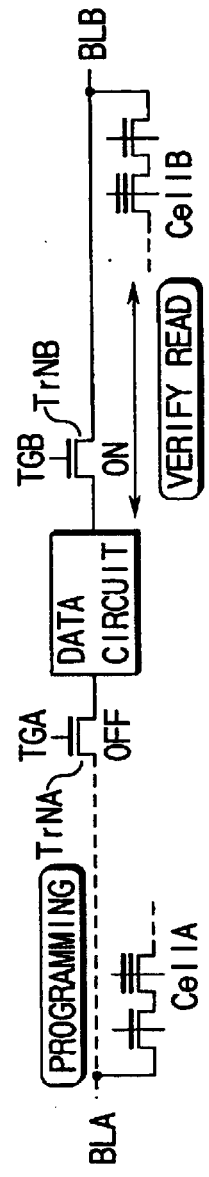

As shown in FIGS. 60A and 60B, if executing the program operation to the memory cell CellA, the level of TGA is set at "L" and that of TGB is set at "H".

Namely, since a transfer gate TrNA is turned off, the bit line BLA is in a floating state and the bit line BLA holds program data on the memory cell CellA. At this moment, a program pulse is supplied to the control gate line (word line) of the memory cell CellA. Due to this, a program operation is executed to the memory cell CellA according to the program data of the bit line BLA.

In case of "0"-programming (program select), for example, the potential of the bit line BLA is 0V ("Low", i.e., program data "0") and the potential of the channel of the memory cell CellA becomes 0V, as well. Accordingly, a high voltage is applied to the tunnel oxide film of the memory cell CellA and "0"-programming (the injection of electrons into the floating gate electrode) is executed to the memory cell CellA.

In case of "1"-programming (write inhibit), the level of the bit line BLA is Vdd ("High", i.e., program data "1") and the potential of the channel of the memory cell CellA becomes, for example, Vdd-Vth (where Vth is the threshold voltage of a select transistor) and the memory cell CellA is disconnected from the bit line BLA (the select transistor is cut off).

Therefore, even if a program pulse is supplied to the control gate line (word line), a channel potential rises by the capacitive coupling between the control gate line and the channel. As a result, a high voltage is not applied to the tunnel oxide film of the memory cell CellA and "1"-programming (maintaining an erase state) is executed to the memory cell CellA.

While a program pulse is supplied to the memory cell CellA, the program data is being held by the bit line BLA which is in a floating state. At this time, the program data on the bit line BLA has no change and the data is stably held by the bit line BLA.

The reason is as follows. Since the bit line BLA has sufficient high capacity, the potential of the bit line BLA which is in a floating state due to the capacitive coupling, little changes even if a program pulse is supplied to the control gate line during "0"-programming. In addition, since a tunnel current flowing from the floating gate electrode of the memory cell CellA to the bit line BLA is quite low, the tunnel current hardly influences the potential change of the bit line BLA.

Meanwhile, while a program pulse is being supplied to the memory cell CellA, a transfer gate TrNB is kept to be turned on and the bit line BLB is electrically connected to the data circuit 2-$i$.

If no program operation, for example, is conducted to the memory cell CellB, program data ("0" or "1") held by the bit line BLB may be refreshed while supplying a program pulse to the memory cell CellA. This is because the bit line BLB turns into a floating state during the program operation and the data held by the bit line BLB may possibly change by leakage (leakage of charges).

The refresh operation is conducted by transferring the program data held by the bit line BLB to the storage circuit (e.g., latch circuit) in the data circuit 2-$i$, sensing and latching the program data by the storage circuit and returning the program data again to the bit line BLB.

On the other hand, after a program pulse is supplied to the memory cell CellB, a operation for verifying the state of the memory cell CellB (whether or not the program operation has been successfully conducted to CellB), i.e., a program verify operation is carried out while applying a program pulse to the memory cell CellA.

First, the program data on the memory cell CellB held by the bit line BLB is transferred to and held by the storage circuit in the data circuit 2-$i$ (FIG. 60A). Then, the data of the-memory cell CellB is read (verify read) and, for example, the program data held by the storage circuit in the data circuit 2-$i$ is compared with the read data of the memory cell CellB.

If the both data are coincident with each other, it is determined as Program OK and electrons are not injected into the memory cell CellB thereafter. If the both data are not coincident, it is determined as Program NG and the program operation is continuously conducted to the memory cell CellB.

That is to say, the reprogram data held by the storage circuit in the data circuit 2-$i$ is returned to the bit line BLB and then a program pulse is supplied to the memory cell CellB.

Figure 60C:
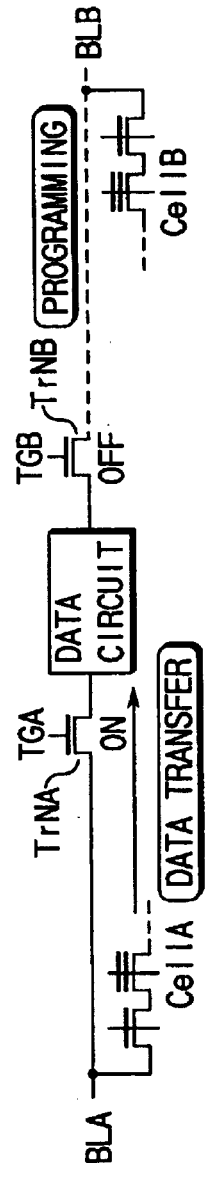
Figure 60D:
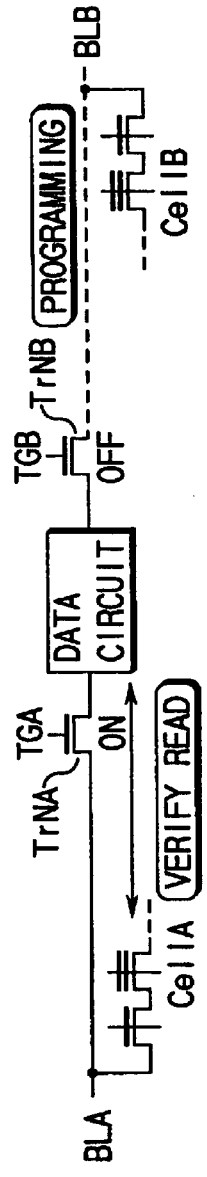

Further, as shown in FIGS. 60C and 60D, after a program pulse is supplied to the memory cell CellA, the level of TGA is set at "H" and that of TGB is set at Namely, since the transfer gate TrNB is turned off, the bit line BLB is in a floating state and the bit line BLB holds the program data on the memory cell CellB. At this time, since a program pulse is supplied to the control gate line (word line) of the memory cell CellB, a program operation is executed to the memory cell CellB according to the program data on the memory cell CellB.

In case of "0"-programming (program select), for example, the potential of the-bit line BLB is 0V ("Low", i.e., program data "0") and the potential of the memory cell CellB becomes 0V, as well. Accordingly, a high voltage is applied to the tunnel oxide film of the memory cell CellB and "0"-programming (the injection of electrons into the floating gate electrode) is executed to the memory cell CellB.

In case of "1"-programming (write inhibit), the potential of the bit line BLB is Vdd ("High", i.e., program data "1"), the potential of the channel of the memory cell CellB becomes Vdd-Vth (where Vth is the threshold voltage of the select transistor) and the memory cell CellB is disconnected from the bit line BLB (the select transistor is cuts off).

Accordingly, even if a program pulse is supplied to the control gate line (word line), a channel potential rises by the capacitive coupling between the control gate line and the channel. As a result, a high voltage is not applied to the tunnel oxide film of the memory cell CellB and "1"-programming (maintaining an erase state) is executed to the memory cell CellB.

While a program pulse is being supplied to the memory cell CellB, the program data is held by the bit line BLB which is in a floating state. At this time, for the same reason as that described above, the program data of the bit line BLB has no change and the program data is stably held by the bit line BLB.

Meanwhile, in FIGS. 60C and 60D, the transfer gate TrNA is kept to be turned on, the bit line BLA is electrically connected to the data circuit 2-$i$ and a verify read operation is conducted to the memory cell CellA.

First, the program data on the memory cell CellA held by the bit line BLA is transferred to and held by the storage circuit in the data circuit 2-9 (FIG. 60C). Then, the data of the memory cell CellA is read (verify read) and, for example, the program data held by the storage circuit in the data circuit 2-$i$ is compared with the read data of the memory cell CellA.

If the both data are coincident with each other, no electrons are injected into the memory cell CellA thereafter. If the both data are not coincident, the program operation is continuously conducted to the memory cell CellA.

That is to say, the reprogram data held by the storage circuit in the data circuit 2-$i$ is returned to the bit line BLA and then a program pulse is supplied to the memory cell CellA.

The operations shown in FIGS. 60A to 60D are repeatedly carried out until the memory cells CellA and CellB have been precisely programmed.

In this way, according to the present invention, one data circuit corresponding to two selected memory cells (two bit lines) is provided. If so, while one of the memory cells is being programmed, program data is held by the bit line connected to the one memory cell and the bit line is electrically disconnected from the data circuit. At this moment, the bit line to which the other memory cell is connected is electrically connected to the data circuit and a verify operation is executed to the other memory cell.

With the above-stated constitution and control method, two selected memory cells can be programmed almost simultaneously using one data circuit capable of temporarily holding only the program data on one memory cell. Thus, program speed can be accelerated (almost twice as fast as the conventional speed) without increasing a chip area.

It should be noted that the above description has been given to the gist of the present invention. Accordingly, using a similar technique, a program operation can be executed almost simultaneously to, for example, two or more selected memory cells using one data circuit.

3. Concrete Example 1

The concrete examples of the present invention will be described hereinafter.

It is noted that description will be given, while taking a two-level NAND type Flash memory as an example as in the case of the description of the gist of the invention.

3.-1. Chip Layout

FIG. 61 is a schematic diagram of the chip layout of a two-level NAND type flash memory according to the present invention.

The layout is characterized in that a memory cell array consists of an Upper bank and a Lower bank and that data circuits are arranged between the Upper and Lower banks.

Namely, in this example, data circuits are common to the memory cells in the Upper bank and those in the Lower bank. In that case, it is possible to program one memory cell in the Upper bank and one memory cell in the Lower bank almost simultaneously using one data circuit. Due to this, compared with the conventional memory (wherein one memory cell is programmed using one data circuit), program speed can be almost doubled.

The Upper bank consists of four banks, i.e., Bank1U, Bank2U, Bank3U and Bank4U. The Lower bank consists of four banks, i.e., Bank1L, Bank2L, Bank3L and Bank4L, accordingly. The bit line BLA extends from the data circuit toward the Upper bank and the bit line BLB extends from the data circuit toward the Lower bank.

In this example, by one program operation (an operation from data input to completion of program; the supply of a program pulse is normally conducted a plurality of times), data program for eight pages, Page1U, Page2U, Page3U, Page4U, Page1L, Page2L, Page3L and Page4L (program to one page for one bank) can be carried out.

With the conventional program method, it is impossible to program a memory cells in the Upper bank and that in the Lower bank almost simultaneously. For that reason, with the conventional method, only data program for four pages can be carried out by one program operation. Namely, the present invention can make program speed almost twice as fast as the conventional program speed.

3.-2. Data Circuit

FIG. 62 shows one data circuit as well as bit lines and memory cells connected to the data circuit with regard to the chip layout shown in FIG. 61.

The data circuit 2-*i* includes a latch circuit LATCH1, an N channel MOS transistor TN31, verification P channel MOS transistors TP31 and TP32, precharge N channel MOS transistors TN32A, TN32B, TN32C and TN32D, and transfer gates TrNA, TrNB, TrNC and TrND.

The latch circuit LATCH1 is employed to, for example, temporarily store program/read data for program/read operations.

In this example, four bit lines BLA, BLB, BLC and BLD are connected to one data circuit 2-*i*. The two bit lines BLA and BLC are arranged in the Upper bank. The bit lines BLA and BLC are arranged to face each other and to be adjacent each other. Also, the two bit lines BLB and BLD are arranged in the Lower bank. The bit lines BLB and BLD are arranged to face each other and to be adjacent each other.

During the program operation, one bit line is selected out of the two bit lines BLA and BLC in the Upper bank and one bit line is selected out of the two bit lines BLC and BLD in the Lower bank. Namely, using one data circuit 2-*i*, two memory cells (one memory cell in the Upper bank and one memory cell in the Lower bank) are programmed almost simultaneously.

The reason for connecting two bit lines in one bank to one data circuit 2-*i* as shown in this example is intended to fix the potential of one line out of the two bit lines to Vss or Vdd during the program/read operations and to thereby prevent capacitive coupling noise between the bit lines during the program/read operations from occurring.

For example, during the program operation, the potential of one unselected bit line out of the two bit lines BLA and BLC in the Upper bank is set at an internal power supply potential Vdd. By setting the potential of the unselected bit line at Vdd (turning the unselected bit line in a write inhibit state), it is possible to eliminate capacitive coupling noise between the bit lines during the program operation. Besides, erroneous program ("0"-programming) to the memory cell connected to the unselected bit line can be prevented.

For the same reason, the potential of one, unselected bit line out of the two bit lines BLB and BLD in the Lower bank is set at the internal power supply potential Vdd.

Further, as in this example, if two bit lines in one bank are connected to one data circuit 2-*i*, a so-called shield bit line read method can be adopted during the read operation, thereby making it possible to eliminate capacitive coupling noise between the bit lines during the read operation. Namely, by using one bit line as a data read bit line and the other bit line as a shield bit line (Vss), it is possible to accelerate read speed and to prevent erroneous data read.

As can be seen from the above, in this example, if two memory cells CellA and CellB are programmed using one data circuit 2-*i*, the potentials of the two bit lines BLC and BLD are always set at a fixed potential (Vdd or Vss). In addition, if two memory cells CellC and CellD are programmed using the data circuit 2-*i*, the potentials of the two bit lines BLA and BLB are always set at a fixed potential (Vdd or Vss).

Accordingly, during the program/read operations, it is possible to execute the program/read operations without generating capacitive coupling noise between the bit lines.

3.-3. Program Operation

FIG. 63 shows the detail of the program operation to the two memory cells CellA and CellB with regard to the memories shown in FIGS. 61 and 62.

(1) Step1

First, Data load for loading data on the memory cell CellA in the Upper bank is conducted, i.e., program data on the memory cell CellA is inputted from externally of the chip into the data circuit 2-*i* in the chip.

Actually, data on four pages, i.e., Page1U, Page2U, Page3U and Page4U for the four banks, i.e., Bank1U, Bank2U, Bank3U and Bank4U, are inputted into a plurality of data circuits provided to correspond to the four-page data, respectively.

Also, when the level of TGA becomes "H" and the transfer gate TrNA is turned on, the program data on the memory cell CellA is transferred from the data circuit 2-*i* to the bit line BLA in the Upper bank.

If the program data is, for example, "0" ("0"-programming or program select), the potential of the bit line BLA becomes Vss (0V) and if the program data is "1" ("1"-programming or write inhibit), the potential of the bit line BLA becomes the internal power supply potential Vdd (e.g., about 2.3V).

(2) Step2

First, the level of TGA becomes "L" and the transfer gate TrNA is turned off. As a result, the bit line BLA is electrically disconnected from the data circuit 2-*i* and the program data on the memory cell CellA is enclosed (held) by the bit line BLA.

Thereafter, data load for the memory cell CellB in the Lower bank is conducted, i.e., the program data on the memory cell CellB is inputted from externally of the chip into the data circuit 2-*i* in the chip.

Actually, data on four pages, i.e., Page1L, Page2L, Page3L and Page4L for the four banks, i.e., Bank1L, Bank2L, Bank3L and Bank4L are inputted into a plurality of data circuits provided to correspond to the four-page data, respectively.

Also, when the level of TGB becomes "H" and the transfer gate TrNB is turned on, the program data on the memory cell CellB is transferred from the data circuit 2-$i$ to the bit line BLB in the Lower bank.

If the program data is, for example, "0" ("0"-programming or program select), the potential of the bit line BLB becomes Vss and if the program data is "1" ("1"-programming or write inhibit), the potential of the bit line BLB becomes the internal power supply potential Vdd (e.g., about 2.3V).

(3) Step3

A program operation to the memory cell CellB in the Lower bank (the supply of a program pulse) is executed.

First, the level of TGB is set at "L" and that of TGA is set at "H".

At this time, the transfer gate TrNB is turned off and the bit line BLB is, therefore, electrically disconnected from the data circuit 2-$i$. The bit line BLB turns into a floating state and the program data on the memory cell CellB is held by the bit line BLB.

Thereafter, a program pulse is supplied to the control gate line (word line) of the memory cell CellB. At this moment, the potential of the select gate line at the bit line BLB side is set at the internal power supply potential Vdd and that of the select gate line at the source line side is set at the ground potential Vss. Further, the potential of the control gate line (selected word line) connected to the selected memory cell CellB is set at a program potential Vpgm and those of the other control gate lines (unselected word lines) are set at a transfer potential Vpass.

In case of "0"-programming, the potential of the bit line BLB is Vss (0V) and that of the channel of the memory cell CellB is Vss, as well. Accordingly, in the memory cell CellB, a high electric field is applied to the tunnel oxide film and an FN tunnel current flows into the tunnel oxide film. That is, in the memory cell CellB, electrons are injected from the channel into the floating gate electrode and the threshold voltage of the memory cell CellB, therefore, rises.

In case of "1"-programming, the potential of the bit line BLB is Vdd (e.g., about 2.3V), that of the channel of the memory cell CellB is Vdd-Vth (where Vth is the threshold voltage of the select transistor connected between the bit line and the memory cell), and the select transistor connected between the bit line and the memory cell is cut off.

Therefore, in the memory cell CellB, if a program pulse is supplied thereto, the channel potential also rises to, for example, about 8V by the capacitive coupling between the word line and the channel. Due to this, a high electric field is not applied to the tunnel oxide film and an FN tunnel current does not flow into the tunnel oxide film. In other words, the threshold voltage of the memory cell CellB has no change (the erase state is maintained).

While programming the memory cell CellB in the. Lower bank, the program data on the memory cell CellA held by the bit line BLA in the Upper bank is refreshed.

Namely, since the potential of TGA is "H", the transfer gate TrNA is turned on and the bit line BLA is electrically connected to the data circuit 2-$i$. The program data held by the bit line BLA is transferred to and held by the latch circuit in the data circuit 2-$i$. Then, the program data held by the latch circuit is returned again to the bit line BLA (refresh).

The program data held by the bit line BLA in the Upper bank may be refreshed if there is a possibility that the potential of the bit line BLA in the Upper bank (program data) changes because of leak current in the Step2. In other words, in the Step2, i.e., while the program data on the memory cell CellB is loaded and the program data on the memory cell CellB is held by the bit line BLB in the Lower bank, if the potential of the bit line BLA in the Upper bank has little change, it is not necessary to carry out a refresh operation.

The refresh operation may be carried out before the program operation (the supply of a program pulse) or after the program operation (the supply of a program pulse).

If the refresh operation is carried out after programming, the memory cell CellB is programmed in, for example, a state of Step2 (in which the level of TGA is "L" and that of TGB is "H"), i.e., a state in which the potential of the bit line BLB is fixed to Vss ("0"-programming) or to Vdd ("1"-programming) (in a non-floating state). Then, in a state changed to a Step3 state (the level of TGA is "H" and that of TGB is "L"), the program data held by the bit line BLA may be refreshed.

Also, in this example, after the program data is transferred to the bit line BLA (in the Step1) and the program data is transferred to the bit line BLB (in the Step2), the memory cell CellB in the Lower bank is programmed (in the Step3). However, if the potential change of the bit line (leak current) does not cause any problem, after the program data is transferred to the bit line BLA (in the Step1) and the program data is transferred to the bit line BLB (in the Step2), the memory cell CellA in the Upper bank may be programmed and then the memory cell CellB in the Lower bank may be programmed. Alternatively, after the Step2, the memory cell CellA and the memory cell CellB may be programmed almost simultaneously.

(4) Step4

After refreshing the program data held by the bit line BLA, the level of TGA becomes "L" and the transfer gate TrNA is turned off. Thereafter, the level of TGB becomes "H" and the transfer gate TrNB is turned on.

After the level of TGA becomes "L", a program operation (the supply of a program pulse) is executed to the memory cell CellA in the Upper bank.

Since the transfer gate TrNA is turned off, the bit line is in a floating state. Also, the program data on the memory cell CellA is held by the bit line BLA.

Then, a program pulse is supplied to the control gate line (word line) of the memory cell CellA. At this moment, the potential of the select gate line at the bit line BLA side is set at the internal power supply potential Vdd, and the potential of the select gate line at the source line side is set at the ground potential Vss. Further, the potential of the control gate line (selected word line) connected to the selected memory cell CellA is set at the program potential Vpgm and those of the other control gate lines (unselected word lines) are set at the transfer potential Vpass.

In case of "0"-programming, the potential of the bit line BLA is Vss (0V) and that of the memory cell CellA is Vss. Accordingly, in the memory cell CellA, a high electric field is applied to the tunnel oxide film and an FN tunnel current flows into the tunnel oxide film. Namely, in the memory cell CellA, electrons are injected into the floating gate electrode from the channel and the threshold voltage of the memory cell CellA, therefore, rises.

In case of "1"-programming, the potential of the bit line BLA is Vdd, that of the channel of the memory cell CellA is Vdd-Vth (where Vth is the threshold voltage of the select transistor connected between the bit line and the memory cell) and the select transistor connected between the bit line and the memory cell is cut off. In that case, if a program pulse is supplied to the memory cell, the channel potential rises to, for example, about 8V by the capacitive coupling between the word line and the channel. Due to this, no FN tunnel current flows into the tunnel oxide film and the threshold voltage of the memory cell CellA has no change (the erase state is maintained).

While the memory cell CellA in the Upper bank is being programmed, an operation for transferring program data on the memory cell CellB held by the bit line BLB to the data circuit is first conducted in the Lower bank.

Namely, if the level of TGB becomes "H" and the transfer gate TrNB is turned on, the bit line BLB is electrically connected to the data circuit 2-i. Accordingly, the program data held by the bit line BLB is held by the latch circuit (e.g., LATCH1 shown in FIG. 62) in the data circuit 2-i.

(5) Step5

After transferring the program data held by the bit line BLB to the latch circuit in the data circuit, a verify read operation is conducted to the memory cell CellB in the Lower bank. It is noted that at this moment, the memory cell CellA in the Upper bank, for example, is being programmed.

First, the verify read operation is conducted to the memory cell CellB in the Lower bank. Namely, since the level of the TGB is "H" and the transfer gate TrNB is turned on, the bit line BLB is electrically connected to the data circuit 2-i.

Therefore, if the two select gate lines are applied with Vread, the control-gate line (selected word line) of the memory cell CellB is applied with a read potential Vcgv0 for the verify read operation and the unselected word lines are applied with a potential Vread with which the memory cells are always turned on, then the data of the memory cell CellB is transferred to the data circuit by way of the bit line BLB.

Thereafter, in the data circuit, an operation for detecting whether or not precise data has been completely written into the memory cell CellB and an operation for generating reprogram data, are carried out based on the data of the memory cell CellB and the program data held by the latch circuit.

If it is judged that precise data has been completely written into the memory cell CellB, the later program operation to the memory cell CellB is completed (to be specific, in case of "0"-programming, the program data is changed from "0" to "1" to prevent "0"-programming from being conducted thereafter). On the other hand, if it is judged that precise data has not been sufficiently written into the memory cell CellB, the program operation to the memory cell CellB continues.

After completing the above-stated verify operation, the reprogram data generated by the data circuit is transferred to and held by the bit line BLB in the Lower bank.

(6) Step6

After completing the verify operation to the memory cell CellB, the level of TGB becomes "L" and the transfer gate TrNB is turned off. Then, the level of TGA becomes "H" and the transfer gate TrNA is turned on.

After the level of TGB becomes "L", a reprogram (Re-write) operation is conducted to the memory cell CellB in the Lower bank.

In case of "0"-programming, if the program is, for example, deficient, "0" data is reprogrammed (re-written). If the program is already sufficient, the program data is changed to "1" to thereby prevent "0"-programming from being conducted.

Since the transfer gate TrNB is turned off, the bit line BLB is in a floating state. Further, the program data on the memory cell CellB is held by the bit line BLB.

Thereafter, a program pulse is supplied to the control gate line (word line) of the memory cell CellB.

On the other hand, while the memory cell CellB in the Lower bank is being programmed, an operation for transferring the program data on the memory cell CellA held by the bit line BLA to the data circuit, is first carried out.

Namely, if the level of TGA becomes "H" and the transfer gate TrNA is turned on, the bit line is electrically connected to the data circuit 2-i. Accordingly, the program data held by the bit line BLA is held by the latch circuit (e.g., LATCH1 shown in FIG. 62) in the data circuit 2-i.

(7) Step7

After transferring the program data held by the bit line BLA to the latch circuit in the data circuit, a verify operation to the memory cell CellA in the Upper bank is carried out. It is noted that at this moment, the program operation to, for example, the memory cell CellB is continuing in the Lower bank.

First, a verify read operation to the memory cell CellA in the Upper bank is carried out. Namely, since the level of TGA is "H" and the transfer gate TrNA is turned on, the bit line BLA is electrically connected to the data circuit 2-i.

Accordingly, if the two select gate lines are applied with Vread, the control gate line (selected word line) of the memory cell CellA is applied with the read potential Vcgv0 for the verify read operation and unselected word lines are applied with the potential Vread with which corresponding memory cells are always turned on, then the data of the memory cell CellA is transferred to the data circuit by way of the bit line BLA.

Thereafter, in the data circuit, an operation for detecting whether or not precise data has been completely written into the memory cell CellA and an operation for generating reprogram (Re-write) data, are carried out based on the data of the memory cell CellA and the program data held by the latch circuit.

If it is judged that precise data has been completely written into the memory cell CellA, the later program operation to the memory cell CellA is completed (to be specific, in case of "0"-programming, the program data is changed from "0" to "1" to thereby prevent "0"-programming from being conducted later). On the other hand, if it is judged that precise data has not been sufficiently written into the memory cell CellA, the program operation to the memory cell CellA continues.

After completing the above-stated verify operation, the reprogram (Re-write) data generated by the data circuit is transferred to and held by the bit line BLA in the Upper bank.

(8) After Step7

Thereafter, the Step4 operation is executed again. Namely, after the step 7, the operations of Step4 to Step7 are repeatedly carried out until all the memory cells including the memory cells CellA and CellB have been sufficiently programmed or until the number of program times exceeds a predetermined number to cause a program defect.

In FIG. 62, while the program operations are conducted to the memory cells CellA and CellB, respectively, the potentials of, for example, the bit lines BLC and BLD are fixed to Vdd (during the program operations) or Vss (during the verify operations).

As in the case of the above-stated operation, program operations to the memory cells CellC and CellD are conducted. At this time, the potentials of the bit lines BLA and BLB are fixed to Vdd (during the program operations) or Vss (during the verify operations).

3.-4. Description of Respective Operations Constituting Program Operation

Next, the respective operations constituting the above-stated program operation will be described in detail.

It is assumed that a data circuit and a memory cell array have constitutions shown in FIG. 62. It is also assumed that the memory cells CellA and CellB are programmed and that the potentials of the bit lines BLC and BLD are fixed to Vdd or Vss.

3.-4.-1. Data Load

In the "Step1" shown in FIG. 63, the program data on the memory cell CellA in the Upper bank is transferred from externally of the chip to the data circuit and transferred from the data circuit to the bit line BLA.

Figure 64:
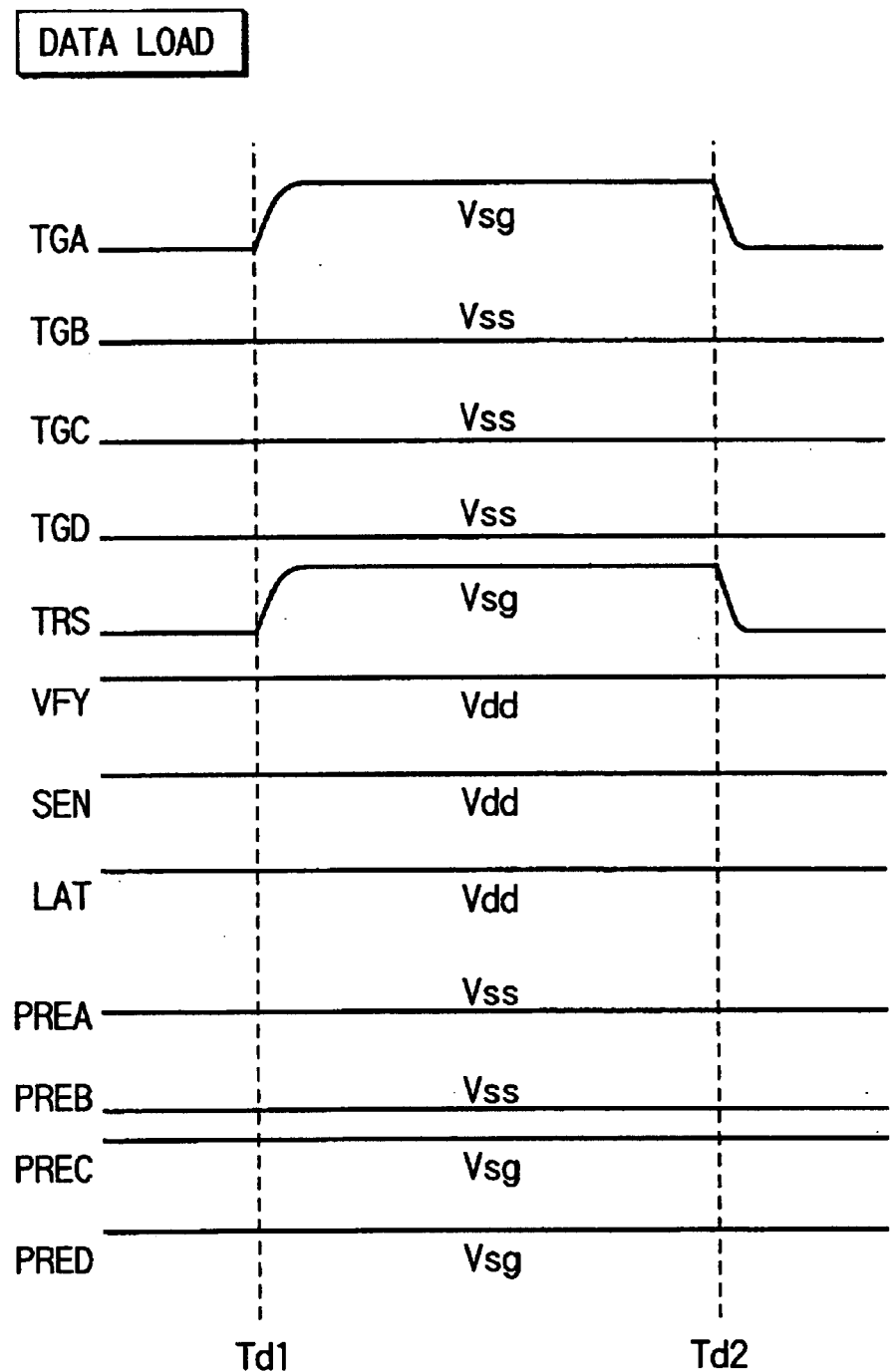
FIG. 64 is a waveform view showing operation timing relating to Data Load.

FIG. 64 shows timing for respective signals for executing the operation of the "Step1".

First, the level of CSL becomes "H", and program data is inputted into the latch circuit LATCH1 in the data circuit 2-$i$ from externally of the chip through IO and nIO. At period Td1, the potentials of TRS and TGA become Vsg (e.g., about 4V) and the program data held by the latch circuit LATCH1 is transferred to the bit line BLA in the Upper bank. The potentials of all of TGB, TGC and TGD are Vss.

In case of "0"-programming (program select), the program data held by the latch circuit LATCH1 becomes "0" (N1=Vss, N2=Vdd). During "0"-programming, therefore, the bit line holds Vss (program data "0").

In case of "1"-programming (write inhibit), the program data held by the latch circuit LATCH1 becomes "1" (N1=Vdd, N2=Vss). During "1"-programming, therefore, the bit line BLA holds Vdd (program data Then, at period Td2, the potentials of TRS and TGA become Vss and data load for loading program data on the memory cell CellA is completed.

During the above-stated data load, the potential of VSC is set at, for example, Vss and that of PREG is set at Vsg or Vdd. In that case, the potential of the bit line BLC is fixed to Vss and the capacitive coupling noise between the bit lines to the bit line BLA can be eliminated. The potential of BLC (VSC) may be changed from Vss to Vdd.

In the "Step2", shown in FIG. 63, the program data on the memory cell CellB in the Lower bank is inputted from externally of the chip into the data circuit and transferred from the data circuit to the bit line BLB.

Figure 65:
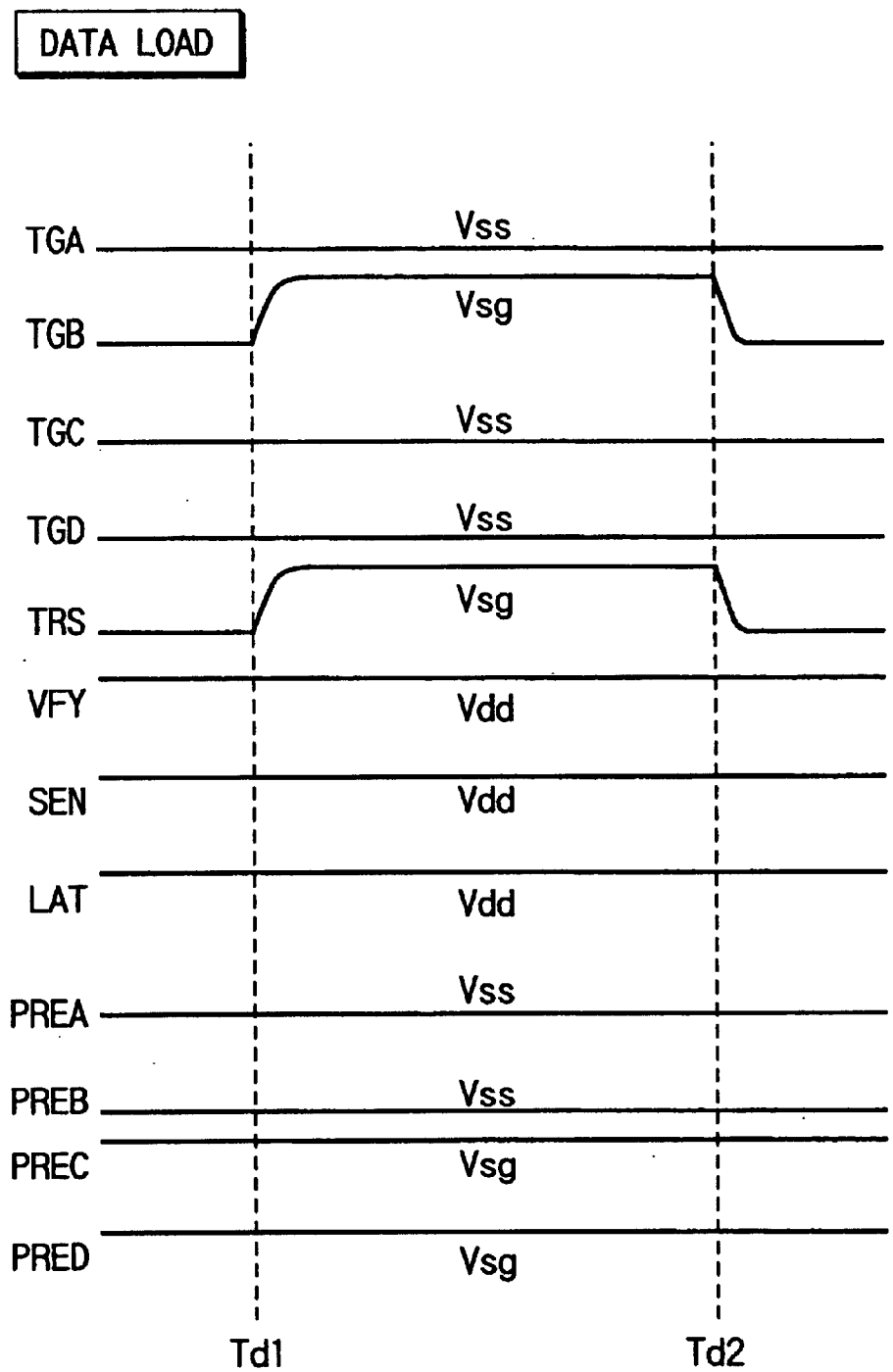
FIG. 65 is a waveform view showing operation timing relating to Data Load.

FIG. 65 shows timing for respective signals for executing "Step2" operation.

First, the program data is inputted into the latch circuit LATCH1 in the data circuit 2-$i$ from externally of the chip through nodes Naij and Nbij. At period Td1, the potentials of TRS and TGB become Vsg (e.g., about 4V) and the program data held by the latch circuit LATCH1 is transferred to the bit line BLB in the Lower bank. The potentials of all of TGA, TGC and TGD are Vss.

Then, at period Td2, the potentials of TRS and TGB become Vss and the data load for loading program data on the memory cell CellB is completed.

During the above-stated data load, the potential of VSD is set at, for example, Vdd and that of PRED is set at Vsg. In this case, the potential of the bit line BLD is fixed to Vdd and the capacitive coupling noise between bit lines to the bit line BLB can be eliminated.

3.-4.-2. Supply of Program Pulse

In the "Step3" show in FIG. 63, a program pulse is supplied to the memory cell CellB in the Lower bank.

Figure 66:
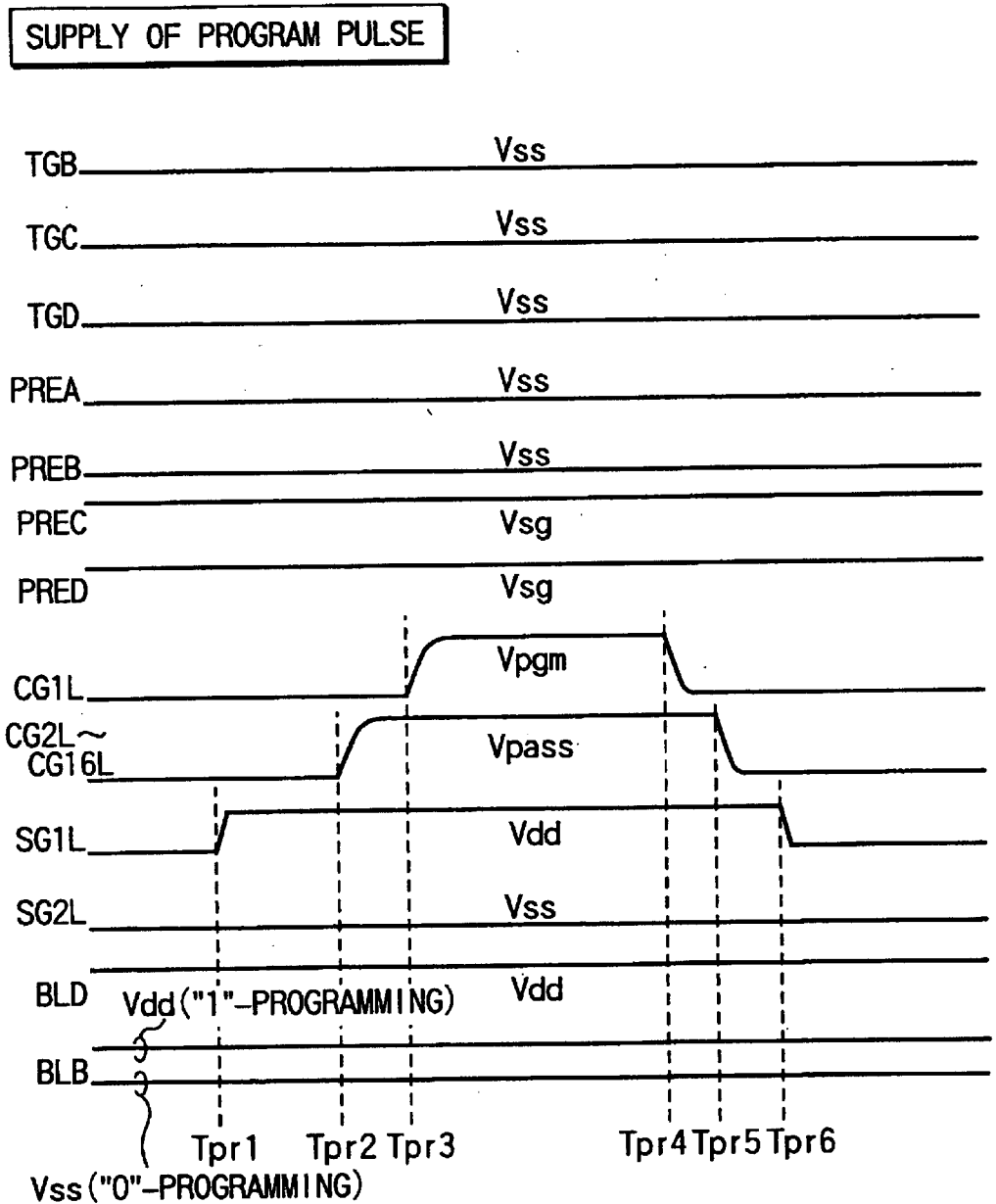
FIG. 66 is a waveform view showing operation timing relating to the supply of a program pulse.

FIG. 66 shows timing for respective signals for executing "Step3" operation (operation relating to the supply of a program pulse).

The potentials of TGB, TGC and TGD are all Vss and the transfer gate TrNB, TrNC and TrND are turned off.

The potential of PREB is Vss and the bit line BLB holds the program data so as to program the memory cell CellB. The potential of the bit line BLD is fixed to Vdd. That is, the potential of PRED is set at Vsg and that of VSD is set at Vdd.

Since the bit line BLA holds program data on the memory cell CellA, the potential of PREA is set at Vss.

First, at period Tpr1, the potential of the select gate line SG1L becomes Vdd. At period Tpr2, the potentials of unselected control gate lines (word lines) CG2L to CG16L become the transfer potential vpass. At period Tpr3, the potential of the selected control gate line (word line) CGLL becomes the program potential Vpgm.

In case of "0"-programming, the potential of the bit line BLB is Vss ("0" data is held) and the channel of the memory cell CellB, therefore, becomes Vss (0V), as well. Accordingly, in the memory cell CellB, a high electric field is applied to the tunnel oxide film and electrons are injected from the channel into the floating gate electrode.

In case of "1"-programming, the potential of the bit line BLB is Vdd ("1" data is held) and the channel of the memory cell CellB, therefore, becomes Vdd-Vth (where Vth is the threshold voltage of the select transistor). Also, the select transistor is cut off and the channel of the memory cell CellB turns into a floating state.

In this case, in the memory cell CellB, the channel potential rises to, abbot 8V by the capacitive coupling between the control gate line (word line) and the channel. Due to this, a high electric field is not applied to the tunnel oxide film and no electrons are injected from the channel into the floating gate electrode.

Then, at period Tpr4, the potential of the selected control gate line CGLL decreases from the program potential Vpgm to the ground potential Vss. At period Tpr5, the potentials of the unselected control gate lines CG2L to CG16L decrease from the transfer potential Vpass to the ground potential Vss. Further, at period Tpr6, the potential of the select gate line SG1L decreases from Vdd to Vss.

Through the above procedures, the supply of a program pulse is completed.

In an ordinary program operation, after the completion of the supply of a program pulse, the bit line BLB is discharged. In the present invention, however, after the completion of the supply of a program pulse, the bit line BLB is not discharged. This is because the bit line BLB holds the program data in the present invention.

3.-4.-3. Refresh

In the Step3 shown in FIG. 63, while a program pulse is being applied to the memory cell CellB in the Lower bank, the program data held by the bit line BLA in the Upper bank is refreshed.

Figure 67:
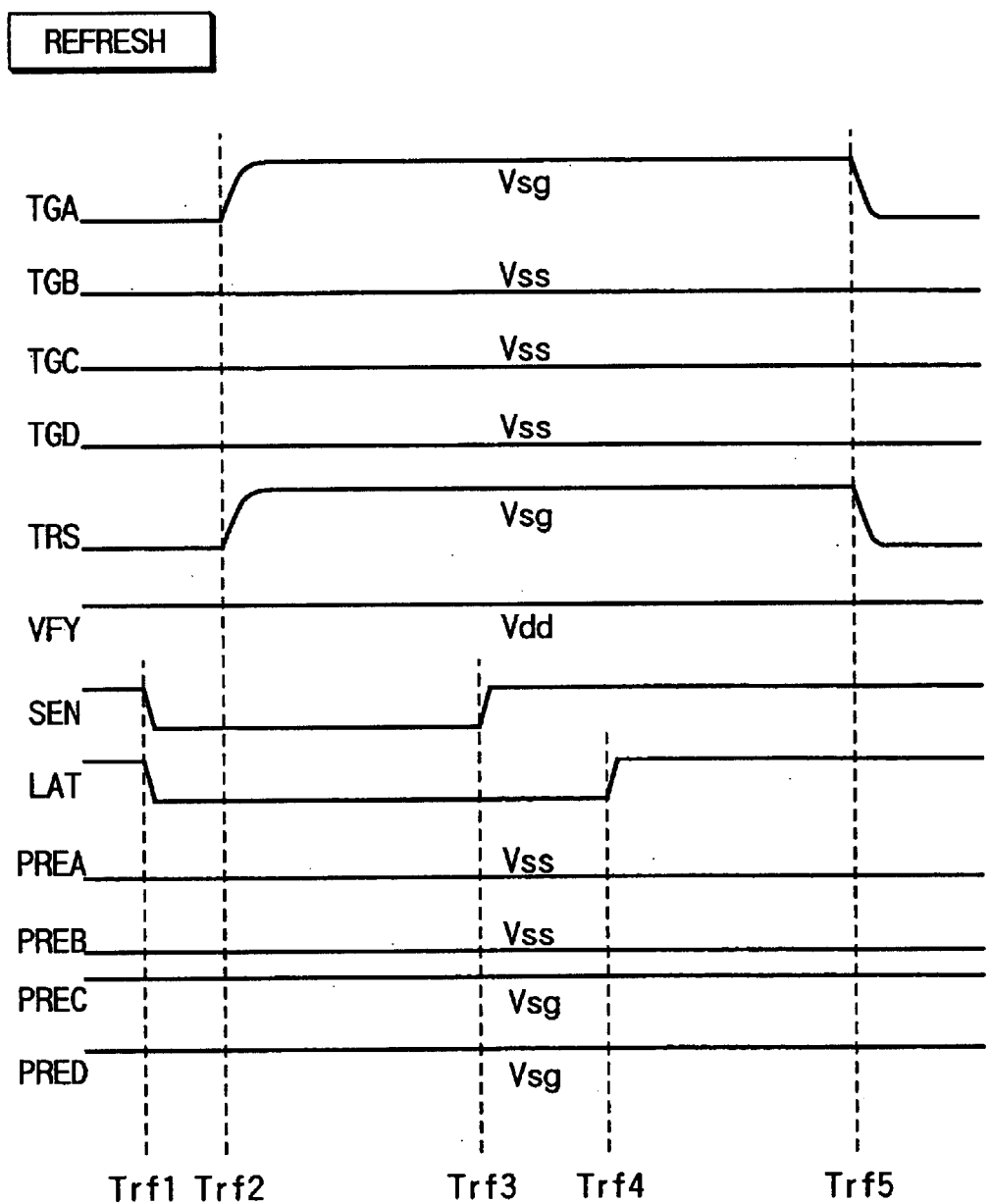
FIG. 67 is a waveform view showing operation timing relating to refresh.

FIG. 67 shows timing for respective signals for executing "Step3"operation (operation relating to the refresh operation to the program data).

The potentials of TGB, TGC and TGD are all Vss and the transfer gate TrNB, TrNC and TrND are turned off.

The potential of PREA is set at Vss so as to refresh the program data on the memory cell CellA held by the bit line BLA. Since the memory cell CellB is programmed, the potential of PREB is also Vss. Further, the potentials of PREC and PRED are set at Vsg, those of VSc and VSD are set at Vdd and the those of the bit lines BLC and BLD are fixed to Vdd.

First, at period Trf1, the potentials of SEN and LAT become Vss and the clocked inverters INV1 and INV2 turn into a non-operation state. Namely, the latch circuit LATCH1 turns into a non-operation state. At period Trf2, the potentials of TRS and TGA become Vsg and the bit line BLA in the Upper bank is electrically connected to the latch circuit LATCH1 in the data circuit 2-$i$.

As a result, the program data held by the bit line BLA is transferred to the sense node N1. Thereafter, at period Trf3, when the potential of SEN becomes Vdd and the clocked inverter INV1 turns into an operation state, the clocked inverter INV1 senses the potential of the sense node N1 (program data).

At period Trf4, when the potential of LAT becomes Vdd, the clocked inverter INV2 turns into an operation state and the program data is latched by the latch circuit LATCH1. That is, the program data held by the bit line BLA is amplified by the latch circuit LATCH1.

In addition, since the latch circuit LATCH1 is electrically connected to the bit line BLA, the program data latched by the latch circuit LATCH1 is returned to the bit line BLA again (refresh).

At period Trf5, the potentials of TRS and TGA become Vss and the refresh operation to the program data held by the bit line BLA is completed.

3.-4.-4. Supply of Program Pulse

In the "Step4" and "Step5" shown in FIG. 63, a program pulse is supplied to the memory cell CellA in the Upper bank.

Figure 68:
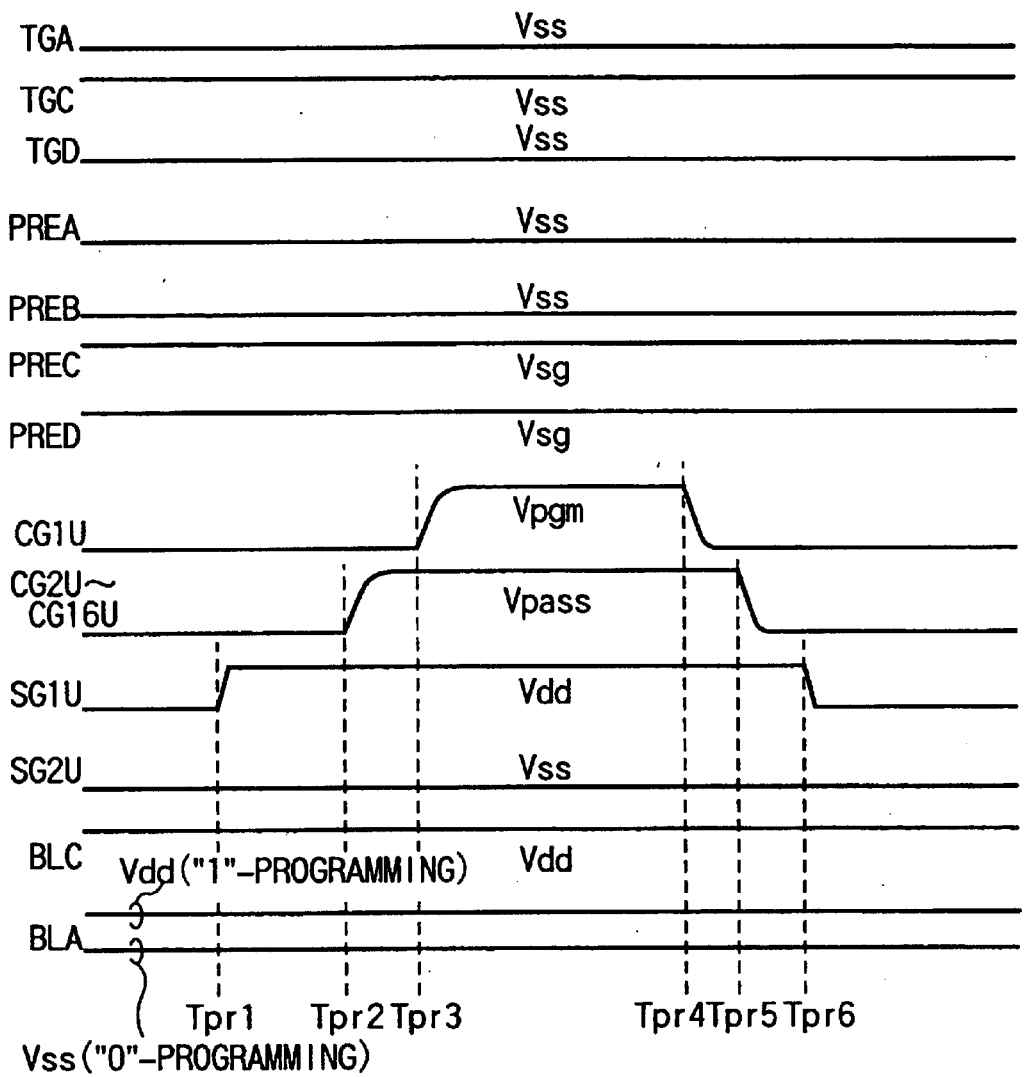
FIG. 68 is a waveform view showing operation timing relating to the supply of a program pulse.

FIG. 68 shows timing for respective signals for executing "Step4" and "Step5" operations (operations relating to the supply of a program pulse).

The potentials of TGA, TGC and TGD are all Vss and the transfer gates TrNA, TrNC and TrND are turned off. Due to the need to conduct program data transfer and verify read operation to be described later, the potential of TGB is set at Vsg.

The potential of PREA is set at Vss so as to program the memory cell CellA and the bit line BLA holds program data. The potential of PREC is set at Vsg, that of VSc is set at Vdd and that of the bit line BLC is fixed to Vdd. Also, the potential of PREB is set at Vss.

First, at period Tpr1, the potential of the select gate line SG1U becomes Vdd. At period Tpr2, the potentials of the unselected control gate lines (word lines) CG2U to CG16U become the transfer potential Vpass. At period Tpr3, the potential of the selected control gate line (word line) CG1U becomes the program potential Vpgm.

In case of "0"-programming, the potential of the bit line BLA is Vss ("0" data is held) and the channel of the memory cell CellA, therefore, becomes Vss (0V). Accordingly, in the memory cell CellA, a high electric field is applied to the tunnel oxide film and electrons are injected from the channel into the floating gate electrode.

In case of "1"-programming, the potential of the bit line BLA is Vdd ("1" data is held) and the channel of the memory cell CellA, therefore, becomes Vdd-Vth (where Vth is the threshold voltage of the select transistor). Further, the select transistor is cut off and the channel of the memory cell CellA turns into a floating state.

In this case, in the memory cell CellA, the channel potential rises to, for example, about 8V by the capacitive coupling between the control gate electrode (word line) and the channel. Due to this, a high electric field is not applied to the tunnel oxide film and no electrons are injected from the channel into the floating gate electrode.

Then, at period Tpr4, the potential of the selected control gate line CG1U decreases from the program potential Vpgm to the ground potential Vss. At period Tpr5, the potentials of the unselected control gate lines CG2U to CG16U decrease from the transfer potential Vpass to the ground potential Vss. At period Tpr6, the potential of the select gate line SG1U decreases from Vdd to Vss.

Through the above-stated procedures, the supply of a program pulse to the memory cell CellA is completed. In the present invention, after the completion of the supply of a program pulse, the bit line BLA is not discharged. This is because the bit line BLA holds the program data in the present invention.

3.-4.-5. Program Data Transfer

In the "Step4" shown in FIG. 63, while a program pulse is being supplied to the memory cell CellA in the Upper bank, an-operation for transferring the program data held by the bit line BLB to the latch circuit LATCH1 in the data circuit 2-$i$, is first carried out in the Lower bank.

Figure 69:
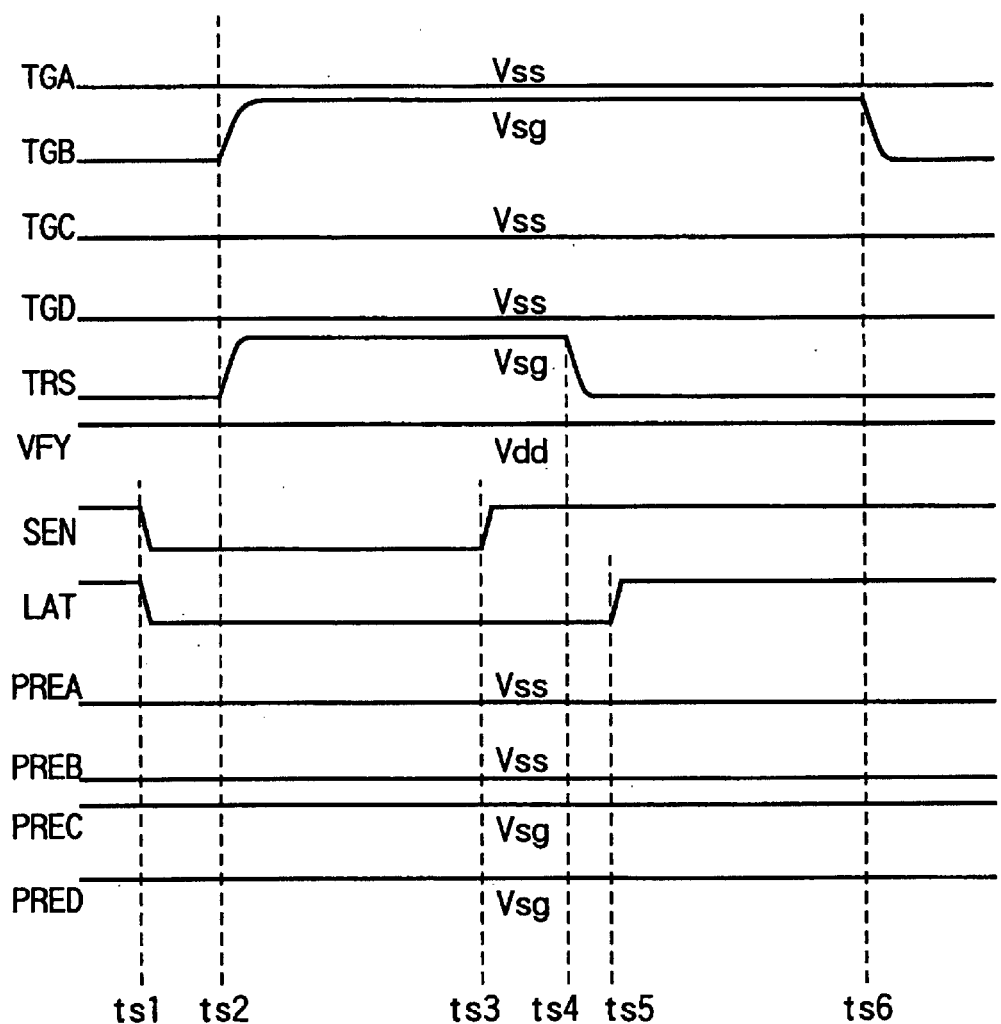
FIG. 69 is a waveform view showing operation timing relating to program data transfer.

FIG. 69 shows timing for respective signals for executing "Step4" operation (operation relating to program data transfer).

The potentials of TGA, TGC and TGD are all Vss and the transfer gates TrNA, TrNC and TrND are turned off.

The potential of PREB is set at Vss so as to transfer the program data on the memory cell CellB held by the bit line BLB. Since the memory cell CellA is programmed, the potential of PREA is also Vss. Further, the potentials of PREC and PRED are set at Vsg, those of VSc and VSD are set at Vdd and those of the bit lines BLC and BLD are set at Vdd.

First, at period Tts1, the potentials of SEN and LAT become Vss and the clocked inverters INV1 and INV2 turn into a non-operation state. That is, the latch circuit LATCH1 turns into a non-operation state. Further, at period Tts2, the potentials of TRS and TGB become Vsg and the bit line BLB in the Lower bank is electrically connected to the latch circuit LATCH1 in the data circuit 2-$i$.

As a result, the program data held by the bit line BLB is transferred to the sense node N1. Then, at period Tts3, when the potential of SEN becomes Vdd and the-clocked inverter turns into an operation state, the clocked inverter INV1 senses the potential of the sense node N1 (program data).

Thereafter, at period Tts4, when the potential of TRS changes from Vsg to Vss, the transistor TN31 is turned off and the latch circuit LATCH1 is electrically disconnected from the bit line BLB.

At period Tts5, when the potential of LAT becomes Vdd, the clocked inverter INV2 turns into an operation state and the program data is latched by the latch circuit LATCH1. That is, the program data held by the bit line BLB is latched by the latch circuit LATCH1.

At period Tts6, the potential of TGB becomes Vss and the transfer of the program data held by the bit line BLB is completed.

3.-4.-6. Verify Read

In the "Step5" shown in FIG. 63, while a program pulse is being supplied to the memory cell CellA in the Upper bank, a verify read operation is conducted to the memory cell CellB in the Lower bank.

Figure 70:
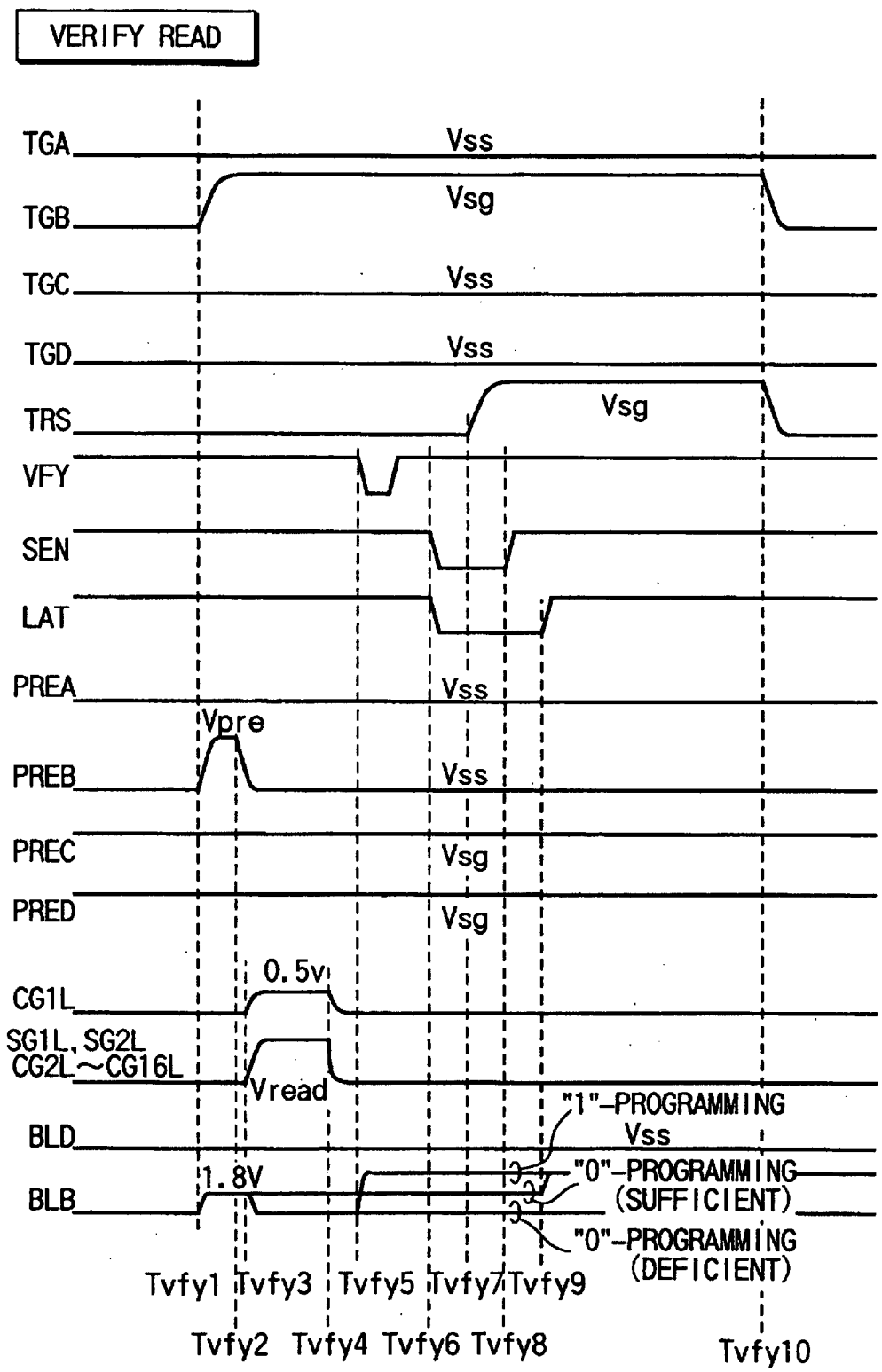
FIG. 70 is a waveform view showing operation timing relating to verify read.

FIG. 70 shows timing for respective signals for executing "Step5" operation (operation relating to the verify read operation).

The potentials of TGA, TGC and TGD are all Vss and the transfer gates TrNA, TrNC and TrND are turned off.

The potential of PREA is set at Vss so as to program the memory cell CellA. The potential of the bit line BLC is set at Vdd and that of the bit line BLD is set at Vss. The potentials of PREC and PRED are, therefore, set at Vsg, that of VSc is set at Vdd and that of VSD is set at Vss.

First, at period Tvfy1, the potential of TGB becomes Vsg. Also, the potential of PREB becomes Vpre (e.g., about 3V) and the bit line BLB is precharged with about 1.8V. Then, at period Tvfy2, the potential of PREB becomes Vss and the precharge of the bit line BLB is completed.

At period Tvfy3, the potential of the selected control gate line (word line) CG1L is set at the read potential Vcgv0 for the verify read operation (e.g., about 0.5V) and those of the select gate lines SG1L and SG2L and the control gate lines (word lines) CG2L to CG16 are set at the potential Vread (e.g., about 3.5V) with which corresponding memory cells are always turned on.

At this moment, the potential of the bit line BLB changes or is maintained according to the data of the memory cell CellB.

For example, as for the memory cell CellB, if "0"-programming is deficient and "1"-programming is conducted, the threshold voltage of the memory cell CellB is lower than Vcgv0. Due to this, the memory cell CellB is turned on and the charges of the bit line BLB are discharged. As a result, the potential of the bit line BLB becomes Vss.

Further, as for the memory cell CellB, if "0"-programming is sufficient, the threshold voltage of the memory cell CellB is higher than Vcgv0. Due to this, the memory cell CellB is turned off and the charges of the bit line BLB are not discharged. As a result, the bit line BLB maintains the precharge potential (e.g., about 1.8V).

Then, at period Tvfy4, the potentials of the control gate lines (word lines) CGLL to CG16L and the select gate lines SGLL and SG2L are set at Vss (0V).

At period Tvfy5, when the level of VFY becomes "L", the transistor TP32 is turned on. Due to this, the potential of the bit line BLB is determined according to the program data latched by the latch circuit LATCH1.

In case of "1"-programming (write inhibit), for example, since the latch circuit LATCH1 latches the program data "1" (the level of the node N2 is "L"), the transistor TP31 is turned on and the potential of the bit line BLB is fixed to Vdd.

Namely, by period Tvfy4, the potential of the bit line BLB becomes Vss due to the verify read operation. At period Tvfy5, the potential of the bit line BLB is forcedly set at Vdd.

In addition, in case of "0"-programming (program select), since the latch circuit LATCH1 latches the program data "0" (the level of the node N2 is "H"), the transistor TP31 is turned off. Accordingly, the bit line BLB maintains the data read to the bit line BLB by the verify read operation, i.e., the potential of the bit line BLB at period Tvfy4 as it is.

That is, if "0"-programming is deficient, the potential of the bit line BLB becomes Vss. If "0"-programming is sufficient, the potential of the bit line BLB becomes the precharge potential.

Then, at period Tvfy6, the potentials of SEN and LAT become Vss and the clocked inverters INV1 and INV2 turn into a non-operation state, i.e., the latch circuit LATCH1 turns into a non-operation state. At this moment, the program data latched by the latch circuit LATCH1 is eliminated.

At period Tvfy7, when the potential of TRS becomes Vsg, the transistor TN31 is turned on and the bit line BLB is electrically connected to the latch circuit LATCH1. At period Tvfy8, the level of SEN becomes "H" and the clocked inverter INV1 senses the potential of the bit line BLB. Further, at period Tvfy9, when the level of LAT becomes "H", the potential of the bit line BLB is latched by the latch circuit LATCH1.

Namely, the potential of the bit line BLB is latched, as reprogram (Re-write) data, by the latch circuit LATCH1. At the same time, the reprogram (Re-write) data is transferred to and held by the bit line BLB.

Thereafter, the reprogram (Re-write) operation is carried out based on the reprogram (Re-write) data held by the bit line BLB.

Meanwhile, in principle, the program operation (the supply of a program pulse) is completed when the potentials of bit lines BLB corresponding to all columns (all selected memory cells) become "H" as a result of the verify read operation. If there exists a column in which the potential of the bit line BLB is "L", i.e., there exists a memory cell for which "0"-programming is deficient, then, the program operation continues unless the number of program times reaches the upper limit.

The detection as to whether or not the potentials of the bit lines BLB of all columns become "H" may be made by using a batch detection circuit (e.g., as shown in FIGS. 8, 9 and 12) (Program completion detection).

Finally, at period Tvfy10, the potentials of TRS and TGA become Vss and the verify read operation is completed.

3.-4.-7. Others

In the "Step6" and "Step7" shown in FIG. 63, the same operations as those in "Step4" and "Step5" are carried out. Namely, in the Lower bank, a program pulse is supplied to the memory cell CellB. In the Upper bank, the program data held by the bit line BLA is transferred and the verify read operation is conducted to the memory cell CellA.

Figure 71:
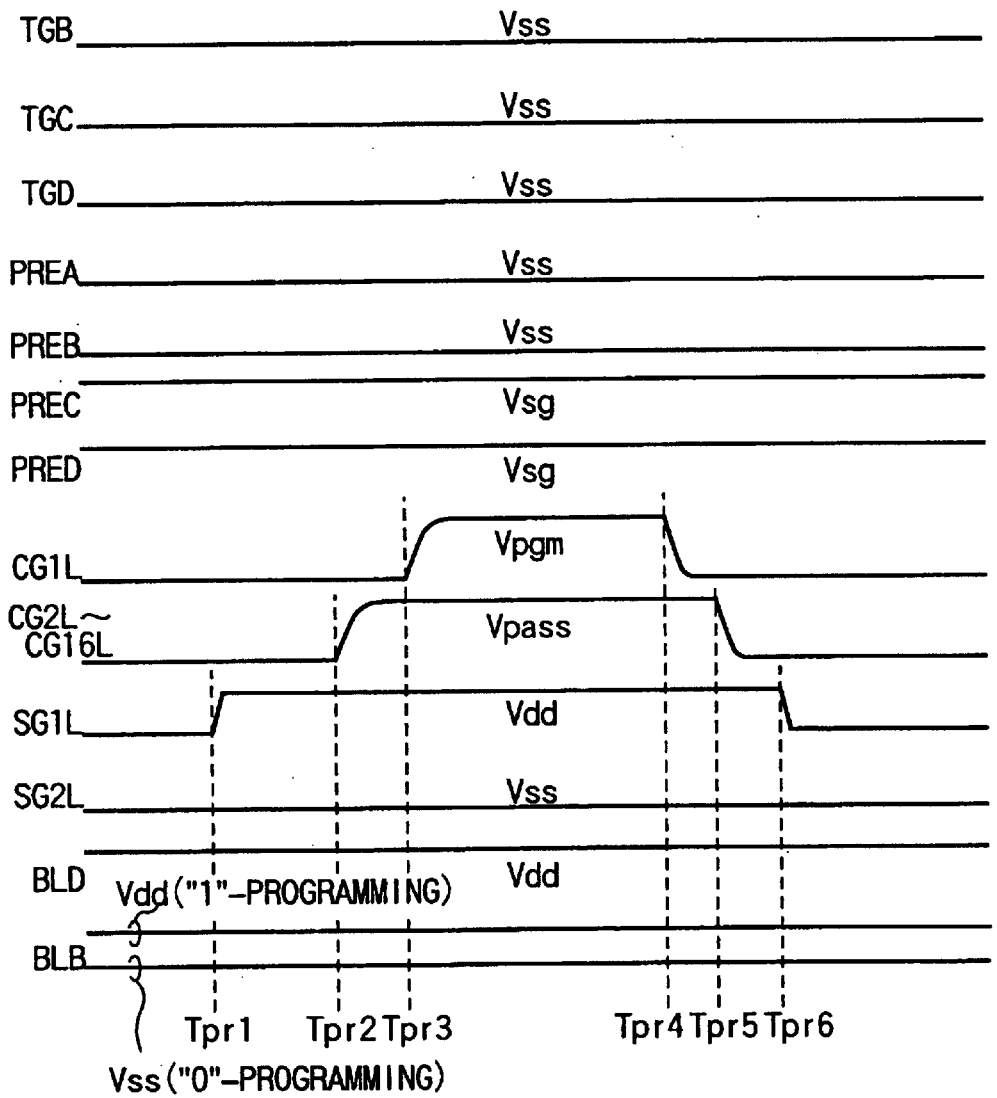
FIG. 71 is a waveform view showing operation timing relating to the supply of a program pulse.
Figure 72:
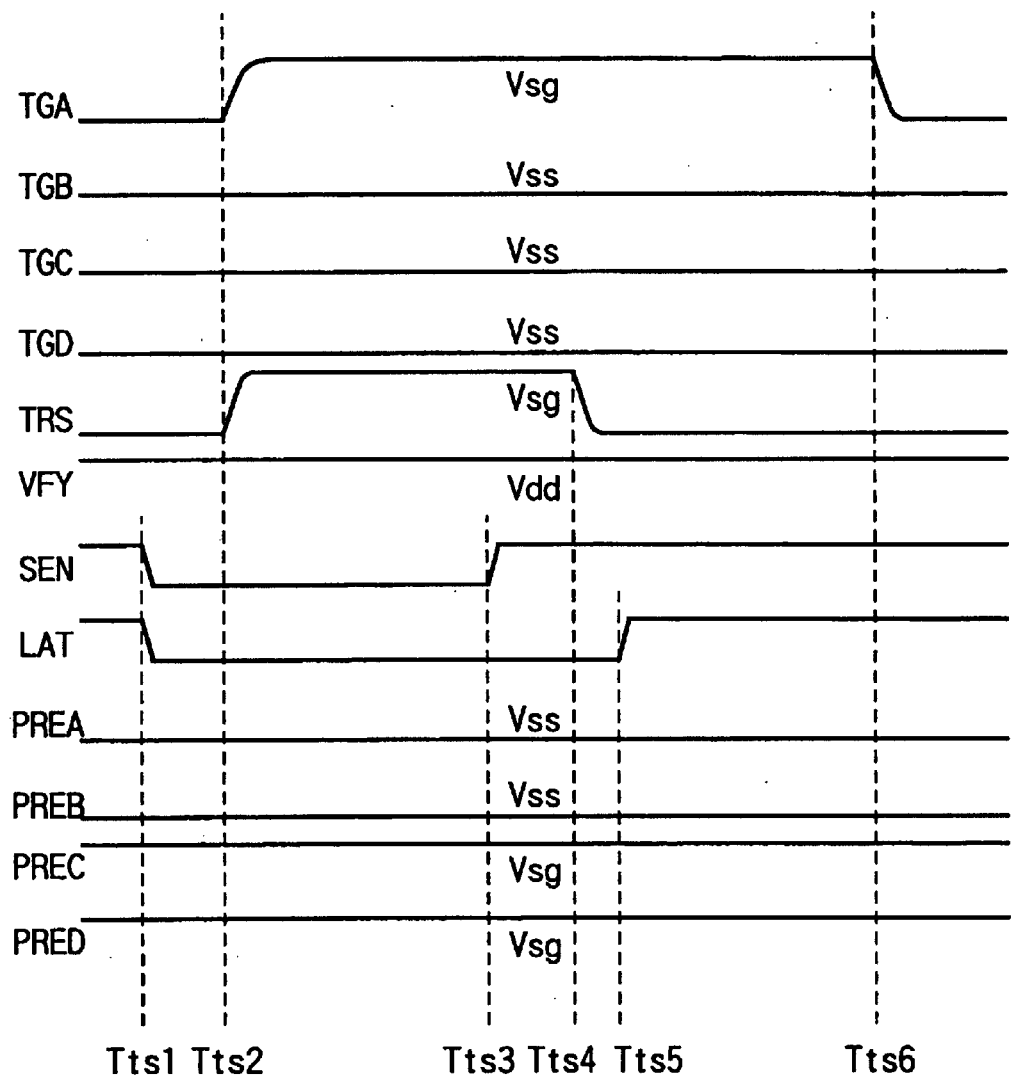
FIG. 72 is a waveform view showing operation timing relating to program data transfer.
Figure 73:
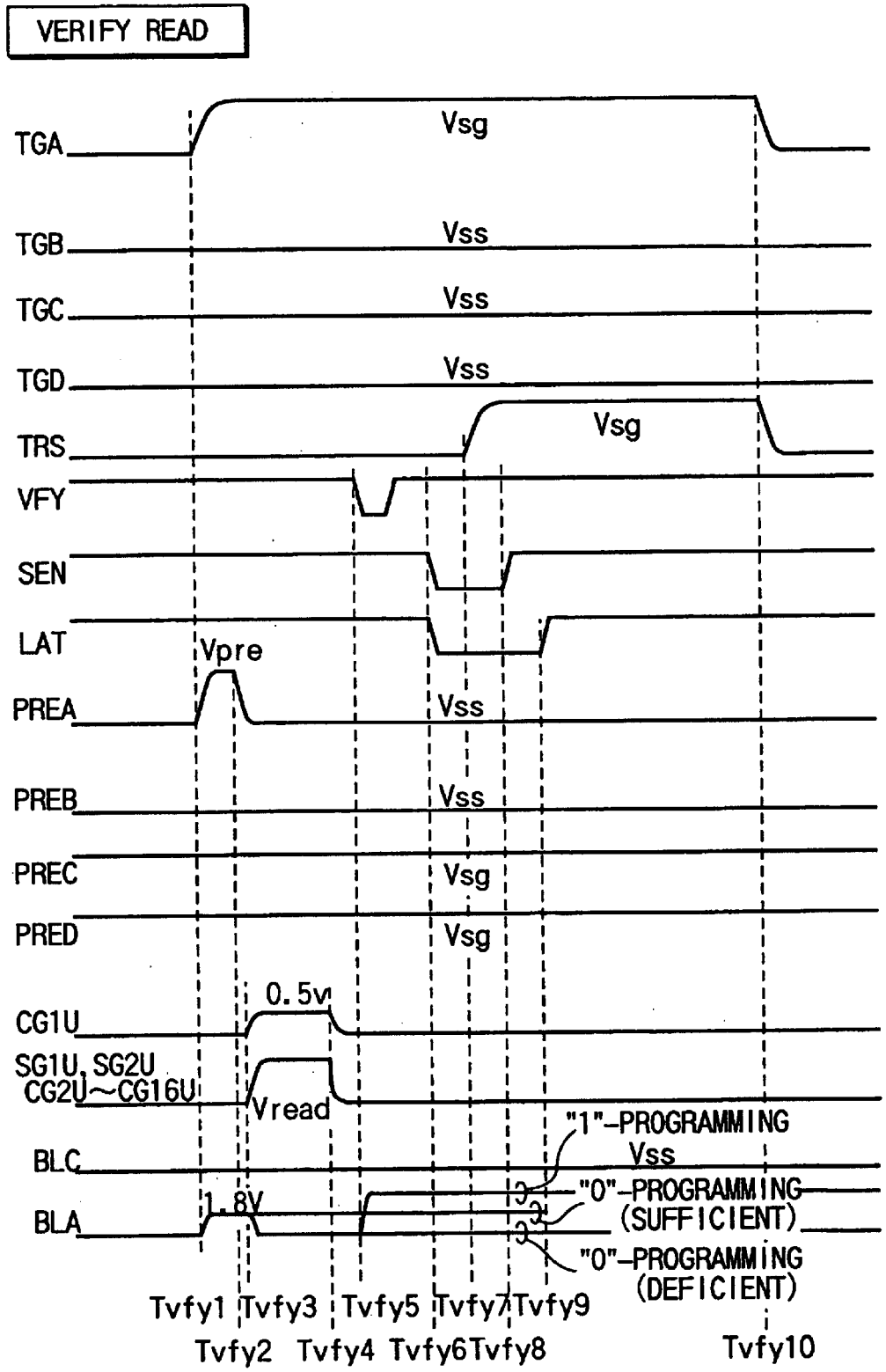
FIG. 73 is a waveform view showing operation timing relating to verify read.

The respective operations of the supply of a program pulse, the transfer of program data and the verify read operation in the "Step6" and "Step7" are exactly the same as the respective operations in "Step4" and "Step5" (see Section 3.-4.-4, 3.-4.-5. And 3.-4.-6) except for the difference of targets. Only waveform views are shown in FIGS. 71 to 73 and detailed description will not be, therefore, given to those operations.

In the above-stated example, after the bit line is turned into a floating state, a program pulse is supplied to the memory cell. Conversely, after a program pulse is supplied to the memory cell, the bit line may be turned into a floating state to allow the bit line to hold the program data.

4. Concrete Example 2

In Concrete Example 1 stated above, it is assumed that a plurality of memory cells (selected bit lines) connected to one data circuit and programmed simultaneously are arranged in different banks. Due to this, the control gates (word lines) of the plurality of selected memory cells are not common to the memory cells.

In this example, description will be given to a case where a plurality of memory cells existing in a single bank (i.e., a control gate line is common to the memory cells) are programmed simultaneously using one data circuit. Needless to say, only a storage circuit (e.g., a latch circuit) capable of temporarily holding program data (two-level data or multi-level data) on one memory cell is arranged in one data circuit.

4.-1. Overview

In this embodiment, description will be given hereinafter while taking a two-level NAND type flash memory as an example, as in the case of Concrete Example 1.

Figure 74:
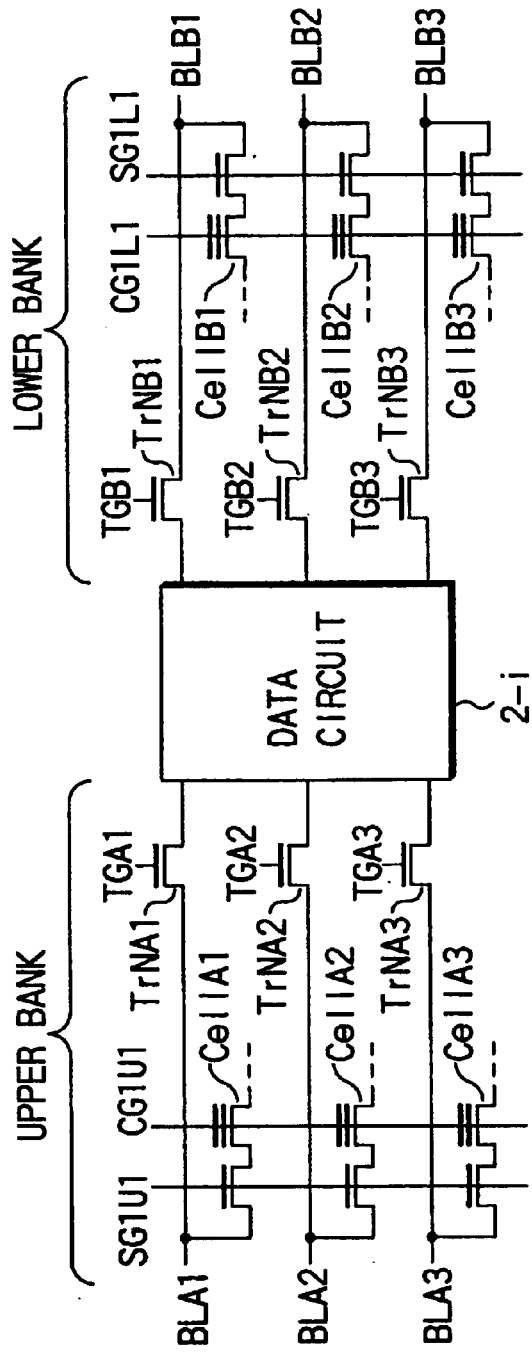
FIG. 74 shows the gist of the present invention (Concrete Example 2) relating to program speed.

The same chip layout and data circuit as those in Concrete Example 1 are employed (see FIGS. 61 and 62). The connection between the data circuit and the bit lines, however, satisfies the relationship shown in, for example, FIG. 74. That is to say, six bit lines BLA1, BLA2, BLA3, BLB1, BLB2 and BLB3 are connected to one data circuit 2-*i*.

Among the six bit lines BLA1, BLA2, BLA3, BLB1, BLB2 and BLB3, the three bit lines BLA1, BLA2 and BLA3 are arranged in an Upper bank and the three bit lines BLB1, BLB2 and BLB3 are arranged in a Lower bank.

In this example, using one data circuit 2-*i*, three memory cells CellA1, CellA2 and CellA3 connected to the three bit lines BLA1, BLA2 and BLA3 in the Upper bank, respectively, and having a common control gate line CG1U1, are programmed simultaneously. At this time, the three bit lines BLB1, BLB2 and BLB3 in the Lower bank are used to make program data on the memory cells CellA, CellA2 and CellA3 to temporarily wait, respectively.

Further, three memory cells CellB1, CellB2 and CellB3 connected to the three bit lines BLB1, BLB2 and BLB3 in the Lower bank, respectively and having a common control gate line CG1L1, are programmed simultaneously. At this time, the three bit lines BLA1, BLA2 and BLA3 in the Upper bank are used to make the program data on the memory cells CellB1, CellB2 and CellB3, respectively temporarily wait.

4.-2. Program Operation

The program operation will be described concretely hereinafter with reference to FIGS. 75 to 77. The program operations to the memory cells CellA1, CellA2 and CellA3 are exactly the same as those to the memory cells CellB1, CellB2 and CellB3 except for the difference of targets. Therefore, description will be given only to the program operations to the memory cells CellA1, CellA2 and CellA3.

(1) Step1-1

First, Data Load for loading program data on the memory cell CellA1 is carried out.

Program data on the memory cell CellA1 is inputted from externally of a chip into a data circuit 2-*i*. Then, when the level of TGA1 becomes "H", a transfer gate TrNA1 is turned on. Due to this, the program data in the data circuit 2-*i* is transferred to and held by the bit line BLA1. At this time, the level of TGB1 is "L" and a transfer gate TrNB1 is turned off.

In case of "0"-programming (program select), the program data is "0" and the potential of the bit line BLA1 becomes 0V. In case of "1"-programming (write inhibit), the program data is "1" and the potential of the bit line BLA1 becomes Vdd.

Thereafter, the level of TGB1 changes from "L" to "H" and the transfer gate TrNB1 is turned on. Therefore, the program data in the data circuit 2-*i* is also transferred to and held by the bit line BLB1.

(2) Step1-2

Following Step1-1, Data Load for loading program data on the memory cell CellA2 is carried out.

First, the levels of TGAL and TGB1 are set at "L" and the transfer gates TrNA1 and TrNB1 are turned off. At this time, the bit lines BLA1 and BLB1 turn into a floating state and the program data on the memory cell CellA1 is enclosed in the bit lines BLA1 and BLB1.

Thereafter, program data on the memory cell CellA2 is inputted from externally of the chip into the data circuit 2-*i*. Then, when the level of TGA2 becomes "H", the transfer gate TrNA2 is turned on. Therefore, the program data in the data circuit 2-*i* is transferred to and held by the bit line BLA2. At this time, the level of TGB2 is "L" and the transfer gate TrNB2 is turned off.

Then, the level of TGB2 changes from "L" to "H" and the transfer gate TrNB2 is turned on. Therefore, the program data in the data circuit 2-*i* is also transferred to and held by the bit line BLB2.

(3) Step1-3

Following the Step1-2, Data Load for loading program data on the memory cell CellA3 is carried out.

First, the levels of TGA2 and TGB2 are set at "L" and the transfer gates TrNA2 and TrNB2 are turned off. At this time, the bit lines BLA2 and BLB2 turn into a floating state and the program data on the memory cell CellA2 is enclosed in the bit lines BLA2 and BLB2.

Thereafter, program data on the memory cell CellA3 is inputted from externally of the chip into the data circuit 2-*i*. Then, when the level of TGA3 becomes "H", the transfer gate TrNA3 is turned on. Therefore, the program data in the data circuit 2-*i* is transferred to and held by the bit line BLA3. At this time, the level of TGB3 is "L" and the transfer gate TrNB3 is turned off.

Thereafter, the level of TGB3 changes from "L" to "H" and the transfer gate TrNB3 is turned on. Therefore, the program data in the data circuit 2-*i* is also transferred to and held by the bit line BLB3.

(4) Step1-4

Data Load for loading program data has been completed by the operations in "Step1-1" to "Step1-3". Thereafter, in this example, write data held by each bit line is refreshed before applying a program pulse.

However, the refresh operation to the write data ("Step1-4" and "Step1-5") may be conducted if there is a possibility that the potential of bit line for which Data Load has been already completed, changes with a leak current during Data Load. If there is no possibility that the potential of the bit line for which Data Load has been already completed, does not change with the leak current, it is not necessary to conduct the refresh operation to the write data.

In that case, after the completion of Data Load (in "Step1-1" to "Step1-3"), a program pulse is instantly applied (in "Step1-6").

If the potential change of the bit line due to the leak current causes a problem, a program data refresh operation is conducted to the program data on the memory cell CellA1 held by the bit lines BLA1 and BLB1 and the program data on the memory cell CellA2 held by the bit lines BLA2 and BLB2.

Namely, the program data on the memory cell CellA3 held by the bit lines BLA3 and BLB3 is not refreshed even if the potential change of the bit line due to the leak current causes a problem. This is because Data Load for loading the program data on the memory cell CellA3 is finally conducted (in "Step1-3") and time (Data retention-time) for which-the-bit lines BLA3 and BLB3 hold the program data is, therefore, short.

In "Step1-4", the program data on the memory cell CellA1 is refreshed.

First, the level of TGA1 becomes "H" and the transfer gate TrNA1 is turned on. At this time, the bit line BLA1 is electrically connected to the data circuit 2-$i$. Thus, using the latch circuit in the data circuit 2-$i$, the program data on the memory cell CellA1 held by the bit line BLA1 is refreshed.

While refreshing the program data held by the bit line BLA1, the level of TGB1 is "L" and the transfer gate TrNB1 is turned off.

Then, the level of TGA1 becomes "L" and the transfer gate TrNA1 is turned off. Further, the level of TGB1 becomes "H" and the transfer gate TrNB1 is turned on. At this time, the bit line BLB1 is electrically connected to the data circuit 2-$i$. Thus, using the latch circuit in the data circuit 2-$i$, the program data on the memory cell CellA1 held by the bit line BLB1 is refreshed.

(5) Step1-5

In "Step1-5", the program data on the memory cell CellA2 is refreshed.

First, the level of TGA2 becomes "H" and the transfer gate TrNA2 is turned on. At this time, the bit line BLA2 is electrically connected to the data circuit 2-$i$. Thus, using the latch circuit in the data circuit 2-$i$, the program data on the memory cell CellA2 held by the bit line BLA2 is refreshed.

While refreshing the program data held by the bit line BLA2, the level of TGB2 is "L" and the transfer gate TrNB2 is turned off.

Then, the level of TGA2 becomes "L" and the transfer gate TrNA2 is turned off. Further, the level of TGB2 becomes "H" and the transfer gate TrBN2 is turned on. At this time, the bit line BLB2 is electrically connected to the data circuit 2-$i$. Thus, using the latch circuit in the data circuit 2-$i$, the program data on the memory cell CellA2 held by the bit line BLB2 is refreshed.

During "Step1-1" to "Step1-5", the select gate lines SGlU1 and SGlL1 are turned off. The write data held by each bit line is not, therefore, eliminated.

(6) Step1-6

In "Step1-6", a program pulse is supplied.

The bit line BLA1 already holds the program data on the memory cell CellA1, the bit line BLA2 already holds the program data on the memory cell CellA2 and the bit line BLA3 already holds the program data on the memory cell CellA3. Due to this, if a program pulse is supplied to the control gate line CGlU1, program operations to the three memory cells CellA1, CellA2 and CellA3 are simultaneously executed.

The potentials of the control gate line (word line) and the select gate lines during the program operations are as follows.

The potential of the select gate line SGlU1 at the bit line side is set at Vdd, that of the select gate line at the source line side is set at Vss, that of the selected control gate line CGlU1 is set at the program potential Vpgm and those of unselected control lines are set at the transfer potential Vpass.

In case of "0"-programming (program select), the potential of the channel of the selected memory cell becomes 0V. Due to this, a high electric field is applied to the tunnel oxide film and electrons are injected from the channel into the floating gate electrode.

In case of "1"-programming (write inhibit), the potential of the channel of the selected memory cell becomes Vdd-Vth (where Vth is the threshold voltage of the select transistor) and the select transistor at the bit line side is turned off. Thus, the channel turns into a floating state.

Accordingly, if a program pulse is supplied, the channel potential rises to about 8V by the capacitive coupling between the control gate line and the channel. Namely, no electric field is applied to the tunnel oxide film and no electrons are injected from the channel into the floating gate electrode.

(7) Step1-7

After the completion of the supply of a program pulse, an operation for transferring the program data temporarily stored in the bit line to the data circuit, a verify operation (verify read operation and Program completion detection) and an operation for transferring reprogram (Re-write) data to the bit line, are carried out.

Since the data circuit 2-$i$ has only one latch circuit capable of temporarily storing program/read data on one memory cell, these operations are carried out for each bit line (or memory cell).

In this example, the operation for transferring the program data temporarily stored in the bit line BLB1 (which may be BLA1) to the data circuit, the verify read operation (including Program completion detection) to the memory cell CellA1, and the operation for transferring reprogram (Re-write) data to the bit line BLB1 (which may be BLA1 or BLB1), are carried out in "Step1-7" and "Step1-8".

Further, in "Step1-9" and "Step1-10", the operation for transferring the program data temporarily stored in the bit line BLB2 (not the bit line BLA2, which will be described later) to the data circuit, the verify read operation (including Program completion detection) to the memory cell CellA2 and the operation for transferring reprogram (Re-write) data from the data circuit to the bit line BLB2 (which may be BLA2 or BLB2), are carried out.

In "Step1-11" and "Step1-12", the operation for transferring the program data temporarily stored in the bit line BLB3 (not the bit line BLA3, which will be described later) to the data circuit, the verify read operation (including Program completion detection) to the memory cell CellA3 and the operation for transferring reprogram (Re-write) data from the data circuit to the bit line BLB3 (which may be BLA3 or BLB3), are carried out.

In this example, the program data on the selected memory cell in the Upper bank is held by the bit line connected to the memory cell and by one bit line in the Lower bank. The reason is as follows. In the verify read operation to be described later, if a verify read operation is conducted to, for example, the selected memory cell CellA1, program data held by the bit lines BLA2 and BLA3 connected to the other selected memory cells CellA2 and CellA3, respectively, are eliminated.

Namely, if the program data on the bit lines BLB2 and BLB3 in the Lower bank is held, the program data on the memory cells CellA2 and CellA3 are held by the bit lines BLB2 and BLB3 and not eliminated even if the program data held by the bit lines BLA2 and BLA3 in the Upper bank are eliminated during the verify read operation to the memory cell CellA1.

"Step1-7" operation will be described hereinafter.

In "Step1-7", an operation for transferring the program data on the memory cell CellA in the Upper bank which data is held by the bit line BLB1 in the Lower bank to the data circuit, is carried out.

First, when the level of TGB1 becomes "H", the transfer gate TrNB1 is turned on. At this time, the bit line is electrically connected to the data circuit and the program data on the memory cell CellA1 held by the bit line BLB1 in the Lower bank is transferred to the data circuit.

Alternatively, in this example, the level of TGA1 may be set at "H", the transfer gate TrNA1 may be turned on and the program data held by the bit line BLA1 in the Upper bank may be transferred to the data circuit.

The program data is held by the latch circuit LATCH1 in the data circuit 2-*i* shown in, for example, FIG. 62.

(8) Step1-8

In "Step1-8", a verify read operation to the memory cell CellA1 is carried out.

First, the bit line BLA1 is precharged with a precharge potential (e.g., about 1.8V). At this time, the program data held by the bit line BLA1 is eliminated. However, since the program data has been already transferred to the latch circuit in the data circuit, no problem arises.

Then, when th level of TGA1 is set at "H" and the transfer gate TrNA1 is turned on, the bit line BLA1 is electrically connected to the data circuit.

If the two select gate lines are applied with Vread, the control gate line (selected word line) CG1U1 of the memory cell CellA1 is applied with the read potential Vcgv0 for the verify read operation and unselected word lines are applied with the potential Vread with which corresponding memory cells are always turned on, then the data of the memory cell CellA1 is transferred to the data circuit 2-*i* by way of the bit line BLA1.

Thereafter, in the data circuit 2-*i*, an operation for generating reprogram (Re-write) data and an operation for detecting whether or not precise data has been completely written into the memory cell CellA1 (Program completion detection) are carried out based on the data of the memory cell CellA1 and the program data latched by the latch circuit LATCH1.

Providing that the data circuit shown in FIG. 62 is used, if "1"-programming and "0"-programming" are sufficient, the reprogram (Re-write) data becomes "1" and "0"-programming is not, therefore, conducted thereafter. Namely, the program operation to the memory cell CelA1 is completed.

If "0"-programming-is deficient, the reprogram (Re-write) data becomes "0" and "0"-programming, therefore, continues. Namely, the program operation to the memory cell CellA1 continues.

In the verify read operation to the memory cell CellA1, the read potential Vcgv0 is applied to the control gate line CG1U1.

As a result, the memory cell A1 as well as the memory cells CellA2 and CellA3 having the control gate line CG1U1 common to the memory cell A1 are turned on, and the program data on the memory cells CellA2 and CellA3 held by the bit lines BLA2 and BLA3 are eliminated. However, the program data on the memory cells CellA2 and CellA3 are also held by the bit lines BLB2 and BLB3 in the Lower bank and no problem, therefore, arises.

After the verify read operation, the reprogram (Re-write) data on the memory cell CellA1 is transferred to the bit line BLA1 (actually, since the transfer gate TrNA1 is turned on, the reprogram (Re-write) data is transferred to the bit line BLA1 almost simultaneously with the verify read operation). At this time, the level of TGB1 is "L" and the transfer gate TrNb1 is turned off.

Thereafter, when the level of TGB1 is set at "H", the transfer gate TrNB1 is turned on and the reprogram (Re-write) data on the memory cell CellA1 is also transferred to the bit line BLB1.

As will be described later, during the verify operation to the memory cell CellA2, the reprogram (Re-write) data on the memory cells CellAl held by the bit line BLA1 is eliminated. Accordingly, the program data held by the bit line BLB1 is used in the later operation.

(9) Step1-9

As in the case of the above-stated "Step1-7" and "Step1-8" operations, "Step1-9" and "Step1-10" operations are carried out.

First, the "Step1-9" operation will be described.

In "Step1-9", an operation for transferring the program data on the memory cell CellA2 in the Upper bank which data is held by the bit line BLB2 in the Lower bank, to the data circuit, is carried out.

First, when the level of TGB2 becomes "H", the transfer gate TrNB2 is turned on. At this time, the bit line BLB2 is electrically connected to the data circuit and the program on the memory cell CellA2 held by the bit line BLB2 in the Lower bank is transferred to the data circuit.

In this example, the program data on the memory cell CellA2 held by the bit line BLA2 in the Upper bank is eliminated during the verify read operation to the memory cell CellA1 (in the "Step1-8"). The program data on the memory cell CellA2 is, therefore, transferred from the bit line BLB2 in the Lower bank to the data circuit.

The program data is held by the latch circuit LATCH1 in the data circuit 2-*i* shown in, for example, FIG. 62.

(10) Step1-10

In "Step1-10", a verify read operation to the memory cell CellA2 is carried out.

First, the bit line BLA2 is precharged with the precharge potential (e.g., about 1.8V). Thereafter, when the level of TGA2 is set at "H" and the transfer gate TrNA2 is turned on, the bit line BLA2 is electrically connected to the data circuit.

If the two select gate lines are applied with Vread, the control gate line (selected word line) CG1U1 of the memory cell CelA2 is applied with the read potential Vcgv0 for the verify read operation and unselected word lines are applied with the potential Vread (e.g., about 3.5V) with which corresponding memory cells are always turned on, then the data of the memory cell CellA2 is transferred to the data circuit 2-*i* by way of the bit line BLA2.

Thereafter, an operation for generating reprogram (Re-write) data and an operation for detecting whether or not precise data has been completely written into the memory cell CellA2 (Program completion detection), are carried out.

For example, if "1"-programming is conducted and "0"-programming is sufficient, the reprogram (Re-write) data becomes "1" and "0"-programming is not conducted to the memory cell CellA2 thereafter. Namely, the program operation to the memory cell CellA2 is completed.

If "0"-programming is deficient, the reprogram (Re-write) data becomes "0" and "0"-programming to the memory cell CellA2, therefore, continues.

In the verify read operation to the memory cell CellA2, the control gate line CG1U1 is applied with the read potential Vread.

As a result, the memory cell CellA2 as well as the memory cells CellA1 and CellA3 having the control gate line CG1U1 common to the cells CellA2, CellA1 and CellA3 are turned on, and the program data on the memory cells CellA1 and CellA3 held by the bit lines BLA1 and BLA3 are eliminated.

However, the program data (or reprogram (Re-write) data) on the memory cells CellA1 and CellA3 are held by the bit lines BLB1 and BLB3 in the Lower bank, respectively, and these program data are not, therefore, completely eliminated.

After the verify read operation, the reprogram (Re-write) data on the memory cell CellA2 is transferred to the bit line BLA2 (actually, since the transfer gate TrNA2 is turned on, the reprogram (Re-write) data is transferred to the bit line BLA2 almost simultaneously with the verify read operation). At this time, the level of TGB2 is "L" ad the transfer gate TrNB2 is turned off.

Thereafter, when the level of TGB2 is set at "H", the transfer gate TrNB2 is turned on and the reprogram (Re-write) data on the memory cell CellA2 is also transferred to the bit line BLB2.

As will be described later, during the verify read operation to the memory cell CelA3, the reprogram (Re-write) data on the memory cell CellA2 held by the bit line BLA2 is eliminated. The program data held by the bit line BLB2 is, therefore, used in later operation.

(11) Step1-11

As in the case of the above-stated "Step1-9" and "Step1-10" operations, "Step1-11" and "Step1-12" operations are carried out.

First, "Step1-11" operation will be described.

In "Step1-11", an operation for transferring program data on the memory cell CellA3 in the Upper bank which data is held by the bit line BLB3 in the Lower bank to the data circuit, is carried out.

First, when the level of TGB3 becomes "H", the transfer gate TrNB3 is turned on. At this time, the bit line BLB3 is electrical connected to the data circuit and the program data on the memory cell CellA3 held by the bit line BLB3 in the Lower bank is transferred to the data circuit.

The program data on the memory cell CellA3 held by the bit line BLA3 in the Upper bank has been already eliminated during the verify read operation to the memory cell CellA1 (in "Step1-8"). The program data on the memory cell CellA3 is, therefore, transferred from the bit line BLB3 in the Lower bank to the data circuit.

This program data is held by the latch circuit LATCH1 in the data circuit 2-*i* shown in, for example, FIG. 62.

(12) Step1-12

In "Step1-12", a verify read operation to the memory cell CellA3 is carried out.

First, the bit line BLA3 is precharged with the precharge potential (e.g., about 1.8V). Then, when the level of TGA3 is set at "H" and the transfer gate TrNA3 is turned on, the bit line BLA3 is electrically connected to the data circuit.

When the two select gate lines are applied with Vread, the control gate line (selected word line) CG1U1 of the memory cell CellA3 is applied with the read potential Vcgv0 for the verify read operation and unselected word lines are applied with the potential Vread (e.g., about 3.5V) with which corresponding memory cells are always turned on, then the data of the memory cell CellA3 is transferred to the data circuit 2-*i* by way of the bit line BLA3.

Thereafter, in the data circuit 2-*i*, an operation for generating reprogram (Re-write) data and an operation for detecting whether or not precise data has been completely written into the memory cell CellA3 (Program completion detection) are carried out based on the data of the memory cell CellA3 and the program data held by the latch circuit LATCH1.

For example, if "1"-programming is conducted and "0"-programming is sufficient, the reprogram (Re-write) data becomes "1" and "0"-programming is not, therefore, conducted to the memory cell CellA3 thereafter. Namely, the program operation to the memory cell CellA3 is completed.

If "0"-programming is deficient, the reprogram data becomes "0" and "0"-programming to the memory cell CellA3, therefore, continues.

In the verify read operation to the memory cell CellA3, the control gate line CG1U1 is applied with the read potential Vcgv0.

As a result, the memory cells CellA1 and CellA2 having the control gate line CG1U1 common to the memory cells CellA3, CellA1 and CellA2 are turned on, and the program data on the memory cells CellA1 and CellA2 held by the bit lines BLA1 and BLA2 are eliminated.

However, since the program data (or reprogram (Re-write) data) on the memory cells CellA1 and CellA2 are held by the bit lines BLB1 and BLB2 in the Lower bank, the program data are not completely eliminated.

After the verify read operation, the reprogram (Re-write) data on the memory cell CellA3 is transferred to the bit line BLA3 (actually, since the transfer gate TrNA2 is turned on, the reprogram (Re-write) data is transferred to the bit line BLA3 almost simultaneously with the verify read operation). At this time, the level of TGB3 is "L" and the transfer gate TrNB3 is turned off.

Thereafter, when the level of TGB3 is set at "H", the transfer gate TrNB3 is turned on and the reprogram (Re-write) data on the memory cell CellA3 is also transferred to the bit line BLB3.

If "Step1-12" is completed, the verify read operations to the memory cells CellA1, CellA2 and CellIA3 are completed. That is, the reprogram (Re-write) data on the memory cell CellA3 transferred to the bit line BLA3 in the Upper bank is not eliminated but held by the bit line BLA3.

Thereafter, reprogram operations (the supply of program pulses) to the memory cells CellA1, CellA2 and CellA3 in the Upper bank are conducted. As already described above, the bit line BLA1 in the Upper bank does not hold the program data on the memory cell CellA1 and the bit line BLA2 in the Upper bank does not hold the program data on the memory cell CellA2. Only the-bit line BLA3 in the Upper bank holds the program data on the memory cell CellA3.

Accordingly, before starting the reprogram (Re-write) operations, an operation for transferring the program data on the memory cell CellA1 from the bit line BLB1 in the Lower bank to the bit line BLA1 in the Upper bank ("Step1-13" and "Step1-14"), and an operation for transferring the program data on the memory cell CellA2 from the bit line BLB2 in the Lower bank to the bit line BLA2 in the Upper bank ("Step1-15", and "Step1-16") are executed.

(13) Step1-13

In "Step1-13", the write data on the memory cell CellA1 held by the bit line BLB1 in the Lower bank is transferred to the data circuit 2-*i*.

First, the level of TGB1 is set at "H" and the transfer gate TrNB1 is turned on. At this time, the write data on the memory cell CellA1 held by the bit line BLB1 is transferred to the data circuit 2-*i*. This program data is latched by the latch circuit LATCH1 in the data circuit 2-*i* (e.g., see FIG. 62).

Thereafter, the level of TGB1 is set at "L" and the transfer gate TrNB1 is turned off.

(14) Step1-14

In "Step1-14", the write data on the memory cell CellA1 held by the latch circuit LATCH1 in the data circuit 2-$i$ is transferred to the bit line BLA1 in the Upper bank.

First, the level of TGA1 is set at "H" and the transfer gate TrNA1 is turned on. At this time, the bit line BLA1 in the Upper bank is electrically connected to the data circuit 2-$i$ and the write data on the memory cell CellA1 held by the latch circuit LATCH1 in the data circuit 2-$i$ is transferred to the bit line BLA1 in the Upper bank.

Thereafter, the level of TGA1 is set at "L" and the transfer gate TrNA1 is turned off.

(15) Step1-15

In "Step1-15", the write data on the memory cell CellA2 held by the bit line BLB2 in the Lower bank is transferred to the data circuit 2-$i$.

First, the level of TGB2 is set at "H" and the transfer gate TrNB2 is turned on. At this time, the bit line BLB2 in the Lower bank is electrically connected to the data circuit 2-$i$ and the write data on the memory cell CellA2 held by the bit line BLB2 is transferred to the data circuit 2-$i$. This program data is then latched by the latch circuit LATCH1 in the data circuit 2-$i$ (e.g., see FIG. 62).

Thereafter, the level of TGB2 is set at "L" and the transfer gate TrNB2 is turned off.

(16) Step1-16

In "Step1-16", the write data on the memory cell CellA2 held by the latch circuit LATCH1 in the data circuit 2-$i$ is transferred to the bit line BLA2 in the Upper bank.

First, the level of TGA2 is set at "H" and the transfer gate TrNA2 is turned on. At this time, the bit line BLA2 in the Upper bank is electrically connected to the data circuit 2-$i$, and the write data on the memory cell CellA2 held by the latch circuit LATCH1 in the data circuit 2-$i$ is transferred to the bit line BLA2 in the Upper bank.

Thereafter, the level of TGA2 is set at "L" and the transfer gate TrNA2 is turned off.

(17) Step1-17

By the time of "Step1-12", the program data on the memory cell CellA3 has been held by the bit line BLA3 in the Upper bank and by the operations of the "Step1-13" to "Step1-16", the program data on the memory cells CellA1 and CellA2 have been transferred to the bit lines BLA1 and BLA2 in the Upper bank.

Thus, each of the bit lines BLA1, BLA2 and BLA3 in the Upper bank turns into a state in which the bit line holds reprogram data.

Thereafter, in "Step1-17", a program pulse is supplied to the selected control gate line (selected word line) CG1U1 and reprogram (Re-write) operations are executed to the memory cells CellA1, CellA2 and CellA3 in the Upper bank.

After the supply of program pulses in "Step1-17", the same operations as those of "Step1-7" to "Step1-16" are carried out again.

Namely, after the "Step1-17", the operations of "Step1-7" to "Step1-16" are repeatedly executed until all the selected memory cells have been sufficiently programmed (or the number of program times exceeds a predetermined number of times and a program defect occurs).

As stated so far, according to Concrete Example 2, program operation can be executed simultaneously to a plurality of memory cells having a common control gate line in the same bank while using one data circuit.

That is to say, even if the data circuit has only one storage circuit capable of temporarily holding program/read data on one memory cell, a plurality of memory cells can be programmed using one data circuit by allowing the bit lines to hold the program data on the corresponding memory cells.

Further, if one data circuit is provided for a plurality of banks and a plurality of memory cells in a certain bank (Upper bank) are programmed using this data circuit, for example, a plurality of bit lines in another bank (Lower bank) hold program data.

Accordingly, it is possible to carry out a series of program operations (the supply of a program pulse, the verify read operation, Program completion detection and the like) without eliminating the program data.

In this way, according to Concrete Example 2, it is possible to attain high-speed programming without increasing the chip area and without making the size of the data circuit large.

In Concrete Example 2, three memory cells existing in the same bank are programmed simultaneously using one data circuit. It is also possible to simultaneously program four or more memory cells existing in the same bank using one data circuit.

Figure 78:
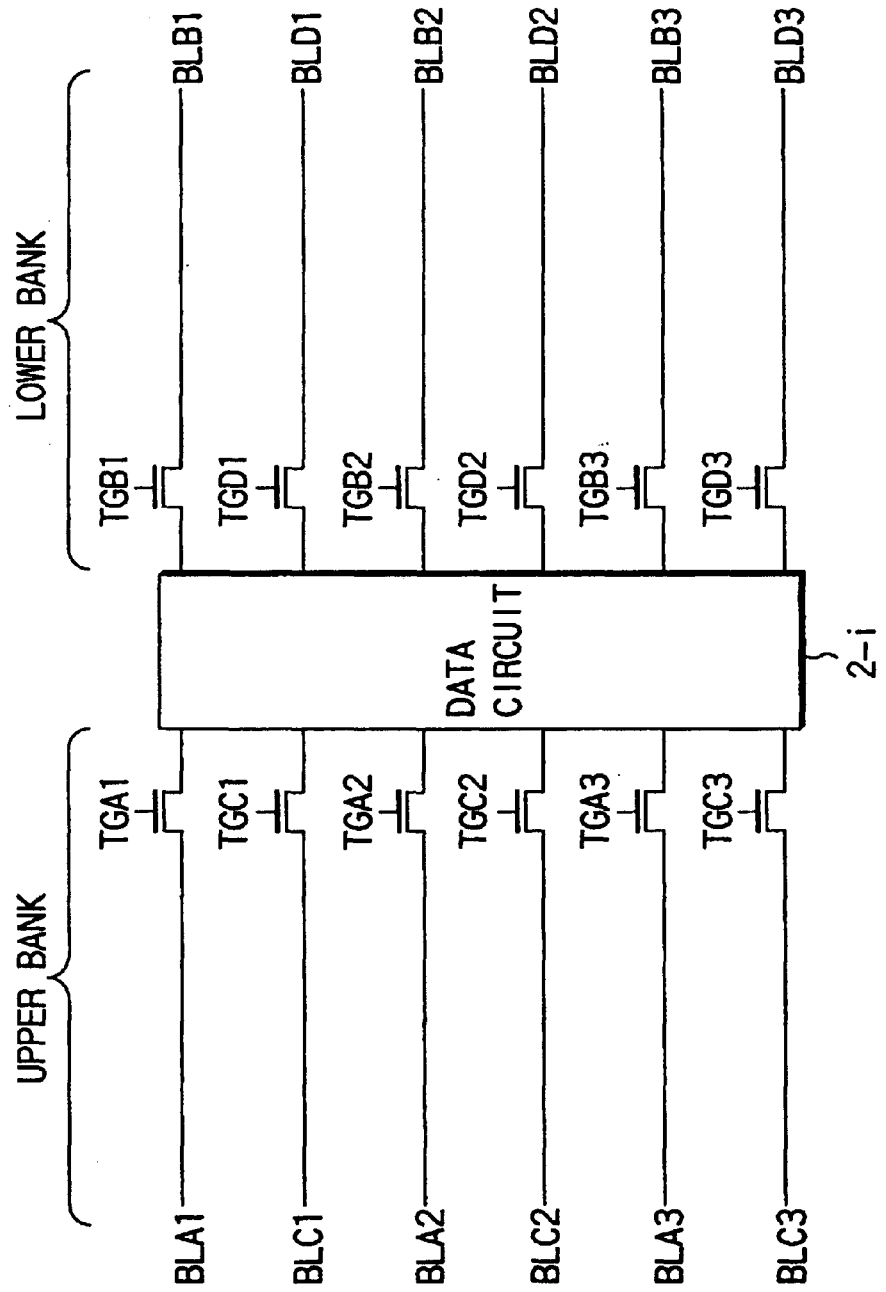
FIG. 78 shows a modification of the present invention (Concrete Example 2) relating to program speed.

In case of FIG. 78, for example, six bit lines BLA1, BLA2, BLA3, BLC1, BLC2 and BLC3 in the Upper bank and six bit lines BLB1, BLB2, BLB3, BLD1, BLD2 and BLD3 in the Lower bank are connected to one data circuit 2-$i$.

In this case, as in the case of Concrete Example 2, six memory cells connected to the six bit lines BLA1, BLA2, BLA3, BLC1, BLC2 and BLC3 in the Upper bank can be programmed simultaneously. Further, six memory cells connected to the six bit lines BLB1, BLB2, BLB3, BLD1, BLD2 and BLD3 in the Lower bank can be programmed simultaneously.

Further, in case of programming memory cells in the Upper bank, three memory cells connected to the three bit lines BLA1, BLA2 and BLA3 may be programmed simultaneously and the bit lines BLB1, BLB2 and BLB3 may store program data of the bit lines BLA1, BLA2 and BLA3, respectively.

At this time, to prevent capacitive coupling noise between the bit lines, the bit lines BLC1, BLC2 and BLC3 and the bit lines BLD1, BLD2 and BLD3 may be used as shield bit lines (which potentials are fixed to Vdd or Vss).

Likewise, in case of programming memory cells in the Upper bank, three memory cells connected to the three bit lines BLC1, BLC2 and BLC3 may be programmed simultaneously and the bit lines BLD1, BLD2 and BLD3 may store program data of the bit lines BLC1, BLC2 and BLC3, respectively. At this time, the bit lines BLA1, BLA2 and BLA3 and the bit lines BLB1, BLB2 and BLB3 may be used as shield bit lines.

In case of programming memory cells in the Lower bank, unselected bit lines may be used as shield bit lines, as well.

[Others]

The detailed description of the nonvolatile semiconductor memory according to the present invention is concluded.

In the embodiments, description has been given while taking a multi-level NAND cell type EEPROM as an example. Needless to say, the present invention is also applicable to other types of multi-level memories. As for a memory cell array, for example, NOR type, AND type (A. Nozoe: ISSCC, Digest of Technical Papers, 1995), DINOR type (S. Kobayashi: ISSCC, Digest of Technical Papers, 1995), Virtual Ground Array type (Lee, et al.: Symposium on VLSI Circuits, Digest of Technical Papers, 1994) or the like may be used.

Further, the present invention should not be limited to a flash memory and is also applicable to a nonvolatile semiconductor memory such as a mask ROM and an EPROM.

As described so far, according to the present invention, firstly, at least one of a plurality of storage circuits used to temporarily store multi-level data (n-level data) and arranged in a data circuit consists of a DRAM cell (capacitor). As is well known, the area of the DRAM cell is smaller than that of an SRAM cell. Due to this, if a part of a plurality of storage circuits are constituted by a DRAM cell, the area of the data circuit can be made smaller than that in the conventional case of constituting all storage circuits out of SRAM cells.

Secondly, the word line control circuit consists of a row address decoder and a word line driver and the row address decoder is arranged at one side of the memory cell array. If word line drivers are arranged at both sides of the memory cell array, respectively, the state of a signal line for connecting the row address decoder at one side of the memory cell array to the word line driver at the other side thereof is controlled according to an operation mode. Accordingly, the signal line does not influence the operation of memory-cells.

Thirdly, by setting the relationship between, for example, four-level data and threshold voltages of memory cells at a predetermined one, even page data can be read by conducting two read operations and odd page data can be read by conducting one read operation.

Fourthly, the relationship between, for example, four-level data and the threshold voltages of memory cells at a predetermined one, in, for example, the program operation to the odd page data conducted after the program operation to the even page data, it is possible to shorten program time (accelerate program) by completing "00"-programming earlier than "01"-programming and omitting "00" verify read operation after the completion of "00"-programming.

Fifthly, in the program operation, for example, by conducting a refresh operation to the DRAM cell (capacitor) provided in the data circuit instead of the latch circuit, the program operation (the supply of a program pulse) and the input of program data can be executed in parallel. By doing so, even if the leakage of charges of the capacitor becomes a problem, precise program operation can be ensured.

Sixthly, by providing a write cache in the data circuit, the program operation (supply of program pulses) and the input of program data can be executed in parallel if conducting program operation over a plurality of pages. This can substantially dispense with data load time after page-2, thereby making it possible to accelerate program operation.

Seventhly, if a write cache is provided in the data circuit and the write cache consists of a DRAM cell (capacitor), a refresh operation is conducted to the DRAM cell. By doing so, even if the leakage of the DRAM cell causes a problem, it is possible to prevent program data from being eliminated.

Eighthly, using a data circuit having only one storage circuit capable of storing program/read data on one memory cell, a plurality of memory cells in different banks can be programmed almost simultaneously. Namely, by allowing the bit lines connected to the memory cells to hold the program data on the memory cells, respectively, a plurality of memory cells can be programmed using one data circuit. Further, while programming one memory cell, the other memory cell is subjected to a verify read operation. By doing so, program speed can be doubled compared with the conventional speed without increasing the chip area.

Ninthly, using a data circuit having only one storage circuit capable of storing program/read data on one memory cell, a plurality of memory cells arranged in the same bank and having a common control gate line can be programmed simultaneously. Namely, by allowing bit lines in a bank different from the bank in which the bit lines to which the memory cells are connected and the memory cells are arranged, to hold the program data on the memory cells, respectively, a plurality of memory cells in the same bank can be programmed simultaneously using one data circuit. This can accelerate program speed compared with the conventional speed without increasing the chip area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a first string including a first memory cell and a first select transitor connected in series;
   a second string line including a second memory cell and a second select transistor connected in series;
   a first bit line connected to said first string line;
   a second bit line connected to said second string line, being different from said first bit line;
   a common node connected to one ends of said first and second bit lines, and
   a common latch circuit connected to said common node, wherein
   said first and second memory cells are programmed substantially simultaneously; and while a program voltage is supplied to said second memory cell, a verify read operation to verify whether said first memory cell has been programmed sufficiently, is carried out by said common latch circuit, and while said program voltage is supplied to said first memory cell, a verify read operation to verify whether said second memory cell has been programmed sufficiently, is carried out by said latch circuit.

2. A nonvolatile semiconductor memory according to claim 1,
   wherein
   while said program voltage is supplied to said second memory cell, program data of said second memory cell is held by said second bit line, and
   while said program voltage is supplied to said first memory cell, program data of said first memory cell is held by said first bit line.

3. The nonvolatile semiconductor memory according to claim 2, wherein said first memory cell and said second memory cell are connected to different word lines.

4. The nonvolatile semiconductor memory according to claim 1, wherein said first memory cell and said second memory cell are connected to different word lines.

5. A nonvolatile semiconductor memory comprising:
   a first string line including a first memory and a first select transistor connected in series;
   a second string line including a second memory cell and a second select transistor connected in series;
   a first bit line connected to said first string line;

a second bit connected to said second string line, being different from said first bit line;
a common node connnected to one ends of said first and second bit lines; and
a common latch circuit connected to said common node, wherein
said first and second memory cells are programmed substantially simultaneously;
while a program voltage is supplied to said first memory cell, program data of said memory cell is held by second bit line, and while said program voltage is supplied to said second memory cell, the program data of said first memory cell held by said first bit line is latched in said common latch circuit and a verify read operation to verify whether said first memory cell has been programmed sufficiently, is carried out by said common latch circuit;
while said program is supplied to said first memory cell, program data of said first memory cell is held by said first bit line, and while said program voltage is supplied to said first memory cell, the program of data said second memory cell held by said second memory cell has been programmed sufficiently, is carried out by said common latch circuit.

6. The nonvolatile semiconductor memory according to claim 5, wherein said first memory cell and said second memory cell are connected to different word lines.

7. A nonvolatile semiconductor memory comprising:
a first string line including a first memory cell and a first select transistor connected in series;
a first bit line connected to said first string line;
a second bit line, being different from said first bit line;
a common node connected to one ends of said first and second bit lines latching program/read data; and
a common latch circuit connected to said common node, wherein
while a program voltage is supplied to said first memory cell, program data of said first memory cell is held by at least one of said first and second bit lines;
after said program voltage is supplied to said first memory cell, said common latch circuit is electrically connected to said second bit line and the program data of said first memory cell held by said second bit line is latched in said common latch circuit; and
a verify read operation to verify whether said first memory cell has been sufficiently programmed, is carried out using said program data latched in said common latch circuit.

8. The nonvolatile semiconductor memory according to claim 7, wherein
while said program/read data is held by said first or second bit line, a potential of a bit line adjacent to said first or second bit line is set at a fixed potential.

9. The nonvolatile semiconductor memory according to claim 8, wherein said fixed potential is a ground potential or a power supply potential.

10. A nonvolatile semiconductor memory comprising:
a first string line including a first memory cell and a first select transistor connected in series;
a first bit line connected to said first string line;
a second string line including a second memory cell and a second select transistor connected in series;
a third bit line connected to said second string line;
a fourth bit line;
a common node connected to one ends of said first, second, third and fourth bit lines, latching program/read data of at least one of said first and second memory cells; and a common latch circuit connected to said common node, wherein
said first, second, third and fourth bit lines are different from each other;
said first and second memory cells are programmed substantially simultaneously, program data of said first memory cell is held by at least one of said first and second bit lines, and program data of said second memory cell is held by at least one of said third and fourth bit lines while a program voltage is supplied to said first and second memory cells;
a verify read operation to verify whether said first memory cell has been sufficiently programmed, is carried out by said common latch circuit, and program data of said second memory cell is held by said fourth bit line while conducting the verify read operation of said first memory cell; and
said common latch circuit and said fourth bit line are electrically connected to each other, after the program data of said second memory cell held by said fourth bit line is latched in said common latch circuit, a verify read operation to verify whether said second memory cell has been sufficiently programmed, is carried out using the program data of said second memory cell held by said common latch circuit, and while conducting a verify read operation of said second memory cell, the program data of said first memory cell is held by said second bit line.

11. A nonvolatile semiconductor memory comprising:
a first memory cell section including a first memory cell;
a first signal line connected to said first memory cell section;
a second signal line;
a third memory cell section including a third memory cell;
a third signal line connected to said third memory cell section;
a fourth signal line; and
a data circuit connected to one ends of said first, second, third and forth signal lines, and including a latch circuit said latch circuit latching program/read data of at least one of said first and third memory cells;
wherein
said first and third memory cells are programmed substantially simultaneously, program data of said first memory cell is held by at least one of said first and second signal lines, and program data of said third memory cell is held by at least one of said third and fourth signal lines while a program voltage is supplied to said first and second memory cells;
a verify read operation to verify whether said first memory cell has been sufficiently programmed, is carried out by said latch circuit, and program data of said third memory cell is held by said fourth signal line while conducting the verify read operation of said first memory cell; and
said data circuit and said fourth signal line are electrically connected to each other, after the program data of said third memory cell held by said fourth signal line is latched in said latch circuit, a verify read operation to verify whether said third memory cell has been sufficiently programmed, is carried out using the program data of said third memory cell held by said latch circuit, and while conducting a verify read operation of said third memory cell, the program data of said first memory cell is held by said second signal line.

12. The nonvolatile semiconductor memory according to claim 11, wherein said first and third memory cells are connected to a same word line.

13. The nonvolatile semiconductor memory according to claim 9, wherein while said program/read data is held by said first or second signal line, a potential of a signal a potential of a signal line adjacent to said first or second signal line is set at a fixed potential.

* * * * *

UNITED STATES PATENT AND TRADEMARK OFFICE
CERTIFICATE OF CORRECTION

PATENT NO. : 7,177,196 B2
APPLICATION NO. : 10/073999
DATED : February 13, 2007
INVENTOR(S) : Ken Takeuchi et al.

It is certified that error appears in the above-identified patent and that said Letters Patent is hereby corrected as shown below:

On the title page, References Cited section (56), Foreign Patent Documents:
  Please insert the following references:
--JP    11-17619      07/1999
  JP    11-167800     06/1999
  CN    1211040A      03/1999--

In Column 101, Claim 5, Line 1:
  Please replace "bit connected" with --bit line connected--

In Column 101, Claim 5, Line 21:
  Please replace "second memory cell" with --second bit line is latched in said common latch circuit and a verify read operation to verify whether said second memory cell--

In Column 101, Claim 10, Line 59:
  Please insert --a second bit line;--

In Claim 11, Column 102, Line 31-Column 103, Line 4:
  Please replace Claim 11 with the following:
--The nonvolatile semiconductor memory according to claim 10, wherein
  said first and second memory cells are connected to a same word line.--

In Claim 12, Column 102, Lines 5-8:
  Please replace Claim 12 with the following:
--The nonvolatile semiconductor memory according to claim 11, wherein
  while said program/read data is held by said first, second, third, or fourth bit line, a potential of a bit line adjacent to said first, second, third, or fourth bit line is set at a fixed potential.--

UNITED STATES PATENT AND TRADEMARK OFFICE
CERTIFICATE OF CORRECTION

PATENT NO. : 7,177,196 B2
APPLICATION NO. : 10/073999
DATED : February 13, 2007
INVENTOR(S) : Ken Takeuchi et al.

It is certified that error appears in the above-identified patent and that said Letters Patent is hereby corrected as shown below:

In Claim 13, Column 104, Lines 1-6:
    Should read as follows:
--The nonvolatile semiconductor memory according to claim 12, wherein said fixed potential is a ground potential or a power supply potential.--

Signed and Sealed this

Twenty-ninth Day of July, 2008

JON W. DUDAS
*Director of the United States Patent and Trademark Office*